US008486785B2

(12) United States Patent
Masuoka et al.

(10) Patent No.: US 8,486,785 B2
(45) Date of Patent: Jul. 16, 2013

(54) SURROUND GATE CMOS SEMICONDUCTOR DEVICE

(75) Inventors: Fujio Masuoka, Tokyo (JP); Hiroki Nakamura, Tokyo (JP); Shintaro Arai, Tokyo (JP); Tomohiko Kudo, Tokyo (JP); Yu Jiang, Tokyo (JP); King-Jien Chui, Tokyo (JP); Yisuo Li, Tokyo (JP); Xiang Li, Singapore (SG); Zhixian Chen, Singapore (SG); Nansheng Shen, Singapore (SG); Vladimir Bliznetsov, Singapore (SG); Kavitha Devi Buddharaju, Singapore (SG); Navab Singh, Singapore (SG)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 0 days.

(21) Appl. No.: 13/113,482

(22) Filed: May 23, 2011

(65) Prior Publication Data

US 2011/0303985 A1 Dec. 15, 2011

Related U.S. Application Data

(60) Provisional application No. 61/352,961, filed on Jun. 9, 2010.

(30) Foreign Application Priority Data

Jun. 9, 2010 (JP) ................................ 2010-132488

(51) Int. Cl.
*H01L 21/8238* (2006.01)

(52) U.S. Cl.
USPC .... 438/270; 257/288; 257/369; 257/E29.131; 438/268

(58) Field of Classification Search
USPC .................. 257/369, 288, E29.131; 438/268, 438/270
See application file for complete search history.

(56) References Cited

U.S. PATENT DOCUMENTS 5,017,977 A 5/1991 Richardson
5,258,635 A 11/1993 Nitayama et al.

(Continued)

FOREIGN PATENT DOCUMENTS

CN 1507035 6/2004
CN 1610126 A 4/2005

(Continued)

OTHER PUBLICATIONS

Agranov, G. et al., "Pixel Size Reduction of CMOS Image Sensors and Comparison of Characteristics", *The Institute of Image Formation and Television Engineers (ITE) Technical Report*, vol. 33, No. 38, pp. 9-12, Sep. 2009.

(Continued)

*Primary Examiner* — Fernando L Toledo
*Assistant Examiner* — Peter Bradford
(74) *Attorney, Agent, or Firm* — Brinks Hofer Gilson & Lione

(57) ABSTRACT

The semiconductor device includes: a columnar silicon layer on the planar silicon layer; a first n+ type silicon layer formed in a bottom area of the columnar silicon layer; a second n+ type silicon layer formed in an upper region of the columnar silicon layer; a gate insulating film formed in a perimeter of a channel region between the first and second n+ type silicon layers; a gate electrode formed in a perimeter of the gate insulating film, and having a first metal-silicon compound layer; an insulating film formed between the gate electrode and the planar silicon layer, an insulating film sidewall formed in an upper sidewall of the columnar silicon layer; a second metal-silicon compound layer formed in the planar silicon layer; and an electric contact formed on the second n+ type silicon layer.

10 Claims, 296 Drawing Sheets

U.S. PATENT DOCUMENTS

| | | | |
|---|---|---|---|
| 5,308,782 | A | 5/1994 | Mazure et al. |
| 5,312,767 | A | 5/1994 | Shimizu et al. |
| 5,382,816 | A | 1/1995 | Mitsui |
| 5,416,350 | A | 5/1995 | Watanabe |
| 5,480,838 | A | 1/1996 | Mitsui |
| 5,627,390 | A | 5/1997 | Maeda et al. |
| 5,656,842 | A | 8/1997 | Iwamatsu et al. |
| 5,703,386 | A | 12/1997 | Yasuda et al. |
| 5,707,885 | A | 1/1998 | Lim |
| 5,710,447 | A | 1/1998 | Tohyama |
| 5,767,549 | A | 6/1998 | Chen et al. |
| 5,780,888 | A | 7/1998 | Maeda et al. |
| 5,811,336 | A | 9/1998 | Kasai |
| 5,872,037 | A | 2/1999 | Iwamatsu et al. |
| 5,905,283 | A | 5/1999 | Kasai |
| 5,994,735 | A | 11/1999 | Maeda et al. |
| 6,127,209 | A | 10/2000 | Maeda et al. |
| 6,175,138 | B1 | 1/2001 | Noda |
| 6,294,418 | B1 | 9/2001 | Noble |
| 6,392,271 | B1 | 5/2002 | Alavi et al. |
| 6,406,962 | B1 | 6/2002 | Agnello et al. |
| 6,420,751 | B1 | 7/2002 | Maeda et al. |
| 6,461,900 | B1 | 10/2002 | Sundaresan et al. |
| 6,483,171 | B1 | 11/2002 | Forbes et al. |
| 6,624,459 | B1 | 9/2003 | Dachtera et al. |
| 6,658,259 | B2 | 12/2003 | McIntosh |
| 6,740,937 | B1 | 5/2004 | Sushihara |
| 6,747,314 | B2 | 6/2004 | Sundaresan et al. |
| 6,815,277 | B2 | 11/2004 | Fried et al. |
| 6,849,903 | B2 | 2/2005 | Sushihara |
| 6,861,684 | B2 | 3/2005 | Skotnicki et al. |
| 6,878,991 | B1 | 4/2005 | Forbes |
| 6,943,407 | B2 | 9/2005 | Ouyang et al. |
| 7,052,941 | B2 | 5/2006 | Lee |
| 7,193,278 | B2 | 3/2007 | Song |
| 7,198,976 | B2 | 4/2007 | Hirata |
| 7,233,033 | B2 | 6/2007 | Koyama et al. |
| 7,241,655 | B2 | 7/2007 | Tang et al. |
| 7,271,052 | B1 | 9/2007 | Forbes |
| 7,368,334 | B2 | 5/2008 | Yeo et al. |
| 7,374,990 | B2 | 5/2008 | Tang et al. |
| 7,413,480 | B2 | 8/2008 | Thomas |
| 7,579,214 | B2 | 8/2009 | Yamazaki et al. |
| 7,619,675 | B2 | 11/2009 | Horii |
| 7,829,952 | B2 | 11/2010 | Moniwa et al. |
| 7,872,287 | B2 | 1/2011 | Masuoka et al. |
| 7,977,736 | B2 | 7/2011 | Kim et al. |
| 7,977,738 | B2 | 7/2011 | Minami et al. |
| 7,981,738 | B2 | 7/2011 | Moniwa et al. |
| 8,039,893 | B2 | 10/2011 | Masuoka et al. |
| 8,058,683 | B2 | 11/2011 | Yoon et al. |
| 8,067,800 | B2 | 11/2011 | Hsieh |
| 8,110,869 | B2 | 2/2012 | Bhalla |
| 8,188,537 | B2 | 5/2012 | Masuoka et al. |
| 8,227,305 | B2 | 7/2012 | Forbes |
| 2001/0052614 | A1 | 12/2001 | Ishibashi |
| 2002/0000624 | A1 | 1/2002 | Takemura et al. |
| 2002/0034853 | A1 | 3/2002 | Alavi et al. |
| 2002/0110039 | A1 | 8/2002 | Forbes et al. |
| 2002/0195652 | A1 | 12/2002 | Maeda et al. |
| 2003/0002093 | A1 | 1/2003 | Hynecek |
| 2003/0075758 | A1 | 4/2003 | Sundaresan et al. |
| 2004/0005755 | A1 | 1/2004 | Moniwa et al. |
| 2004/0113207 | A1 | 6/2004 | Hsu et al. |
| 2004/0135215 | A1 | 7/2004 | Song |
| 2004/0169293 | A1 | 9/2004 | Sushihara |
| 2004/0256639 | A1 | 12/2004 | Ouyang et al. |
| 2004/0262681 | A1 | 12/2004 | Masuoka et al. |
| 2005/0127404 | A1 | 6/2005 | Sushihara |
| 2005/0145911 | A1 | 7/2005 | Forbes et al. |
| 2005/0263821 | A1 | 12/2005 | Cho et al. |
| 2005/0281119 | A1 | 12/2005 | Shibata et al. |
| 2006/0006444 | A1 | 1/2006 | Leslie |
| 2006/0007333 | A1 | 1/2006 | Horii |
| 2006/0033524 | A1 | 2/2006 | Sushihara |
| 2006/0043520 | A1 | 3/2006 | Jerdev et al. |
| 2006/0046391 | A1 | 3/2006 | Tang et al. |
| 2006/0261406 | A1 | 11/2006 | Chen |
| 2007/0007601 | A1 | 1/2007 | Hsu et al. |
| 2007/0075359 | A1 | 4/2007 | Yoon et al. |
| 2007/0117324 | A1 | 5/2007 | Previtali |
| 2007/0138557 | A1 | 6/2007 | Ipposhi |
| 2007/0173006 | A1 | 7/2007 | Moniwa et al. |
| 2008/0048245 | A1 | 2/2008 | Kito et al. |
| 2008/0173936 | A1 | 7/2008 | Yoon et al. |
| 2008/0210985 | A1 | 9/2008 | Ogawa et al. |
| 2008/0227241 | A1 | 9/2008 | Nakabayashi et al. |
| 2009/0032955 | A1 | 2/2009 | Tanaka et al. |
| 2009/0057722 | A1 | 3/2009 | Masuoka et al. |
| 2009/0065832 | A1 | 3/2009 | Masuoka et al. |
| 2009/0114989 | A1 | 5/2009 | Hamamoto |
| 2009/0159964 | A1* | 6/2009 | Lee .............................. 257/329 |
| 2009/0174024 | A1 | 7/2009 | Kim |
| 2009/0197379 | A1 | 8/2009 | Leslie |
| 2009/0290082 | A1 | 11/2009 | Yamazaki et al. |
| 2009/0291551 | A1* | 11/2009 | Cho ............................. 438/585 |
| 2010/0052029 | A1* | 3/2010 | Huang .......................... 257/309 |
| 2010/0200731 | A1 | 8/2010 | Masuoka et al. |
| 2010/0200913 | A1 | 8/2010 | Masuoka et al. |
| 2010/0207172 | A1 | 8/2010 | Masuoka et al. |
| 2010/0207201 | A1 | 8/2010 | Masuoka et al. |
| 2010/0207213 | A1 | 8/2010 | Masuoka et al. |
| 2010/0213525 | A1 | 8/2010 | Masuoka et al. |
| 2010/0213539 | A1 | 8/2010 | Masuoka et al. |
| 2010/0219457 | A1 | 9/2010 | Masuoka et al. |
| 2010/0219483 | A1 | 9/2010 | Masuoka et al. |
| 2010/0270611 | A1 | 10/2010 | Masuoka et al. |
| 2010/0276750 | A1 | 11/2010 | Tu |
| 2010/0295123 | A1* | 11/2010 | Lung et al. .................... 257/334 |
| 2011/0073925 | A1* | 3/2011 | Park et al. ..................... 257/306 |
| 2011/0215381 | A1 | 9/2011 | Masuoka et al. |
| 2011/0254067 | A1 | 10/2011 | Abbott et al. |
| 2011/0275207 | A1 | 11/2011 | Moniwa et al. |
| 2011/0303973 | A1 | 12/2011 | Masuoka et al. |
| 2011/0303985 | A1 | 12/2011 | Masuoka et al. |
| 2012/0086051 | A1 | 4/2012 | Wang et al. |
| 2012/0196415 | A1 | 8/2012 | Masuoka et al. |

FOREIGN PATENT DOCUMENTS

| | | | |
|---|---|---|---|
| CN | 1983601 | A | 6/2007 |
| CN | 101542733 | A | 9/2009 |
| DE | 4443968 | | 11/1995 |
| EP | 1770769 | A1 | 4/2007 |
| EP | 2197032 | A1 | 6/2010 |
| EP | 2239770 | A1 | 10/2010 |
| EP | 2239771 | A1 | 10/2010 |
| EP | 2244305 | A1 | 10/2010 |
| EP | 2246895 | A1 | 11/2010 |
| JP | 60-070757 | A | 4/1985 |
| JP | 61-013661 | | 1/1986 |
| JP | 62-045058 | A | 2/1987 |
| JP | 62-190751 | A | 8/1987 |
| JP | 63-037633 | A | 2/1988 |
| JP | 63-158866 | A | 7/1988 |
| JP | 64-089560 | A | 4/1989 |
| JP | 01-175775 | A | 7/1989 |
| JP | 02-066969 | A | 3/1990 |
| JP | 02-071556 | A | 3/1990 |
| JP | 02-089368 | A | 3/1990 |
| JP | 02-188966 | A | 7/1990 |
| JP | 03-114233 | A | 5/1991 |
| JP | 03-145761 | | 6/1991 |
| JP | 03-225873 | A | 10/1991 |
| JP | 04-234166 | A | 8/1992 |
| JP | 05-276442 | A | 10/1993 |
| JP | 06-021467 | A | 1/1994 |
| JP | 06-069441 | | 3/1994 |
| JP | 06-237003 | A | 8/1994 |
| JP | 07-099311 | A | 4/1995 |
| JP | 07-321228 | | 12/1995 |
| JP | 08-078533 | A | 3/1996 |
| JP | 09-008295 | | 1/1997 |
| JP | 10-079482 | A | 3/1998 |
| JP | 10-223777 | A | 8/1998 |
| JP | 11-087649 | | 3/1999 |
| JP | 2000-012705 | A | 1/2000 |
| JP | 2000-068516 | A | 3/2000 |

| | | | |
|---|---|---|---|
| JP | 2000-208434 | | 7/2000 |
| JP | 2000-243085 | | 9/2000 |
| JP | 2000-244818 | A | 9/2000 |
| JP | 2000-357736 | | 12/2000 |
| JP | 2001-028399 | | 1/2001 |
| JP | 2001-237421 | A | 8/2001 |
| JP | 2001-339057 | A | 12/2001 |
| JP | 2001-352047 | A | 12/2001 |
| JP | 2002-009257 | | 1/2002 |
| JP | 2002-033399 | A | 1/2002 |
| JP | 2002-231951 | A | 8/2002 |
| JP | 2002-246580 | A | 8/2002 |
| JP | 2002-246581 | A | 8/2002 |
| JP | 2003-068883 | A | 3/2003 |
| JP | 2003-142684 | | 5/2003 |
| JP | 2003-179160 | A | 6/2003 |
| JP | 2003-224211 | A | 8/2003 |
| JP | 2004-079694 | | 3/2004 |
| JP | 2004-096065 | A | 3/2004 |
| JP | 2004-153246 | | 5/2004 |
| JP | 2004-193588 | A | 7/2004 |
| JP | 2004-259733 | A | 9/2004 |
| JP | 2004-319808 | A | 11/2004 |
| JP | 2005-012213 | A | 1/2005 |
| JP | 2005-135451 | | 5/2005 |
| JP | 2006-024799 | A | 1/2006 |
| JP | 2006-514392 | | 4/2006 |
| JP | 2006-294995 | A | 10/2006 |
| JP | 2007-0250652 | A | 9/2007 |
| JP | 2008-177565 | | 7/2008 |
| JP | 2008-205168 | A | 9/2008 |
| JP | 2008-300558 | A | 12/2008 |
| JP | 2009-110049 | A | 5/2009 |
| JP | 2009-182316 | A | 8/2009 |
| JP | 2009-182317 | A | 8/2009 |
| JP | 2010-171055 | | 8/2010 |
| JP | 2010-0213539 | A | 9/2010 |
| JP | 2010-258345 | | 11/2010 |
| JP | 2011-066105 | | 3/2011 |
| JP | 2011-071235 | | 4/2011 |
| JP | 2011-077437 | | 4/2011 |
| JP | 2011-211161 | A | 10/2011 |
| KR | 10-0132560 | | 12/1997 |
| KR | 10-0200222 | | 6/1999 |
| KR | 10-0327875 | B1 | 9/2002 |
| KR | 2004-0063348 | A | 7/2004 |
| WO | WO 94/14198 | A1 | 6/1994 |
| WO | WO 01/22494 | A1 | 3/2001 |
| WO | WO 2005/036651 | | 4/2005 |
| WO | WO 2006/127586 | | 11/2006 |
| WO | WO 2009/034623 | A1 | 3/2009 |
| WO | WO 2009/034731 | A1 | 3/2009 |
| WO | WO 2009/057194 | A1 | 5/2009 |
| WO | WO 2009/095997 | A1 | 8/2009 |
| WO | WO 2009/096001 | A1 | 8/2009 |
| WO | WO 2009/096464 | A1 | 8/2009 |
| WO | WO 2009/096465 | A1 | 8/2009 |
| WO | WO 2009/096466 | A1 | 8/2009 |
| WO | WO 2009/096470 | A1 | 8/2009 |
| WO | WO 2009/102059 | A1 | 8/2009 |
| WO | WO 2009/133957 | A1 | 11/2009 |
| WO | WO 2011/111662 | A1 | 9/2011 |

OTHER PUBLICATIONS

Examination Report for European Application No. 08722595.9, dated Jul. 11, 2012, 4 pages.

Examination Report in corresponding European Application No. 07 807 139.6, dated Jun. 11, 2012, 4 pages.

Extended European Search Report for European Application No. 07807139.6, dated Jun. 24, 2011, 10 pages.

Extended European Search Report for European Application No. 12001395.8, dated Apr. 26, 2012, 7 pages.

International Preliminary Report on Patentability for International Application No. PCT/JP2011/055264, dated Oct. 11, 2012, 7 pages.

International Search Report for International Application No. PCT/JP2007/067732, dated Dec. 11, 2007, 2 pages.

International Search Report for International Application No. PCT/JP2008/051304, dated Apr. 15, 2008, 2 pages.

International Search Report for International Application No. PCT/JP2008/058412, dated Jun. 10, 2008, 2 pages.

International Search Report for International Application No. PCT/JP2009/051463, dated Feb. 24, 2009, 2 pages.

International Search Report for International Application No. PCT/JP2009/058629, dated Jun. 2, 2009, 2 pages.

International Search Report for International Application No. PCT/JP2011/070534, dated Dec. 6, 2011, 10 pages.

International Search Report for International Application No. PCT/JP2011/071162, dated Dec. 13, 2011, 18 pages.

Kasano, Masahiro, "A 2.0.mu.m Pixel Pitch MOS Image Sensor with an Amorphous Si Film Color Filter," IEEE International Solid-State Circuits Conference, Feb. 8, 2005, 3 pages.

Nakamura, Jun-ichi et al., "Nondestructive Readout Mode Static Induction Transistor (SIT) Photo Sensors," IEEE Transactions on Electron Devices, 1993, vol. 40, pp. 334-341.

Non-Certified Partial Translation of Office Action from counterpart Korean Application No. 10-2010-7018204, dated Mar. 29, 2012, 1 page.

Notice of Allowance for U.S. Appl. No. 13/447,721, dated Nov. 2, 2012, 9 pages.

Notice of Allowance for U.S. Appl. No. 12/700,294, dated Oct. 5, 2012, 7 pages.

Office Action from counterpart Korean Application No. 10-2010-7018204, dated Mar. 29, 2012, 7 pages.

Takahashi, Hidekazu, "A 3.9.mu.m Pixel Pitch VGA Format 10b Digital Image Sensor with 1.5-Transistor/Pixel," IEEE International Solid-State Circuits Conference, Feb. 16, 2004, 10 pages.

Takato, Hiroshi et al., "Impact of Surrounding Gate Transistor (SGT) for Ultra-High-Density LSI's," IEEE Transactions on Electron Devices, vol. 38, No. 3, Mar. 1991, pp. 573-578.

Watanabe, S. et al., "A Nobel Circuit Technology with Surrounding Gate Transistors (SGT's) for Ultra High Density DRAM's", IEEE Journal of Solid-State Circuits, vol. 30, No. 9, Sep. 1995, pp. 960-971.

Written Opinion of the International Searching Authority for International Application No. PCT/JP2007/067732, dated Dec. 11, 2007, 4 pages.

Written Opinion of the International Searching Authority for International Application No. PCT/JP2008/058412, dated Jun. 10, 2008, 4 pages.

Written Opinion of the International Searching Authority for International Application No. PCT/JP2009/058629, dated Jun. 2, 2009, 4 pages.

Wuu, S.G. et al., "A Leading-Edge 0.9 µm Pixel CMOS Image Sensor Technology with Backside Illumination: Future Challenges for Pixel Scaling", *IEDM2010 Digest Papers*, 14.1.1, pp. 332-335, 2010.

Yonemoto, Kazuya, "A CMOS Image Sensor with a Simple FPN-Reduction Technology and a Hole Accumulated Diode," 2000 IEEE International Solid-State Circuites Conference, 9 pages.

Choi, Yang-Kyu et al., "FinFET Process Refinements for Improved Mobility and Gate Work Function Engineering," IEEE, 2002, 4 pages.

Maeda, Shigenobu et al., "Impact of a Vertical ϕShape Transistor (VϕT) Cell for 1 Gbit DRAM and Beyond," IEEE Transactions on Electron Devices, vol. 42, No. 12, Dec. 1995, pp. 2117-2124.

International Search Report for International Application No. PCT/JP2008/051300, dated May 13, 2008, 4 pages.

Written Opinion of the International Searching Authority for International Application No. PCT/JP2008/051300, dated Aug. 30, 2010, 8 pages.

International Preliminary Report on Patentability for International Application No. PCT/JP2008/051300, dated Aug. 31, 2010, 9 pages.

International Search Report for International Application No. PCT/JP2009/051459, dated Apr. 14, 2009, 4 pages.

Written Opinion of the International Searching Authority for International Application No. PCT/JP2009/051459, dated Aug. 30, 2010, 8 pages.

International Preliminary Report on Patentability for International Application No. PCT/JP2009/051459, dated Aug. 31, 2010, 9 pages.

Office Action from co-pending U.S. Appl. No. 12/704,935, dated Nov. 18, 2011, 9 pages.

Office Action from co-pending U.S. Appl. No. 12/704,955, dated Dec. 8, 2011, 12 pages.
Notice of Allowance from co-pending U.S. Appl. No. 12/704,955, dated Mar. 15, 2012, 8 pages.
Extended European Search Report for European Application No. 10004492.4, dated Jun. 21, 2012, 10 pages.
Notice of Allowance for U.S. Appl. No. 12/894,923, dated Feb. 21, 2013, 5 pages.
Notice of Allowance for U.S. Appl. No. 12/894,923, dated Mar. 14, 2013, 5 pages.
Restriction Requirement for U.S. Appl. No. 13/116,506, dated Feb. 28, 2013, 6 pages.
Office Action for U.S. Appl. No. 13/412,959, dated Mar. 13, 2013, 7 pages.
Office Action for Korean Patent Application Serial No. 9-5-2013-010869116, dated Feb. 18, 2013, 4 pages.
International Search Report for PCT/JP2011/079300, dated Mar. 13, 2012, 5 pages.
Lee, et al., "An Active Pixel Sensor Fabricated Using CMOS/CCD Process Technology" in Program IEEE Workshop on Charge-Coupled Devices and Advanced Image Sensors, 1995, 5 pages.
Murakami et al., "Technologies to Improve Photo-Sensitivity and Reduce VOD Shutter Voltage for CCD Image Sensors", IEEE Transactions on Electron Devices, vol. 47, No. 8, 2000, pp. 1566-1572.
Takahashi et al., "A 3.9-μm Pixel Pitch VGA Format 10-b Digital Output CMOS Image Sensor With 1.5 Transistor/Pixel", IEEE Journal of Solid-State Circuit, Vo.39, No. 12, 2004, pp. 2417-2425.
Yasutomi et al, "A High-Speed CMOS Image Sensor with Global Electronic Shutter Pixel Using Pinned Diodes", IEEJ Trans. SM, vol. 129, No. 10, 2009, pp. 321-327.
Chen, Yijian et al., "Vertical integrated-gate CMOS for ultra-dense IC", *Microelectronic Engineering*, vol. 83, 2006, pp. 1745-1748.
Office Action for Chinese Patent Application Serial No. 200980103454.9, dated Oct. 31, 2012, 7 pages.
Office Action for Chinese Patent Application Serial No. 200980103505.8, dated Nov. 1, 2012, 5 pages.
Office Action for Chinese Patent Application Serial No. 201010171435.4, dated Dec. 21, 2012, 7 pages.
Office Action for Chinese Patent Application Serial No. 2011100647037, dated Nov. 14, 2012, 6 pages.
Office Action for Japanese Patent Application Serial No. 2009-538870, dated Nov. 8, 2012, 4 pages.
Restriction Requirement for U.S. Appl. No. 13/412,959, dated Nov. 8, 2012, 6 pages.
European Search Report for counterpart European Application No. 09705485.2, dated Feb. 14, 2011, 5 pages.
Extended European Search Report for European Application No. 10009574.4, dated May 15, 2012, 6 pages.
Extened European Search Report for European Application No. 10009579.3, dated Jun. 11, 2012, 11 pages.
Guidash, R.M. et al. "A 0.6 μm CMOS Pinned Photodiode Color Imager Technology", *IEDM Digest Papers*, pp. 927-929, 1997.
Hieda, K. et al., "New Effects of Trench Isolated Transistor Using Side-Wall Gates", *VLSI Research Center*, Toshiba Corporation, 1987, 4 pages.
International Search Report for International Application No. PCT/JP2007/071052, dated Jan. 29, 2008, 6 pages.
International Search Report for International Application No. PCT/JP2008/051301, dated Apr. 1, 2008, 2 pages.
International Search Report for International Application No. PCT/JP2008/051302, dated Apr. 8, 2008, 2 pages.
International Search Report for International Application No. PCT/JP2009/051460, dated Apr. 21, 2009, 2 pages.
International Search Report for International Application No. PCT/JP2009/051461, dated Apr. 21, 2009, 2 pages.
Iwai, Makoto et al., "High-Performance Buried Gate Surrounding Gate Transistor for Future Three-Dimensional Devices", *Japanese Journal of Applied Physics*, 2004, vol. 43, No. 10, pp. 6904-6906.
Mendis, Sunetra K. et al. "A 128×128 CMOS Active Pixel Image Sensor for Highly Integrated Imaging System", *IEDM93, Digest Papers*, 22.6.1, pp. 583-586, 1993.
Mistry et al., "A 45nm Logic Technology with High-k+Metal Gate Transistors, Strained Silicon, 9 Cu Interconnect Layers, 193nm Dry Patterning, and 100% Pb-free Packaging", IEEE, pp. 247-250, 2007.
Nitayama, Akihiro et al., "Multi-Pillar Surrounding Gate Transistor (M-SGT) for Compact and High-Speed Circuits", *IEEE Transactions on Electron Devices*, vol. 3, No. 3, Mar. 1991, pp. 679-583.
Office Action from co-pending U.S. Appl. No. 12/894,923, dated Oct. 2, 2012, 21 pages.
Office Action from co-pending U.S. Appl. No. 13/043,081, dated Jul. 16, 2012, 6 pages.
Office Action from co-pending U.S. Appl. No. 13/046,113, dated Jan. 9, 2013, 6 pages.
Office Action from co-pending U.S. Appl. No. 13/412,959, dated Dec. 7, 2012, 9 pages.
Written Opinion of the International Searching Authority for International Application No. PCT/JP2007/071052, dated Jan. 29, 2008, 9 pages.
Written Opinion of the International Searching Authority for International Application No. PCT/JP2008/051301, dated Apr. 1, 2008, 5 pages.
Written Opinion of the International Searching Authority for International Application No. PCT/JP2008/051302, dated Apr. 8, 2008, 5 pages.
Written Opinion of the International Searching Authority for International Application No. PCT/JP2009/051460, dated Apr. 21, 2009, 5 pages.
Written Opinion of the International Searching Authority for International Application No. PCT/JP2009/051461, dated Apr. 21, 2009, 6 pages.
Wu et al., "High Performance 22/20nm FinFET CMOS Devices with Advanced High-K/Metal Gate Scheme", IEEE, pp. 27.1.1-27.1.4, 2010.
Notice of Allowance for U.S. Appl. No. 13/043,081, dated Mar. 18, 2013, 6 pages.
Notice of Allowance for U.S. Appl. No. 12/768,290, dated Apr. 18, 2013, 9 pages.

* cited by examiner

SURROUND GATE CMOS SEMICONDUCTOR DEVICE

RELATED APPLICATIONS

This patent application claims the benefit of U.S. Patent Provisional Application 61/352,961, filed Jun. 9, 2010, and Japanese Patent Application 2010-132488, filed Jun. 9, 2010, the entire disclosures of which are incorporated herein.

BACKGROUND OF THE INVENTION

1. Field of the Invention

This application relates to a semiconductor device and a fabrication method therefor.

2. Description of the Related Art

High integration of a semiconductor integrated circuit and an integrated circuit especially using an MOS transistor has been enhanced.

Miniaturization has been developed to a nano region of a Metal-Oxide-Semiconductor (MOS) transistor used in an integrated circuit with high integration of the semiconductor integrated circuit. When the miniaturization of the MOS transistor progressed, control of leakage current is difficult. Furthermore, there was a problem that it cannot make an occupation area of a circuit easily small in order to secure of needed amount of current value. In order to solve such a problem, it is proposed as Surrounding Gate Transistor (SGT) having a structure where a source, a gate, and a drain are disposed in a vertical direction for a substrate, and the gate surrounds a columnar semiconductor layer (for example, refer to Japanese Unexamined Patent Application H2-71556).

SUMMARY OF THE INVENTION

In an MOS transistor, it is known that a compound layer formed of a compound of metal and silicon is provided on a highly doped silicon layer acting as a gate electrode, a source, and a drain. Lower-resistivity for the highly doped silicon layer can be achieved by forming a thick metal-silicon compound layer on the highly doped silicon layer. Also in SGT, the lower-resistivity for the highly doped silicon layer acting as a gate electrode, a source, and a drain can achieved by forming the thick metal-silicon compound layer on the highly doped silicon layer acting as a gate electrode, a source, and a drain.

However, if the thick metal-silicon compound layer is formed on the highly doped silicon layer of the upper part of a columnar silicon layer, the metal-silicon compound layer may be formed in a spike shape. If the metal-silicon compound layer is formed in a spike shape, the spike-shaped metal-silicon compound layer reaches not only the highly doped silicon layer formed in the upper part of the columnar silicon layer but a channel region under this highly doped silicon layer. Accordingly, it becomes difficult for the SGT to operate as a transistor.

The above-mentioned phenomenon is avoidable by thickening the highly doped silicon layer formed in the upper part of the columnar silicon layer. That is, what is necessary is just to thickly form the highly doped silicon layer more than the metal-silicon compound layer formed in a spike shape. However, since the electrical resistance of the highly doped silicon layer is proportional to the length, the electrical resistance of the highly doped silicon layer will increase if the highly doped silicon layer formed in the columnar silicon layer upper part is thickened. Therefore, it becomes difficult to achieve the low-resistivity for the highly doped silicon layer.

Moreover, there is a phenomenon that the thickness of the formed metal-silicon compound layer becomes thick as the diameter of the columnar silicon layer becomes small in the case that the metal-silicon compound layer is formed on the highly doped silicon layer of the upper part of the columnar silicon layer. If the diameter of the columnar silicon layer becomes small and the thickness of the metal-silicon compound layer formed on the columnar silicon layer becomes thick, the metal-silicon compound layer will come to be formed in the joint part between the highly doped silicon layer and channel region which are formed in the upper part of the columnar silicon layer. This causes leakage current.

The above-mentioned phenomenon is avoidable by thickening the highly doped silicon layer formed on the upper part of the columnar silicon layer. That is, what is necessary is just to form the highly doped silicon layer more thickly than the metal-silicon compound layer formed which becomes thick as the diameter of the columnar silicon layer becomes small. However, since the electrical resistance of the highly doped silicon layer is proportional to the length as above-mentioned, if the highly doped silicon layer formed in the upper part of the columnar silicon layer is thickened, the electrical resistance of the highly doped silicon layer increases and then it is difficult to achieve the low-resistivity.

Usually, in a MOS transistor, the metal-silicon compound layer formed on the highly doped silicon layer acting as a gate electrode, a source, and a drain is formed in the same processing step. Also in an SGT, the metal-silicon compound layer formed on the highly doped silicon layer acting as a gate electrode, a source, and a drain is formed in the same processing step as well as the MOS transistor. Therefore, in the SGT, when forming a thick metal-silicon compound layer in either of the highly doped silicon layers acting as a gate electrode, source, and drain, a metal-silicon compound layer will be formed in all the highly doped silicon layers acting as a gate electrode, source, and drain. As above-mentioned, when the metal-silicon compound layer is formed on the columnar semiconductor layer, the metal-silicon compound layer is formed in a spike shape. Therefore, the highly doped silicon layer formed in the upper part of the columnar silicon layer must be formed thickly so as to avoid that this spike shape metal-silicon compound layer reaches channel regions. As a result, the electrical resistance of this highly doped silicon layer will increase.

In the gate electrode of SGT, the same material as the material which forms the gate electrode often performs gate wiring. Therefore, the low-resistivity for the gate electrode and gate wiring is achieved by forming the metal-silicon compound layer thickly at the gate electrode and gate wiring. Accordingly, the high-speed operation of SGT becomes enabling. Also, in the SGT, it often wires using a planar silicon layer disposed under the columnar silicon layer. Therefore, the low-resistivity for this planar silicon layer is achieved by forming the metal-silicon compound layer thickly into the same layer as the planar silicon layer, thereby enabling the high-speed operation of SGT. On the other hand, since the highly doped silicon layer of the upper part of the columnar silicon layer of SGT connects to electric contact directly, it is difficult to wire with this highly doped silicon layer of the upper part of the columnar silicon layer. Therefore, the metal-silicon compound layer is formed between the electric contact and the highly doped silicon layer. Since current flows into the thickness direction of this metal-silicon compound layer, the low-resistivity for the highly doped silicon layer of the upper part of the columnar silicon layer is achieved corresponding to the thickness of the metal-silicon compound layer. As mentioned above, in order to thickly form the metal-silicon compound layer at the upper part of the columnar silicon layer, there is no other way but to thickly form the highly doped silicon layer formed in the upper part of the columnar silicon layer. However, since the electrical resistance of the highly doped silicon layer is proportional to the length, the electrical resistance of the highly doped silicon layer will increase if the highly doped silicon layer is thickly formed. As a result, it is difficult to achieve the low-resistivity for the highly doped silicon layer lower. Also, parasitic capacitance occurred between multilayer interconnections with the miniaturization of SGT as well as the MOS transistor, thereby there was also a problem that the operating speed of transistor is dropped.

This application is made in view of the above-mentioned situation, and the object is to provide a semiconductor device having satisfactory characteristics and having achieved miniaturization and, a fabrication method for such semiconductor device.

In order to achieve the above object, a semiconductor device according to a first aspect of the present invention comprises:

a first planar semiconductor layer;

a first columnar semiconductor layer formed on the first planar semiconductor layer;

a first highly doped semiconductor layer formed in a lower region of the first columnar semiconductor layer and the first planar semiconductor layer;

a second highly doped semiconductor layer formed in an upper region of the first columnar semiconductor layer and having a conductivity type same as a conductivity type of the first highly doped semiconductor layer;

a first gate insulating film formed so as to surround the first columnar semiconductor layer on a sidewall of the first columnar semiconductor layer between the first highly doped semiconductor layer and the second highly doped semiconductor layer;

a first gate electrode formed so as to surround the first gate insulating film on the first gate insulating film;

a first insulating film formed between the first gate electrode and the first planar semiconductor layer;

a first insulating film sidewall formed so as to contact a top surface of the first gate electrode and an upper sidewall of the first columnar semiconductor layer, and to surround the upper region of the first columnar semiconductor layer;

a second metal-semiconductor compound layer formed in the same layer as the first planar semiconductor layer so as to contact the first highly doped semiconductor layer; and a first electric contact formed on the second highly doped semiconductor layer, wherein the first electric contact and the second highly doped semiconductor layer are connected directly and the first gate electrode includes a first metal-semiconductor compound layer.

Preferably, further comprising a fifth metal-semiconductor compound layer formed between the first electric contact and the second highly doped semiconductor layer, wherein the metal of the fifth metal-semiconductor compound is a different type of metal than the metal of the first metal-semiconductor compound layer and the metal of the second metal-semiconductor compound layer.

Preferably, the first gate electrode further comprises a first metal film formed between the first gate insulating film and the first metal-semiconductor compound layer.

In order to achieve the above object, a semiconductor device according to a second aspect of the present invention comprises a first transistor and a second transistor, the first transistor comprising:

a first planar semiconductor layer;

a first columnar semiconductor layer formed on the first planar semiconductor layer;

a first highly doped semiconductor layer of a second-conductivity type formed in the lower region of the first columnar semiconductor layer and the first planar semiconductor layer;

a second highly doped semiconductor layer of the second-conductivity type formed in the upper region of the 1st columnar semiconductor layer;

a first gate insulating film formed so as to surround the first columnar semiconductor layer on a sidewall of the first columnar semiconductor layer between the first highly doped semiconductor layer and the second highly doped semiconductor layer;

a first gate electrode formed so as to surround the first gate insulating film on the first gate insulating film;

a first insulating film formed between the first gate electrode and the first planar semiconductor layer;

a first insulating film sidewall formed so as to contact to a top surface of the first gate electrode and an upper sidewall of the first columnar semiconductor layer and to surround the upper region of the first columnar semiconductor layer;

a second metal-semiconductor compound layer formed in the same layer as the first planar semiconductor layer so as to contact to the first highly doped semiconductor layer; and a first electric contact formed on the second highly doped semiconductor layer, and the second transistor comprising:

a second planar semiconductor layer;

a second columnar semiconductor layer formed on the second planar semiconductor layer;

a third highly doped semiconductor layer of a first conductivity type formed in a lower region of the second columnar semiconductor layer and the second planar semiconductor layer;

a fourth highly doped semiconductor layer of the first conductivity type formed in an upper region of the second columnar semiconductor layer;

a second gate insulating film formed so as to surround the second columnar semiconductor layer on a sidewall of the second columnar semiconductor layer between the third highly doped semiconductor layer and the fourth highly doped semiconductor layer;

a second gate electrode formed so as to surround the second gate insulating film on the second gate insulating film;

a second insulating film formed between the second gate electrode and the second planar semiconductor layer;

a second insulating film sidewall formed so as to contact to a top surface of the second gate electrode and an upper sidewall of the second columnar semiconductor layer, and to surround the upper region of the second columnar semiconductor layer;

a fourth metal-semiconductor compound layer formed in the same layer as the second planar semiconductor layer so as to contact the third highly doped semiconductor layer; and a second electric contact formed on the fourth highly doped semiconductor layer, wherein the first electric contact and the second highly doped semiconductor layer are connected directly, the second electric contact and the fourth highly doped semiconductor layer are connected directly, the first gate electrode includes a first metal-semiconductor compound layer, and the second gate electrode includes a third metal-semiconductor compound layer.

Preferably, further comprising:

a fifth metal-semiconductor compound layer formed between the first electric contact and the second highly doped semiconductor layer;

a sixth metal-semiconductor compound layer formed between the second electric contact and the fourth highly doped semiconductor layer, wherein the metal of the fifth metal-semiconductor compound is a different type of metal than the metal of the first metal-semiconductor compound and the metal of the second metal-semiconductor compound, and the metal of the sixth metal-semiconductor compound is a different type of metal than the metal of the third metal-semiconductor compound and the metal of the fourth metal-semiconductor compound.

Preferably, further comprising:

a first metal film formed between the first gate insulating film and the first metal-semiconductor compound layer; and a second metal film formed between the second gate insulating film and the third metal-semiconductor compound layer.

Preferably, the first gate insulating film and the first metal film are formed from materials for configuring the first transistor to be an enhancement type, and the second gate insulating film and the second metal film are formed from materials for configuring the second transistor to be an enhancement type.

In order to achieve the above object, a fabrication method for a semiconductor device according to a third aspect of the present invention being a method for fabricating the semiconductor device mentioned above, the fabrication method of aforesaid semiconductor device comprises the step of:

preparing a structure including: the first planar semiconductor layer; the first columnar semiconductor layer formed on the first planar semiconductor layer, a hard mask being formed in a top surface of the first columnar semiconductor layer; the first highly doped semiconductor layer formed in a lower region of the first planar semiconductor layer and the first columnar semiconductor layer; and a third insulating film formed on the hard mask and the first planar semiconductor layer;

forming a fourth insulating film, a third metal film, and a first semiconductor layer in this sequence on the structure;

etching the first semiconductor film to remain the first semiconductor film in a shape of a sidewall on a sidewall of the first columnar semiconductor layer;

etching the third metal film to remain the sidewall of the first columnar semiconductor layer in a shape of the sidewall;

etching the fourth insulating film to remain the sidewall of the first columnar semiconductor layer in a shape of the sidewall;

forming a second semiconductor layer on results of the step of etching the fourth insulating film;

forming a third semiconductor layer so that results of the step of forming the second semiconductor layer are embedded, planarizing the second semiconductor layer, the third semiconductor layer and the first semiconductor layer and etching back so that an upper region of the third metal film is exposed;

etching the third metal film made remaining in the shape of the sidewall and the fourth insulating film made remaining in the shape of the sidewall so as to expose an upper sidewall of the first columnar semiconductor layer, and then forming the first metal film and the first gate insulating film;

forming a second highly doped semiconductor layer having a conductivity type same as the first highly doped semiconductor layer in the upper region of the first columnar semiconductor layer;

forming an oxide film and a nitride film sequentially on results of the step of forming the second highly doped semiconductor layer;

etching the oxide film and the nitride film so that the oxide film and the nitride film remain in a shape of the sidewall on the upper sidewall of the first columnar semiconductor layer and the sidewall of the hard mask, and then forming the first insulating film sidewall;

etching the first semiconductor layer, the second semiconductor layer and the third semiconductor layer to remain at least a part of the first semiconductor layer and the second semiconductor layer so as to surround the first metal film on the first metal film sidewall;

etching to remove the third insulating film exposed in the step of etching the semiconductor layer and exposing the first planar semiconductor layer;

by depositing and then annealing a metal on results of the step of exposing the first planar semiconductor layer, making react the deposited metal with a semiconductor included in the first planar semiconductor layer, and making react the deposited metal with a semiconductor included in the first semiconductor layer and the second semiconductor layer made to remain on the first metal film; and by removing an unreacted metal in the step of making react the metal and the semiconductor, forming the second metal-semiconductor compound layer in the first planar semiconductor layer, and forming the first metal-semiconductor compound layer in the first gate electrode.

Preferably, further comprising the step of directly forming the first electric contact on the second highly doped semiconductor layer formed in the upper part of the first columnar semiconductor layer.

According to the present invention, the semiconductor device and the fabrication method for such semiconductor device having satisfactory characteristics and achieving the miniaturization can be provided.

BRIEF DESCRIPTION OF THE DRAWINGS

FIG. 120A is a cross-sectional diagram taken in the line Y1-Y1' of FIG. 119A, and FIG. 120B is a cross-sectional diagram taken the line Y2-Y2' of FIG. 119A.

FIG. 121A is a top view for explaining the fabrication method of the semiconductor device according to the first embodiment, and FIG. 121B is a cross-sectional diagram taken in the line X-X' of FIG. 121A.

FIG. 122A is a cross-sectional diagram taken in the line Y1-Y1' of FIG. 121A, and FIG. 122B is a cross-sectional diagram taken in the line Y2-Y2' of FIG. 121A.

FIG. 123A is a top view for explaining the fabrication method of the semiconductor device according to the first embodiment, and FIG. 123B is a cross-sectional diagram taken in the line X-X' of FIG. 123A.

FIG. 124A is a cross-sectional diagram taken in the line Y1-Y1' of FIG. 123A, and FIG. 124B is a cross-sectional diagram taken in the line Y2-Y2' of FIG. 123A.

FIG. 125A is a top view for explaining the fabrication method of the semiconductor device according to the first embodiment, and FIG. 125B is a cross-sectional diagram taken in the line X-X' of FIG. 125A.

FIG. 126A is a cross-sectional diagram taken in the line Y1-Y1' of FIG. 125A, and FIG. 126B is a cross-sectional diagram taken in the line Y2-Y2' of FIG. 125A.

FIG. 127A is a top view for explaining the fabrication method of the semiconductor device according to the first embodiment, and FIG. 127B is a cross-sectional diagram taken in the line X-X' of FIG. 127A.

FIG. 128A is a cross-sectional diagram taken in the line Y1-Y1' of FIG. 127A, and FIG. 128B is a cross-sectional diagram taken in the line Y2-Y2' of FIG. 127A.

FIG. 129A is a top view for explaining the fabrication method of the semiconductor device according to the first embodiment, and FIG. 129B is a cross-sectional diagram taken in the line X-X' of FIG. 129A.

FIG. 130A is a cross-sectional diagram taken in the line Y1-Y1' of FIG. 129A, and FIG. 130B is a cross-sectional diagram taken in the line Y2-Y2' of FIG. 129A.

FIG. 131A is a top view for explaining the fabrication method of the semiconductor device according to the first embodiment, and FIG. 131B is a cross-sectional diagram taken in the line X-X' of FIG. 131A.

Figure 131A:
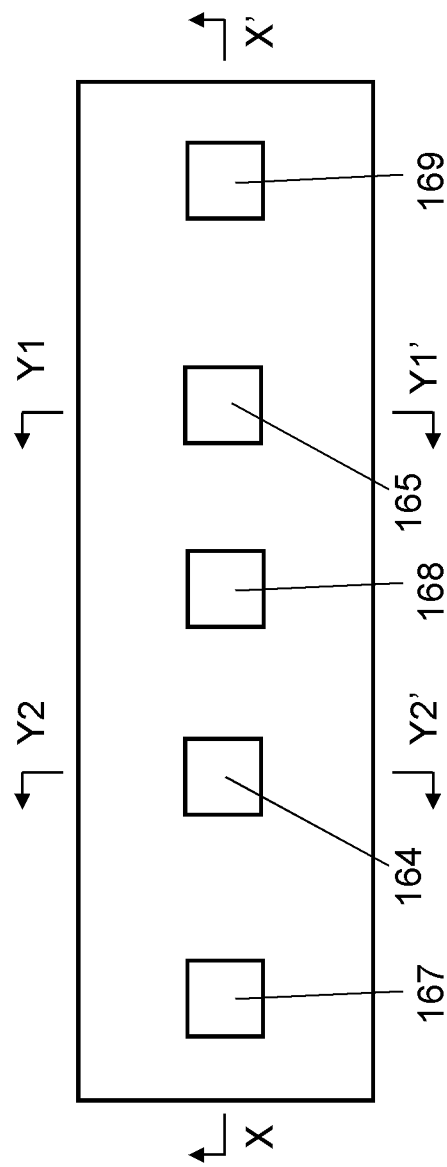
Figure 131B:
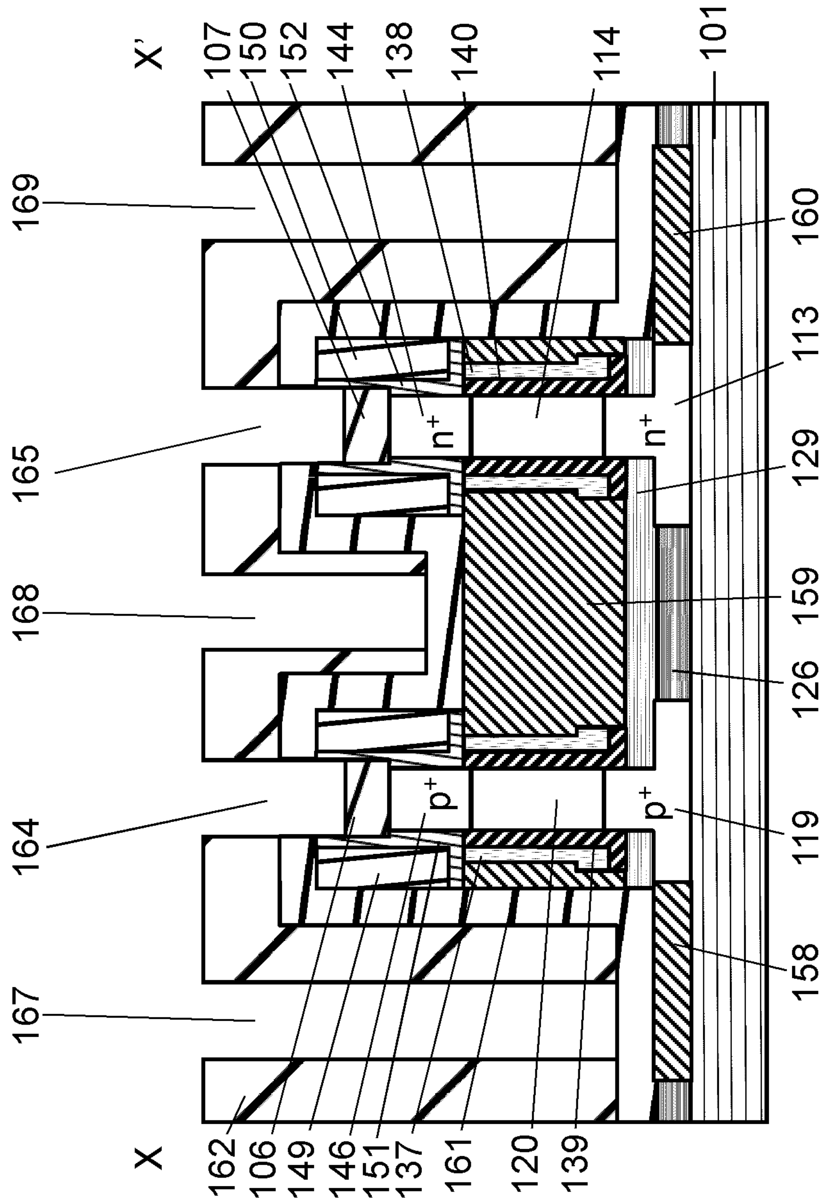
Figure 132A:
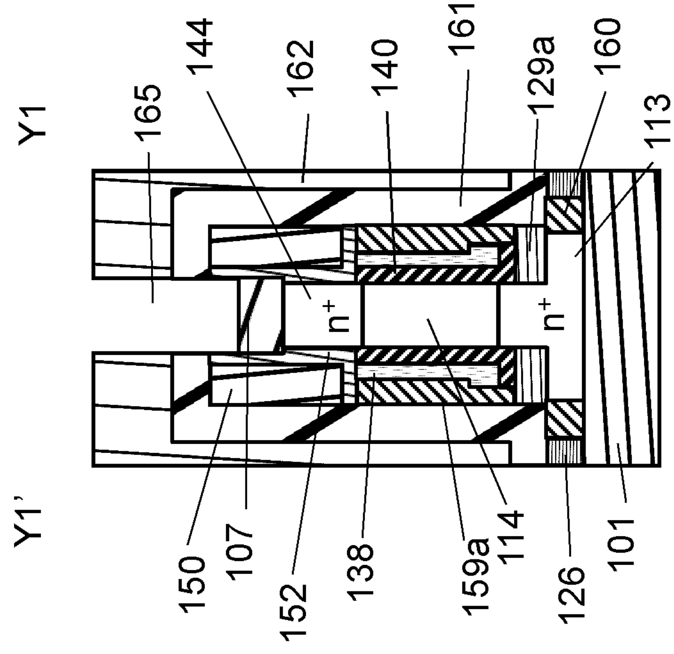
Figure 132B:
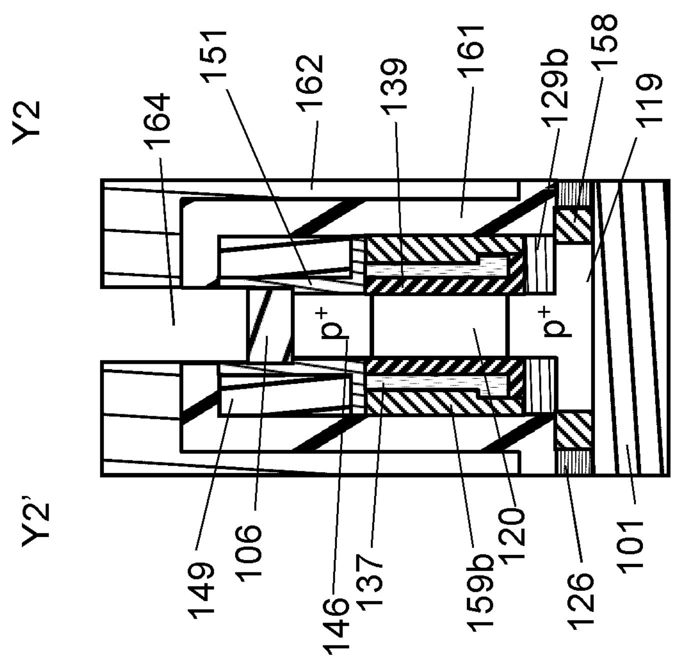

FIG. 132A is a cross-sectional diagram taken in the line Y1-Y1' of FIG. 131A, and FIG. 132B is a cross-sectional diagram taken in the line Y2-Y2' of FIG. 131A.

Figure 133A:
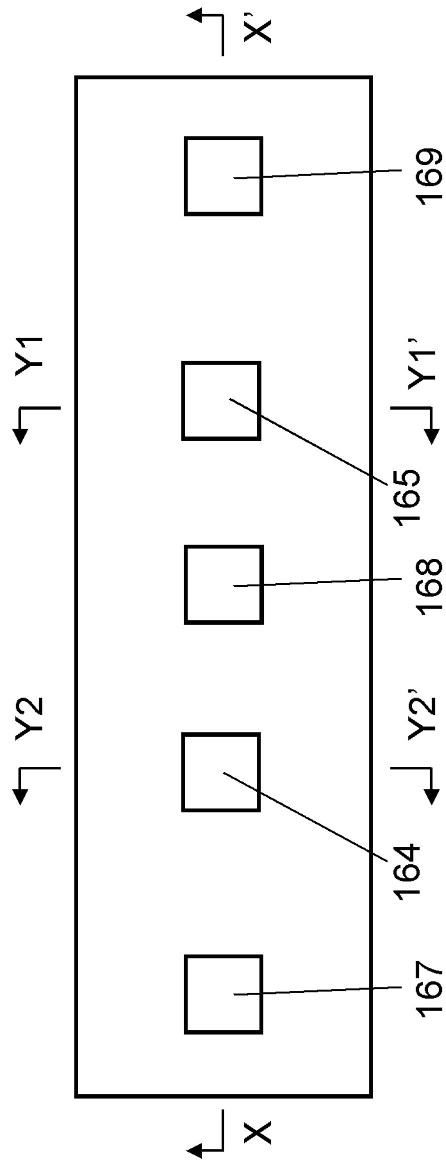
Figure 133B:
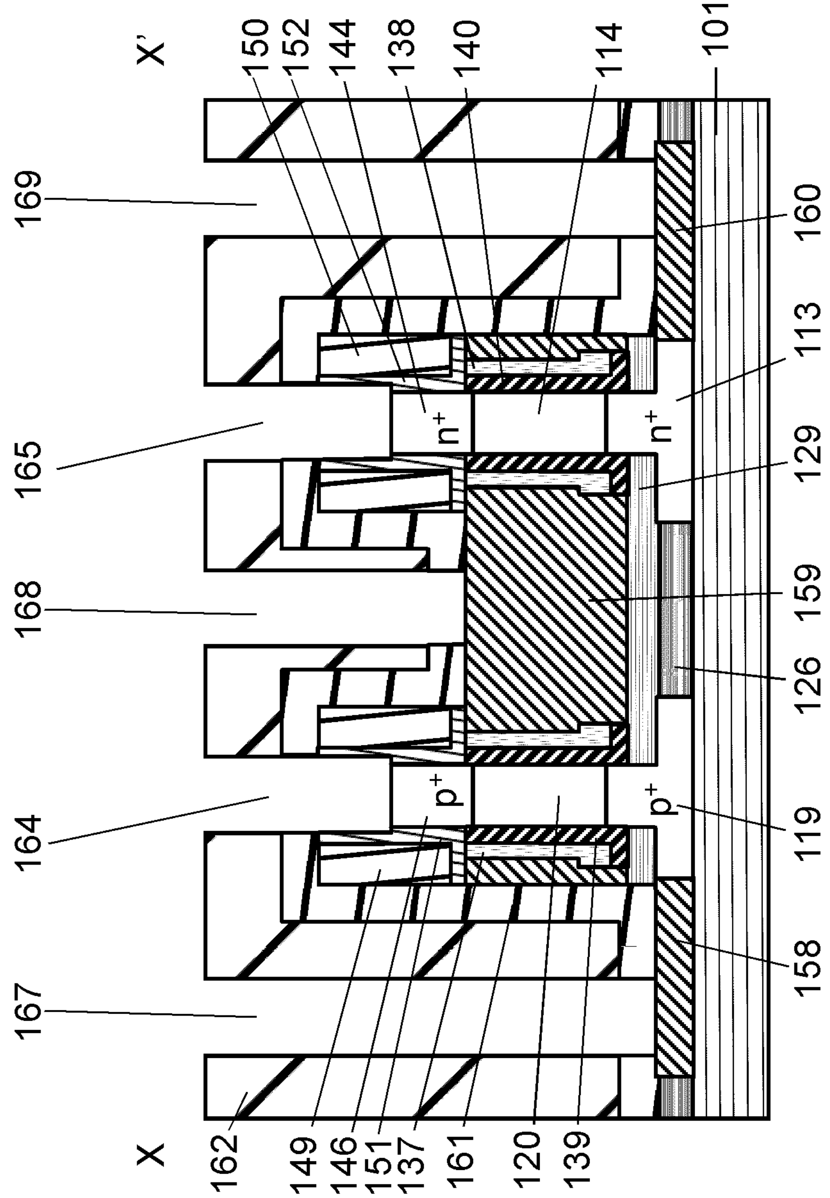

FIG. 133A is a top view for explaining the fabrication method of the semiconductor device according to the first embodiment, and FIG. 133B is a cross-sectional diagram taken in the line X-X' of FIG. 133A.

Figure 134A:
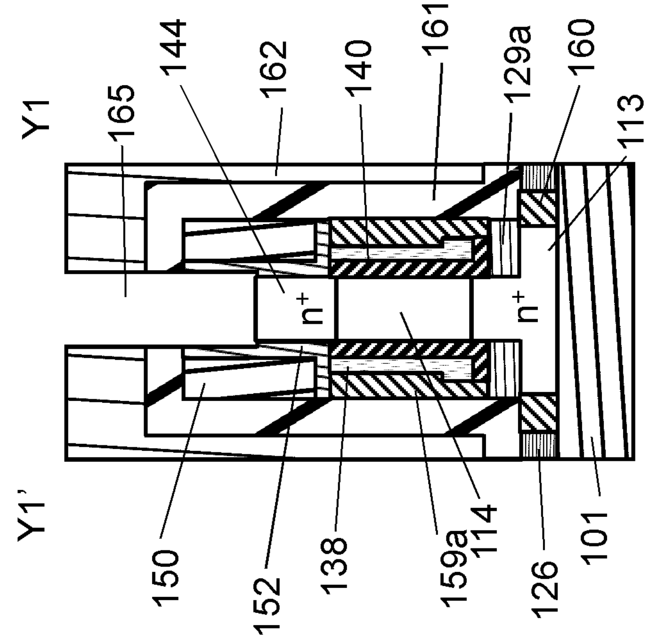
Figure 134B:
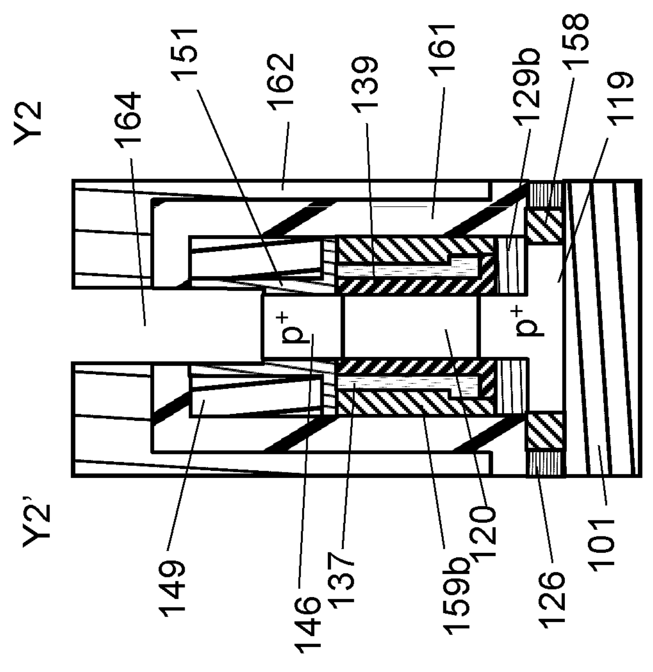

FIG. 134A is a cross-sectional diagram taken in the line Y1-Y1' of FIG. 133A, and FIG. 134B is a cross-sectional diagram taken in the line Y2-Y2' of FIG. 133A.

Figure 135A:
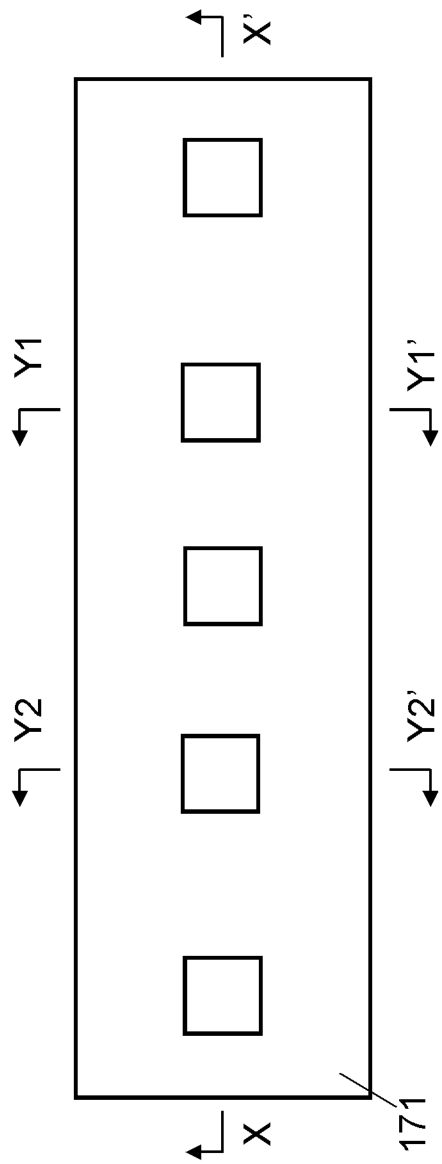
Figure 135B:
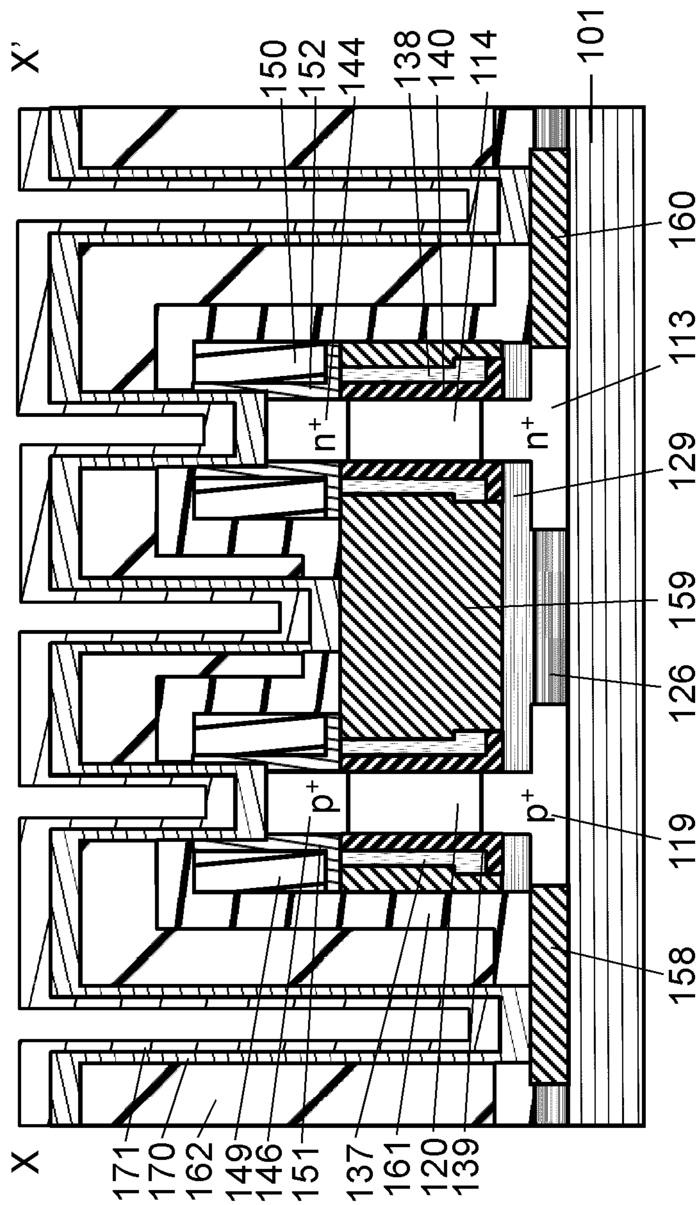

FIG. 135A is a top view for explaining the fabrication method of the semiconductor device according to the first embodiment, and FIG. 135B is a cross-sectional diagram taken in the line X-X' of FIG. 135A.

Figure 136A:
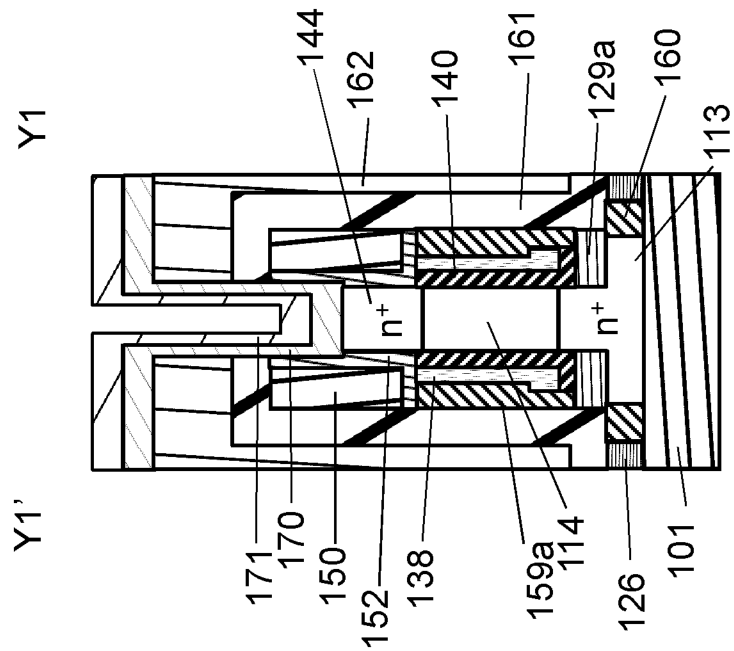
Figure 136B:
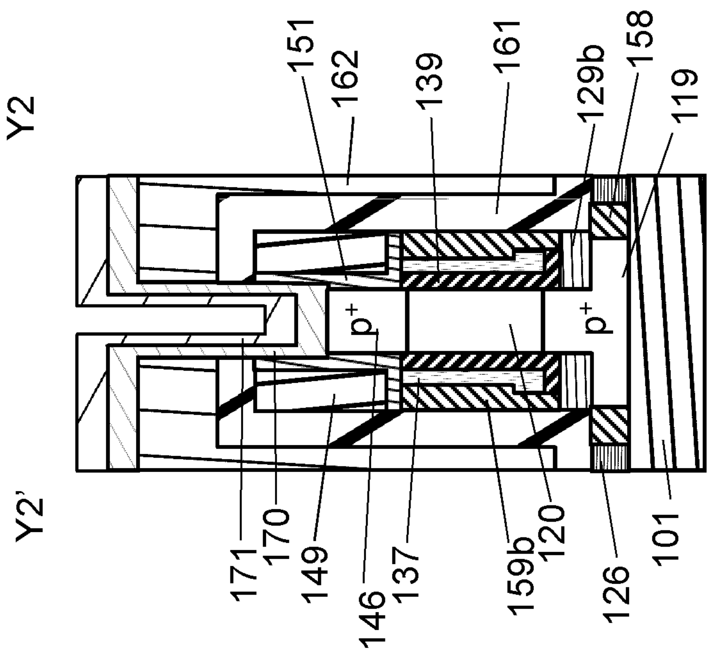

FIG. 136A is a cross-sectional diagram taken in the line Y1-Y1' of FIG. 135A, and FIG. 136B is a cross-sectional diagram taken in the line Y2-Y2' of FIG. 135A.

Figure 137A:
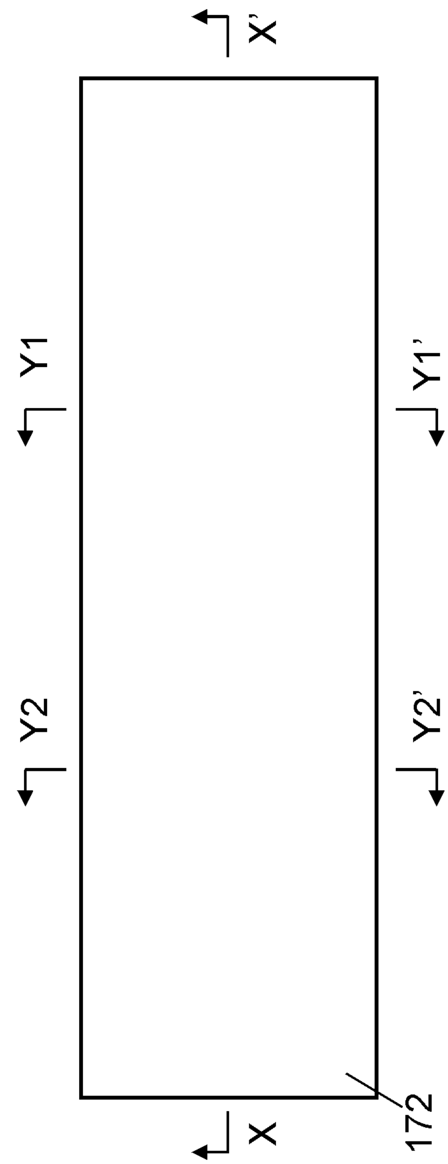
Figure 137B:
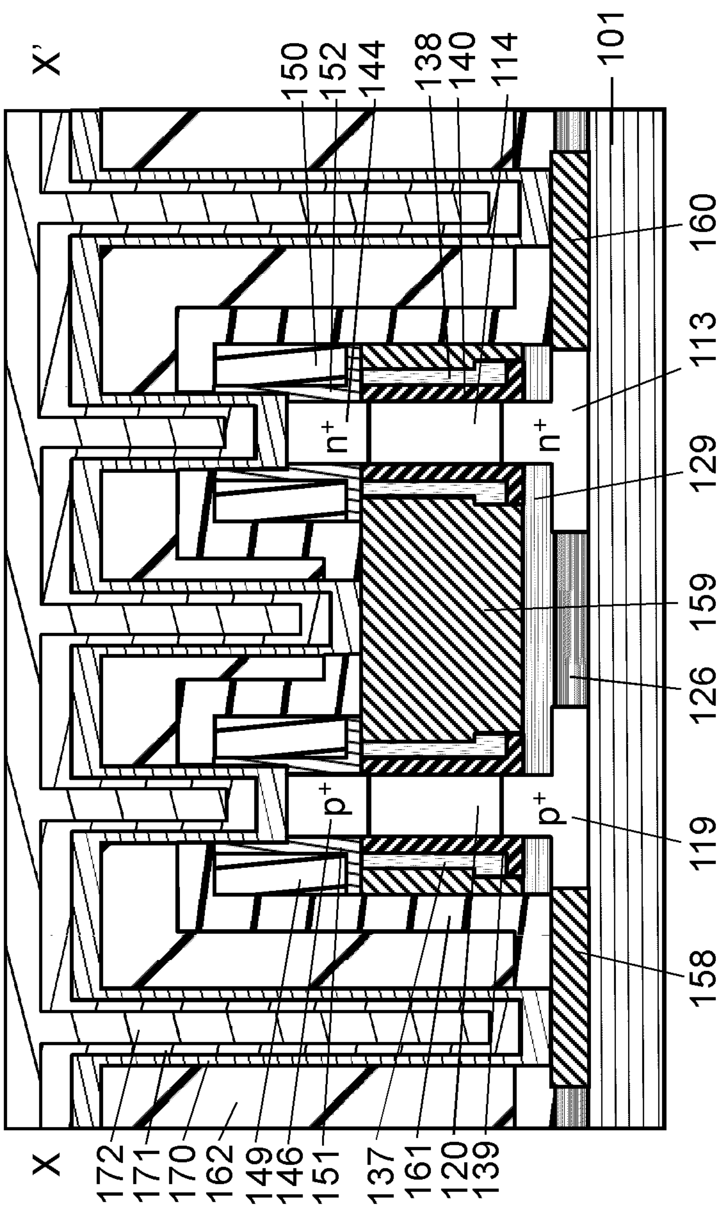

FIG. 137A is a top view for explaining the fabrication method of the semiconductor device according to the first embodiment, and FIG. 137B is a cross-sectional diagram taken in the line X-X' of FIG. 137A.

Figure 138A:
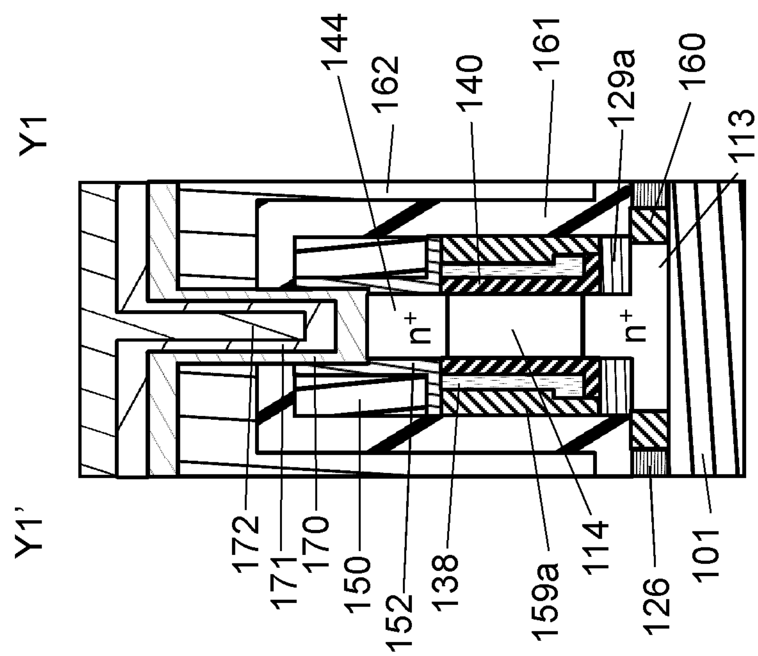
Figure 138B:
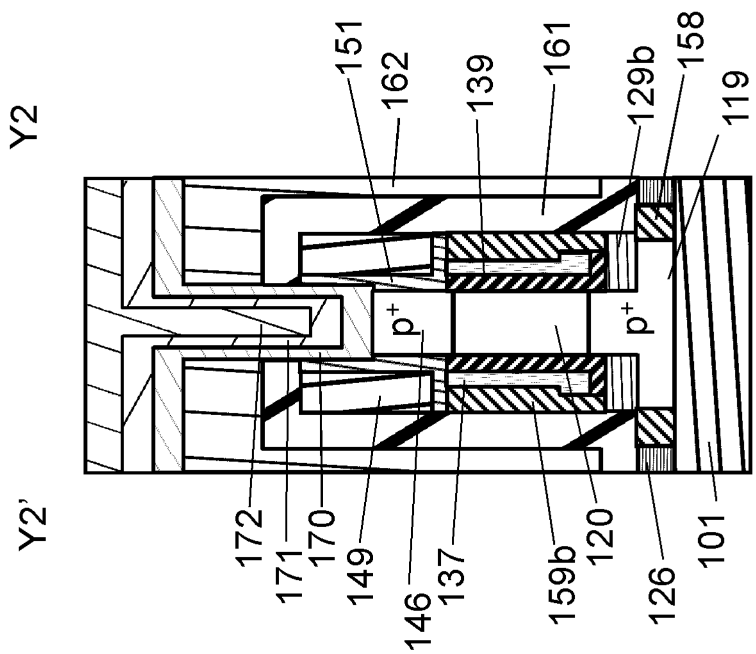

FIG. 138A is a cross-sectional diagram taken in the line Y1-Y1' of FIG. 137A, and FIG. 138B is a cross-sectional diagram taken in the line Y2-Y2' of FIG. 137A.

Figure 139A:
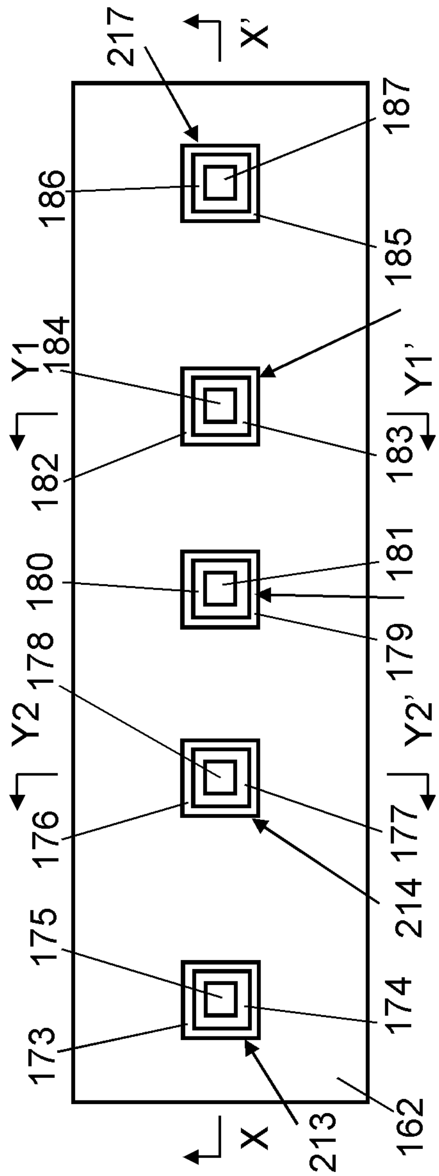
Figure 139B:
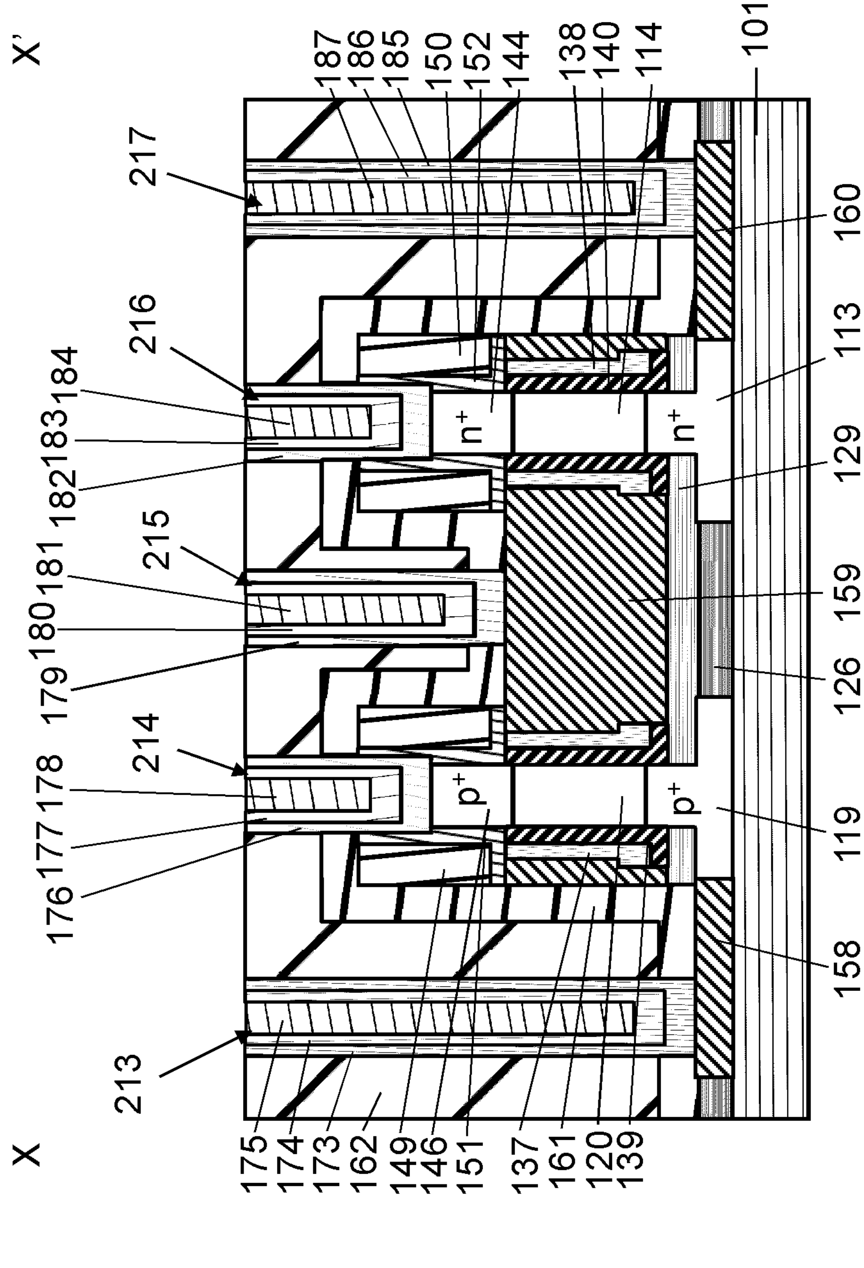

FIG. 139A is a top view for explaining the fabrication method of the semiconductor device according to the first embodiment, and FIG. 139B is a cross-sectional diagram taken in the line X-X' of FIG. 139A.

Figure 140A:
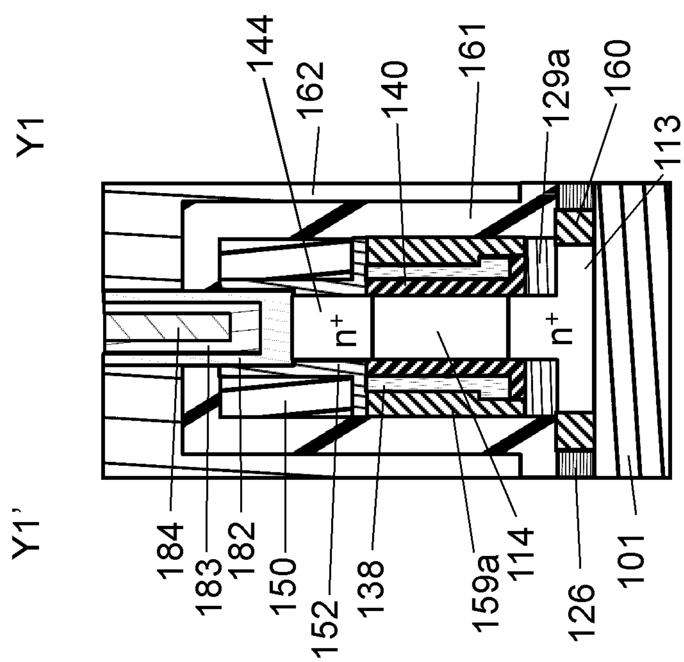
Figure 140B:
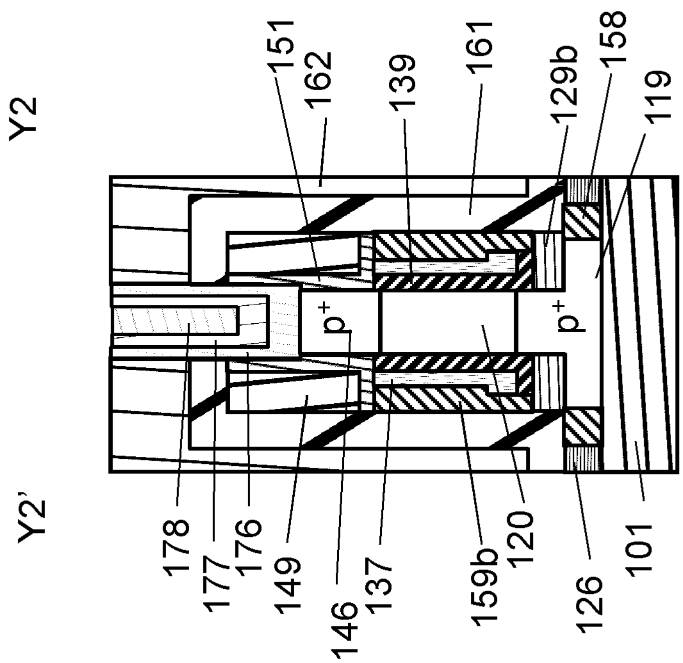

FIG. 140A is a cross-sectional diagram taken in the line Y1-Y1' of FIG. 139A, and FIG. 140B is a cross-sectional diagram taken in the line Y2-Y2' of FIG. 139A.

Figure 141A:
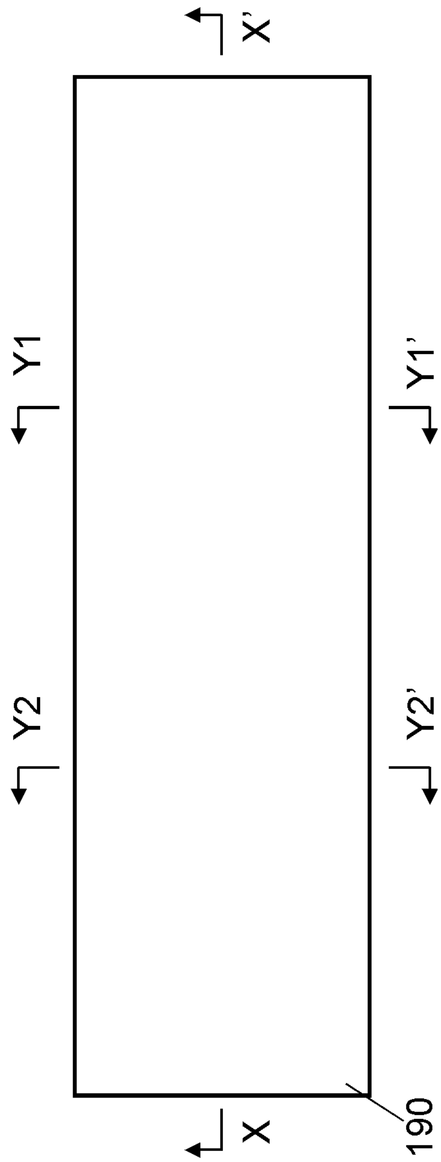
Figure 141B:
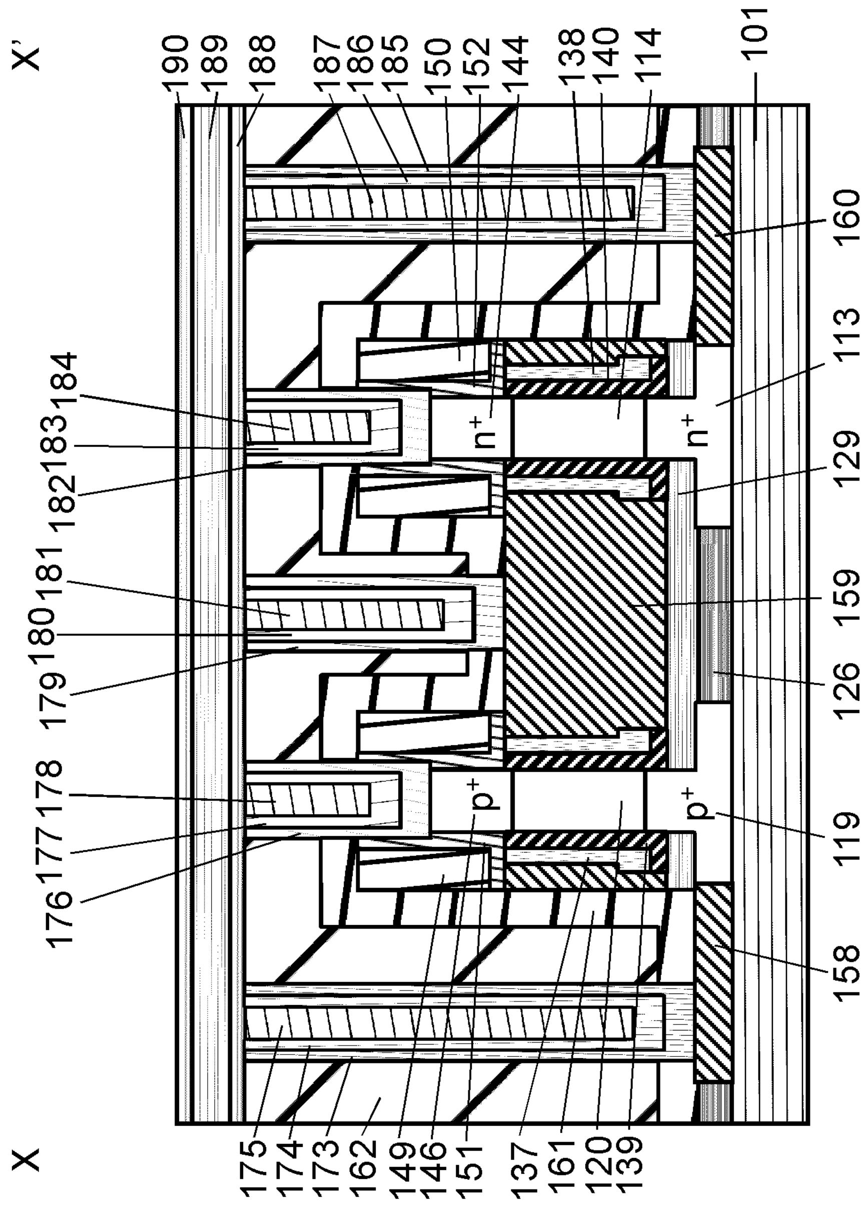

FIG. 141A is a top view for explaining the fabrication method of the semiconductor device according to the first embodiment, and FIG. 141B is a cross-sectional diagram taken in the line X-X' of FIG. 141A.

Figure 142A:
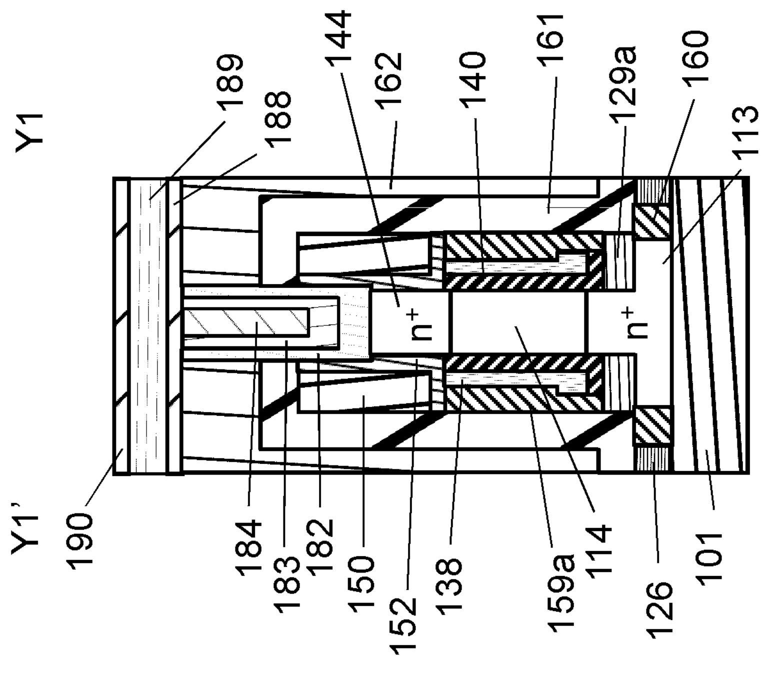
Figure 142B:
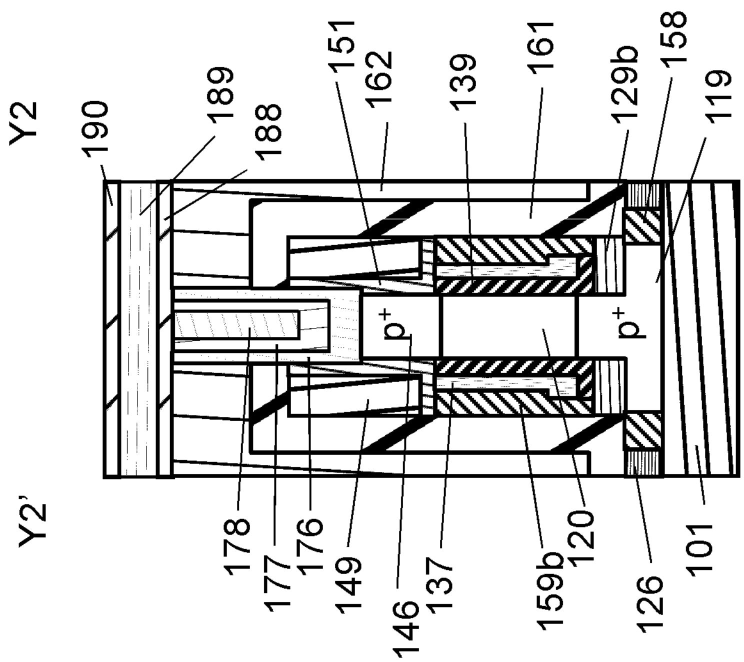

FIG. 142A is a cross-sectional diagram taken in the line Y1-Y1' of FIG. 141A, and FIG. 142B is a cross-sectional diagram taken in the line Y2-Y2' of FIG. 141A.

Figure 143A:
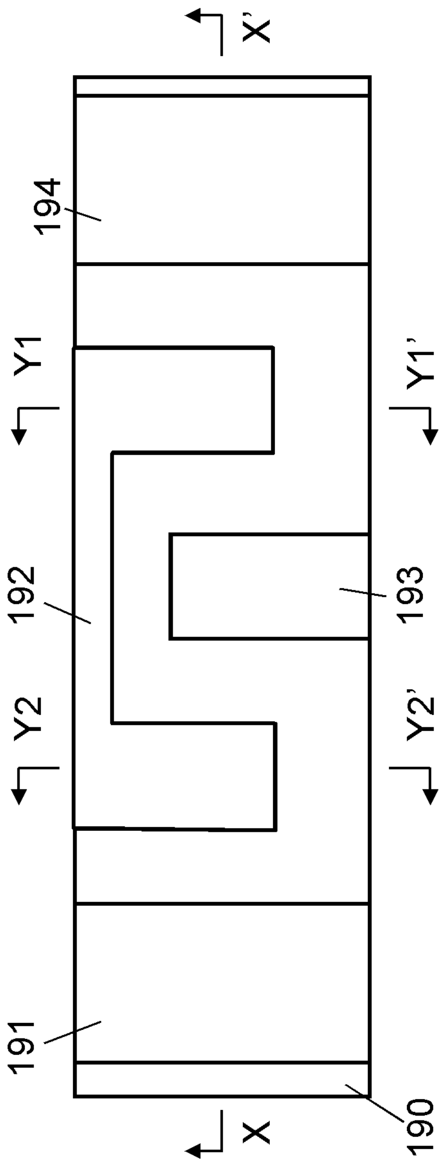
Figure 143B:
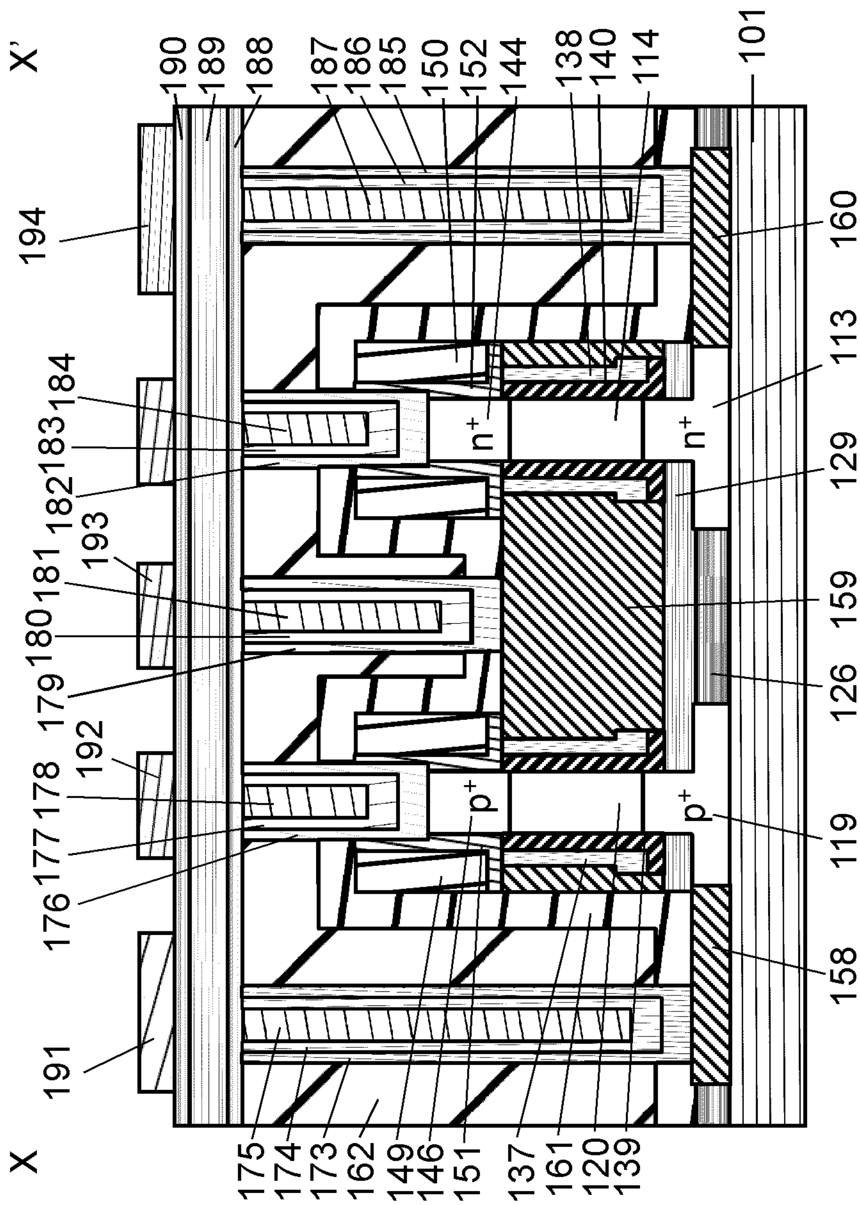

FIG. 143A is a top view for explaining the fabrication method of the semiconductor device according to the first embodiment, and FIG. 143B is a cross-sectional diagram taken in the line X-X' of FIG. 143A.

Figure 144A:
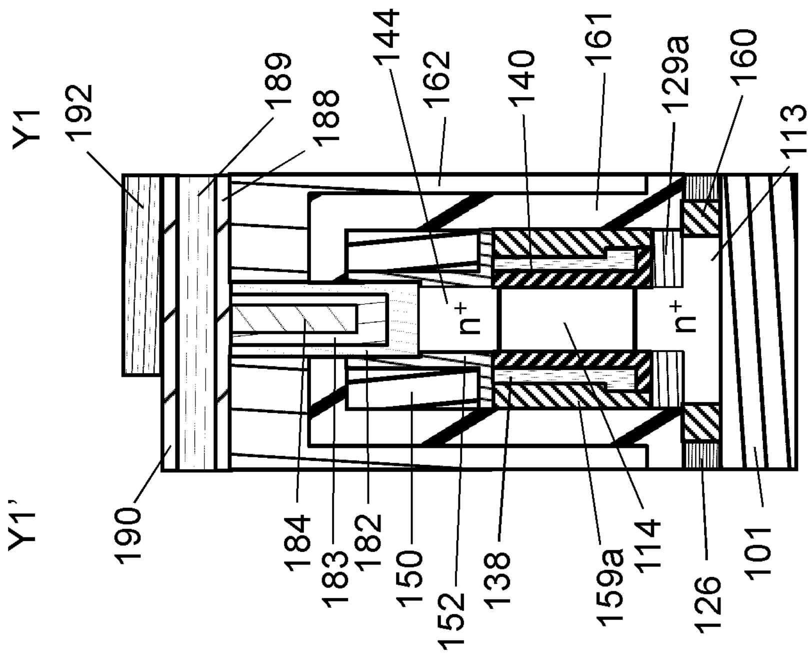
Figure 144B:
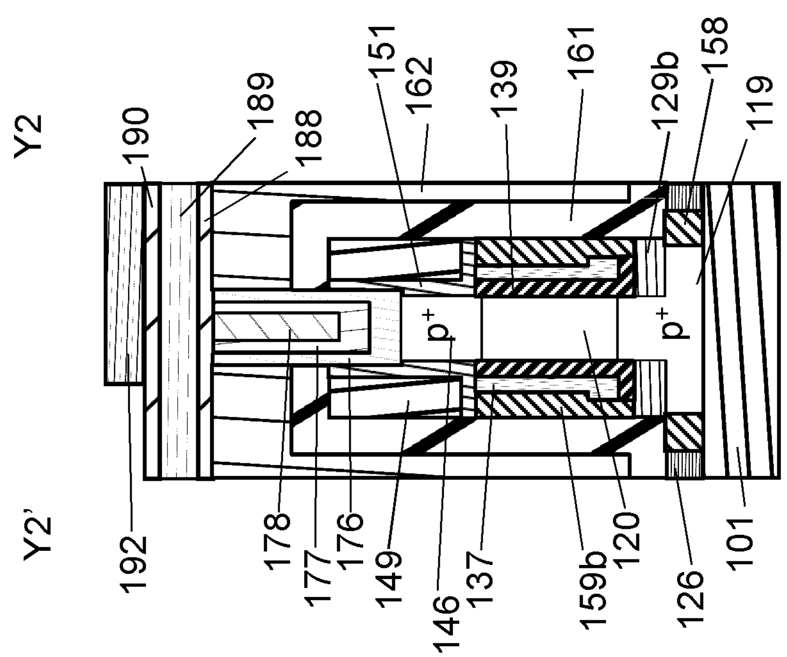

FIG. 144A is a cross-sectional diagram taken in the line Y1-Y1' of FIG. 143A, and FIG. 144B is a cross-sectional diagram taken in the line Y2-Y2' of FIG. 143A.

Figure 49A:
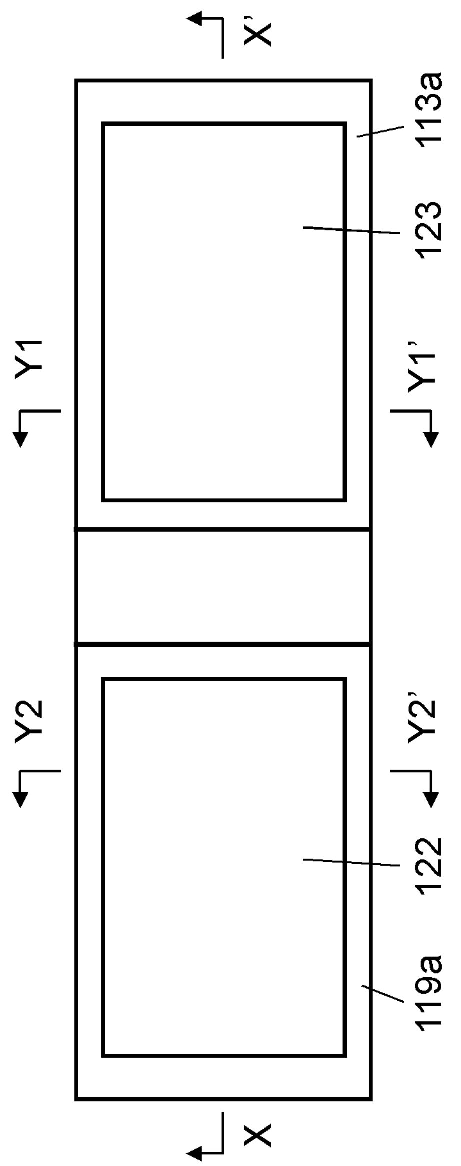
FIG. 49A is a top view for explaining the fabrication method of the semiconductor device according to the first embodiment.
Figure 49B:
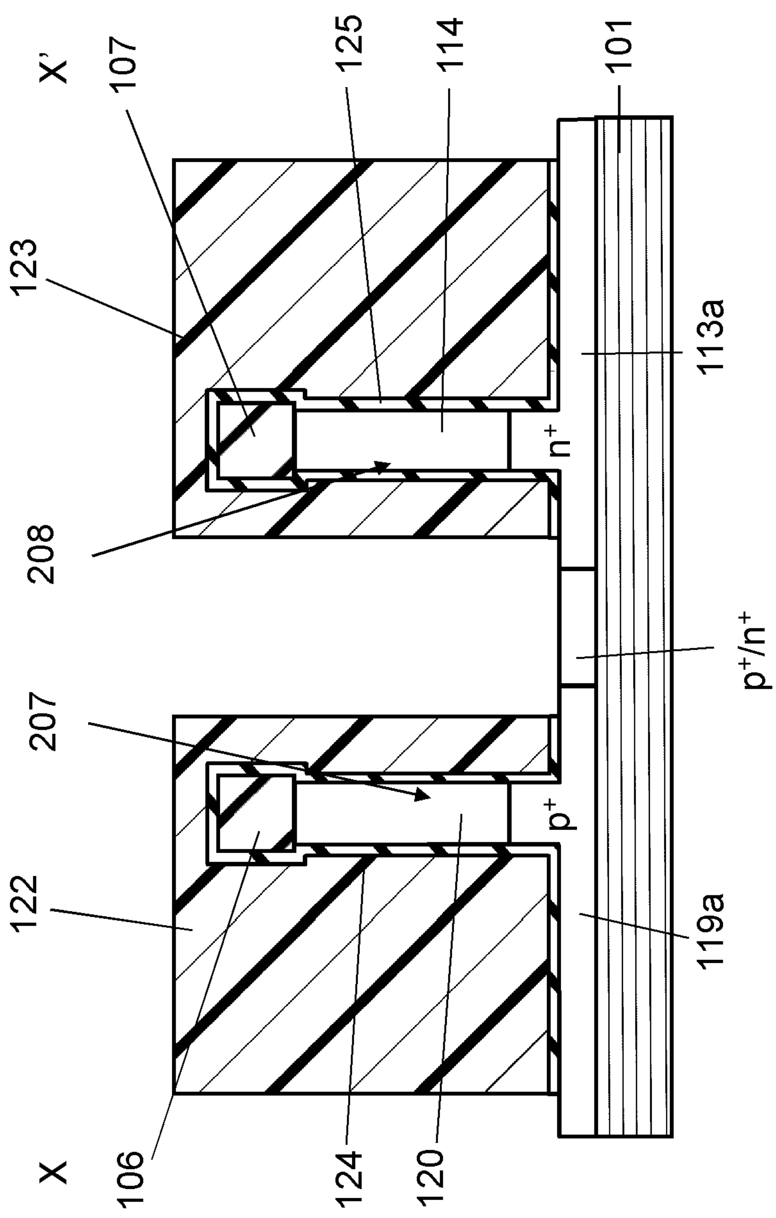
FIG. 49B is a cross-sectional diagram taken in the line X-X' of FIG. 49A.
Figure 50A:
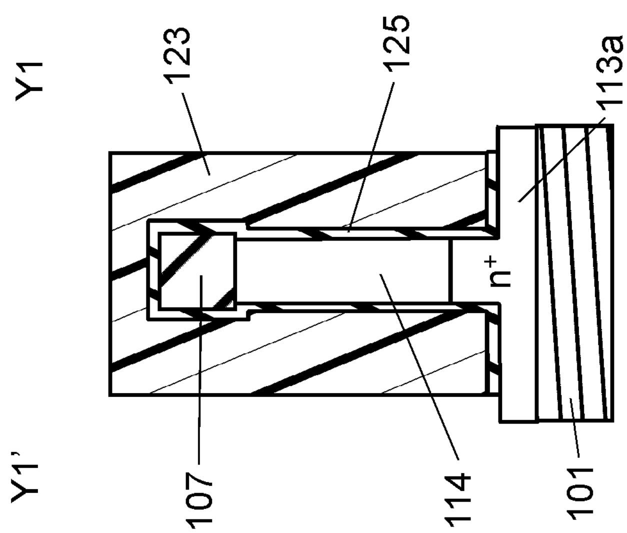
FIG. 50A is a cross-sectional diagram taken in the line Y1-Y1' of FIG. 49A.
Figure 50B:
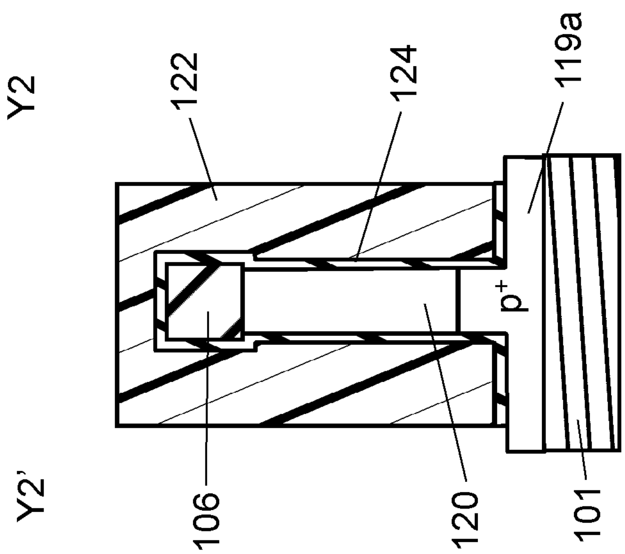
FIG. 50B is a cross-sectional diagram taken in the line Y2-Y2' of FIG. 49A.
Figure 51A:
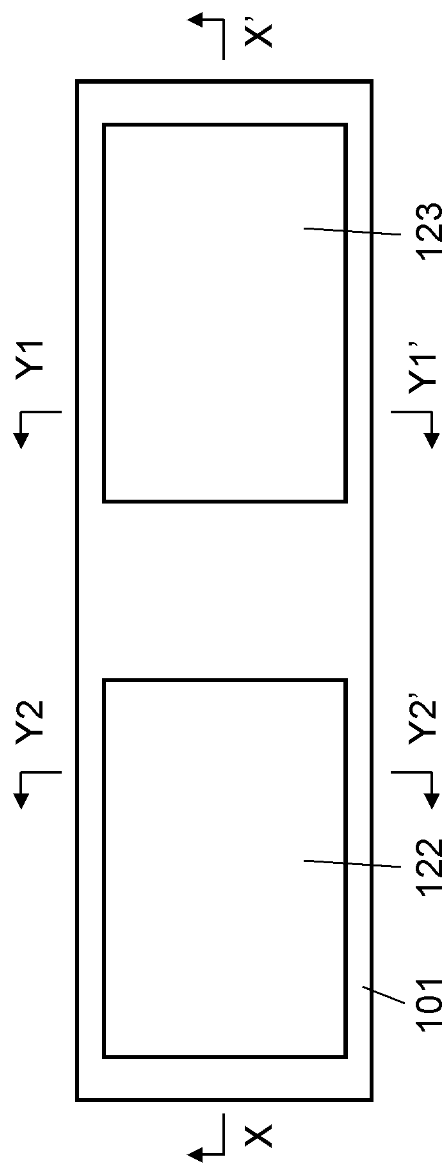
FIG. 51A is a top view for explaining the fabrication method of the semiconductor device according to the first embodiment.
Figure 51B:
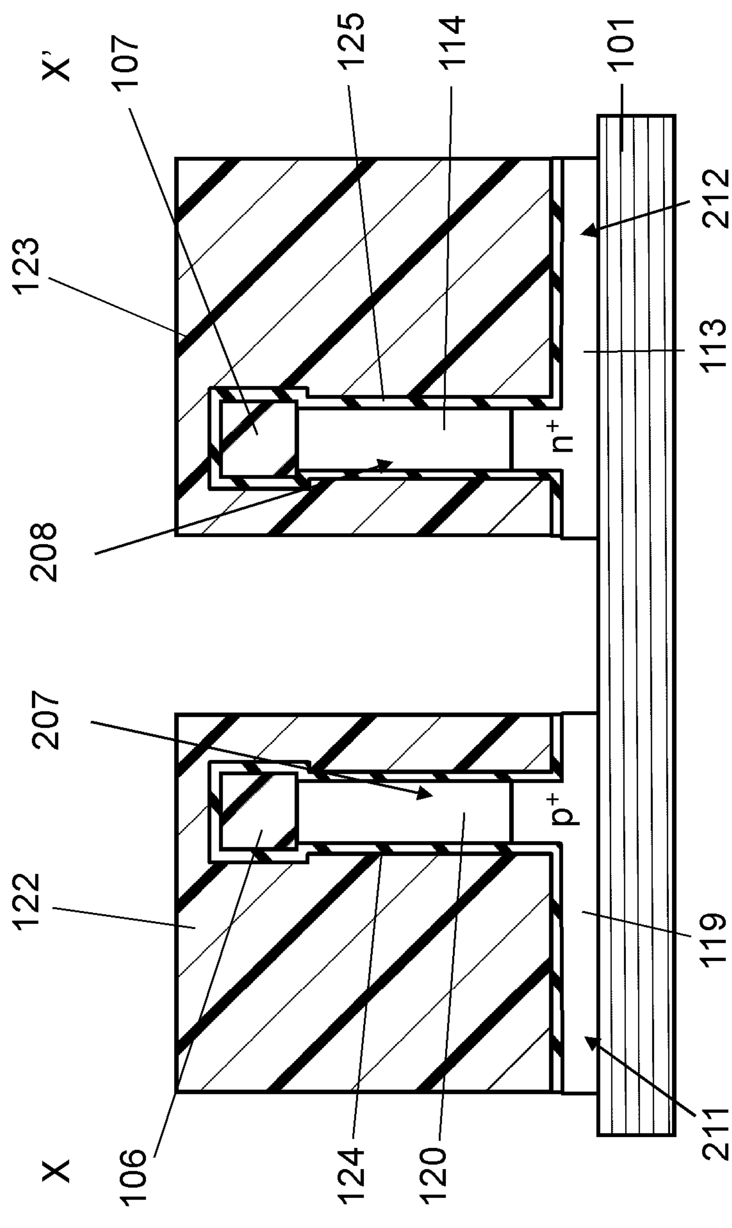
FIG. 51B is a cross-sectional diagram taken in the line X-X' of FIG. 51A.
Figure 52A:
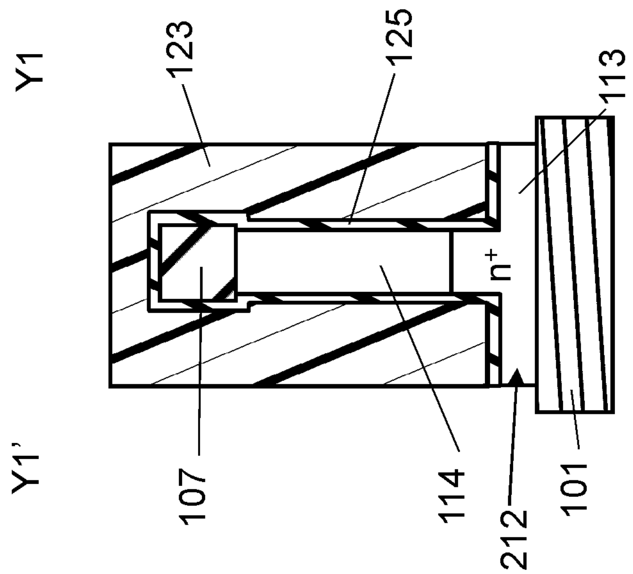
FIG. 52A is a cross-sectional diagram taken in the line Y1-Y1' of FIG. 51A.
Figure 52B:
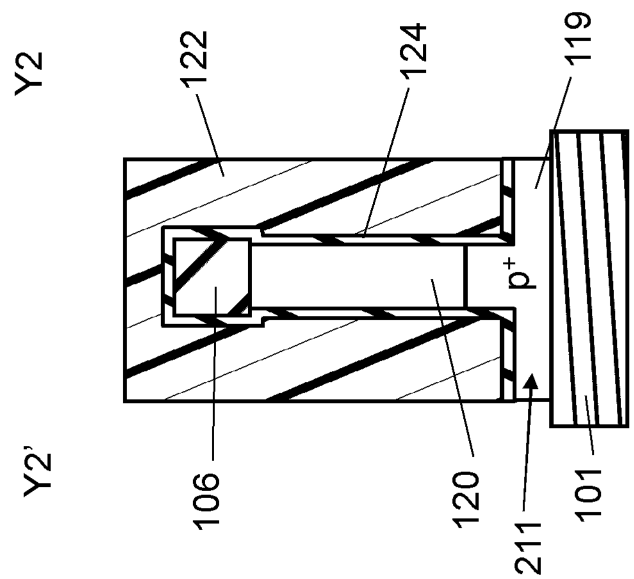
FIG. 52B is a cross-sectional diagram taken in the line Y2-Y2' of FIG. 51A.
Figure 53A:
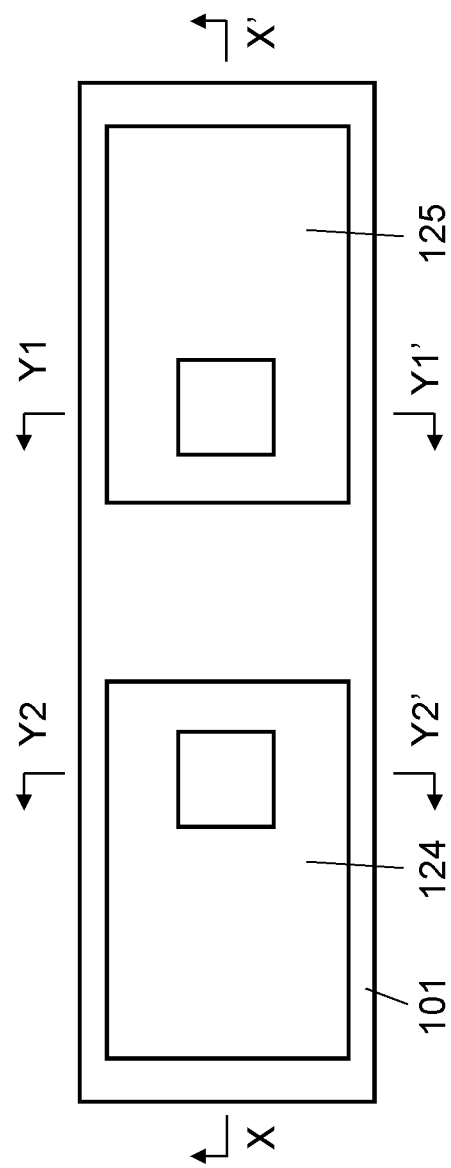
FIG. 53A is a top view for explaining the fabrication method of the semiconductor device according to the first embodiment.
Figure 53B:
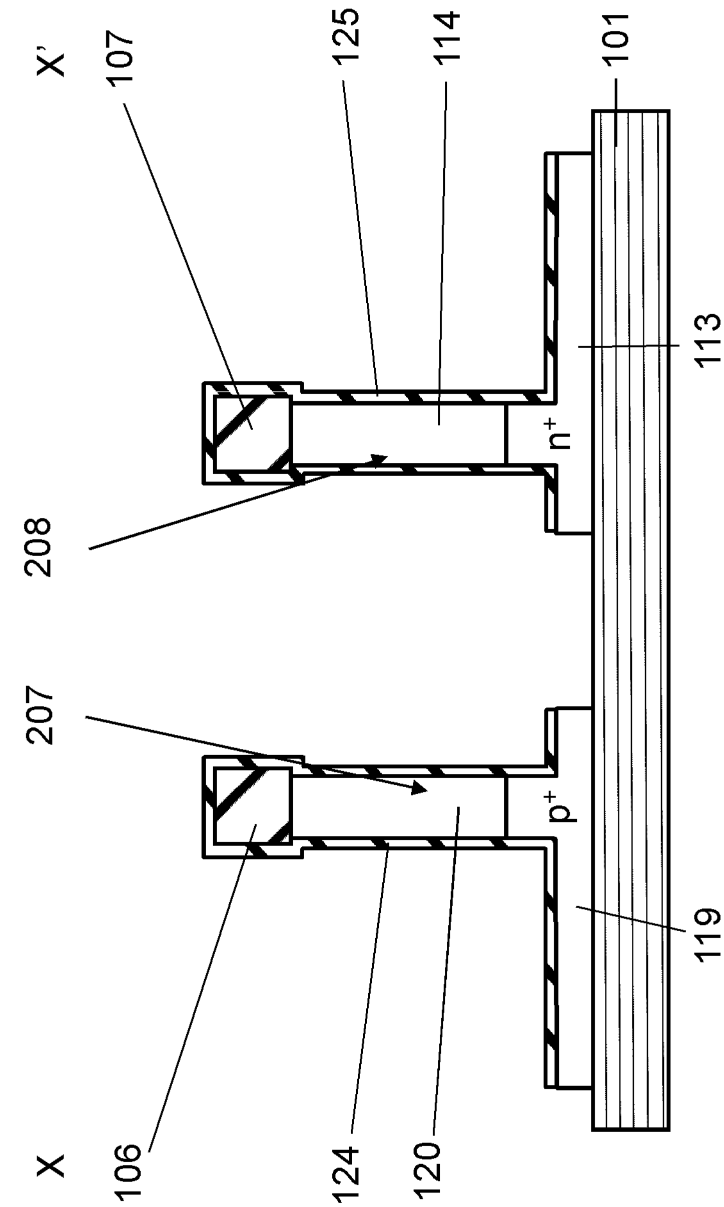
FIG. 53B is a cross-sectional diagram taken in the line X-X' of FIG. 53A.
Figure 54A:
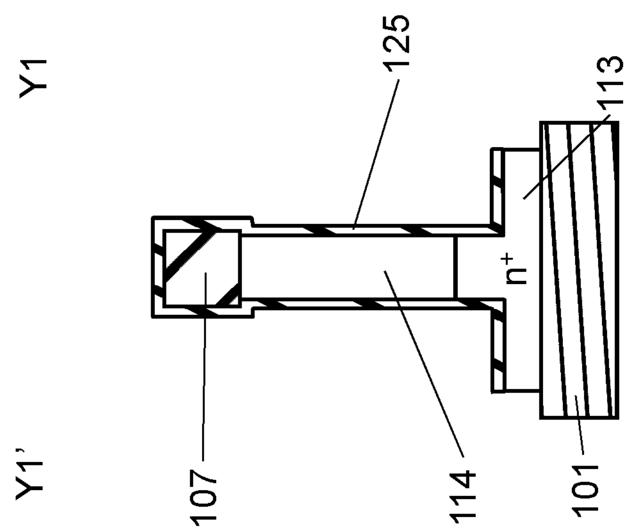
FIG. 54A is a cross-sectional diagram taken in the line Y1-Y1' of FIG. 53A.
Figure 54B:
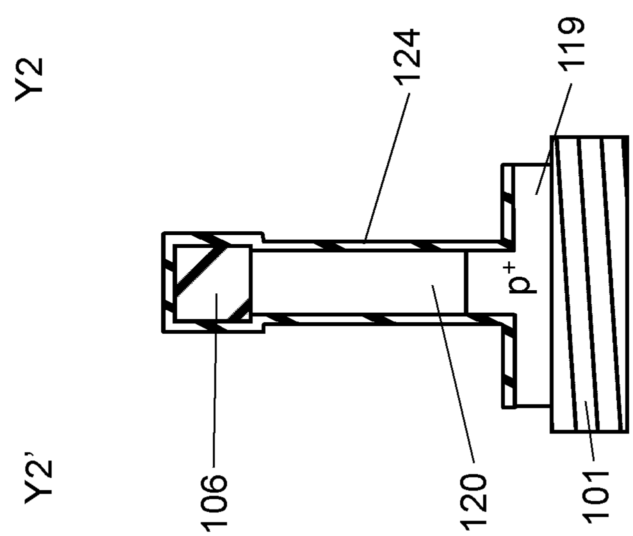
FIG. 54B is a cross-sectional diagram taken in the line Y2-Y2' of FIG. 53A.
Figure 55A:
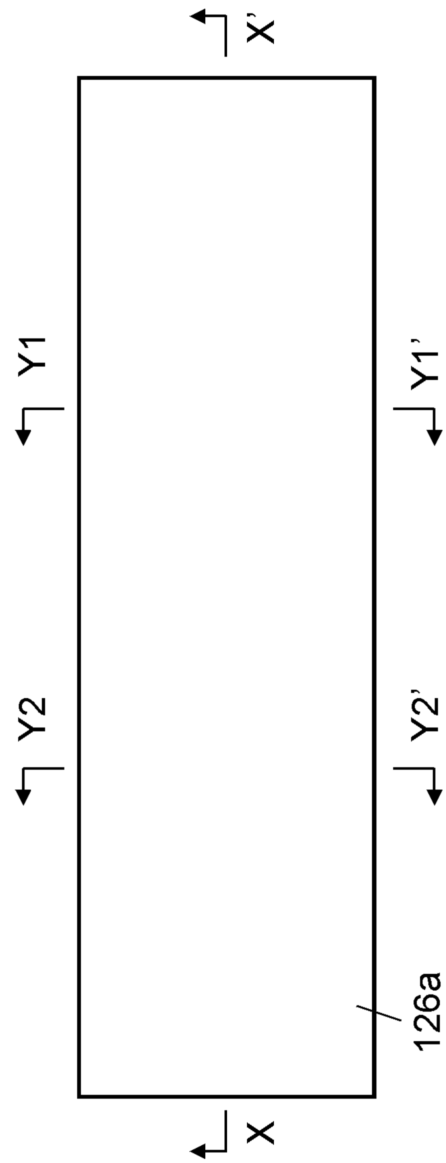
FIG. 55A is a top view for explaining the fabrication method of the semiconductor device according to the first embodiment.
Figure 55B:
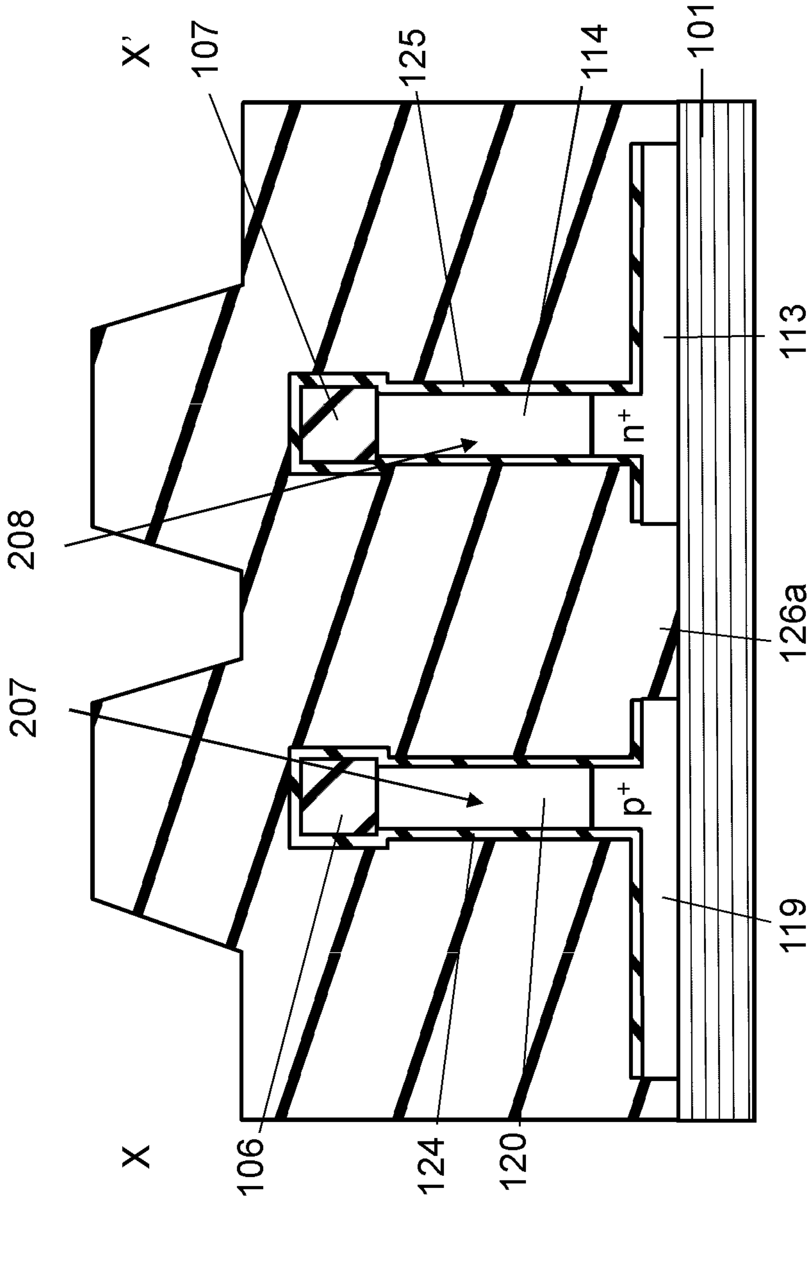
FIG. 55B is a cross-sectional diagram taken in the line X-X' of FIG. 55A.
Figure 56A:
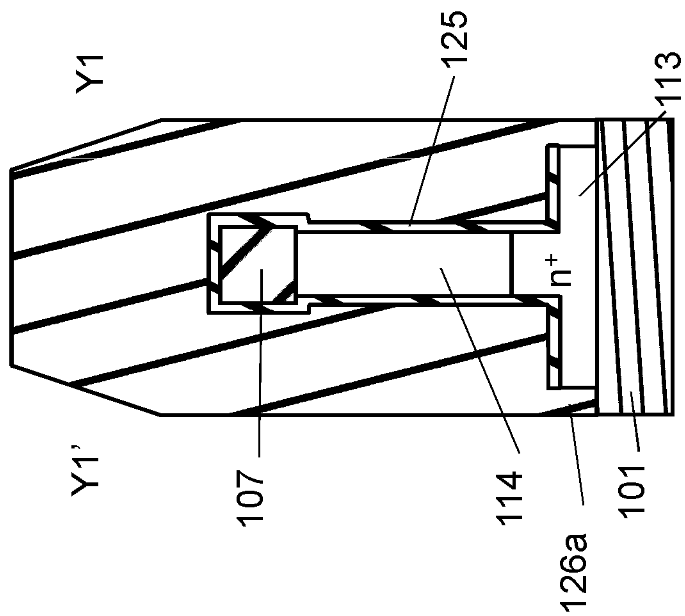
FIG. 56A is a cross-sectional diagram taken in the line Y1-Y1' of FIG. 55A.
Figure 56B:
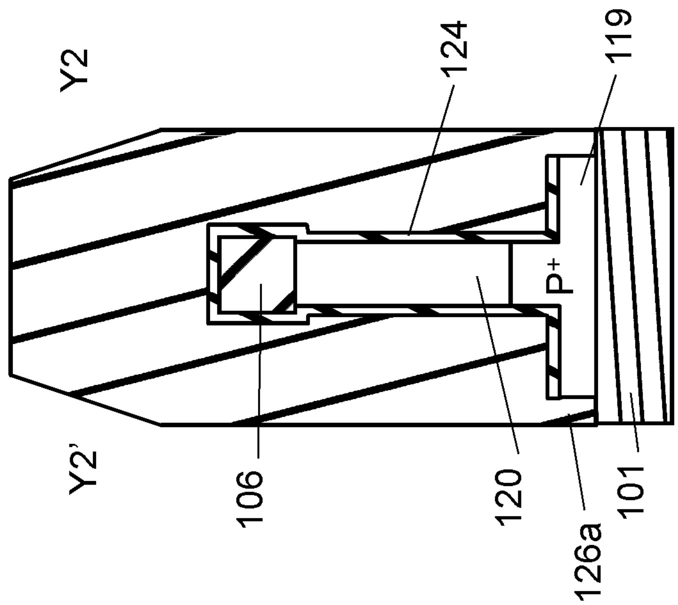
FIG. 56B is a cross-sectional diagram taken in the line Y2-Y2' of FIG. 55A.
Figure 57A:
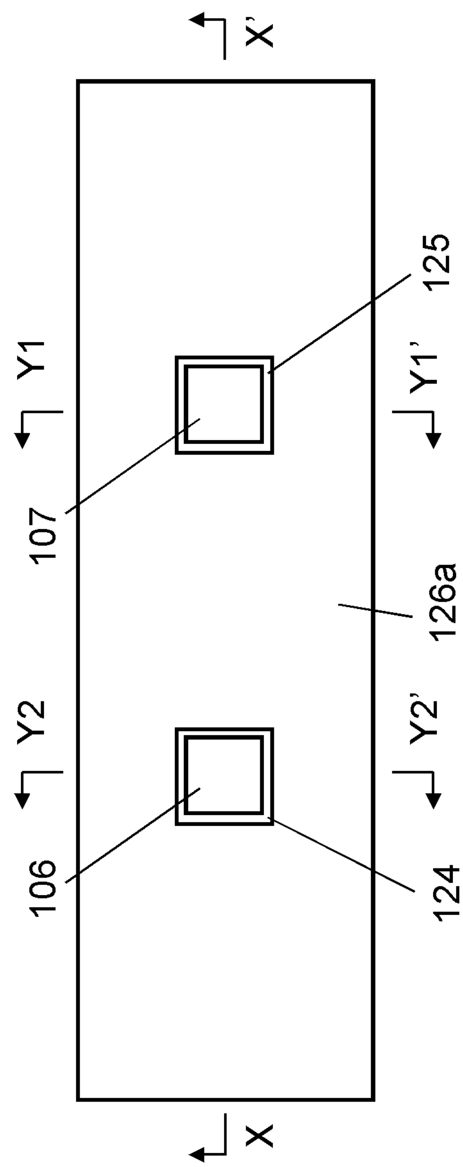
FIG. 57A is a top view for explaining the fabrication method of the semiconductor device according to the first embodiment.
Figure 57B:
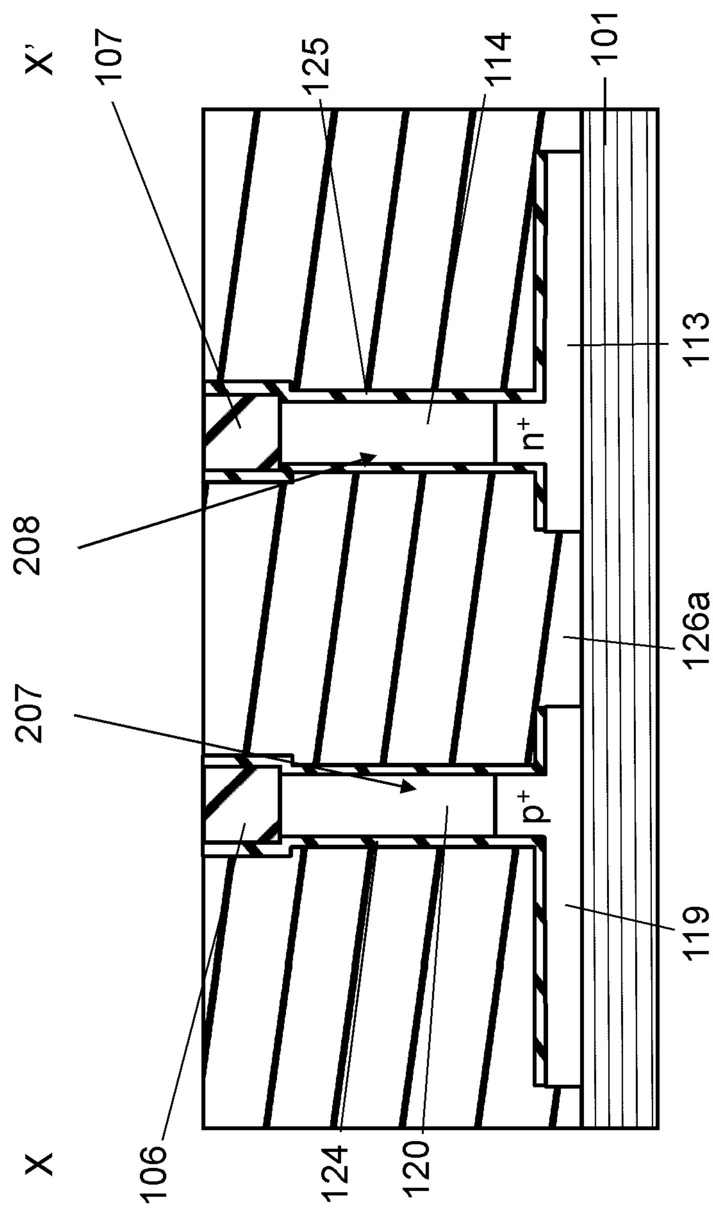
FIG. 57B is a cross-sectional diagram taken in the line X-X' of FIG. 57A.
Figure 58A:
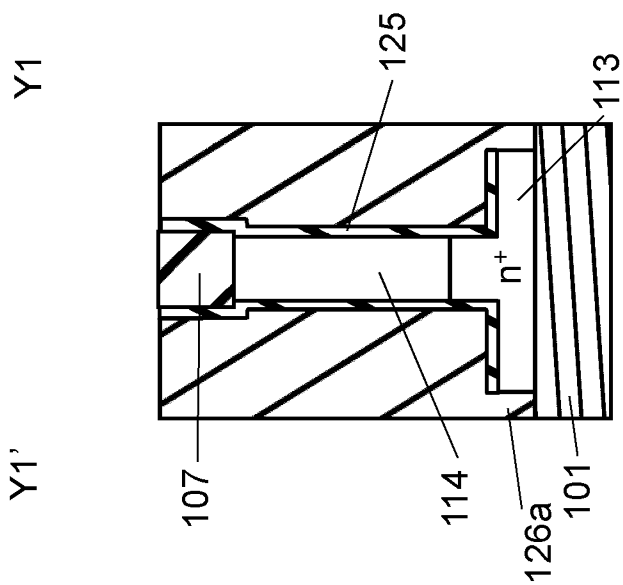
FIG. 58A is a cross-sectional diagram taken in the line Y1-Y1' of FIG. 57A.
Figure 58B:
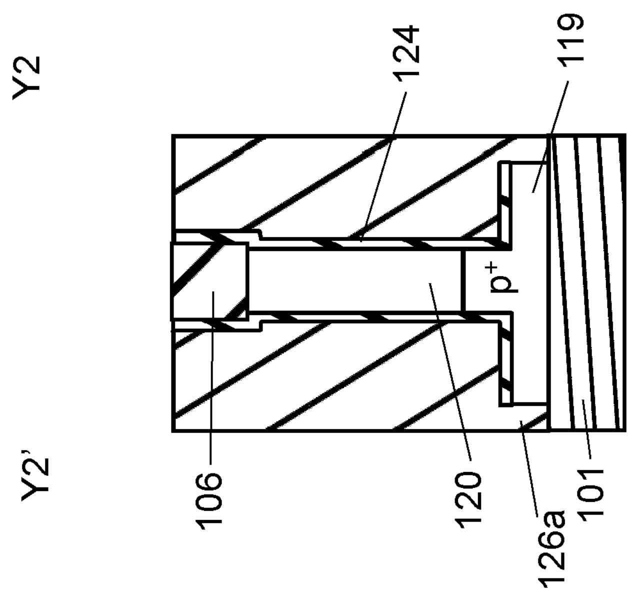
FIG. 58B is a cross-sectional diagram taken in the line Y2-Y2' of FIG. 57A.
Figure 59A:
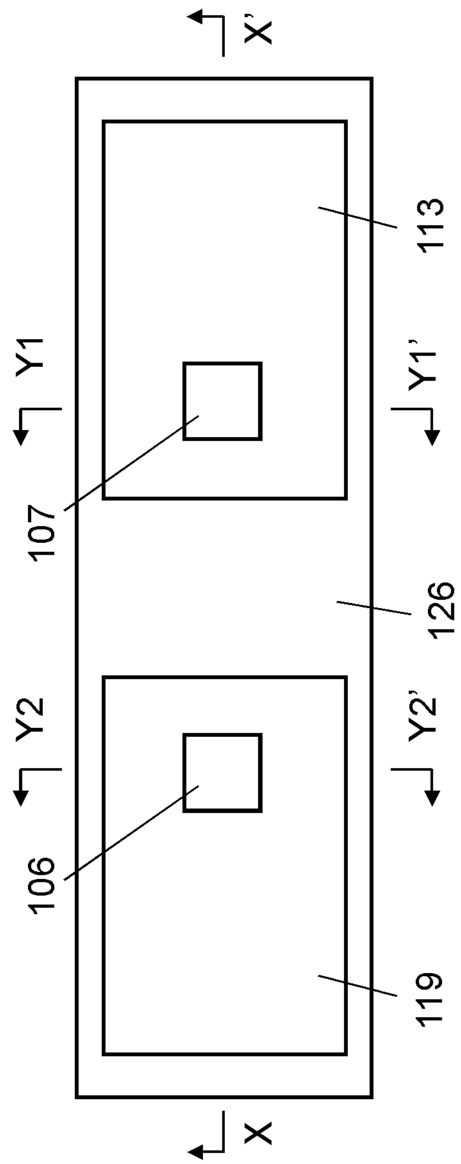
FIG. 59A is a top view for explaining the fabrication method of the semiconductor device according to the first embodiment.
Figure 59B:
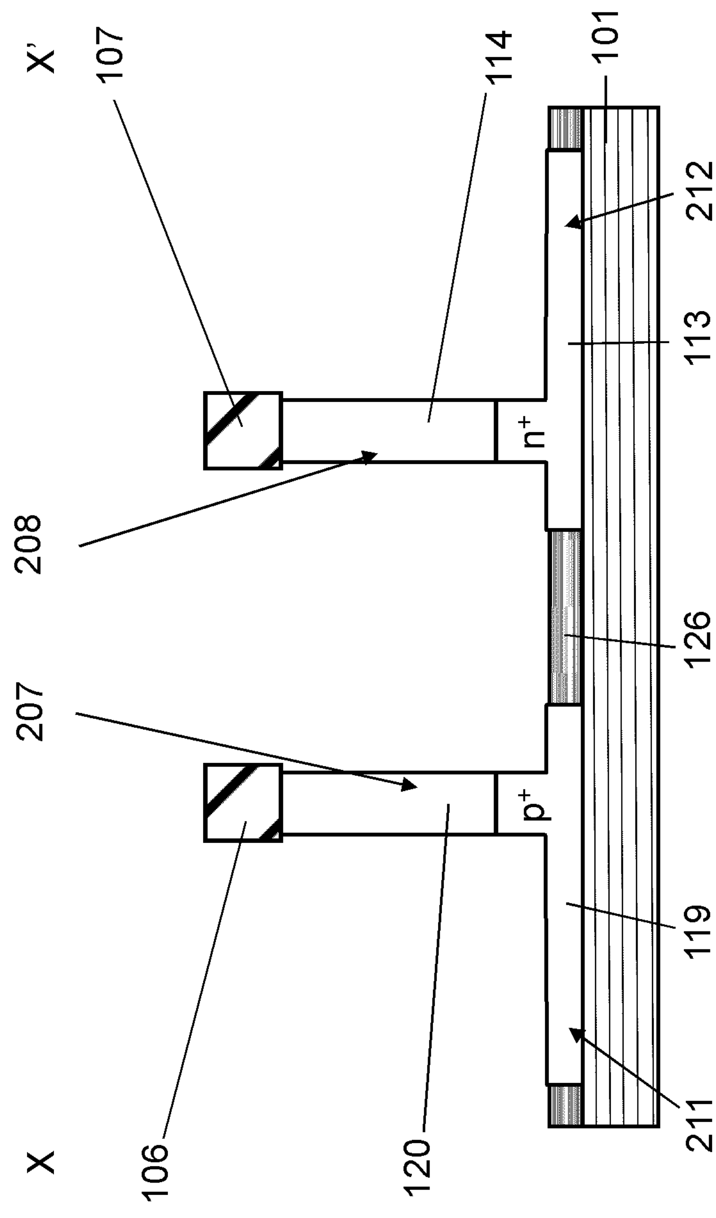
FIG. 59B is a cross-sectional diagram taken in the line X-X' of FIG. 59A.
Figure 60A:
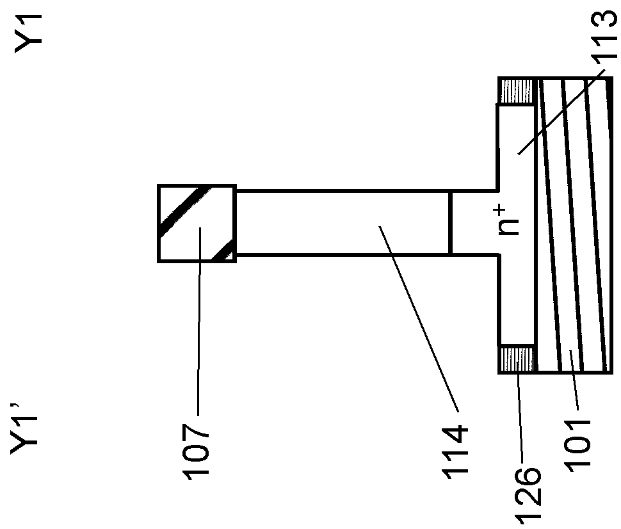
FIG. 60A is a cross-sectional diagram taken in the line Y1-Y1' of FIG. 59A.
Figure 60B:
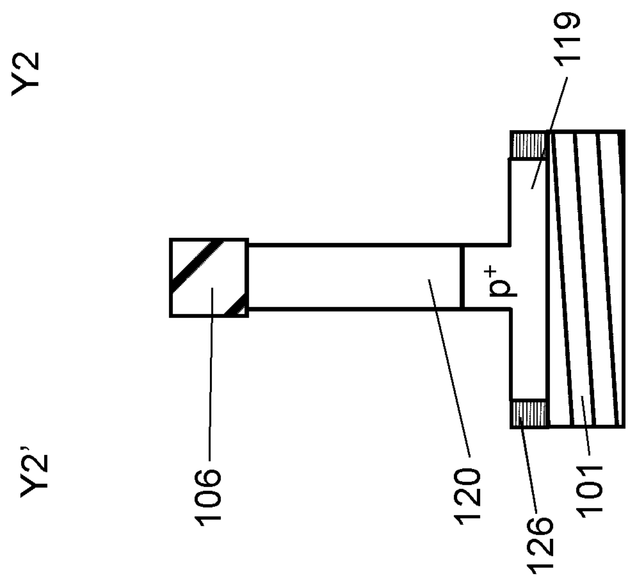
FIG. 60B is a cross-sectional diagram taken in the line Y2-Y2' of FIG. 59A.
Figure 61A:
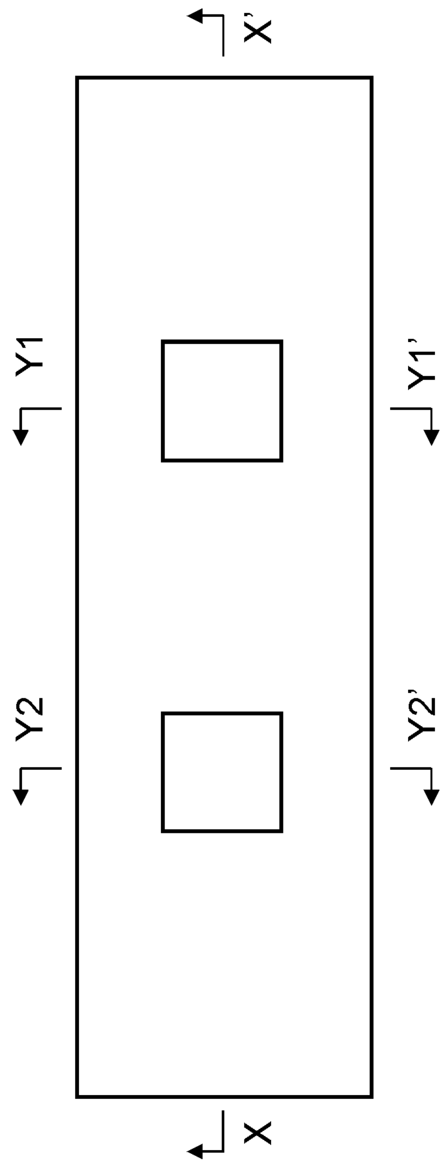
FIG. 61A is a top view for explaining the fabrication method of the semiconductor device according to the first embodiment.
Figure 61B:
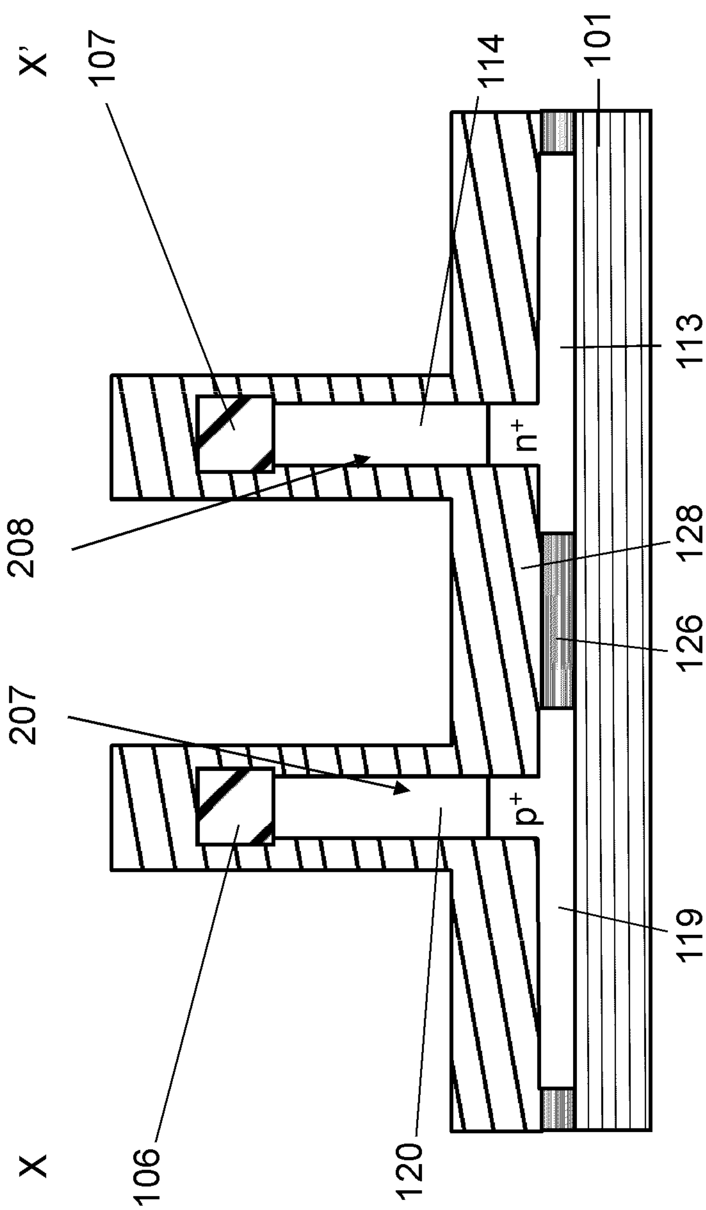
FIG. 61B is a cross-sectional diagram taken in the line X-X' of FIG. 61A.
Figure 62A:
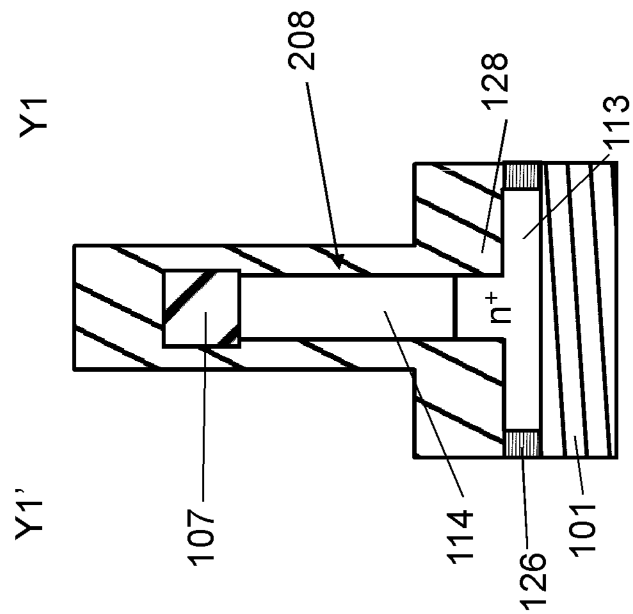
FIG. 62A is a cross-sectional diagram taken in the line Y1-Y1' of FIG. 61A.
Figure 62B:
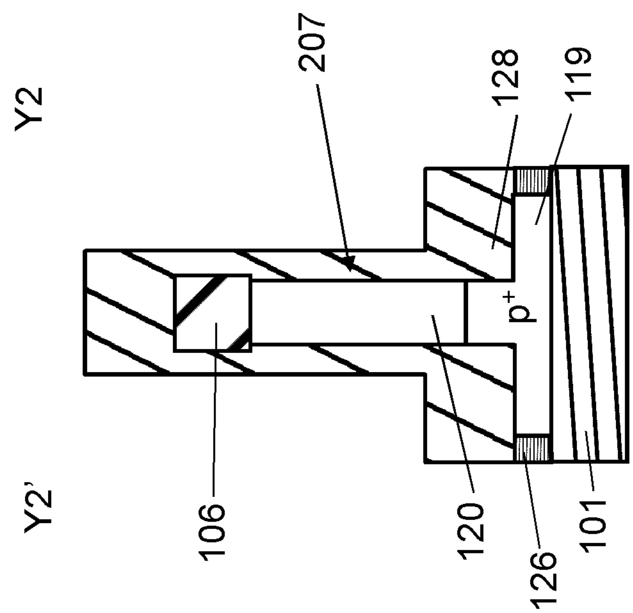
FIG. 62B is a cross-sectional diagram taken in the line Y2-Y2' of FIG. 61A.
Figure 63A:
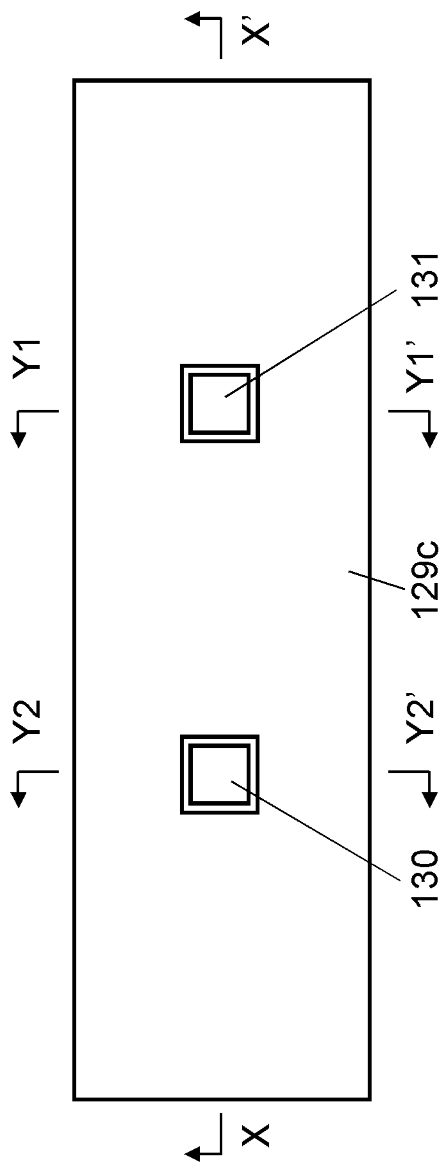
FIG. 63A is a top view for explaining the fabrication method of the semiconductor device according to the first embodiment.
Figure 63B:
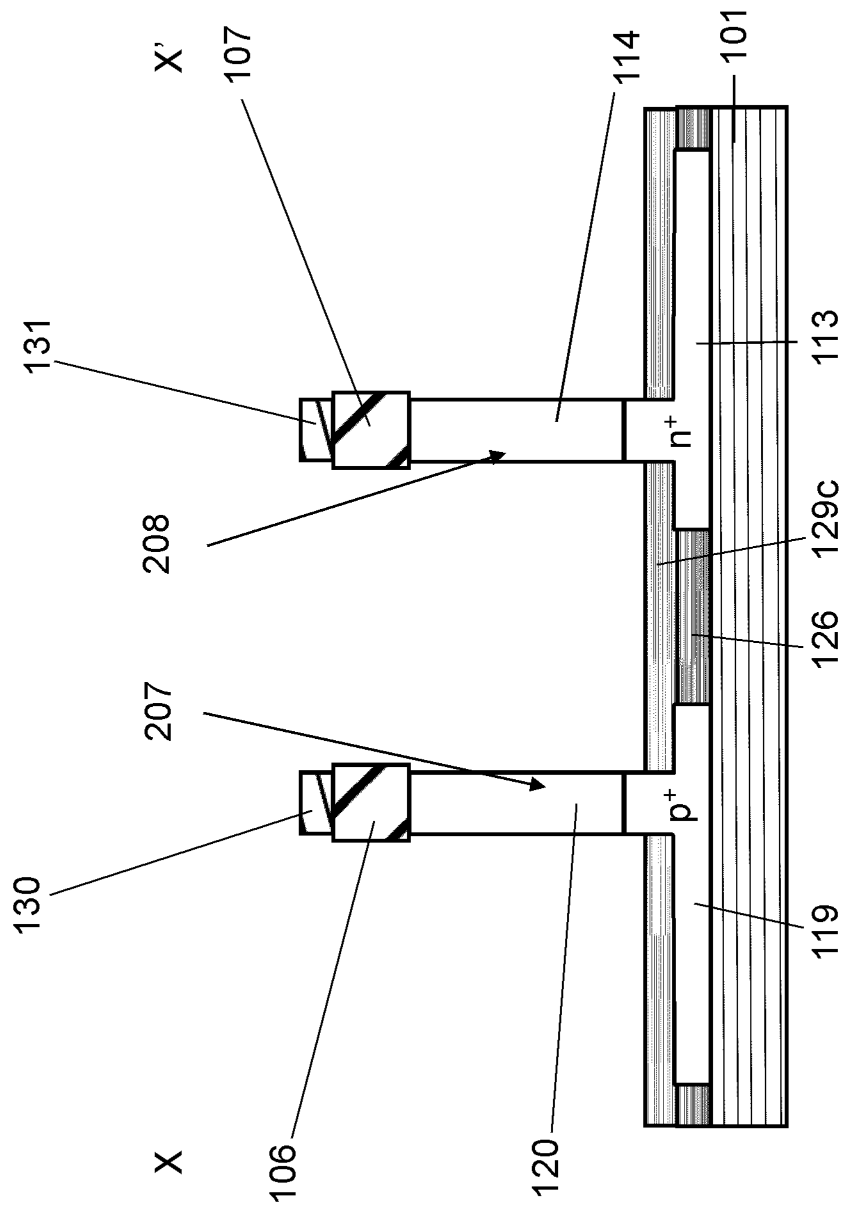
FIG. 63B is a cross-sectional diagram taken in the line X-X' of FIG. 63A.
Figure 64A:
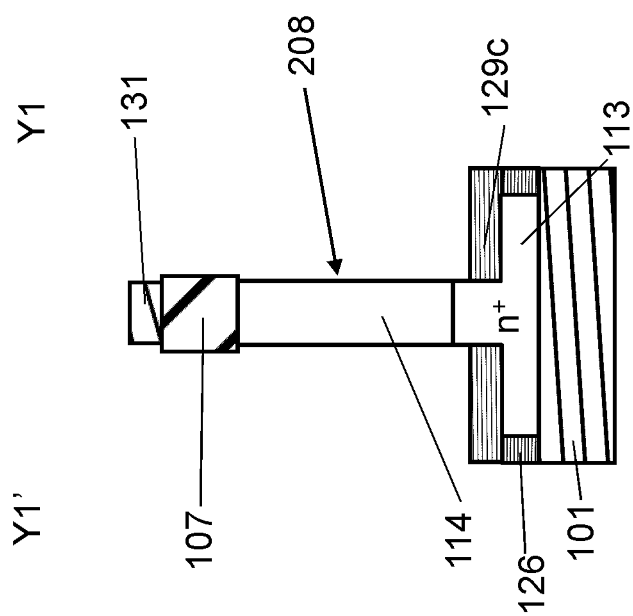
FIG. 64A is a cross-sectional diagram taken in the line Y1-Y1' of FIG. 63A.
Figure 64B:
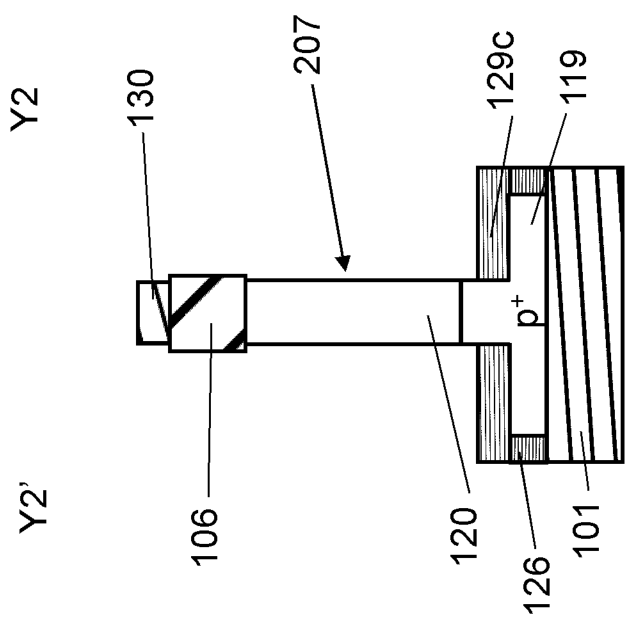
FIG. 64B is a cross-sectional diagram taken in the line Y2-Y2' of FIG. 63A.
Figure 65A:
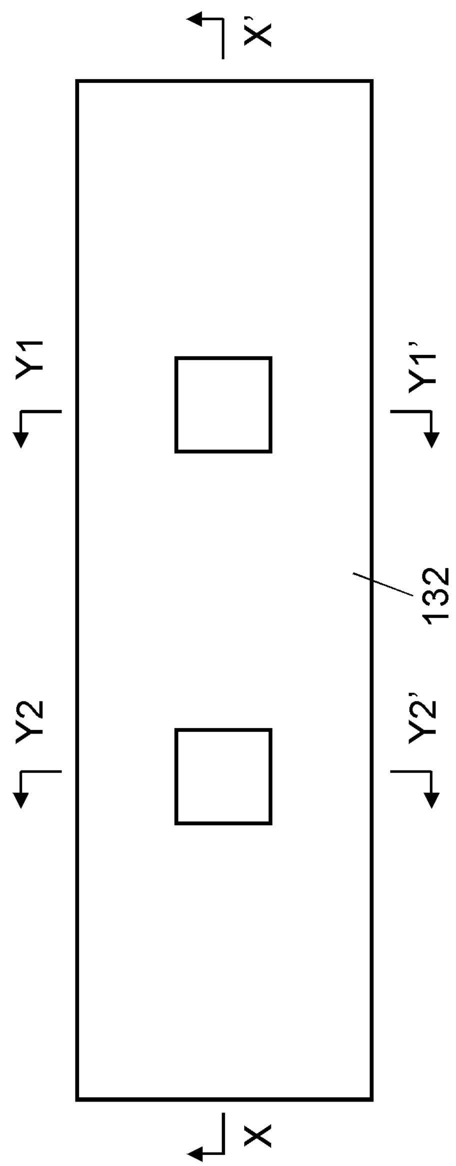
FIG. 65A is a top view for explaining the fabrication method of the semiconductor device according to the first embodiment.
Figure 65B:
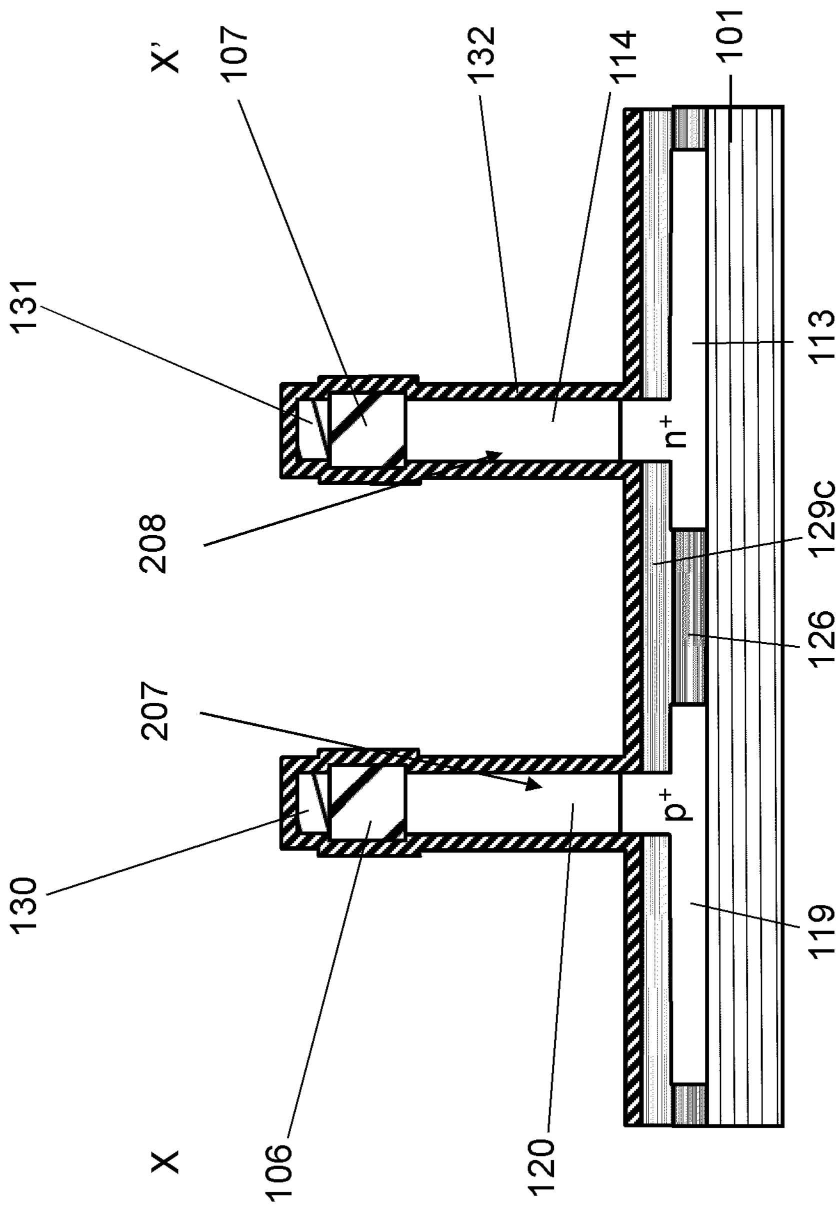
FIG. 65B is a cross-sectional diagram taken in the line X-X' of FIG. 65A.
Figure 66A:
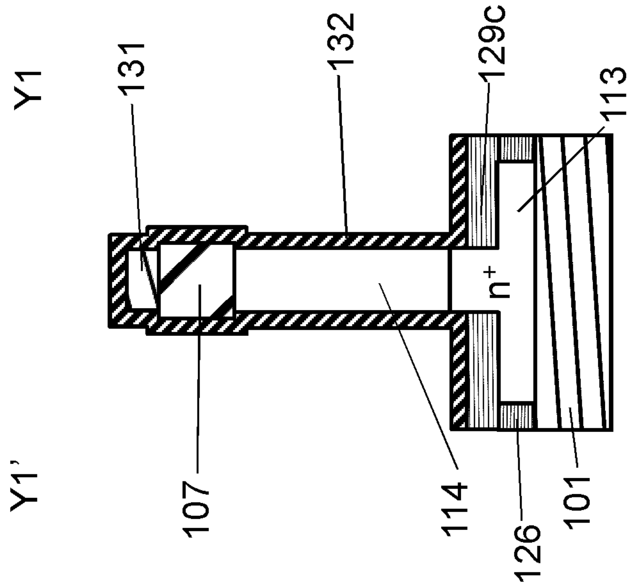
FIG. 66A is a cross-sectional diagram taken in the line Y1-Y1' of FIG. 65A.
Figure 66B:
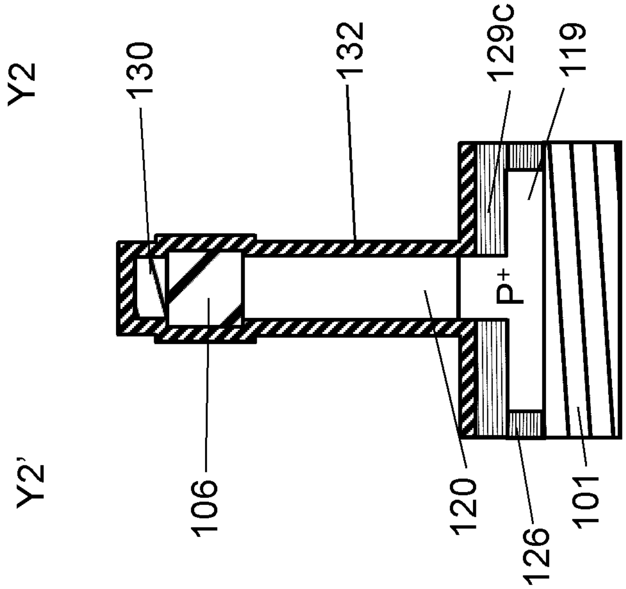
FIG. 66B is a cross-sectional diagram taken in the line Y2-Y2' of FIG. 65A.
Figure 67A:
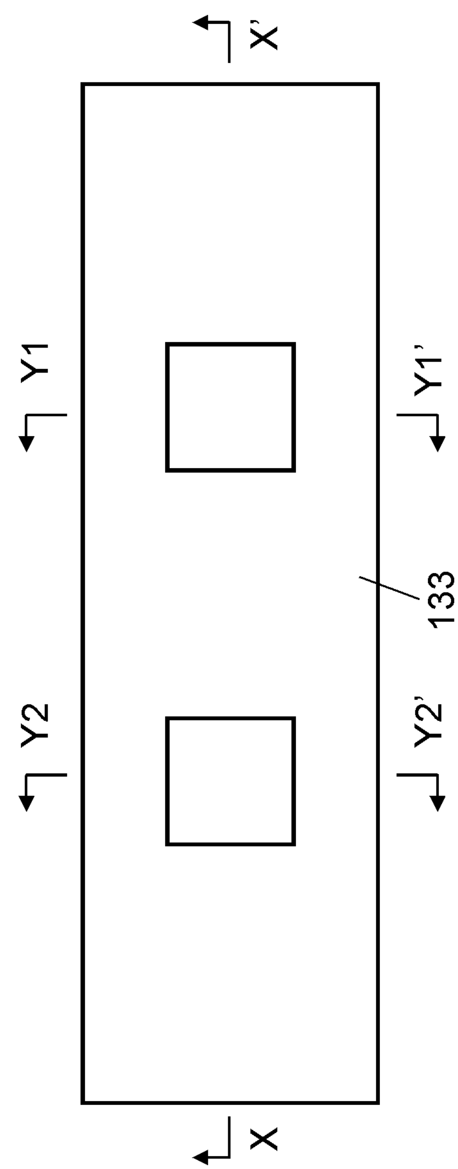
FIG. 67A is a top view for explaining the fabrication method of the semiconductor device according to the first embodiment.
Figure 67B:
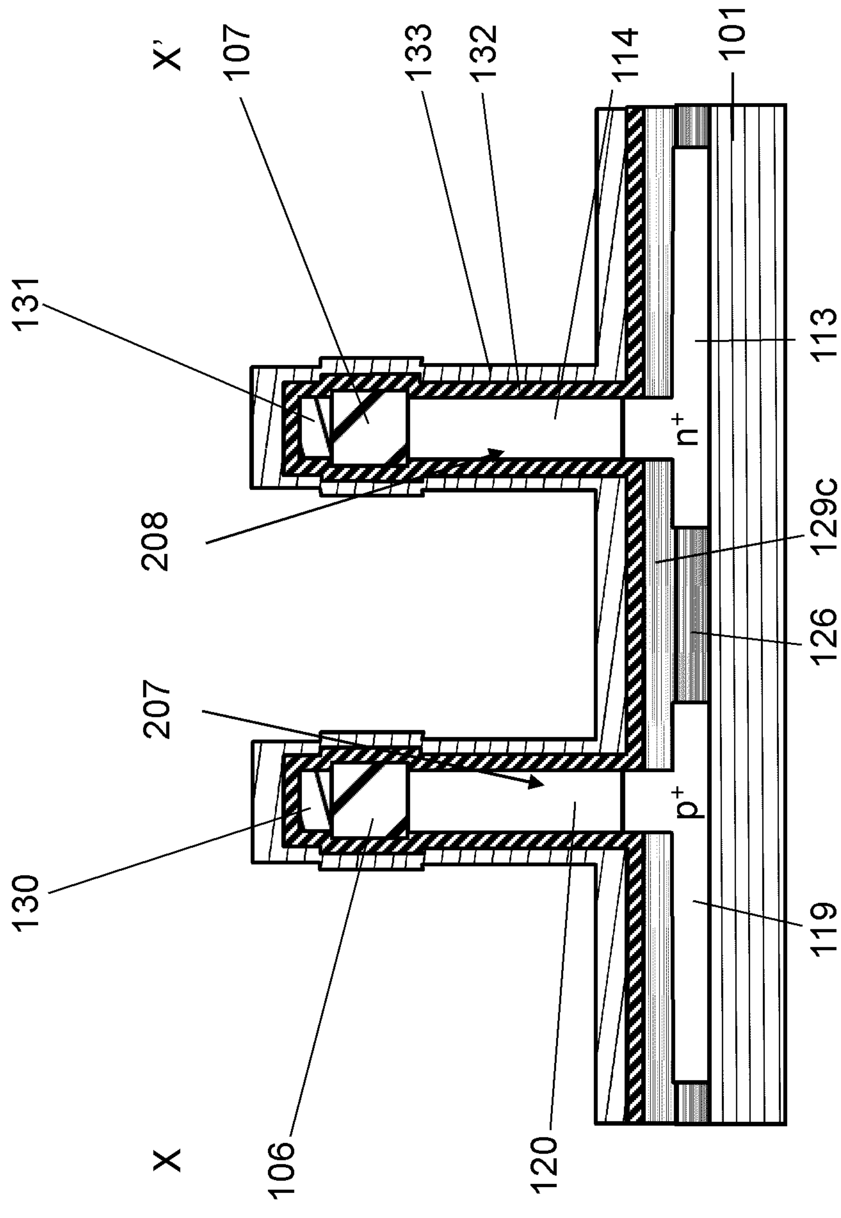
FIG. 67B is a cross-sectional diagram taken in the line X-X' of FIG. 67A.
Figure 68A:
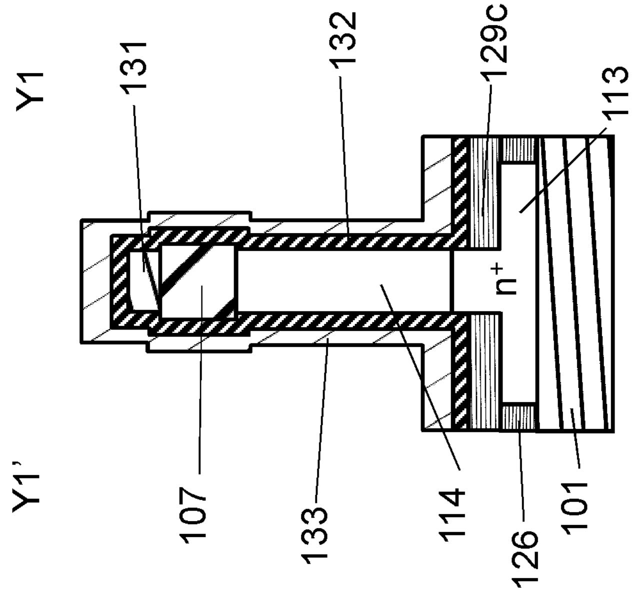
FIG. 68A is a cross-sectional diagram taken in the line Y1-Y1' of FIG. 67A.
Figure 68B:
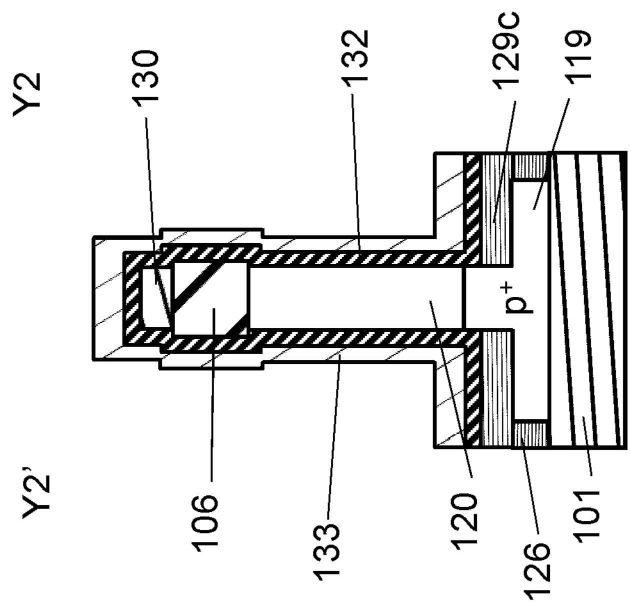
FIG. 68B is a cross-sectional diagram taken in the line Y2-Y2' of FIG. 67A.
Figure 69A:
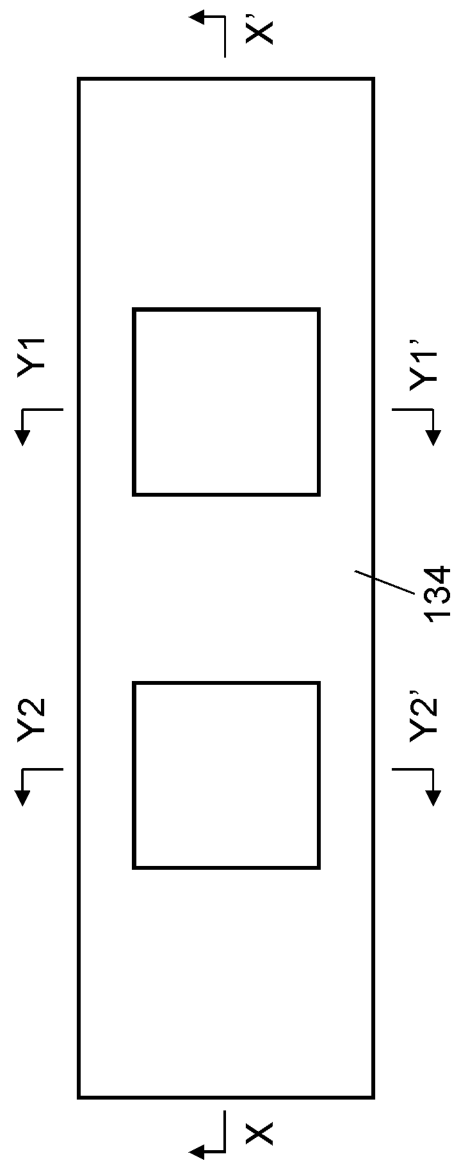
FIG. 69A is a top view for explaining the fabrication method of the semiconductor device according to the first embodiment.
Figure 69B:
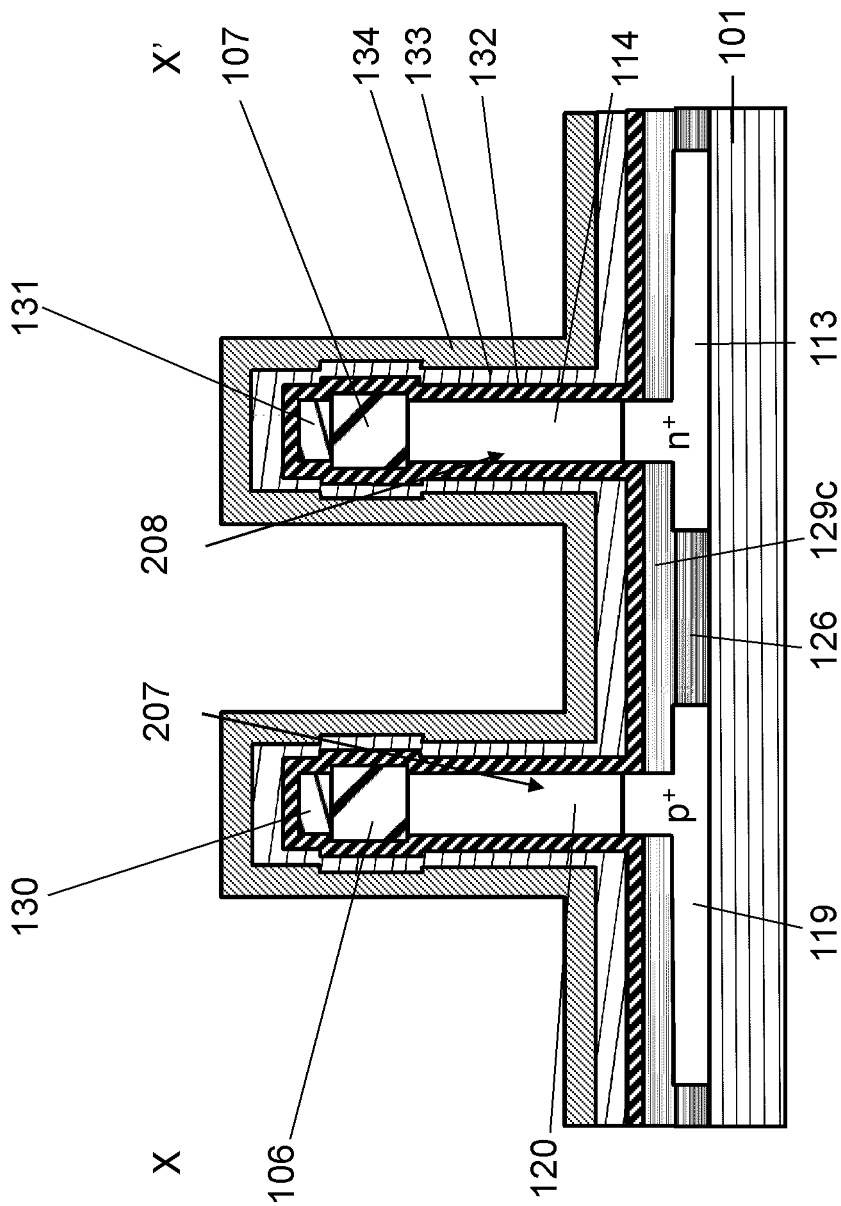
FIG. 69B is a cross-sectional diagram taken in the line X-X' of FIG. 69A.
Figure 70A:
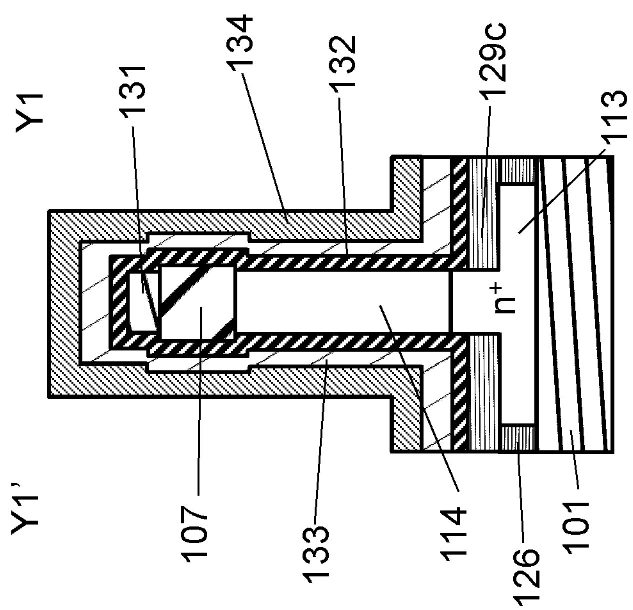
FIG. 70A is a cross-sectional diagram taken in the line Y1-Y1' of FIG. 69A.
Figure 70B:
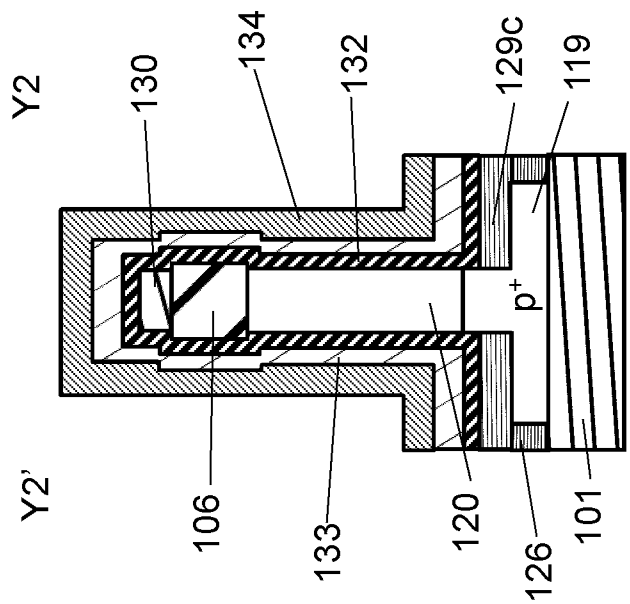
FIG. 70B is a cross-sectional diagram taken in the line Y2-Y2' of FIG. 69A.
Figure 71A:
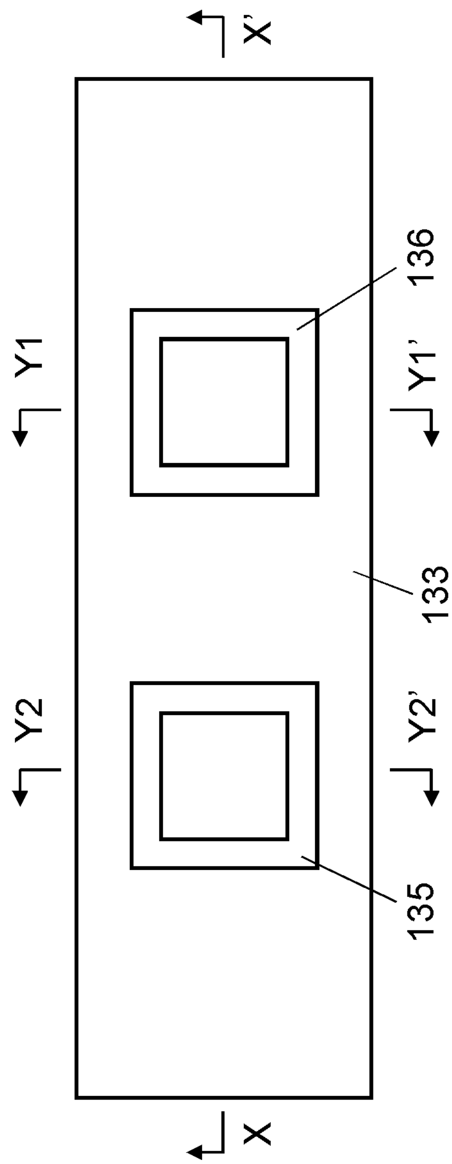
FIG. 71A is a top view for explaining the fabrication method of the semiconductor device according to the first embodiment.
Figure 71B:
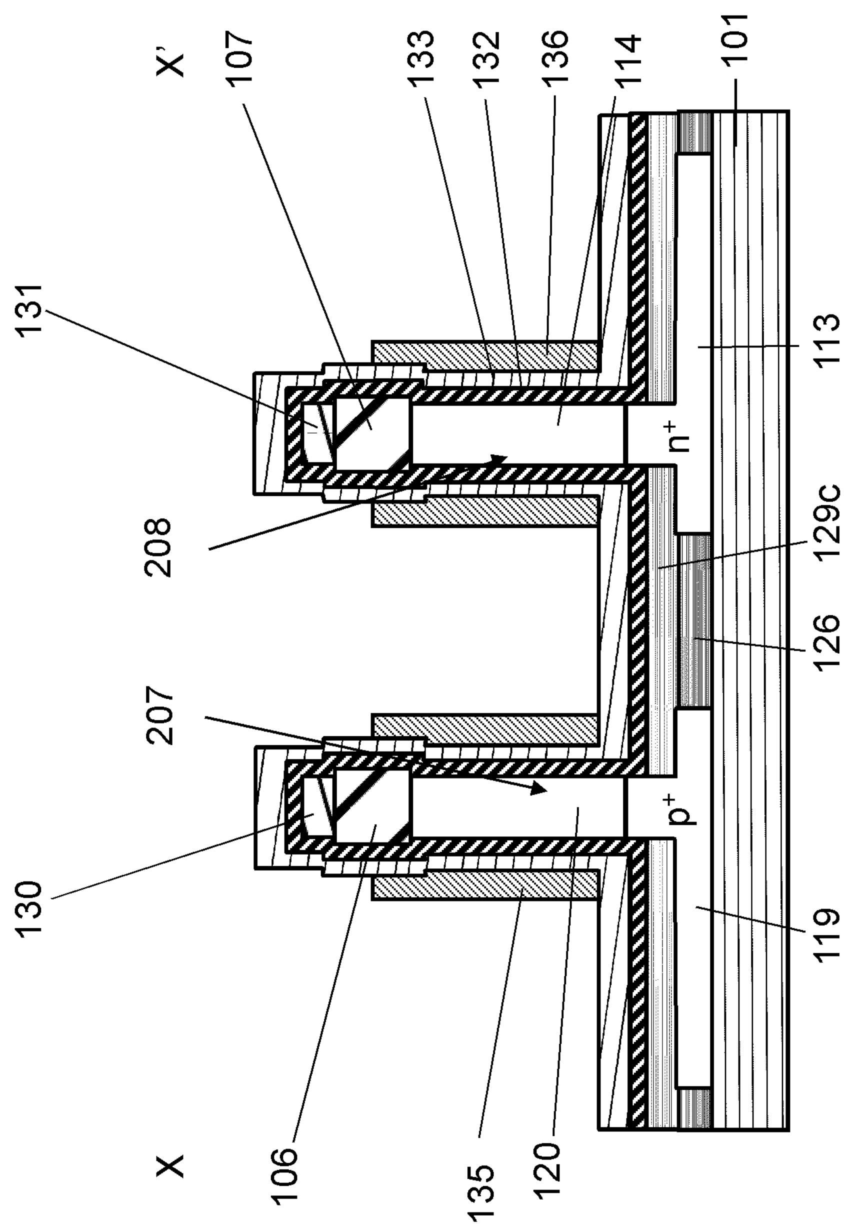
FIG. 71B is a cross-sectional diagram taken in the line X-X' of FIG. 71A.
Figure 72A:
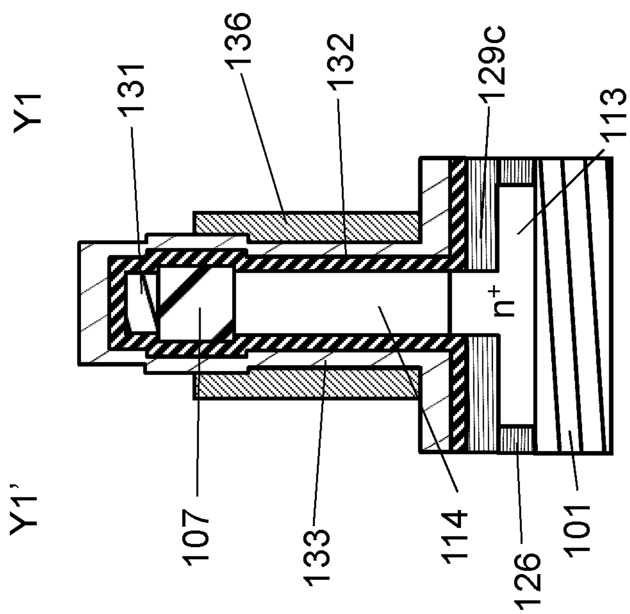
FIG. 72A is a cross-sectional diagram taken in the line Y1-Y1' of FIG. 71A.
Figure 72B:
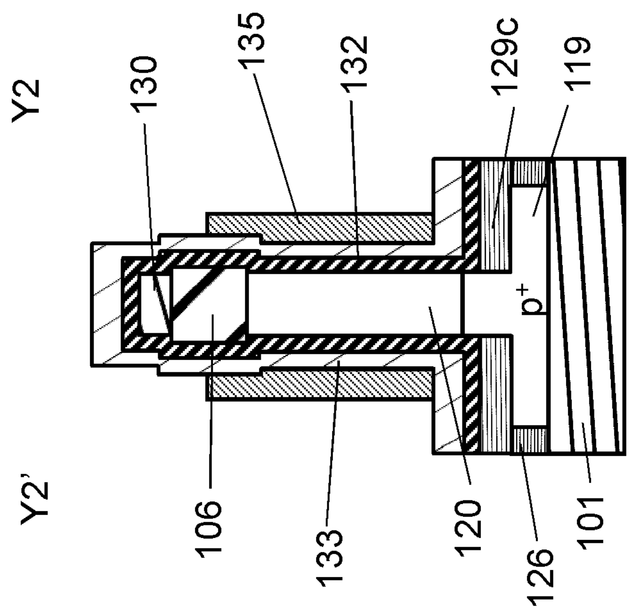
FIG. 72B is a cross-sectional diagram taken in the line Y2-Y2' of FIG. 71A.
Figure 73A:
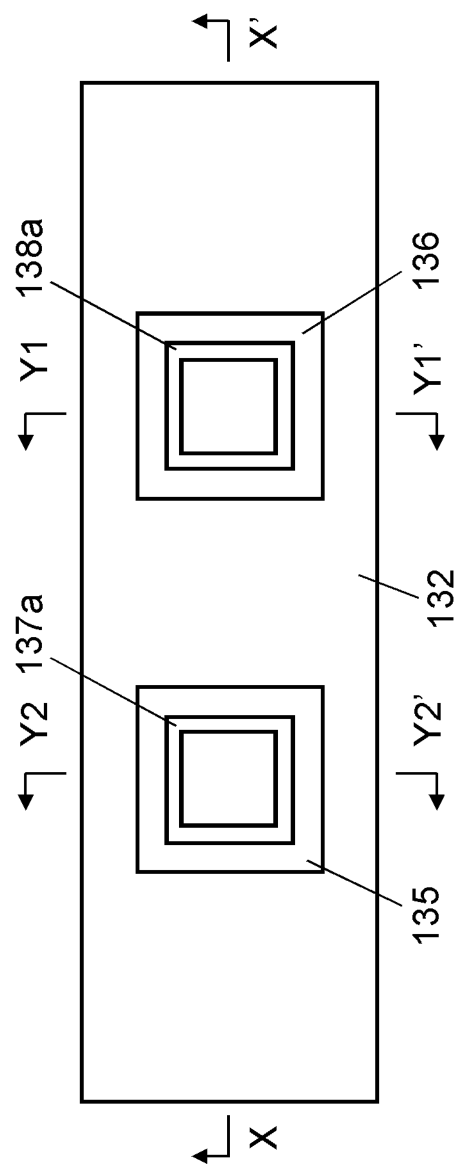
FIG. 73A is a top view for explaining the fabrication method of the semiconductor device according to the first embodiment.
Figure 73B:
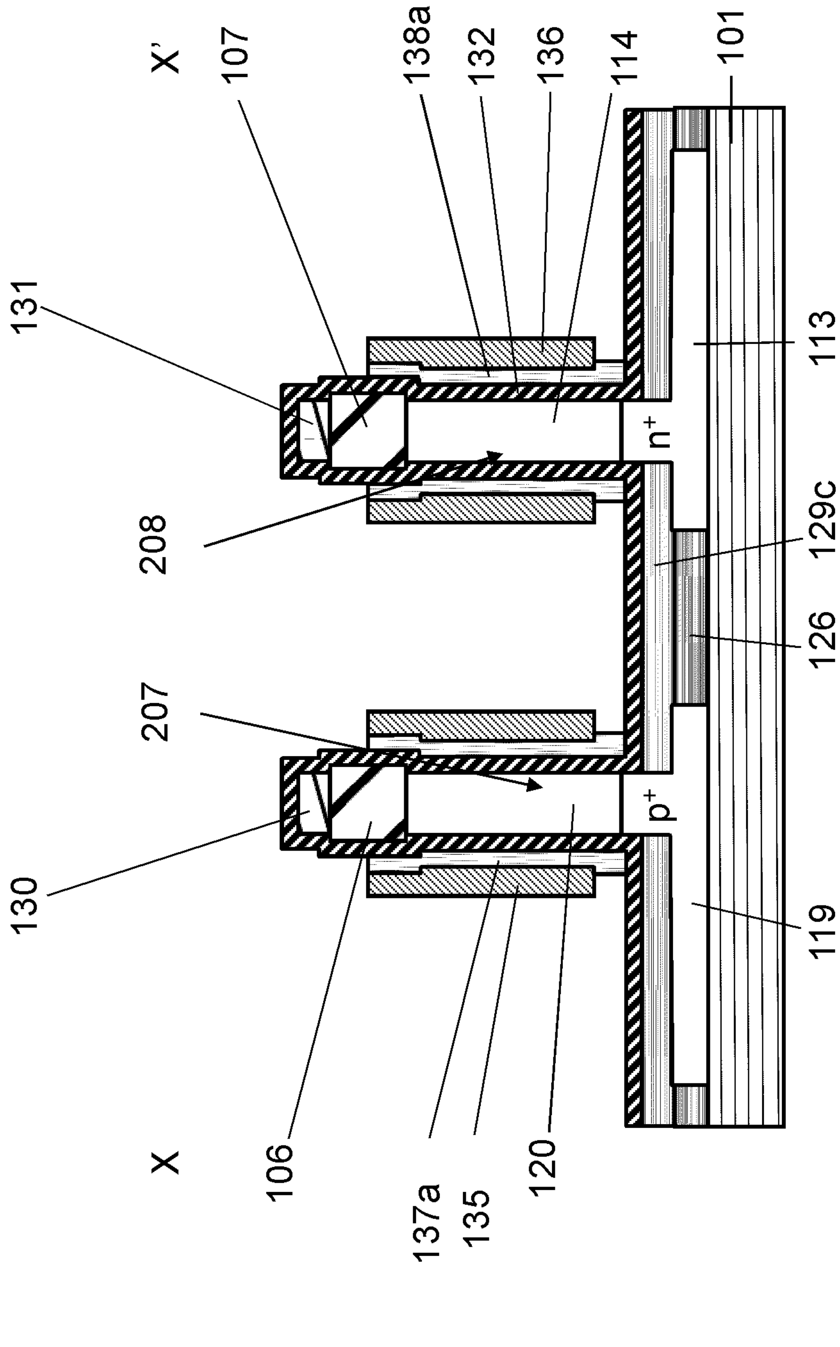
FIG. 73B is a cross-sectional diagram taken in the line X-X' of FIG. 73A.
Figure 74A:
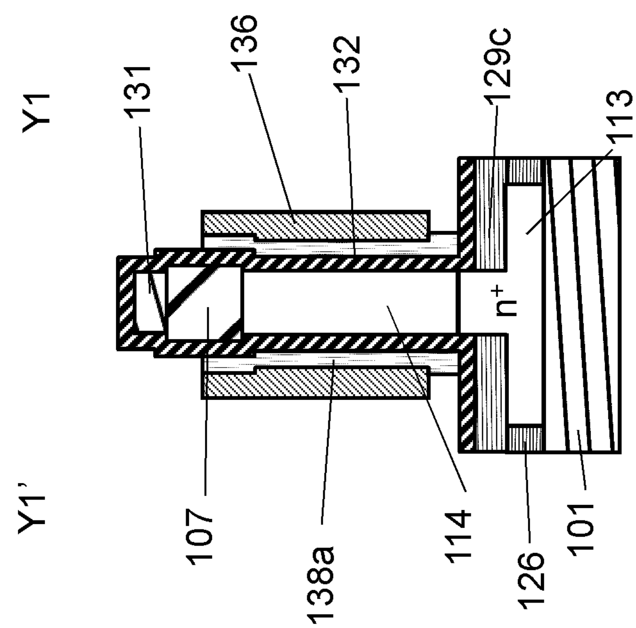
FIG. 74A is a cross-sectional diagram taken in the line Y1-Y1' of FIG. 73A.
Figure 74B:
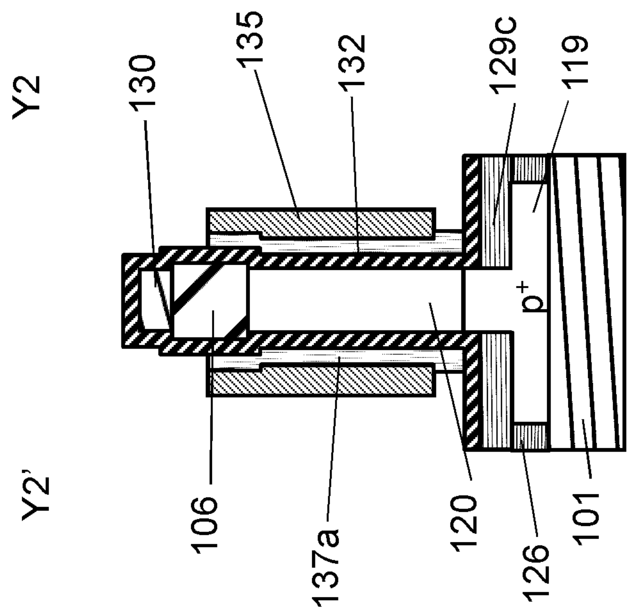
FIG. 74B is a cross-sectional diagram taken in the line Y2-Y2' of FIG. 73A.
Figure 75A:
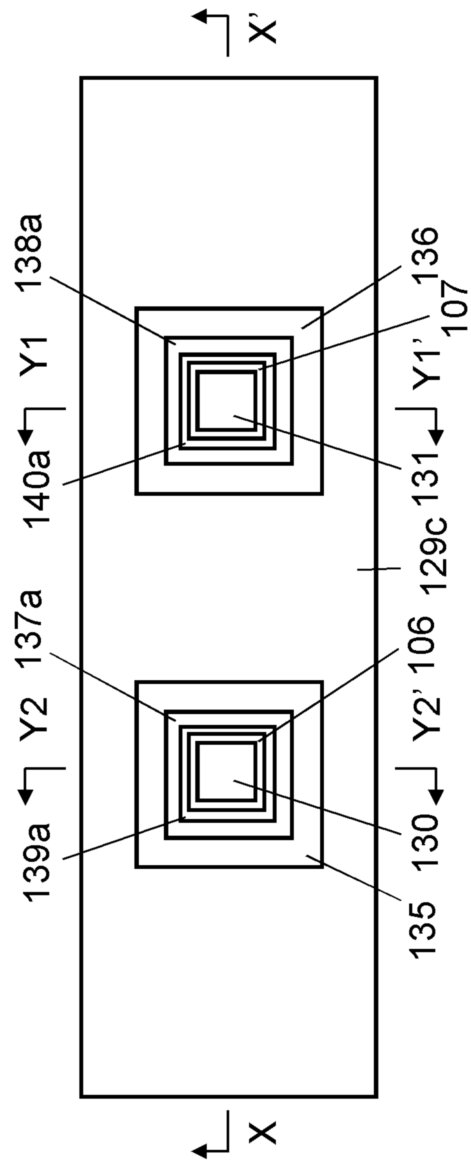
FIG. 75A is a top view for explaining the fabrication method of the semiconductor device according to the first embodiment.
Figure 75B:
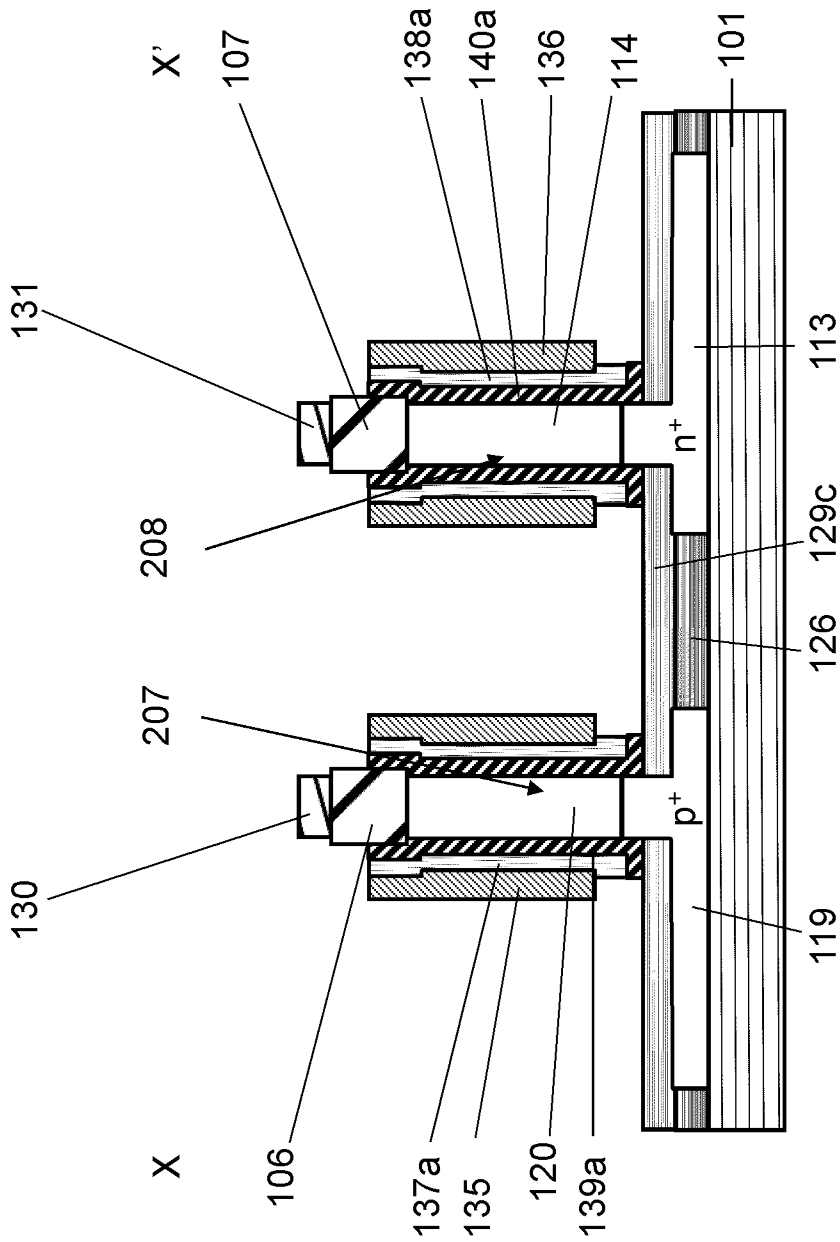
FIG. 75B is a cross-sectional diagram taken in the line X-X' of FIG. 75A.
Figure 76A:
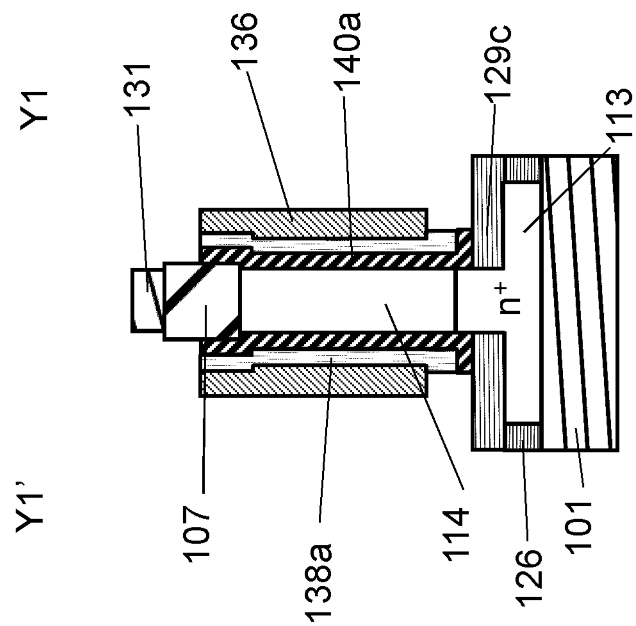
FIG. 76A is a cross-sectional diagram taken in the line Y1-Y1' of FIG. 75A.
Figure 76B:
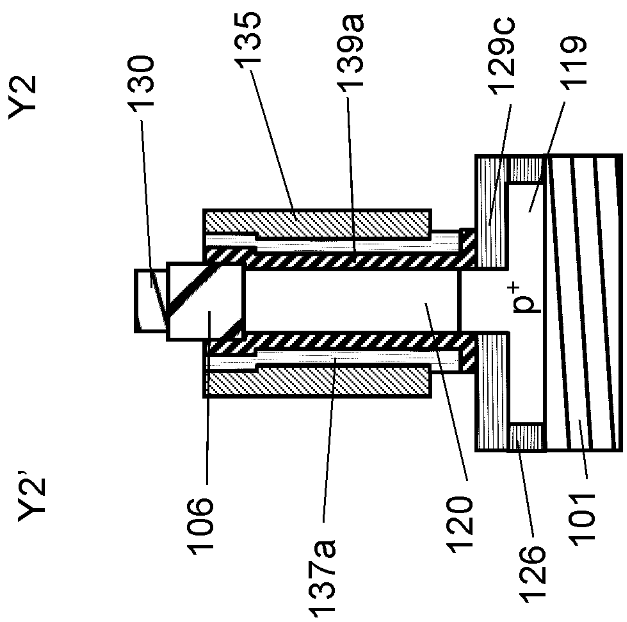
FIG. 76B is a cross-sectional diagram taken in the line Y2-Y2' of FIG. 75A.
Figure 77A:
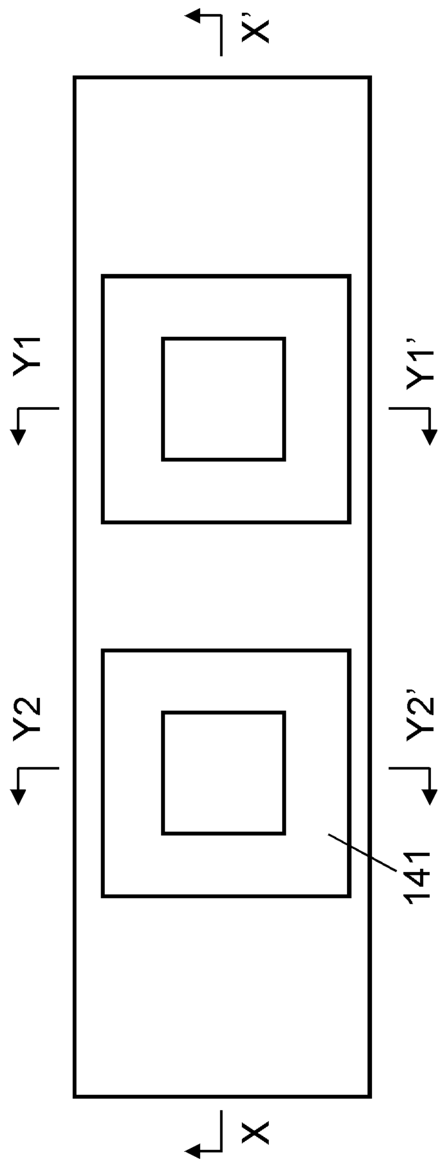
FIG. 77A is a top view for explaining the fabrication method of the semiconductor device according to the first embodiment.
Figure 77B:
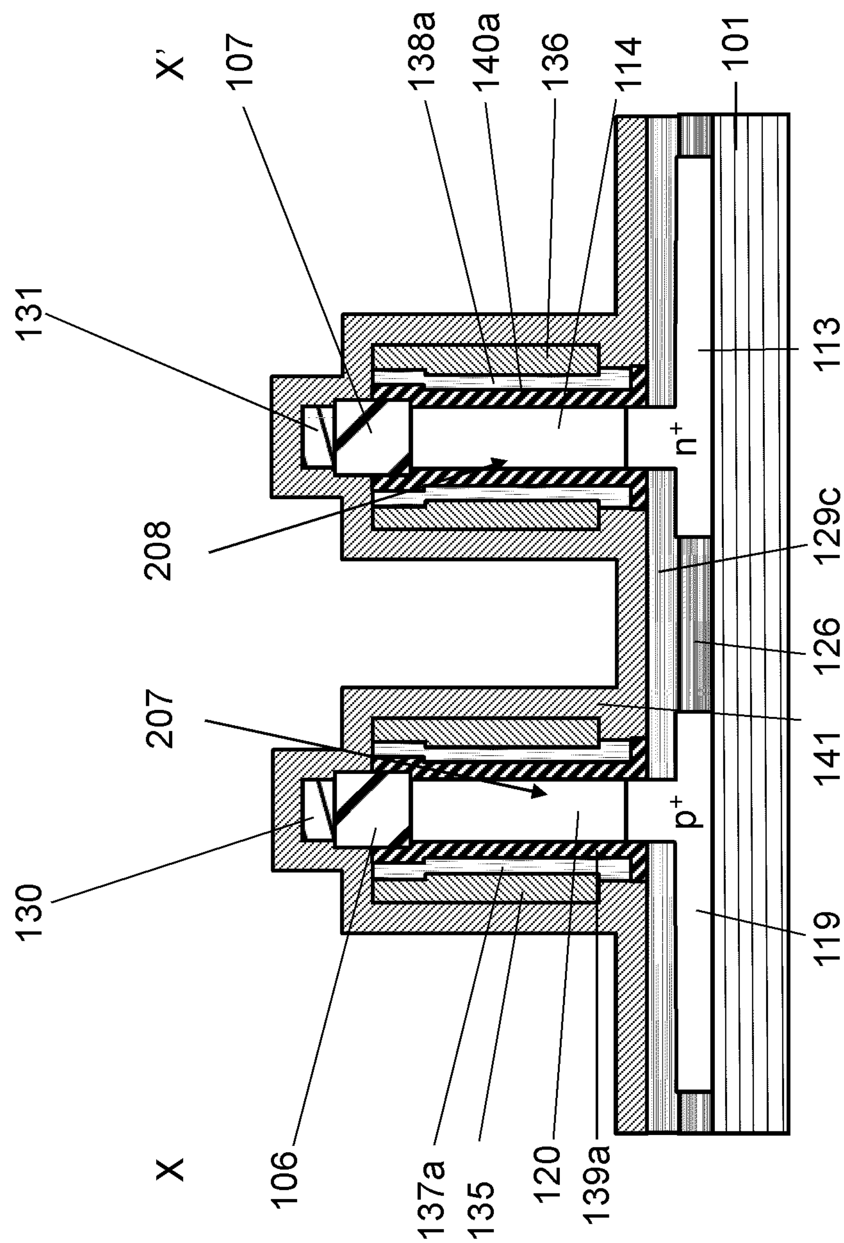
FIG. 77B is a cross-sectional diagram taken in the line X-X' of FIG. 77A.
Figure 78A:
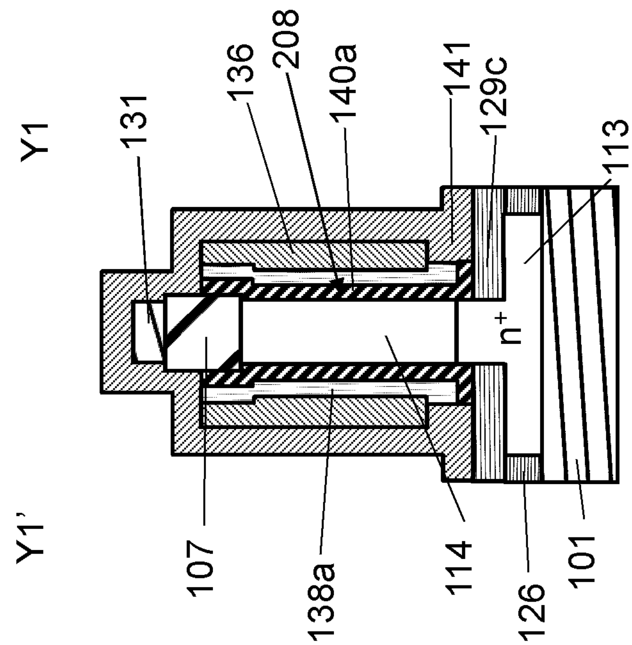
FIG. 78A is a cross-sectional diagram taken in the line Y1-Y1' of FIG. 77A.
Figure 78B:
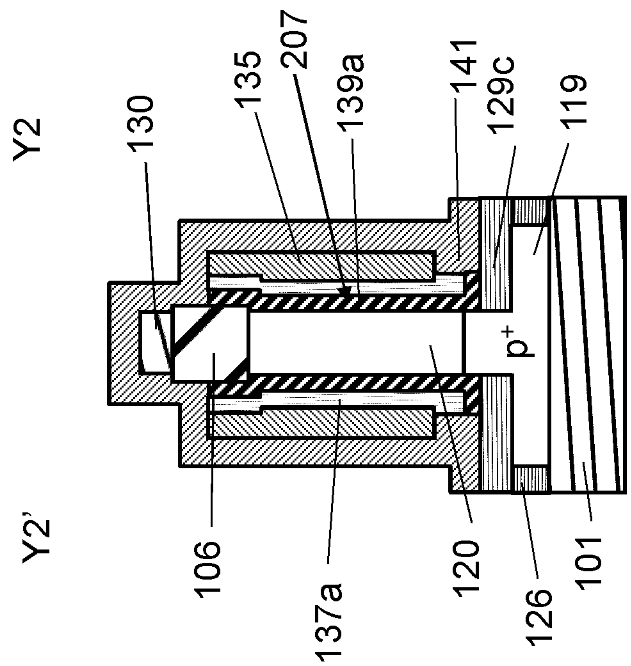
FIG. 78B is a cross-sectional diagram taken in the line Y2-Y2' of FIG. 77A.
Figure 79A:
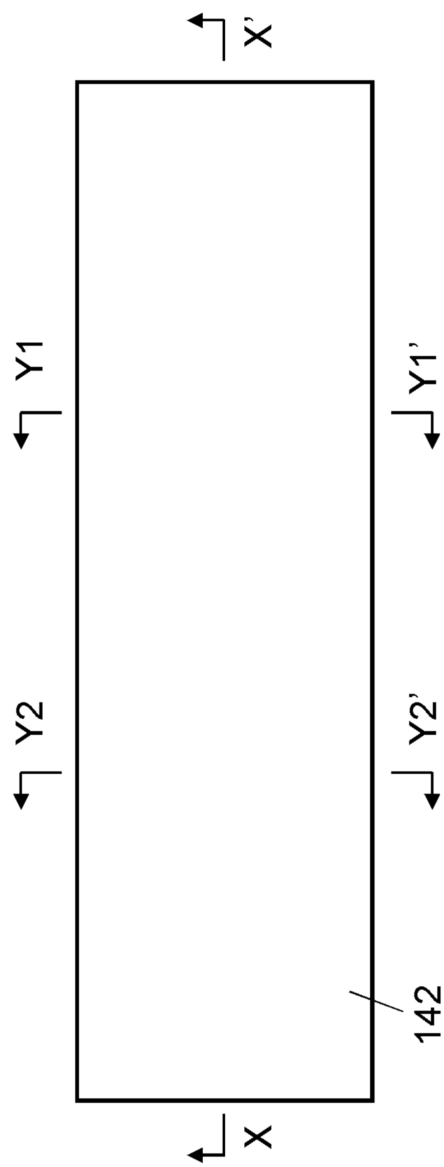
FIG. 79A is a top view for explaining the fabrication method of the semiconductor device according to the first embodiment.
Figure 79B:
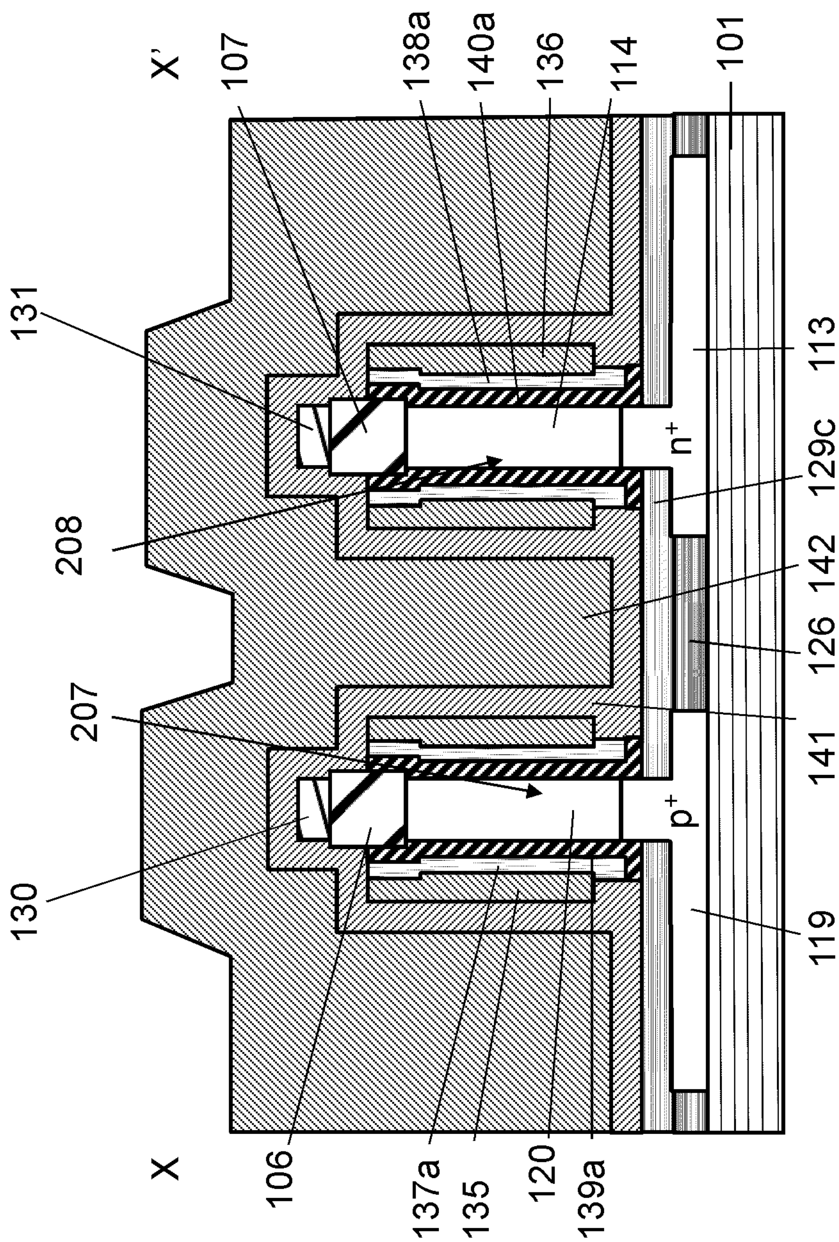
FIG. 79B is a cross-sectional diagram taken in the line X-X' of FIG. 79A.
Figure 80A:
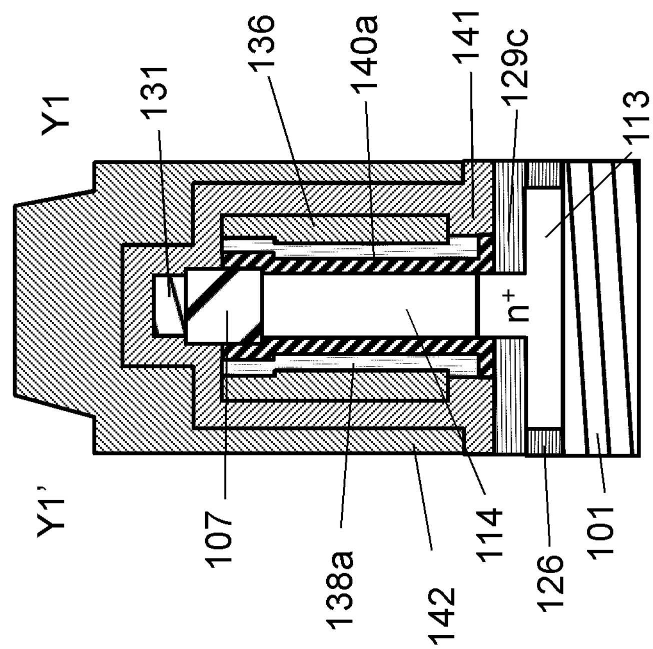
FIG. 80A is a cross-sectional diagram taken in the line Y1-Y1' of FIG. 79A.
Figure 80B:
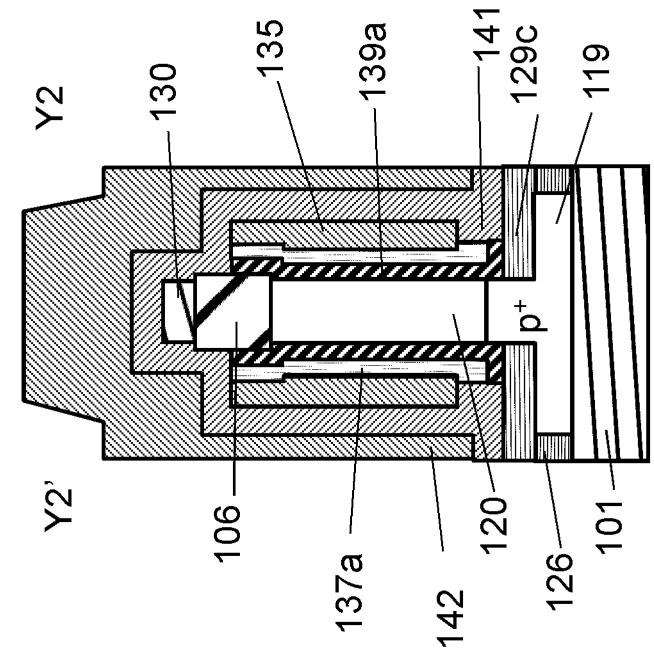
FIG. 80B is a cross-sectional diagram taken in the line Y2-Y2' of FIG. 79A.
Figure 81A:
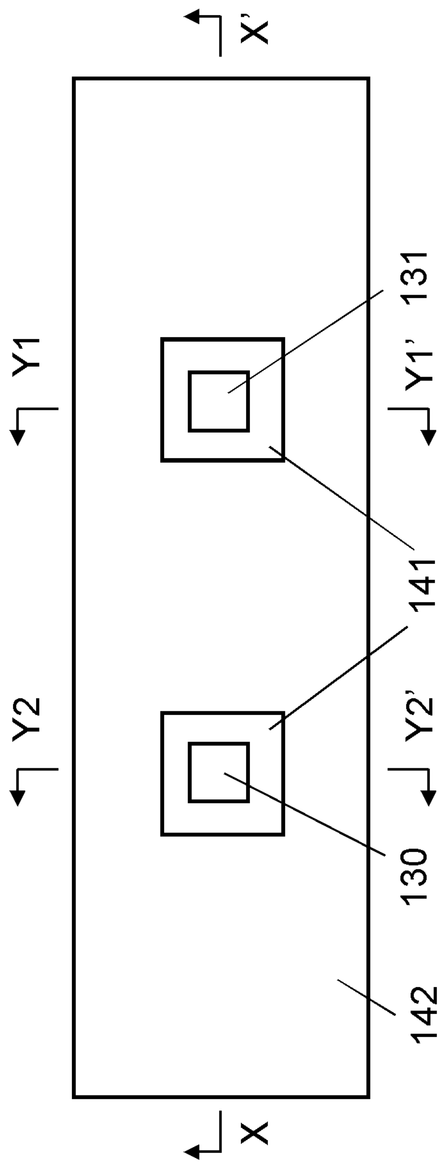
FIG. 81A is a top view for explaining the fabrication method of the semiconductor device according to the first embodiment.
Figure 81B:
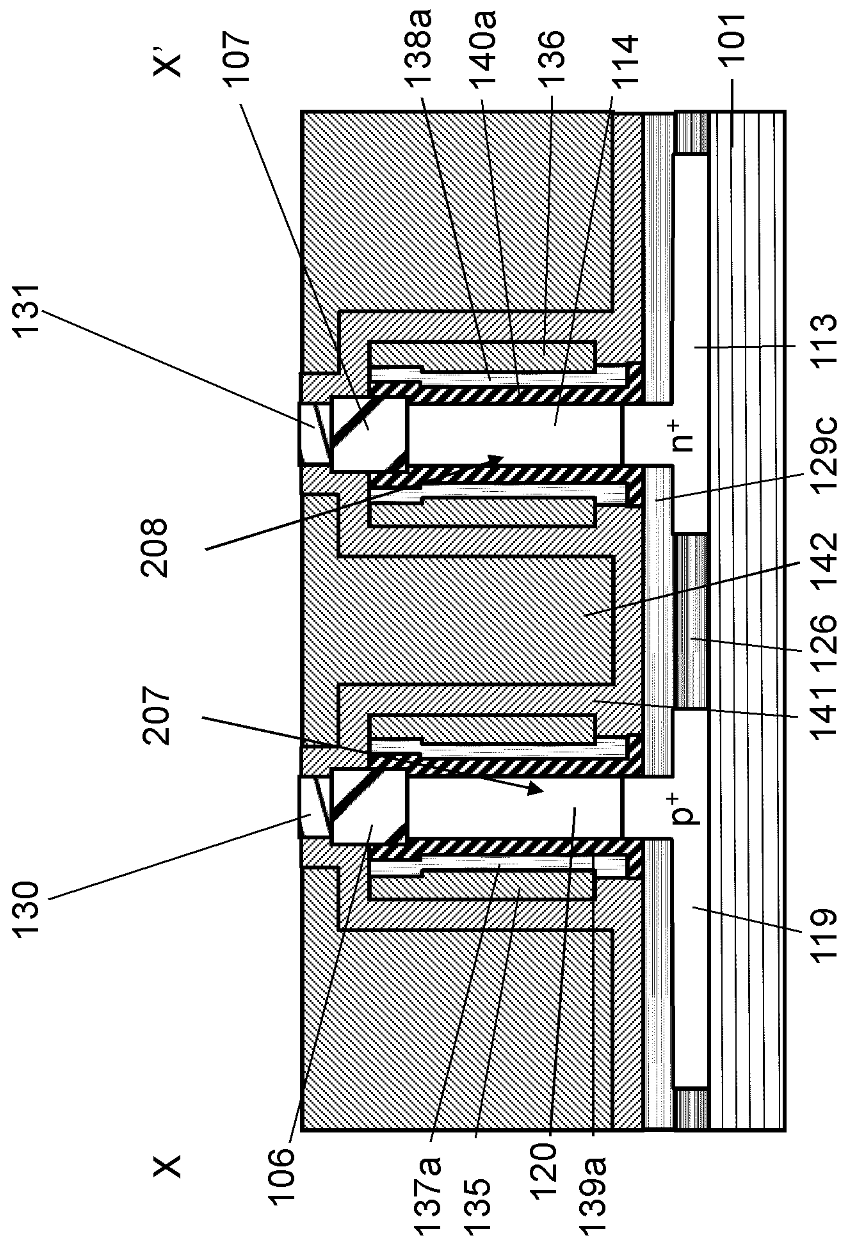
FIG. 81B is a cross-sectional diagram taken in the line X-X' of FIG. 81A.
Figure 82A:
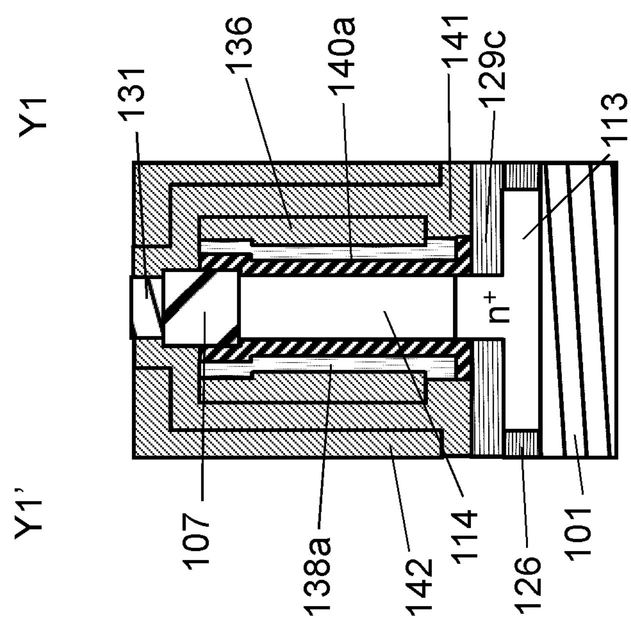
FIG. 82A is a cross-sectional diagram taken in the line Y1-Y1' of FIG. 81A.
Figure 82B:
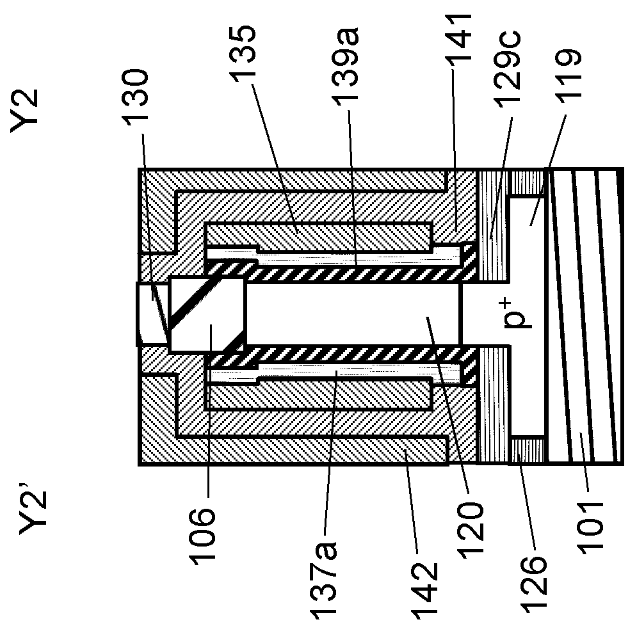
FIG. 82B is a cross-sectional diagram taken in the line Y2-Y2' of FIG. 81A.
Figure 83A:
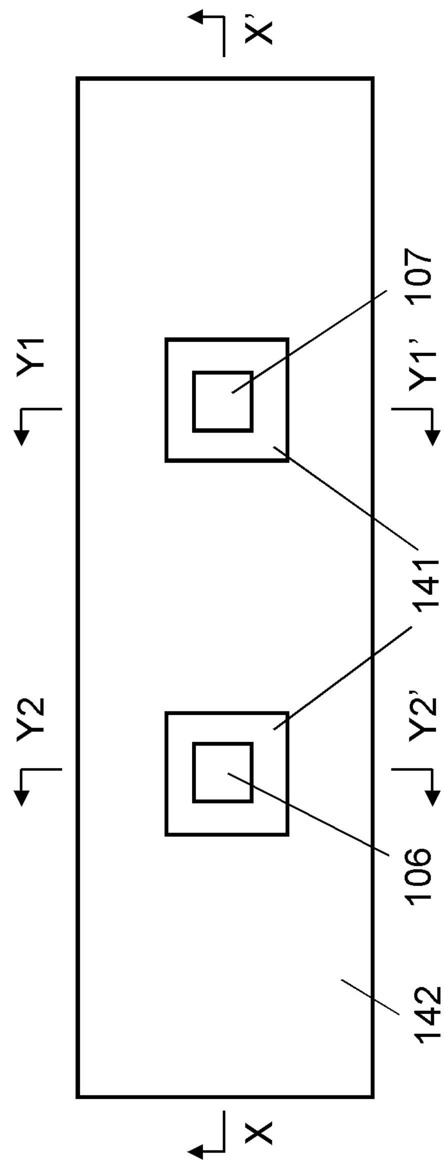
FIG. 83A is a top view for explaining the fabrication method of the semiconductor device according to the first embodiment.
Figure 83B:
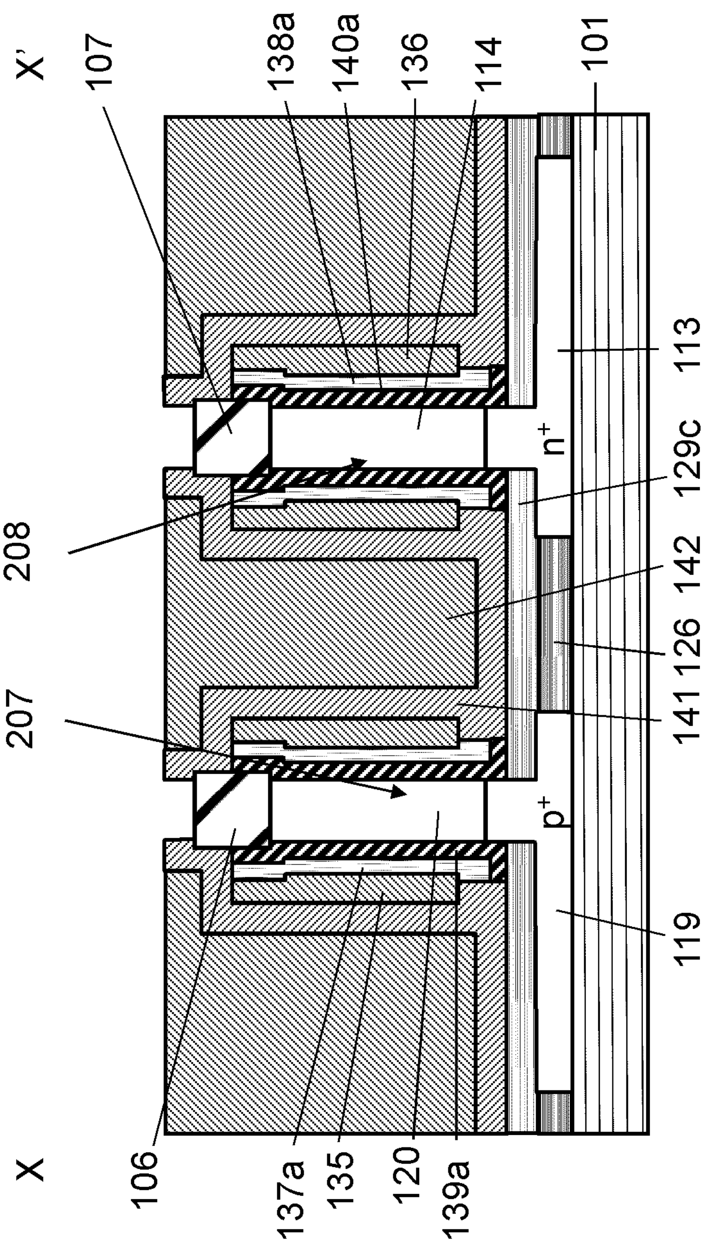
FIG. 83B is a cross-sectional diagram taken in the line X-X' of FIG. 83A.
Figure 84A:
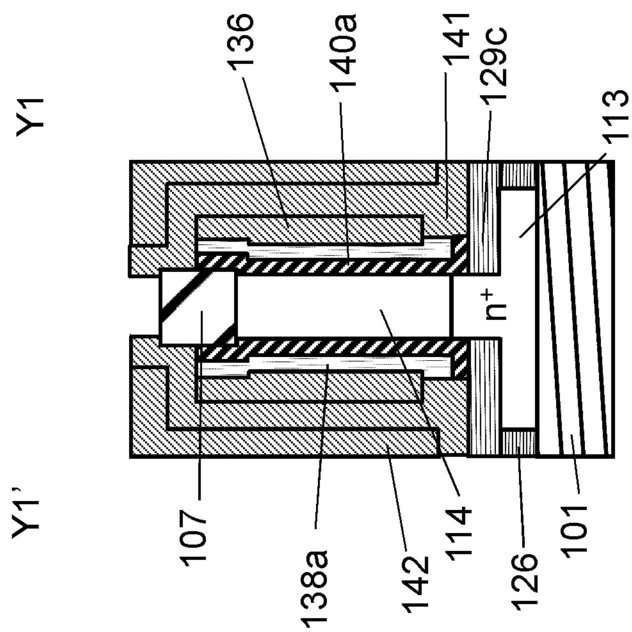
FIG. 84A is a cross-sectional diagram taken in the line Y1-Y1' of FIG. 83A.
Figure 84B:
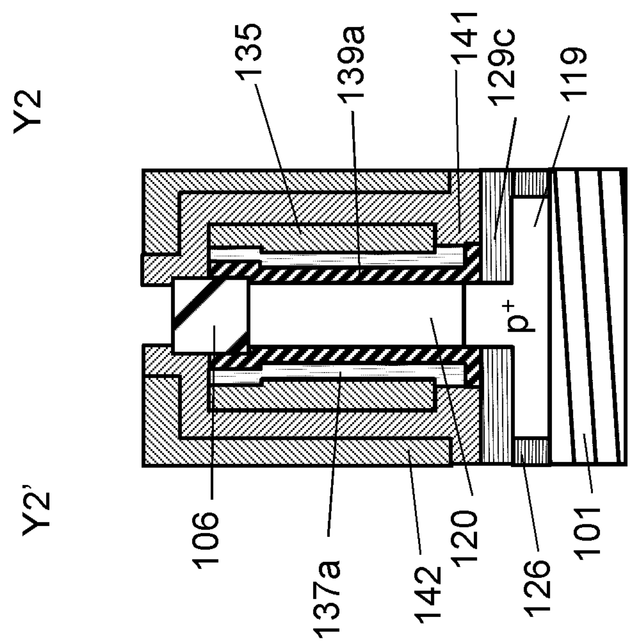
FIG. 84B is a cross-sectional diagram taken in the line Y2-Y2' of FIG. 83A.
Figure 85A:
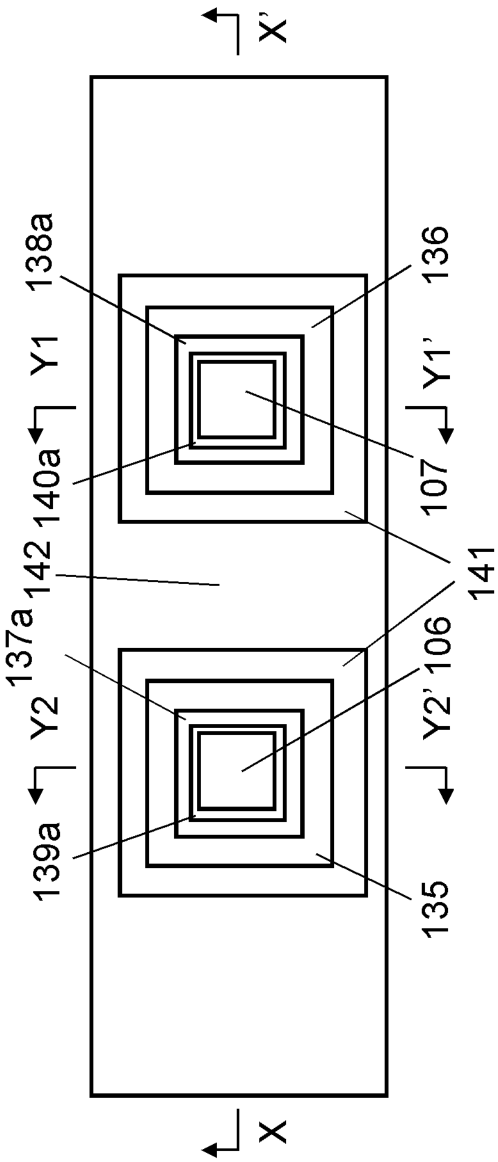
FIG. 85A is a top view for explaining the fabrication method of the semiconductor device according to the first embodiment.
Figure 85B:
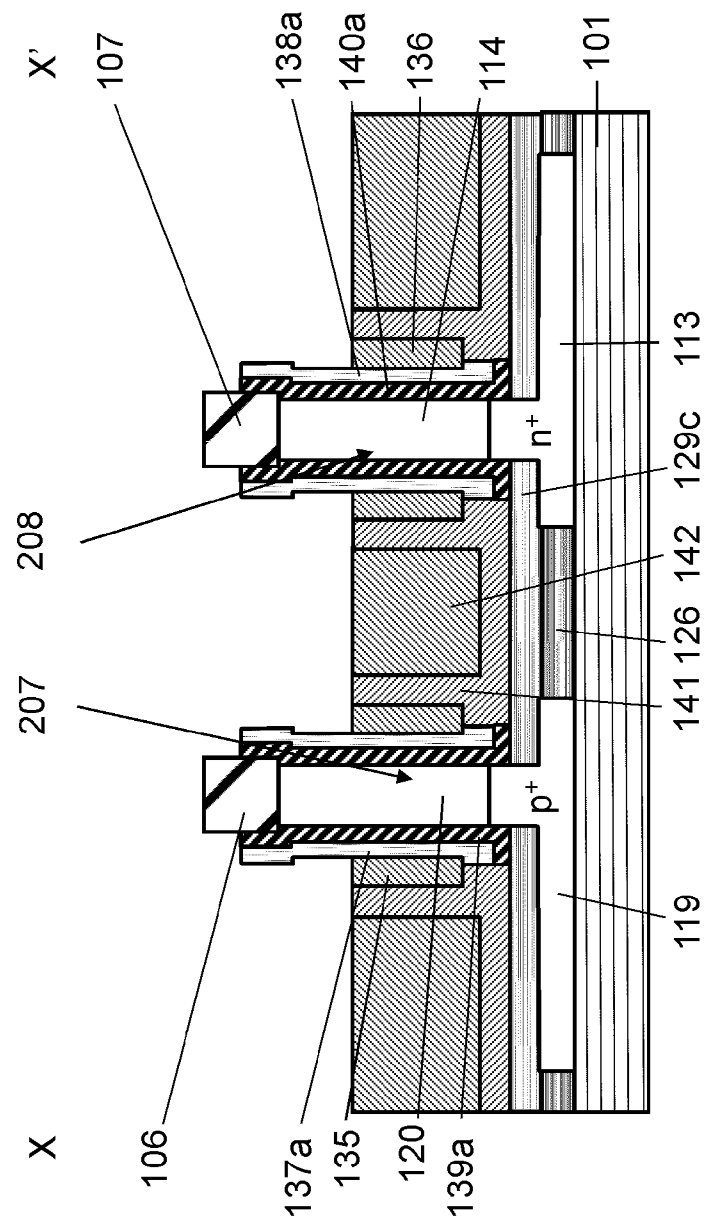
FIG. 85B is a cross-sectional diagram taken in the line X-X' of FIG. 85A.
Figure 86A:
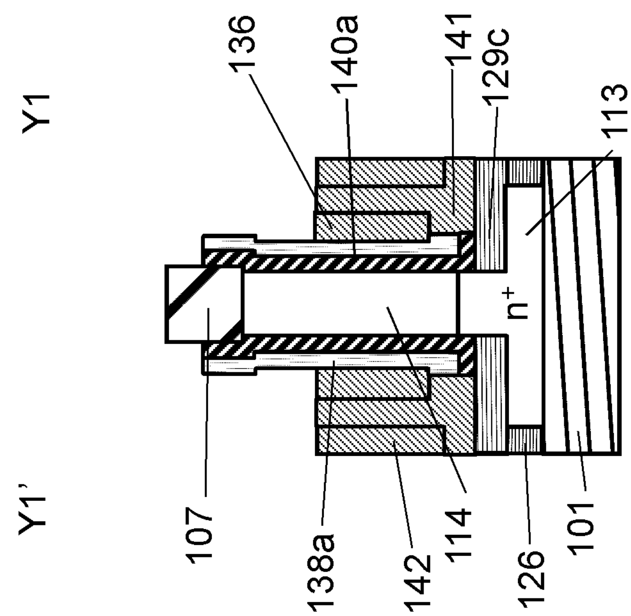
FIG. 86A is a cross-sectional diagram taken in the line Y1-Y1' of FIG. 85A.
Figure 86B:
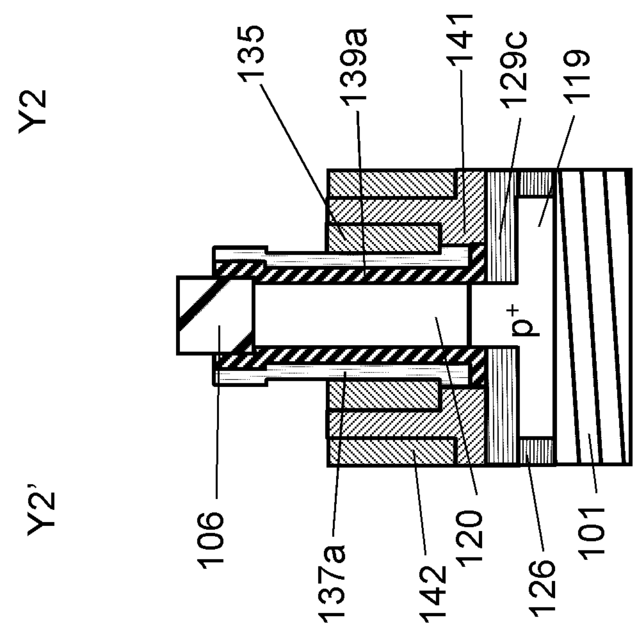
FIG. 86B is a cross-sectional diagram taken in the line Y2-Y2' of FIG. 85A.
Figure 87A:
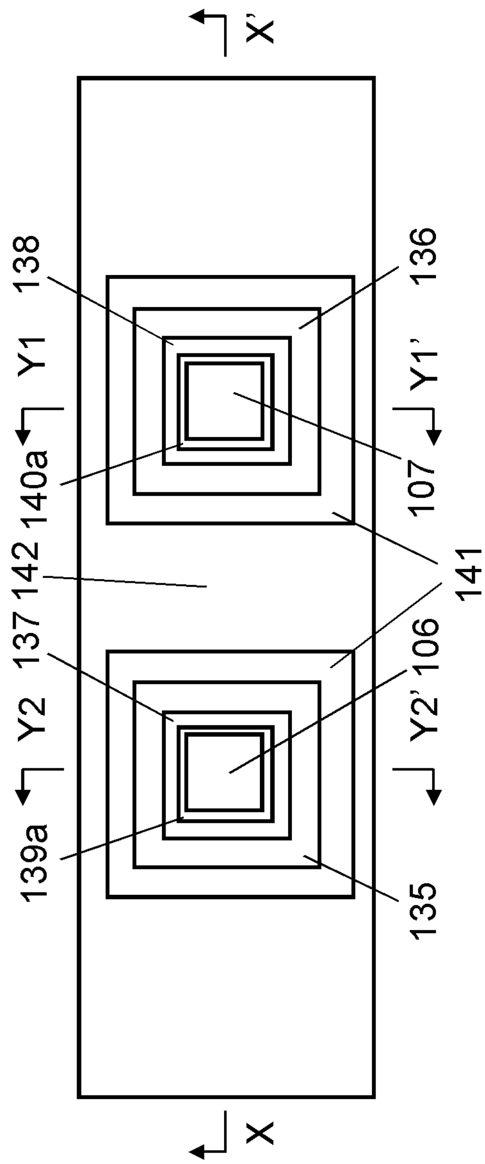
FIG. 87A is a top view for explaining the fabrication method of the semiconductor device according to the first embodiment.
Figure 87B:
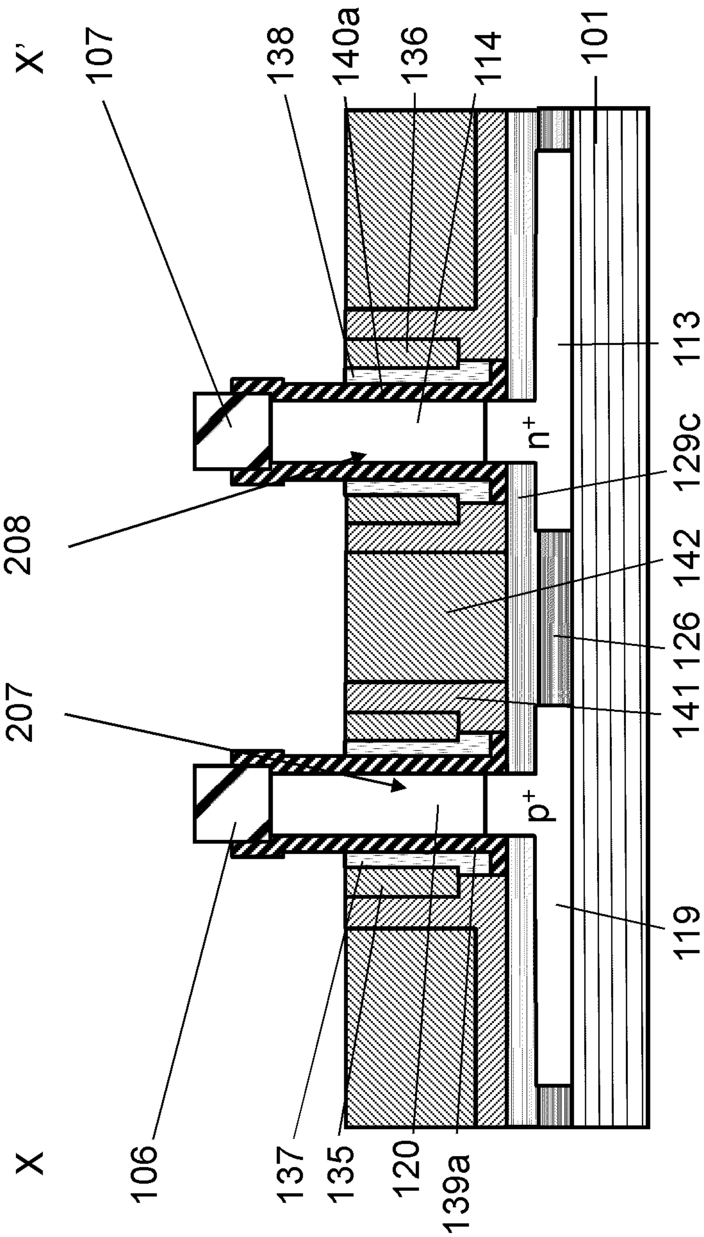
FIG. 87B is a cross-sectional diagram taken in the line X-X' of FIG. 87A.
Figure 88A:
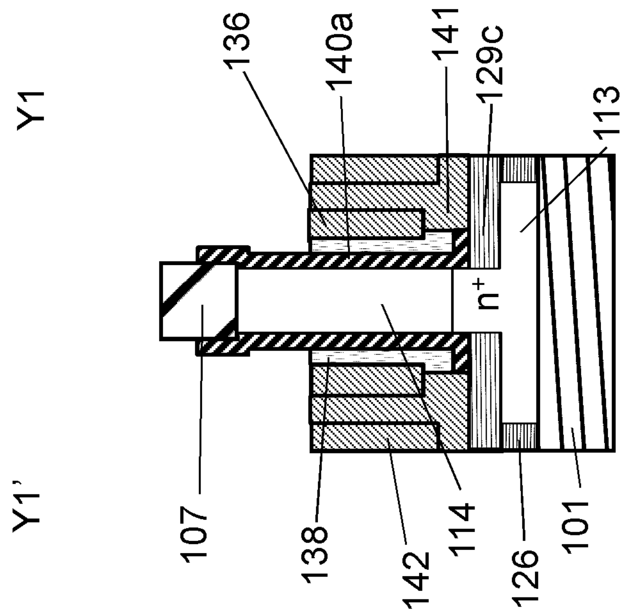
FIG. 88A is a cross-sectional diagram taken in the line Y1-Y1' of FIG. 87A.
Figure 88B:
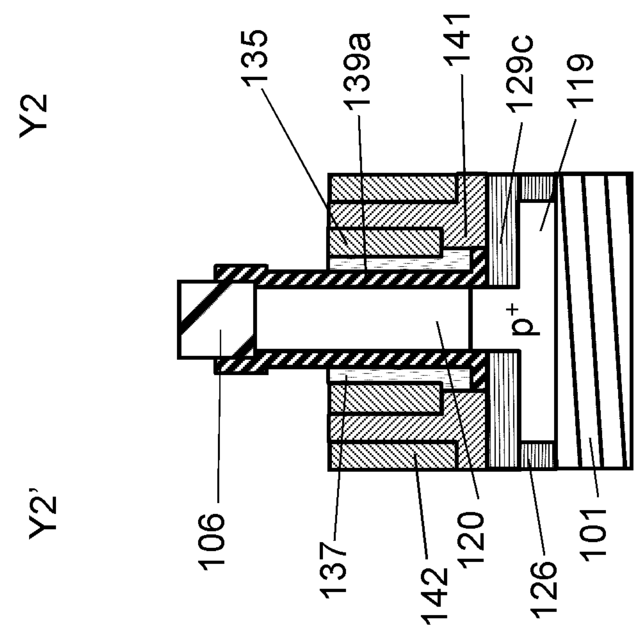
FIG. 88B is a cross-sectional diagram taken in the line Y2-Y2' of FIG. 87A.
Figure 89A:
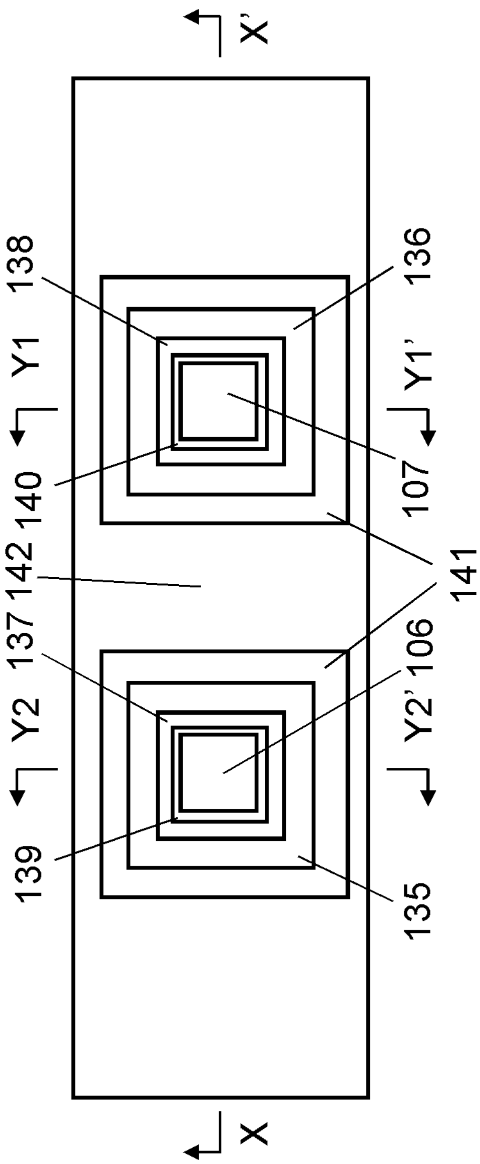
FIG. 89A is a top view for explaining the fabrication method of the semiconductor device according to the first embodiment.
Figure 89B:
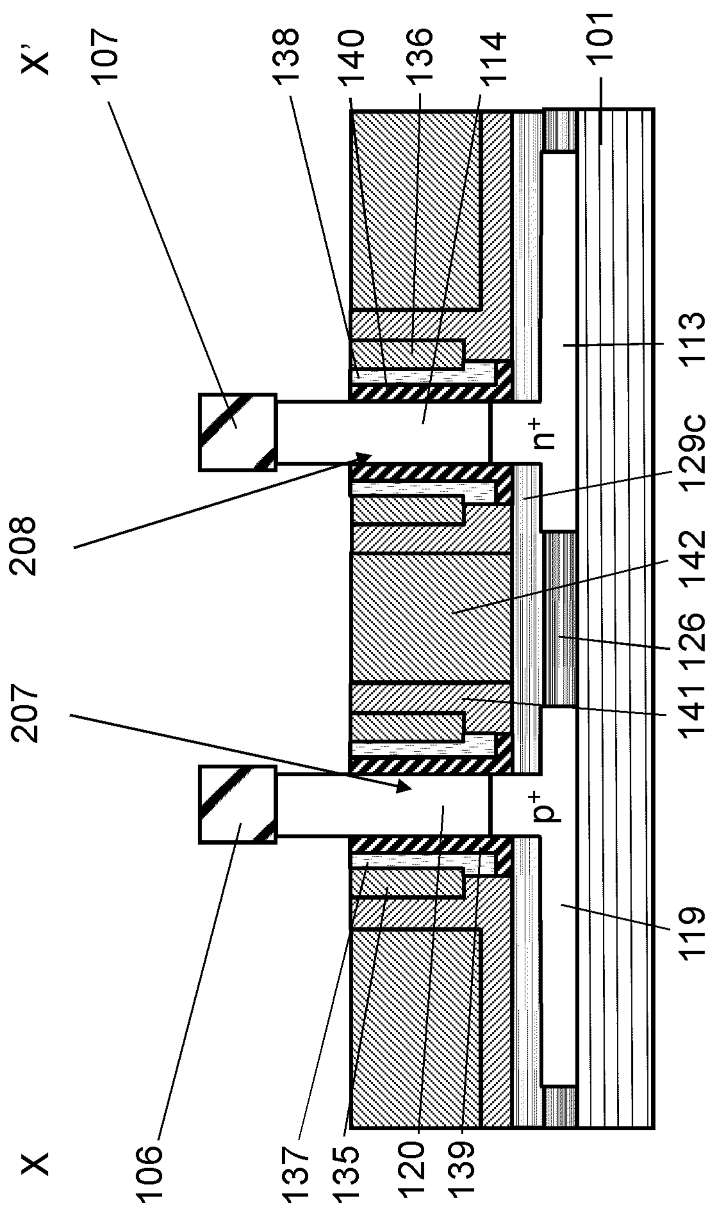
FIG. 89B is a cross-sectional diagram taken in the line X-X' of FIG. 89A.
Figure 90A:
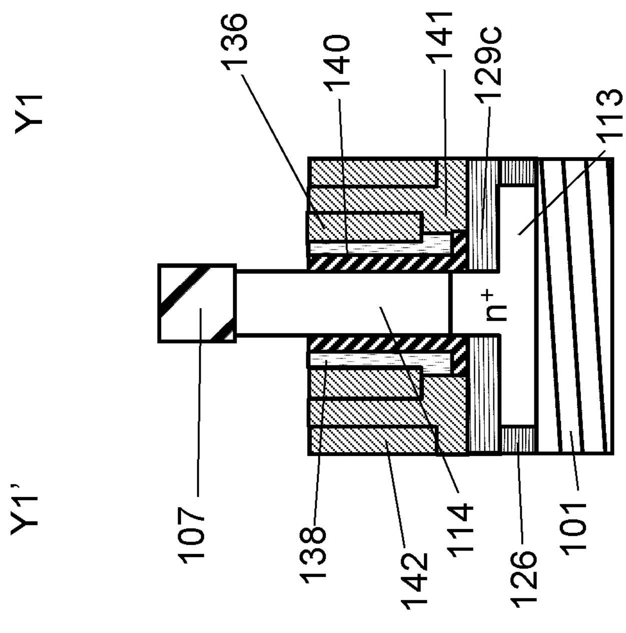
FIG. 90A is a cross-sectional diagram taken in the line Y1-Y1' of FIG. 89A.
Figure 90B:
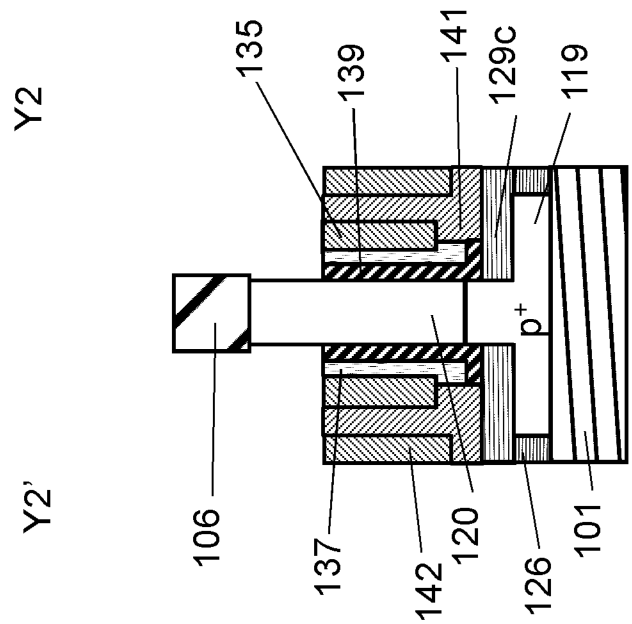
FIG. 90B is a cross-sectional diagram taken in the line Y2-Y2' of FIG. 89A.
Figure 91A:
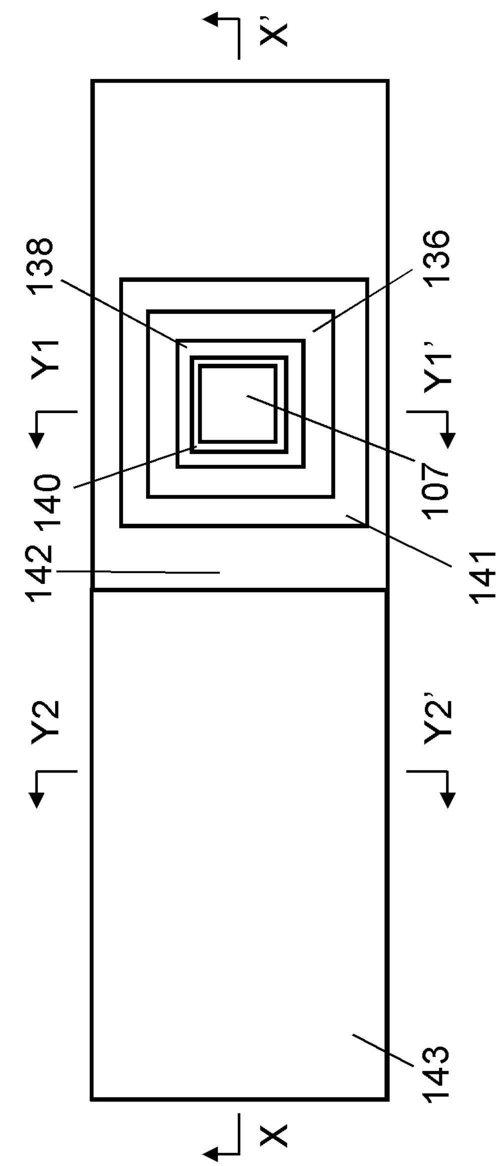
FIG. 91A is a top view for explaining the fabrication method of the semiconductor device according to the first embodiment.
Figure 91B:
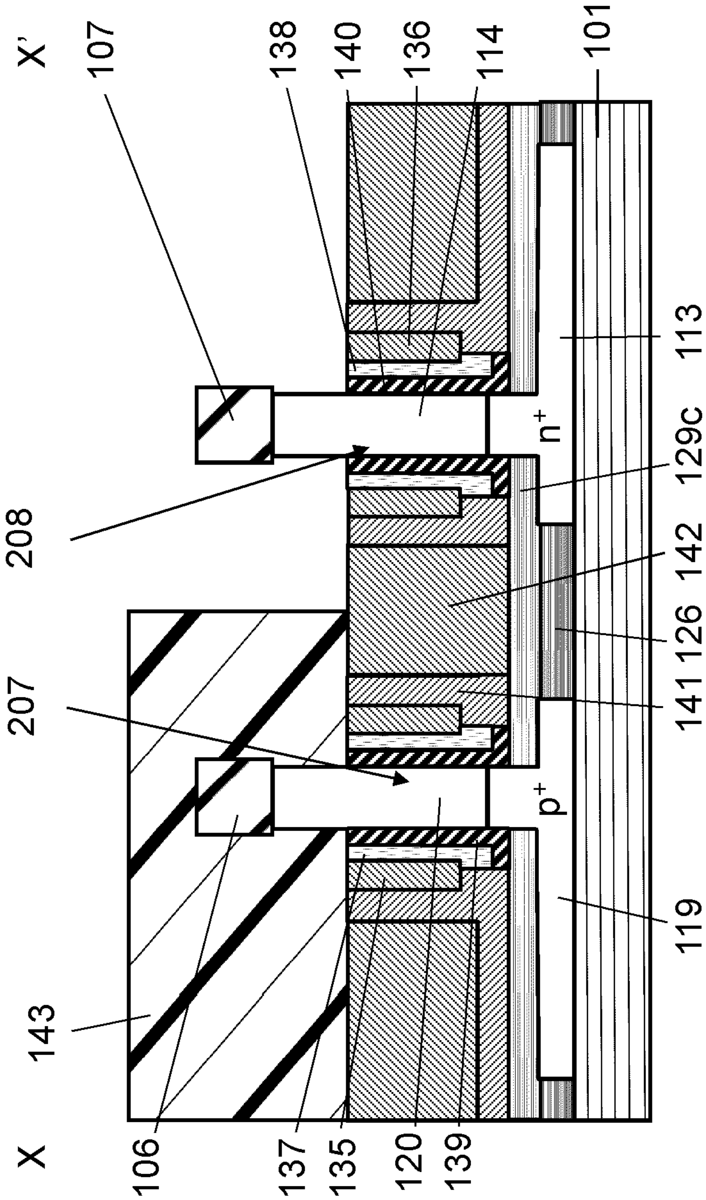
FIG. 91B is a cross-sectional diagram taken in the line X-X' of FIG. 91A.
Figure 92A:
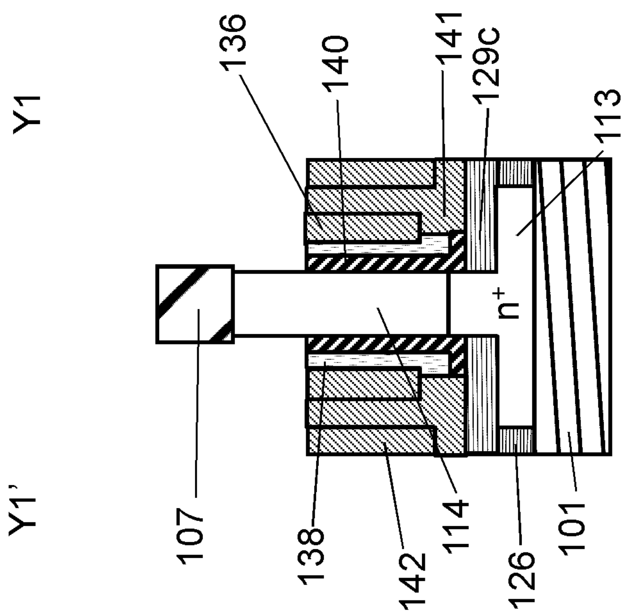
FIG. 92A is a cross-sectional diagram taken in the line Y1-Y1' of FIG. 91A.
Figure 92B:
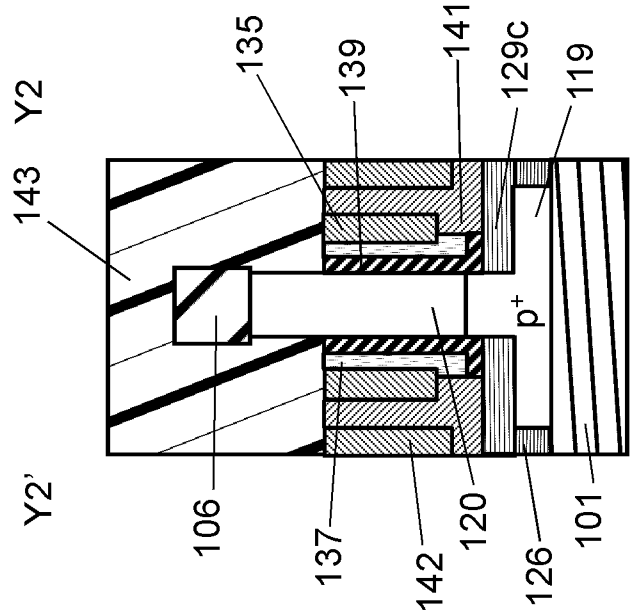
FIG. 92B is a cross-sectional diagram taken in the line Y2-Y2' of FIG. 91A.
Figure 145A:
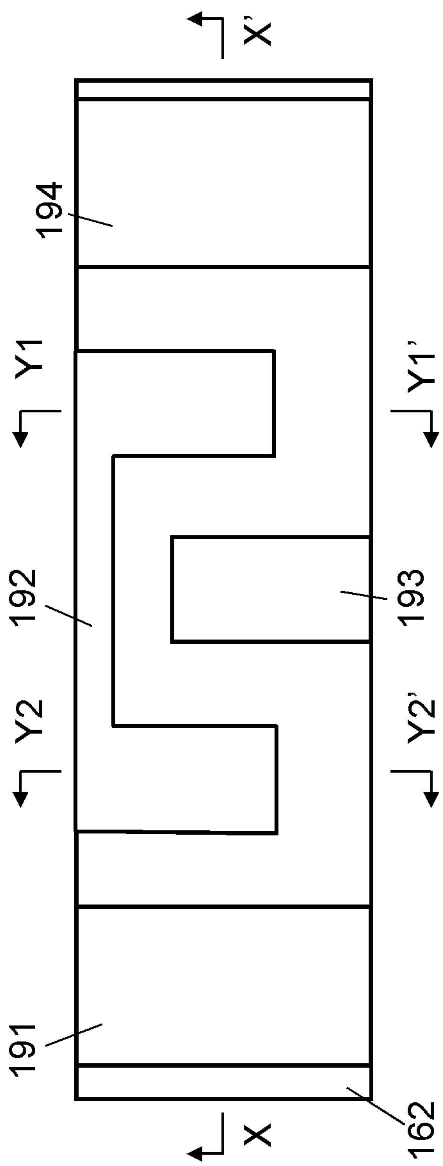
Figure 145B:
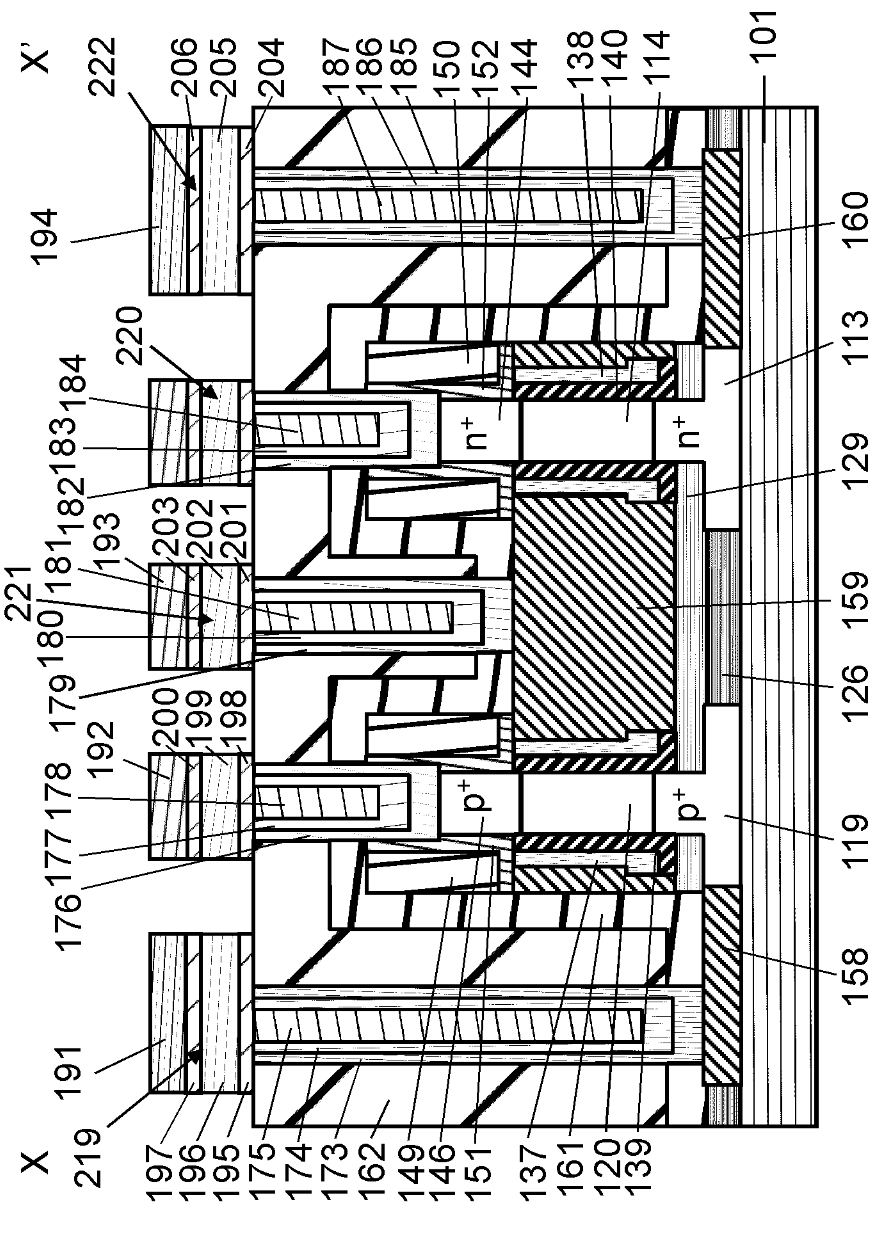

FIG. 145A is a top view for explaining the fabrication method of the semiconductor device according to the first embodiment, and FIG. 145B is a cross-sectional diagram taken in the line X-X' of FIG. 49A.

Figure 146A:
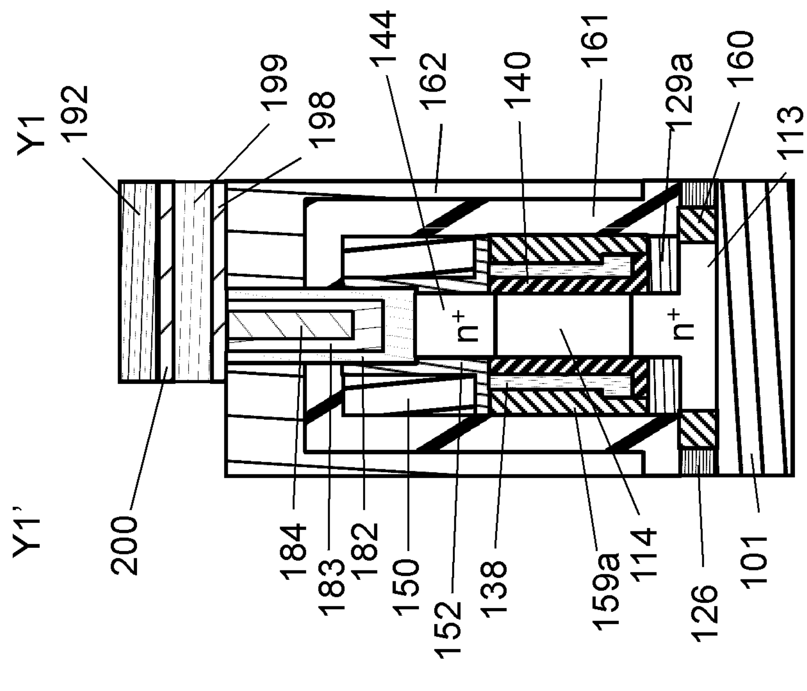
Figure 146B:
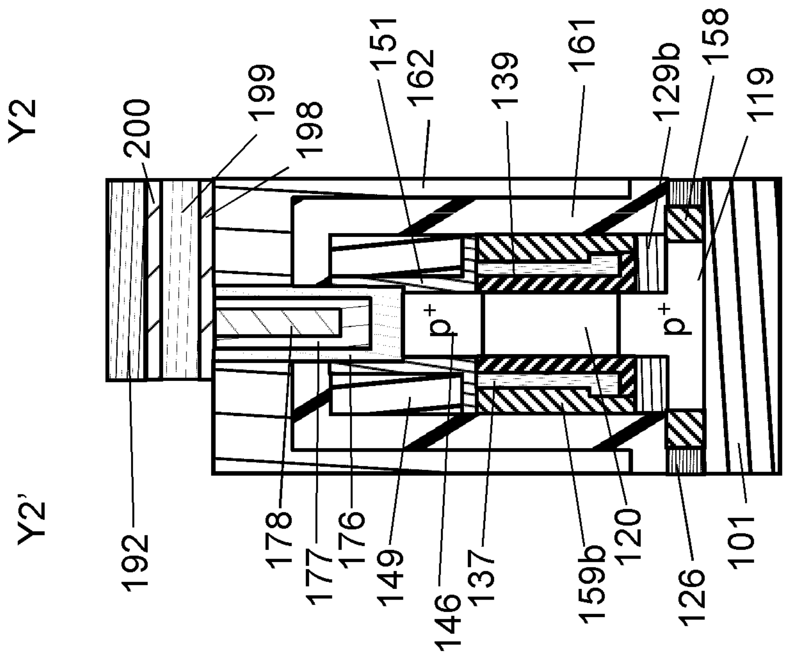

FIG. 146A is a cross-sectional diagram taken in the line Y1-Y1' of FIG. 145A, and FIG. 146B is a cross-sectional diagram taken in the line Y2-Y2' of FIG. 145A.

Figure 147A:
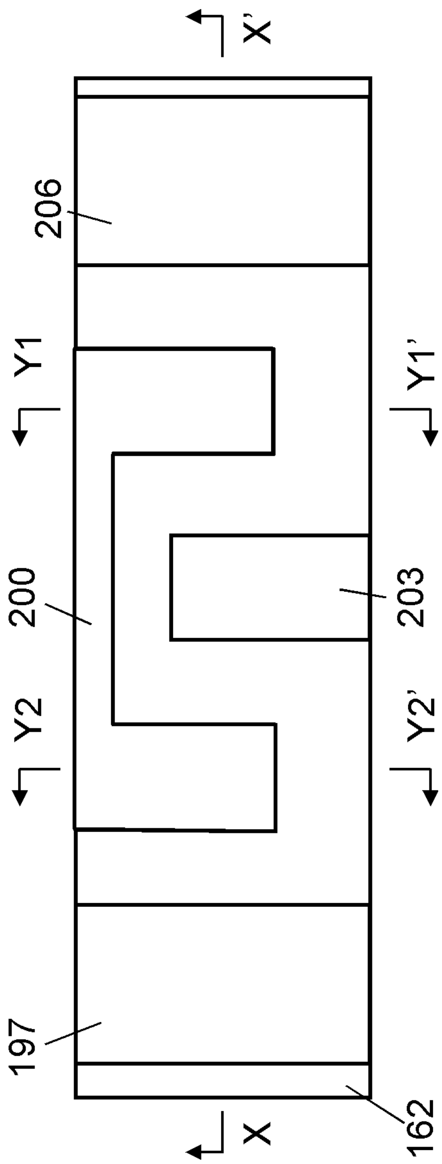
Figure 147B:
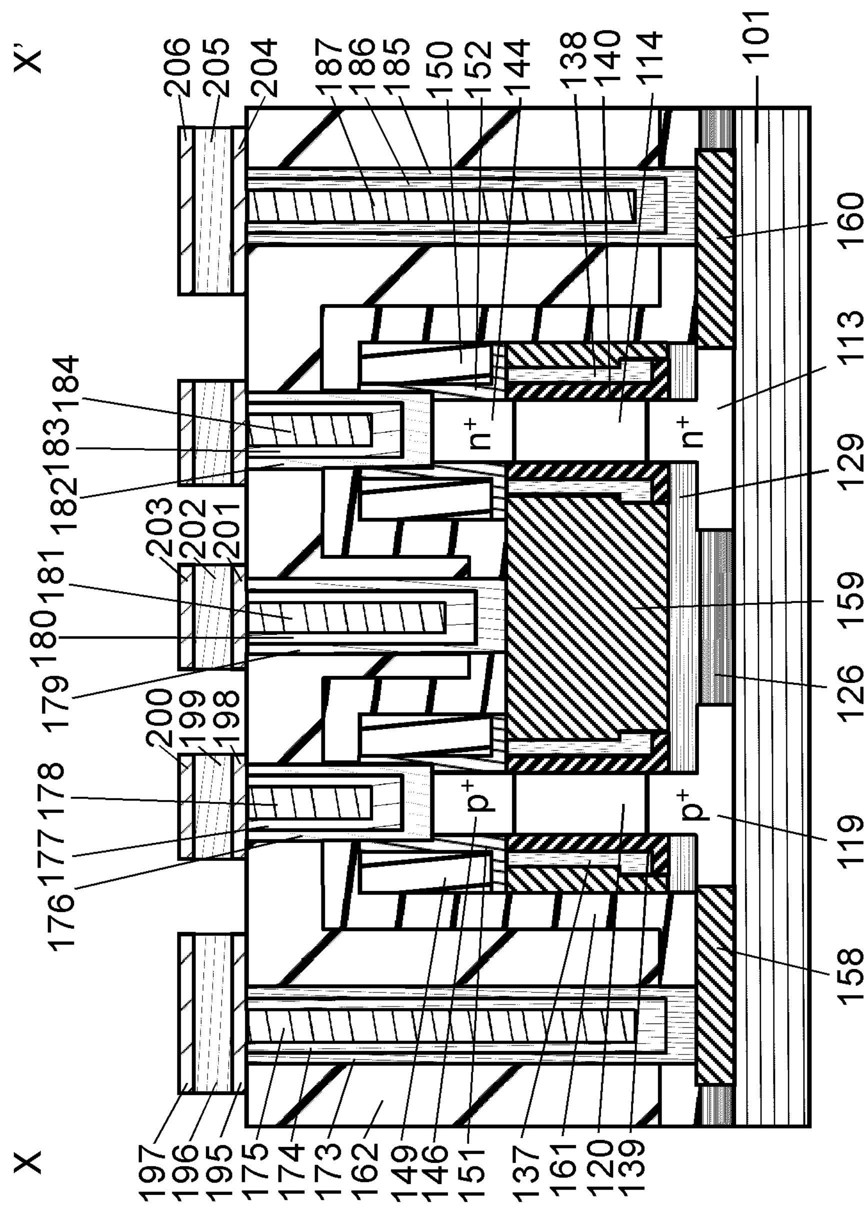

FIG. 147A is a top view for explaining the fabrication method of the semiconductor device according to the first embodiment, and FIG. 147B is a cross-sectional diagram taken in the line X-X' of FIG. 147A.

Figure 148A:
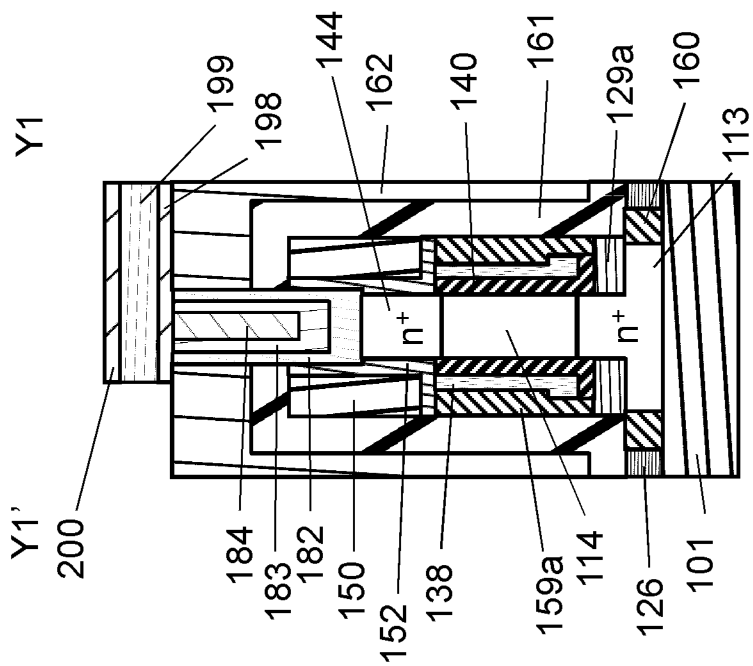
Figure 148B:
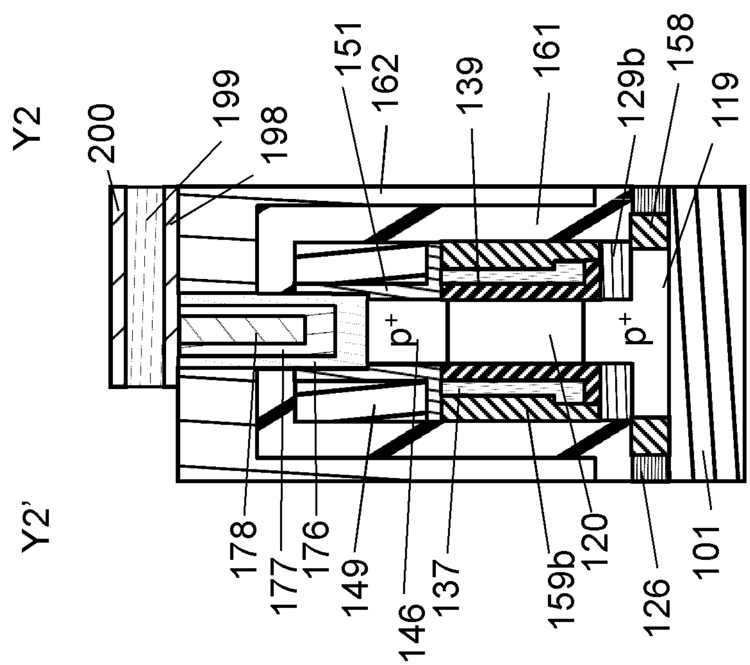

FIG. 148A is a cross-sectional diagram taken in the line Y1-Y1' of FIG. 147A, and FIG. 148B is a cross-sectional diagram taken in the line Y2-Y2' of FIG. 147

DETAILED DESCRIPTION OF THE PREFERRED EMBODIMENTS

First Embodiment

Figure 1A:
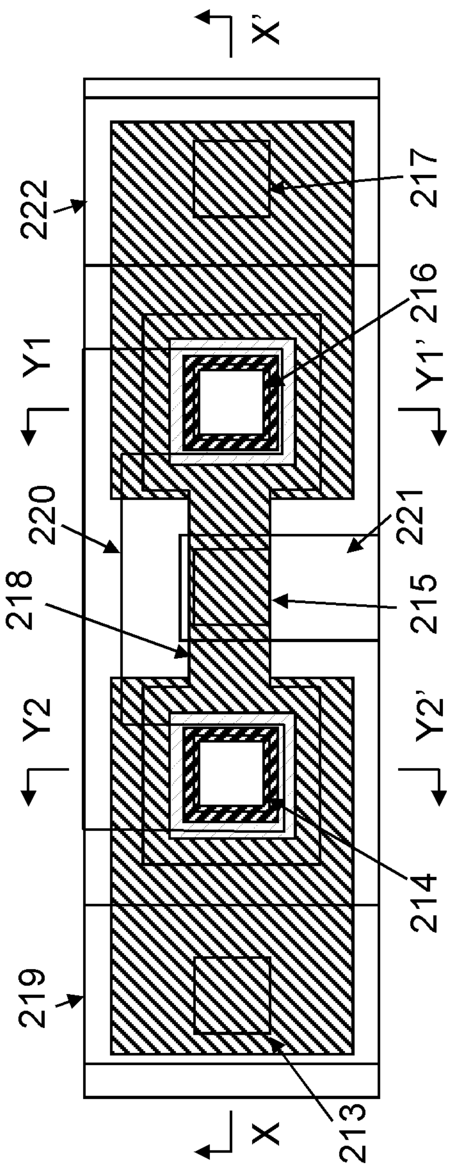
FIG. 1A is a top view of a semiconductor device according to a first embodiment of the present invention.
Figure 1B:
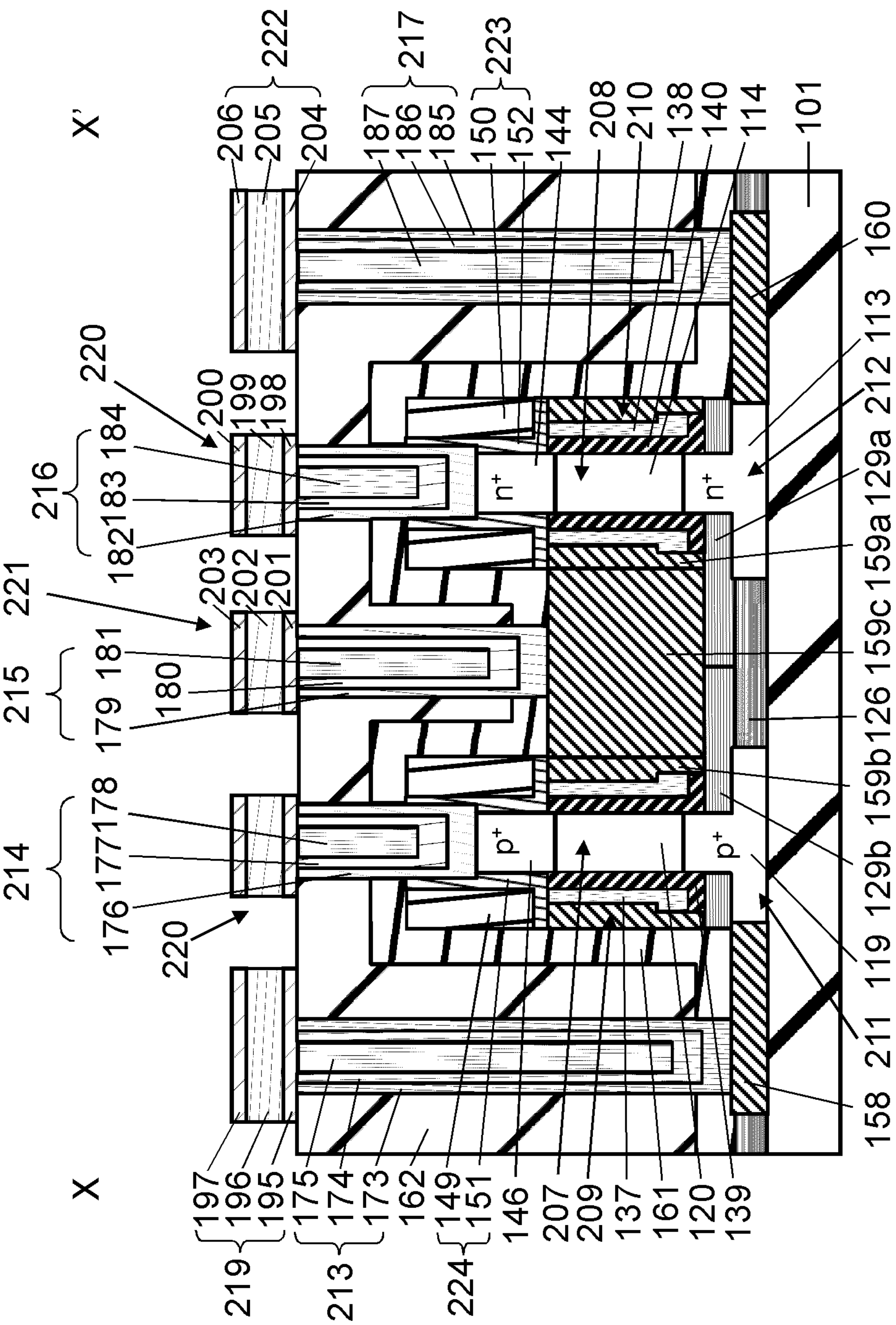
FIG. 1B is a cross-sectional diagram taken in the line X-X' of FIG. 1A.
Figure 2A:
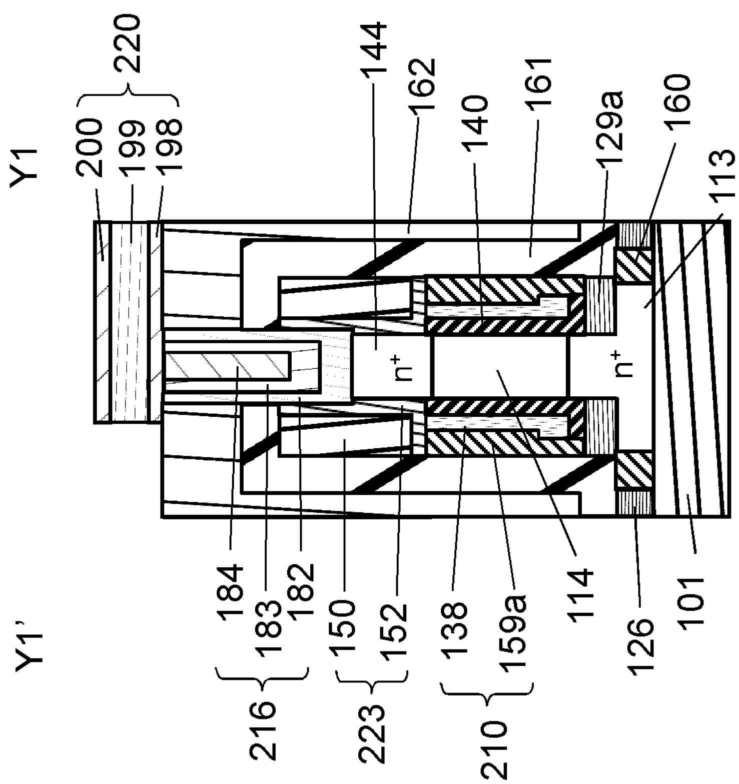
FIG. 2A is a cross-sectional diagram taken in the line Y1-Y1' of FIG. 1A.
Figure 2B:
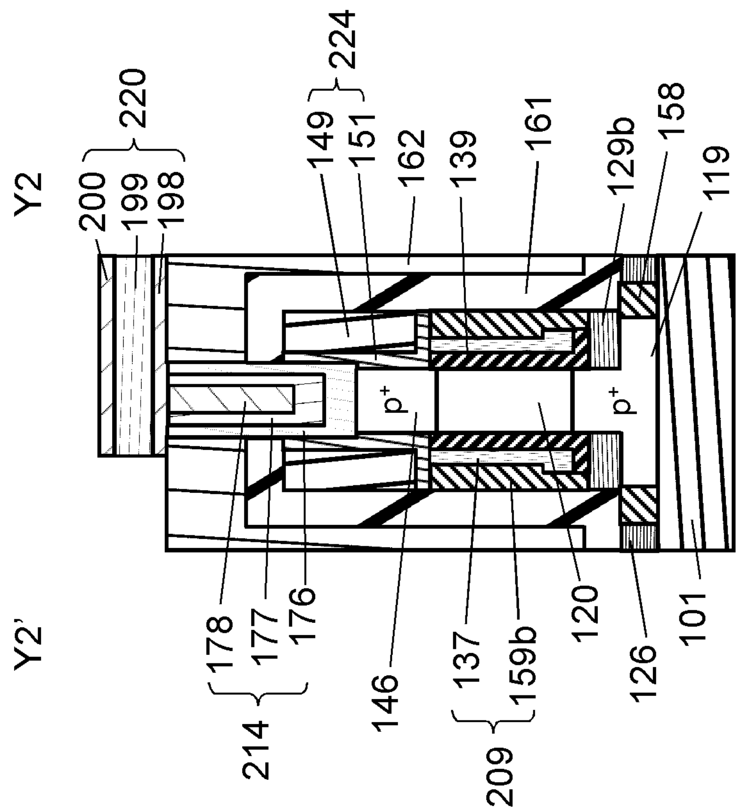
FIG. 2B is a cross-sectional diagram taken in the line Y2-Y2' of FIG. 1A.

FIG. 1A is a top view showing an inverter including Negative Channel Metal-Oxide-Semiconductor (NMOS)-SGT and Positive Channel Metal-Oxide-Semiconductor (PMOS)-SGT according to a first embodiment of the present invention, and FIG. 1B is a cross-sectional diagram taken in the cutting line X-X' of FIG. 1A. FIG. 2A is a cross-sectional diagram taken in the cutting line Y1-Y1' of FIG. 1A. FIG. 2B is a cross-sectional diagram taken in the cutting line Y2-Y2' of FIG. 1A. Although FIG. 1A is a top view, hatching is attached in part in order to distinguish an area.

With reference to FIG. 1A to FIG. 2B, the inverter including the NMOS-SGT and PMOS-SGT according to the first embodiment will be explained hereinafter.

First of all, the NMOS-SGT of the first embodiment will be explained. A first planar silicon layer 212 is formed on a silicon dioxide film 101, and a first columnar silicon layer 208 is formed on the first planar silicon layer 212.

A first n+ type silicon layer 113 is formed in a lower region of the first columnar silicon layer 208 and a region of the first planar silicon layer 212 located under the first columnar silicon layer 208, and a second n+ type silicon layer 144 is formed in an upper region of the first columnar silicon layer 208. In this embodiment, the first n+ type silicon layer 113 functions as a source diffusion layer, and the second n+ type silicon layer 144 functions as a drain diffused layer. Moreover, a part between the source diffusion layer and the drain diffused layer functions as a channel region. The region of the first columnar silicon layer 208 between the first n+ type silicon layer 113 and the second n+ type silicon layer 144 which function as this channel region is a first silicon layer 114.

A first gate insulating film 140 is formed in the side surface of the first columnar silicon layer 208 so that the channel region may be surrounded. That is, the first gate insulating film 140 is formed so that the first silicon layer 114 is surrounded. The first gate insulating film 140 is composed of an oxide film, a nitride film, or a high dielectric film, for example. Furthermore, a first metal film 138 is formed on the first gate insulating film 140, and a first metal-silicon compound layer 159*a* (hereinafter, referred to as first compound layer) is formed in the sidewall of the first metal film 138. The first metal film 138 is a film including titanium nitride or tantalum nitride, for example. Also, the first metal-silicon compound layer 159*a* is formed of the compound of metal and silicon, and this metal is Ni, Co, or the like.

The first metal film 138 and first metal-silicon compound layer 159*a* compose a first gate electrode 210.

In this embodiment, a channel is formed in the first silicon layer 114 by applying voltage to the first gate electrode 210 at the time of operation.

A first insulating film 129*a* is formed between the first gate electrode 210 and the first planar silicon layer 212. Furthermore, a first insulating film sidewall 223 is formed in the upper sidewall of the first columnar silicon layer 208 so that the upper region of the first columnar silicon layer 208 is surrounded, and the first insulating film sidewall 223 contacts with the top surface of the first gate electrode 210. Also, the first insulating film sidewall 223 is composed of a nitride film 150 and an oxide film 152.

Furthermore, a second metal-silicon compound layer 160 is formed in the first planar silicon layer 212.

The second metal-silicon compound layer 160 is formed of the compound of metal and silicon, and this metal is Ni, Co or the like.

The second metal-silicon compound layer 160 is formed to contact with the first n+ type silicon layer 113, and functions as a wiring layer for providing power supply potential to the first n+ type silicon layer 113.

An electric contact 216 is formed on the first columnar silicon layer 208. In addition, the electric contact 216 is composed of a barrier metal layer 182 and metal layers 183 and 184. The electric contact 216 is directly formed on the second n+ type silicon layer 144. Accordingly, the electric contact 216 and the second n+ type silicon layer 144 are connected directly. In this embodiment, the electric contact 216 is contacted with the second n+ type silicon layer 144.

The barrier metal layer 182 is formed of metal, such as titanium or tantalum. The second n+ type silicon layer 144 is connected to an output wiring 220 via the electric contact 216. The output wiring 220 is composed of a barrier metal layer 198, a metal layer 199, and a barrier metal layer 200.

A seventh metal-silicon compound layer 159*c* is formed in a part of the side surface of the first metal-silicon compound layer 159*a*. In addition, a material which composes the seventh metal-silicon compound layer 159*c* is the same material as the first metal-silicon compound layer 159*a*. The seventh metal-silicon compound layer 159*c* functions as a gate wiring 218. An electric contact 215 is formed on the seventh metal-silicon compound layer 159*c*. The electric contact 215 is composed of a barrier metal layer 179 and metal layers 180 and 181. Furthermore, the electric contact 215 is connected to an input wiring 221 composed of a barrier metal layer 201, a metal layer 202, and a barrier metal layer 203. At the time of operation, input voltage is provided to the first gate electrode 210 via the electric contact 215 so that a channel is formed in the first silicon layer 114.

Also, an electric contact 217 is formed on the second metal-silicon compound layer 160. The electric contact 217 is composed of a barrier metal layer 185 and metal layer 186 and 187, and is connected to a power source wiring 222. The power source wiring 222 is composed of a barrier metal layer 204, a metal layer 205, and a barrier metal layer 206. Power supply potential is provided to both of the first n+ type silicon layer 113 and second metal-silicon compound layer 160 via the electric contact 217 at the time of operation.

The NMOS-SGT is formed according to such a configuration.

As mentioned above, in the NMOS-SGT according to this embodiment, the thick first, seventh and second metal-silicon compound layers 159*a*, 159*c*, and 160 are formed in the gate electrode 210, the gate wiring 218 and planar silicon layer 212. By such a structure of the SGT, the low-resistivity for the gate electrode 210 and planar silicon layer 212 is achieved, thereby enabling high-speed operation.

Furthermore, in the NMOS-SGT according to this embodiment, the electric contact 216 is directly disposed on the second n+ type silicon layer 144 comprising the highly doped silicon layer of the upper part of the columnar silicon layer 208. That is, since the metal-silicon compound layer is not formed between the electric contact 216 and the second n+ type silicon layer 144, the spike-shaped metal-silicon compound layer which may cause occurrence of leakage current is not formed. Even if the diameter of the columnar silicon layer is formed small for the purpose of high integration of the semiconductor device, the phenomenon in which the metal-silicon compound layer formed on the columnar silicon layer becomes still thicker is not occurred, either. Therefore, the above leakage current is not occurred. Also, since it is not necessary to thickly form the second n+ type silicon layer 144 comprising the highly doped silicon layer in order to suppress the occurrence of this leakage current, increase of the electrical resistance by the second n+ type silicon layer 144 is also avoidable.

According to the configuration mentioned above, the low-resistivity and the miniaturization for the semiconductor device are achievable.

Also, the parasitic capacitance between the gate electrode 210 and the planar silicon layer 212 can be reduced with the first insulating film 129*a*. Accordingly, the reduction of operating speed with the miniaturization of SGT is avoidable.

Next, PMOS-SGT according to this embodiment will be explained. A second planar silicon layer 211 is formed on a silicon dioxide film 101, and a second columnar silicon layer 207 is formed on the second planar silicon layer 211, as well as the NMOS-SGT mentioned above.

A first p+ type silicon layer 119 is formed in a lower region of the second columnar silicon layer 207 and a region of the second planar silicon layer 211 located under the second columnar silicon layer 207, and a second p+ type silicon layer 146 is formed in an upper region of the second columnar silicon layer 207. In this embodiment, the first p+ type silicon layer 119 functions as a source diffusion layer, and the second p+ type silicon layer 146 functions as a drain diffused layer. Also, a part between the source region and a drain region functions as a channel region. The region of the second columnar silicon layer 207 between the first p+ type silicon layer 119 and the second p+ type silicon layer 146 which function as this channel region is a second silicon layer 120.

A second gate insulating film 139 is formed in the side surface of the second columnar silicon layer 207 so that the channel region is surrounded. That is, the second gate insulating film 139 is formed in the side surface of the second silicon layer 120 so that the second silicon layer 114 is surrounded. The second gate insulating film 139 is composed of an oxide film, a nitride film, or a high dielectric film, for example. Also, a second metal film 137 is formed in the perimeter of the second gate insulating film 139. The second metal film 137 is a film including titanium nitride or tantalum nitride, for example. Also, a third metal-silicon compound layer 159*b* is formed in the perimeter of the second metal film 137. A material which composes the third metal-silicon compound layer 159*b* is the same material as that of the first metal-silicon compound layer 159*a* and that of the seventh metal-silicon layer 159*c*. The second gate electrode 209 is composed of the second metal film 137 and the third metal-silicon compound layer 159*b*. A seventh metal-silicon compound layer 159*c* formed between the first gate electrode 210 and the second gate electrode 209 functions as a gate wiring 218, and provides input potential to the second and first gate electrodes 209 and 210 at the time of operation.

In this embodiment, a channel is formed in a region of the second silicon layer 120 by applying voltage to the second gate electrode 209.

A second insulating film 129*b* is formed between the second gate electrode 209 and the second planar silicon layer 211. Furthermore, a second insulating film sidewall 224 is formed in the upper sidewall of the second columnar silicon layer 207, and the second insulating film sidewall 224 contacts with the top surface of the second gate electrode 209. The second insulating film sidewall 224 is composed of an oxide film 151 and a nitride film 149.

Also, a fourth metal-silicon compound layer 158 is formed in the second planar silicon layer 211 so as to contact with the first p+ type silicon layer 119. The fourth metal-silicon compound layer 158 is formed of the compound of metal and silicon, and this metal is Ni, Co or the like.

An electric contact 214 is formed on the second columnar silicon layer 207. In addition, the electric contact 214 is composed of a barrier metal layer 176 and metal layers 177 and 178. Also, the electric contact 214 is directly formed on the second p+ type silicon layer 146. Accordingly, the electric contact 214 and the second p+ type silicon layer 146 are connected directly. In this embodiment, the electric contact 214 is contacted with the second p+ type silicon layer 146.

The barrier metal layer 176 is formed of metal, such as titanium or tantalum. The second p+ type silicon layer 146 is connected to an output wiring 220 via the electric contact 214. The output of PMOS-SGT is outputted to the output wiring 220.

Also, as mentioned above, an electric contact 215 formed on the seventh metal-silicon compound layer 159*c* is connected to an input wiring 221, and the potential for forming a channel in the second silicon layer 120 is applied to the second gate electrode 209 from the input wiring 221. Furthermore, the gate electrodes 210 and 209 are connected by the gate wiring 218.

Also, an electric contact 213 is formed on the fourth metal-silicon compound layer 158. The electric contact 213 is composed of a barrier metal layer 173 and metal layers 174 and 175. The electric contact 213 is connected to the power source wiring 219 in order to input power supply potential into PMOS-SGT. The power source wiring 219 is composed of a barrier metal layer 195, a metal layer 196, and a barrier metal layer 197.

The PMOS-SGT is formed according to such a configuration.

Furthermore, an oxide film 126 is formed between the first planar silicon layer 212 and the second planar silicon layer 211 of adjoining PMOS-SGT, and a first insulating film 129*a* and a second insulating film 129*b* extends on the oxide film 126. Also, each transistor is separated by a nitride film 161 and an interlayer insulating film 162.

An inverter provided with the NMOS-SGT and PMOS-SGT is formed according to such a configuration.

In this embodiment, the first metal-silicon compound layer 159*a*, third metal-silicon compound layer 159*b*, and seventh metal-silicon compound layer 159*c* are formed in the same processing step by using the same material in one piece. Also, the first insulating film 129*a* and second insulating film 129*b* are formed in the same processing step by using the same material in one piece.

In the inverter according to this embodiment, the first gate insulating film 140 and first metal film 138 are formed by using a material which applies the NMOS-SGT an enhancement type, and the second gate insulating film 139 and second metal film 137 are formed by using a material which applies the PMOS-SGT an enhancement type. Therefore, the short circuit conduction current which flows at the time of operation of this inverter can be reduced.

Hereinafter, an example of a fabrication method for forming the inverter provided with the SGT of the first embodiment of this application will be explained with reference to FIG. 3A to FIG. 148B. In the drawings, the same components are denoted by the same reference numerals.

Figure 3A:
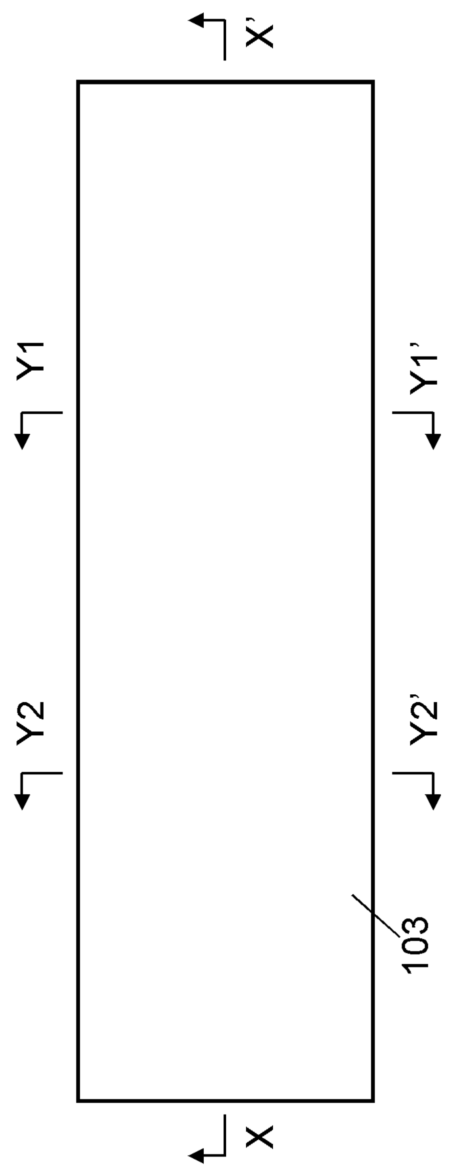
FIG. 3A is a top view for explaining a fabrication method of the semiconductor device according to the first embodiment.
Figure 3B:
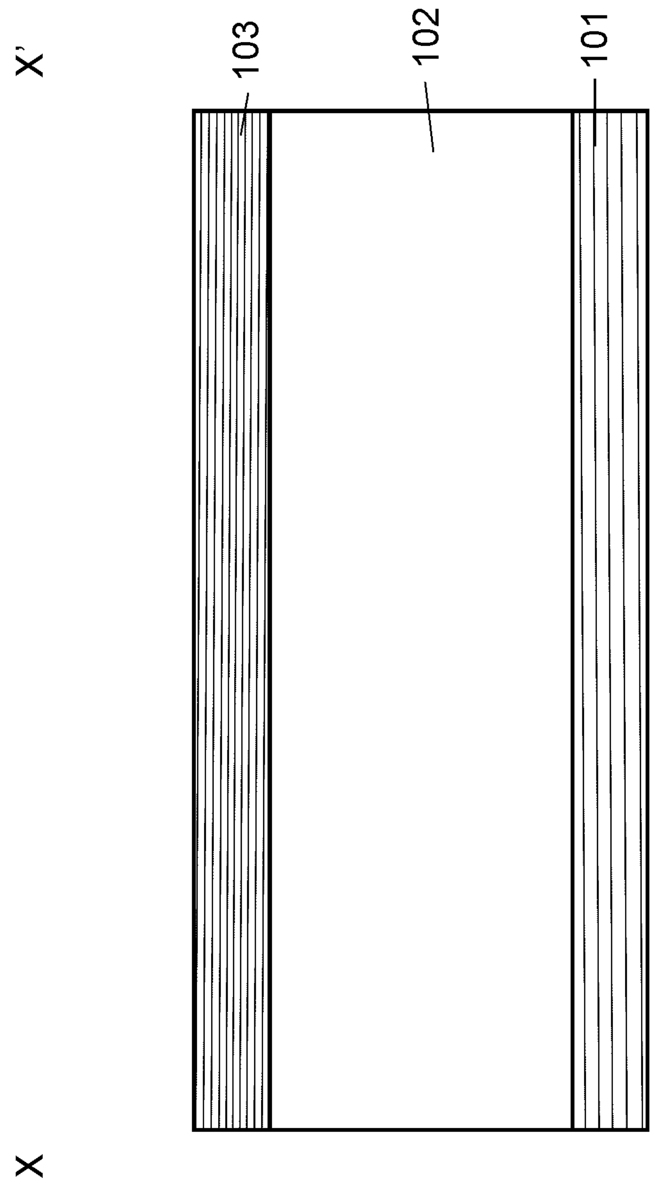
FIG. 3B is a cross-sectional diagram taken in the line X-X' of FIG. 3A.
Figure 4A:
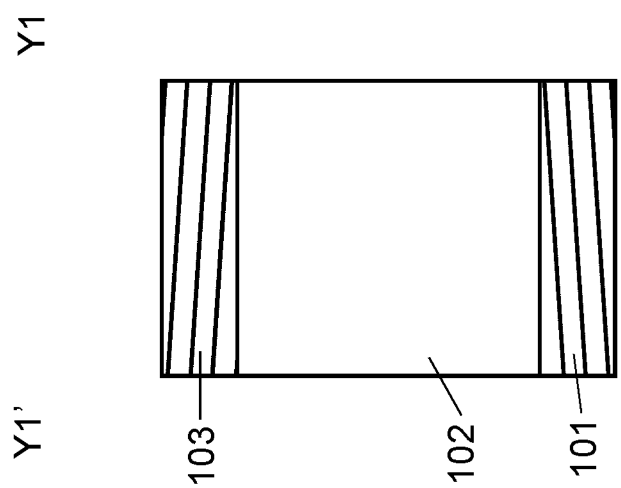
FIG. 4A is a cross-sectional diagram taken in the line Y1-Y1' of FIG. 3A.
Figure 4B:
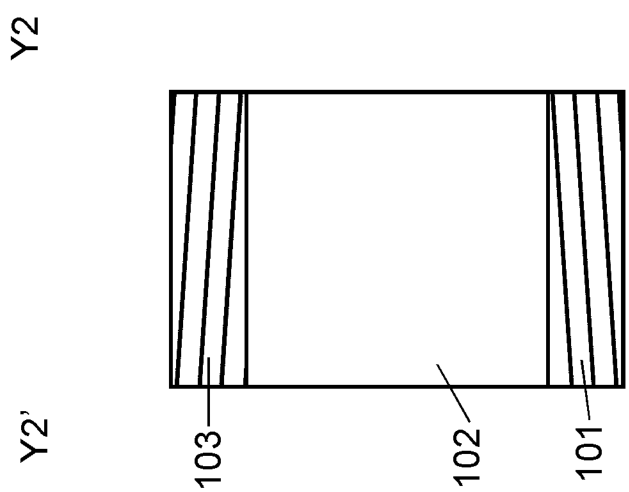
FIG. 4B is a cross-sectional diagram taken in the line Y2-Y2' of FIG. 3A.
Figure 5A:
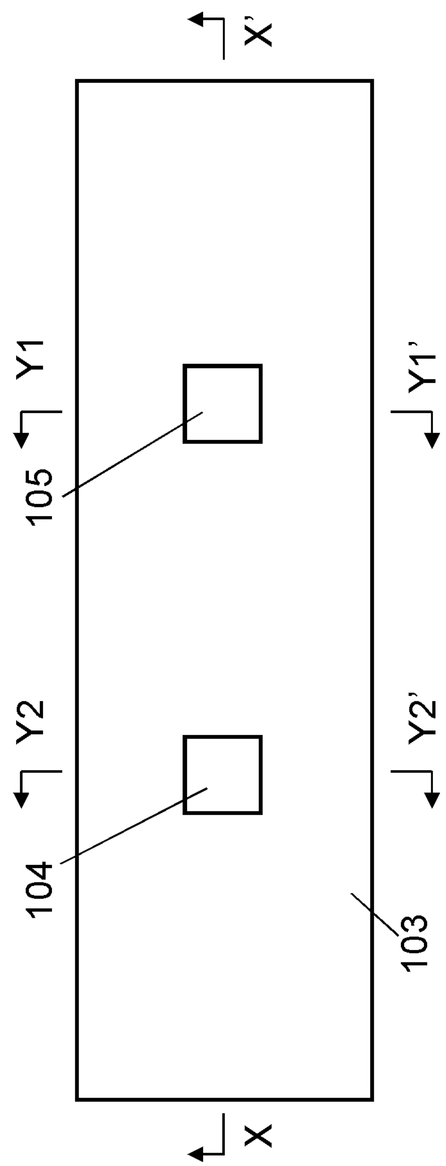
FIG. 5A is a top view for explaining the fabrication method of the semiconductor device according to the first embodiment.
Figure 5B:
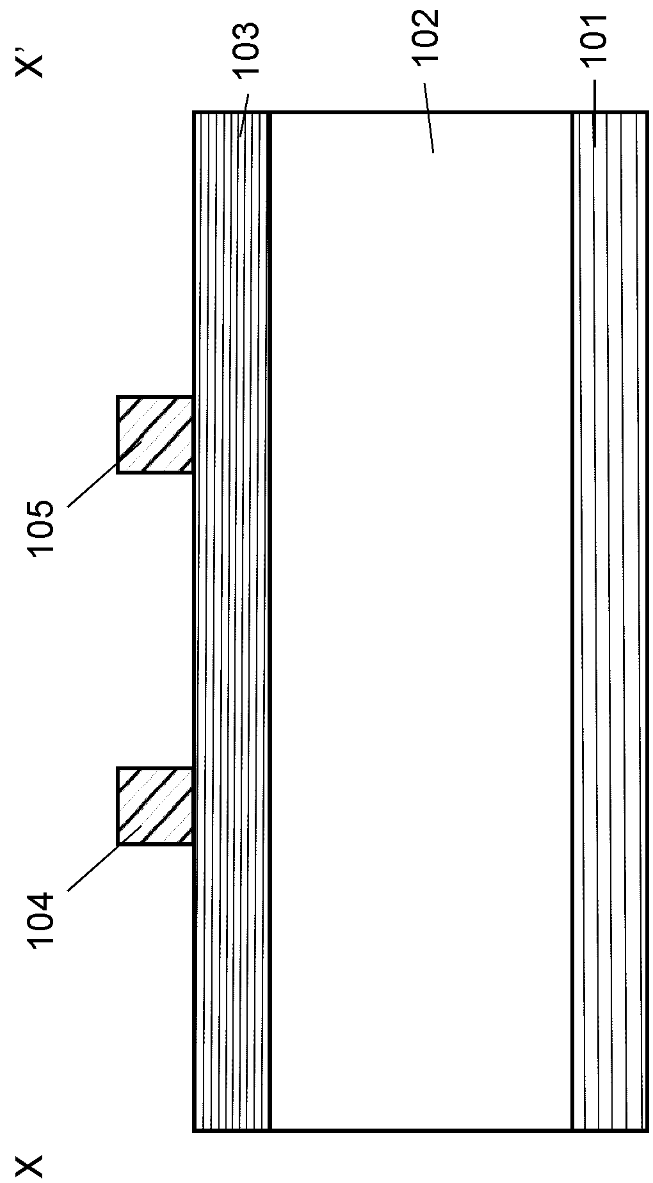
FIG. 5B is a cross-sectional diagram taken in the line X-X' of FIG. 5A.
Figure 6A:
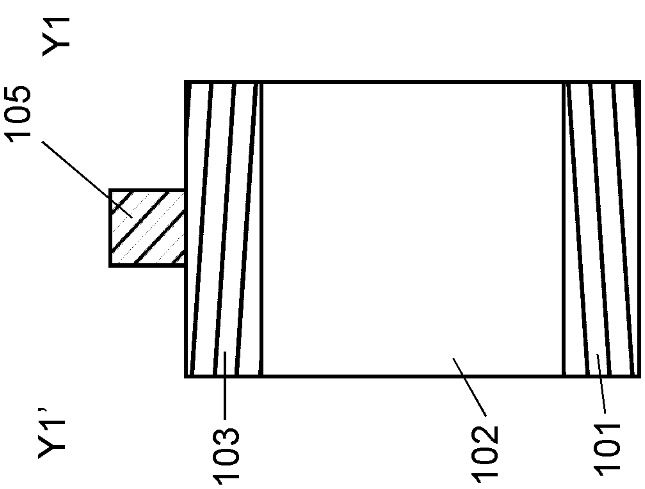
FIG. 6A is a cross-sectional diagram taken in the line Y1-Y1' of FIG. 5A.
Figure 6B:
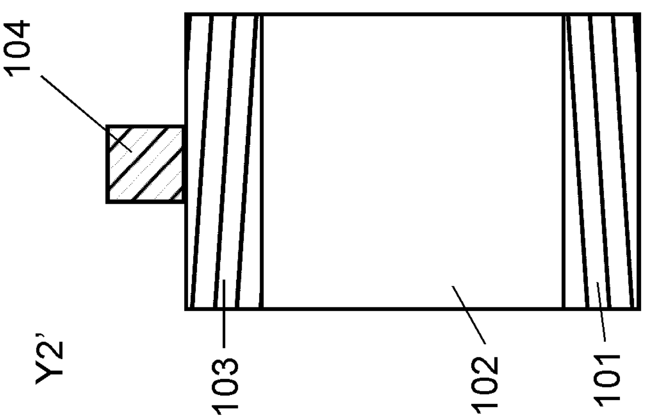
FIG. 6B is a cross-sectional diagram taken in the line Y2-Y2' of FIG. 5A.
Figure 7A:
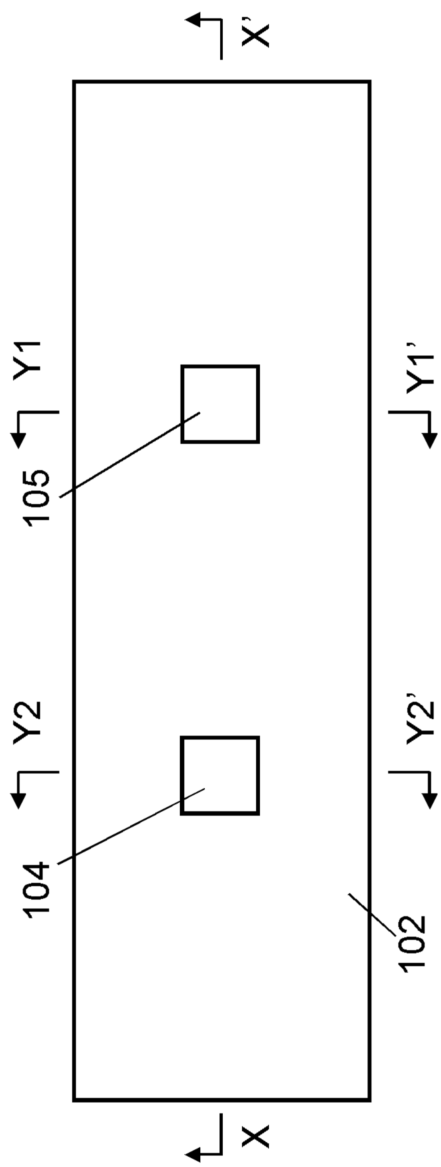
FIG. 7A is a top view for explaining the fabrication method of the semiconductor device according to the first embodiment.
Figure 7B:
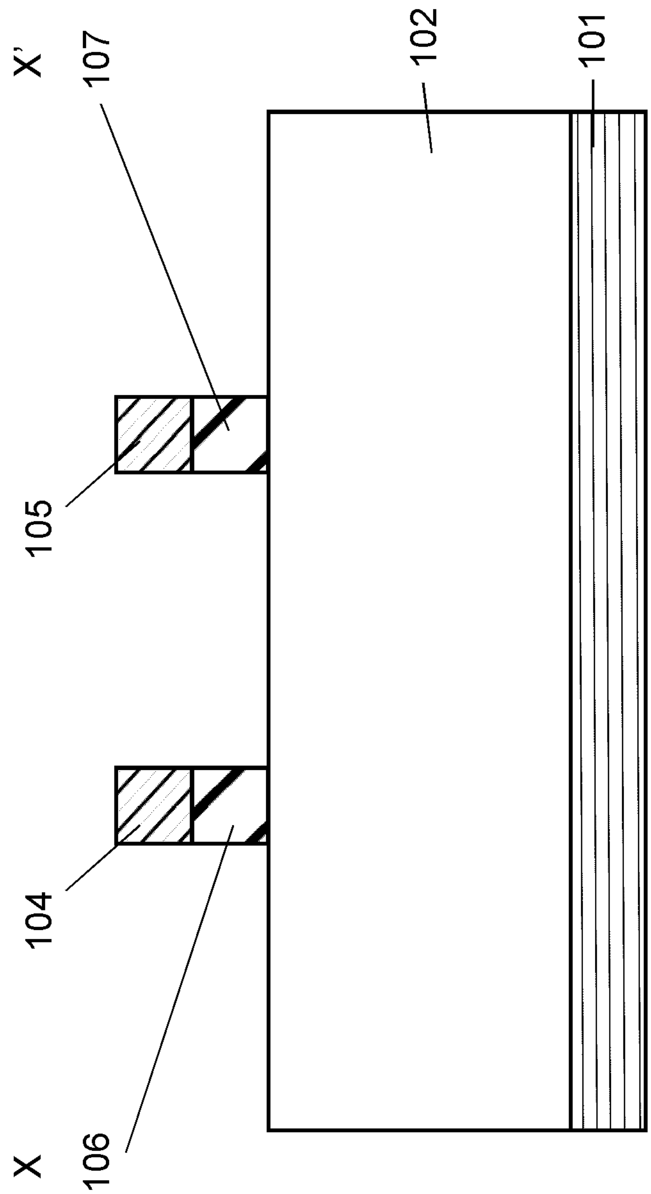
FIG. 7B is a cross-sectional diagram taken in the line X-X' of FIG. 7A.
Figure 8A:
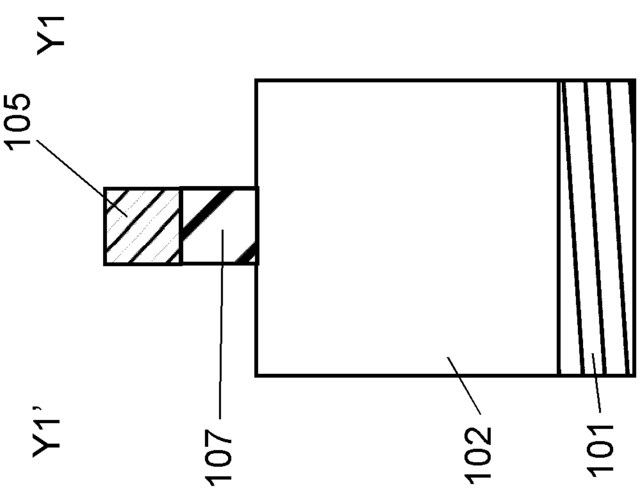
FIG. 8A is a cross-sectional diagram taken in the line Y1-Y1' of FIG. 7A.
Figure 8B:
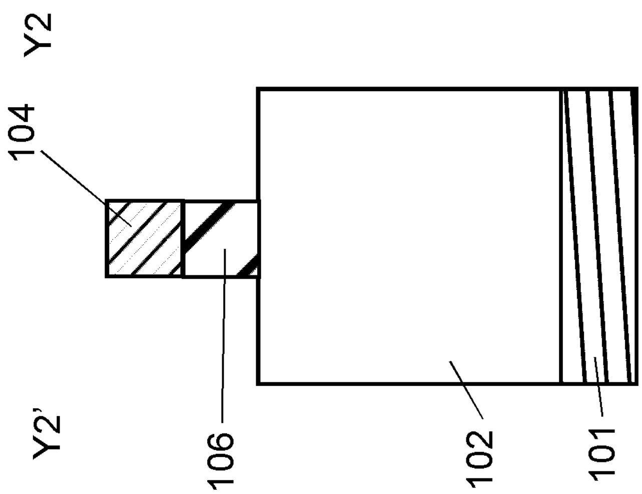
FIG. 8B is a cross-sectional diagram taken in the line Y2-Y2' of FIG. 7A.
Figure 9A:
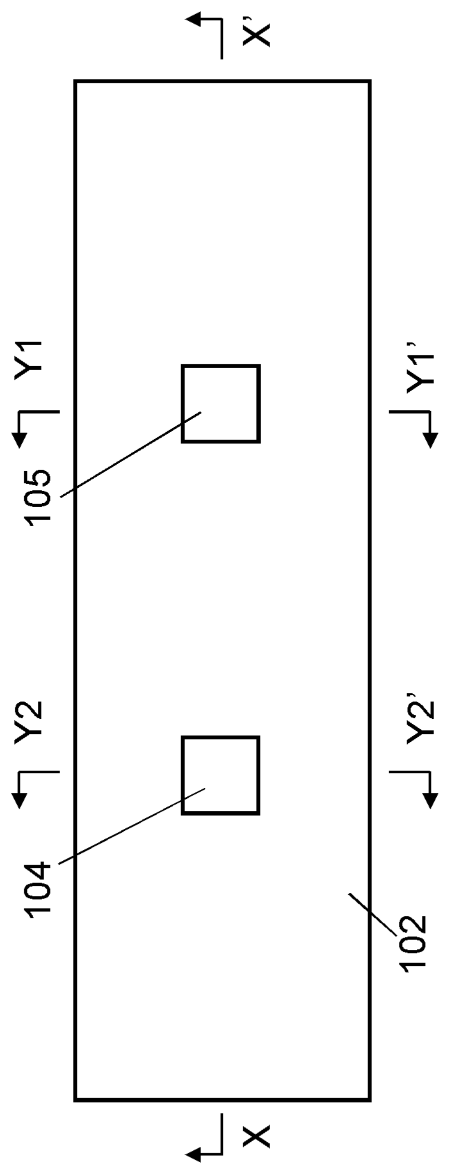
FIG. 9A is a top view for explaining the fabrication method of the semiconductor device according to the first embodiment.
Figure 9B:
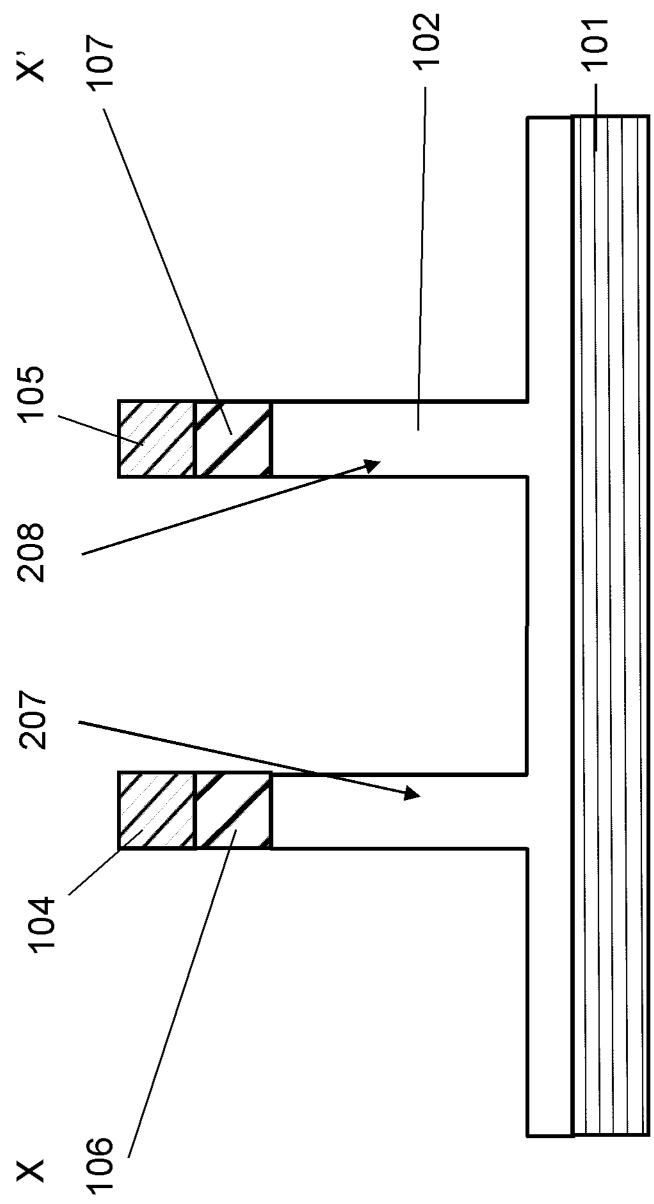
FIG. 9B is a cross-sectional diagram taken in the line X-X' of FIG. 9A.
Figure 10A:
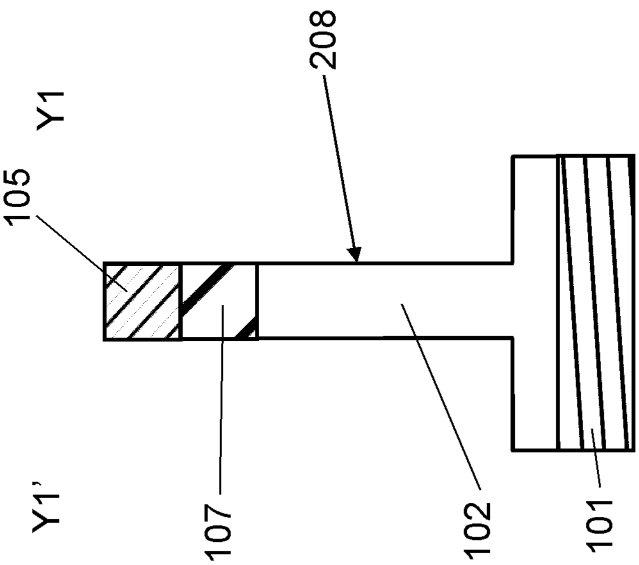
FIG. 10A is a cross-sectional diagram taken in the line Y1-Y1' of FIG. 9A.
Figure 10B:
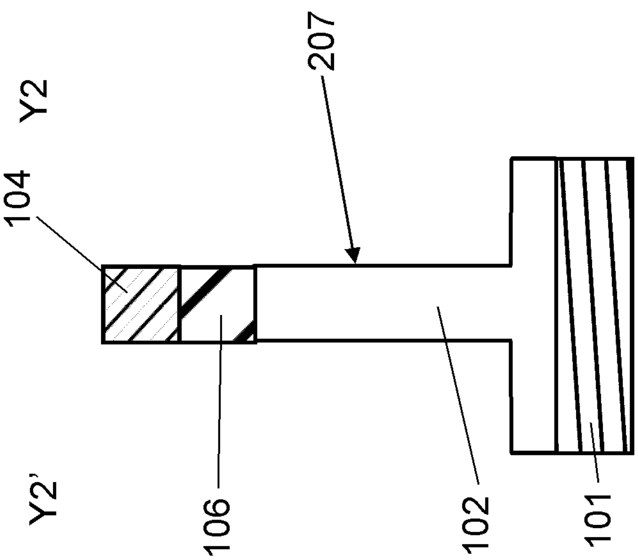
FIG. 10B is a cross-sectional diagram taken in the line Y2-Y2' of FIG. 9A.
Figure 11A:
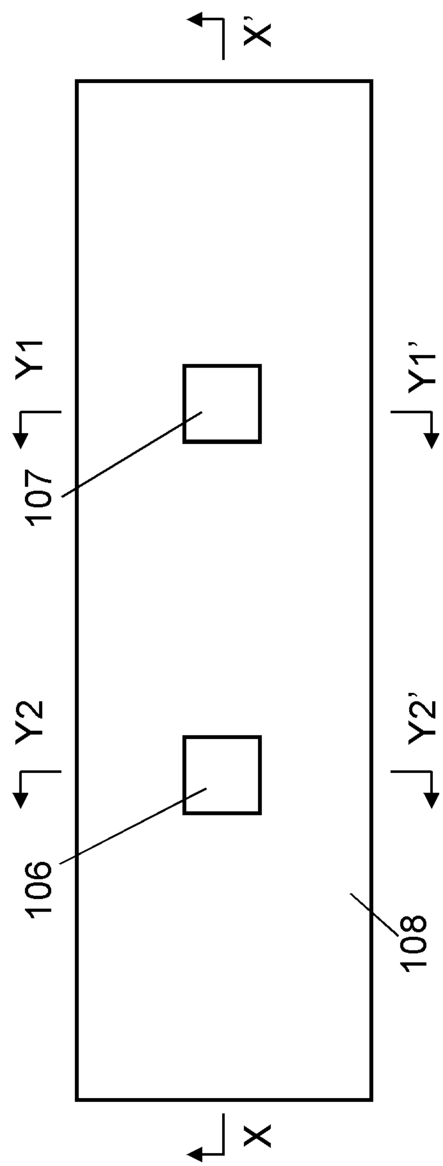
FIG. 11A is a top view for explaining the fabrication method of the semiconductor device according to the first embodiment.
Figure 11B:
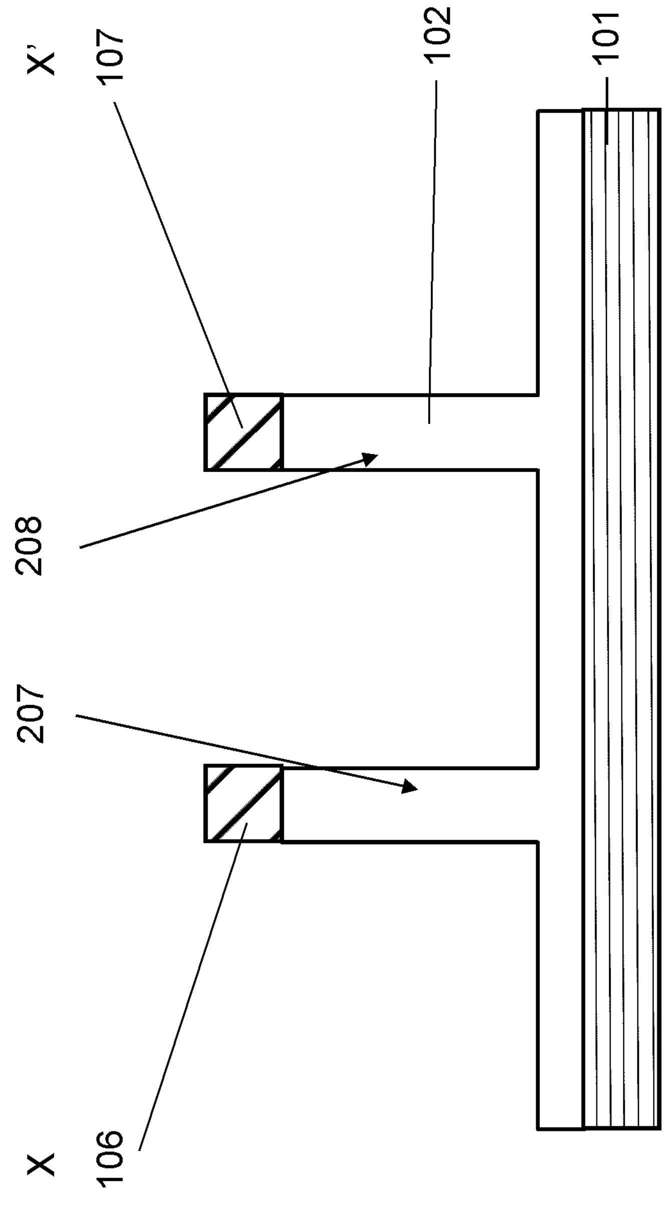
FIG. 11B is a cross-sectional diagram taken in the line X-X' of FIG. 11A.
Figure 12A:
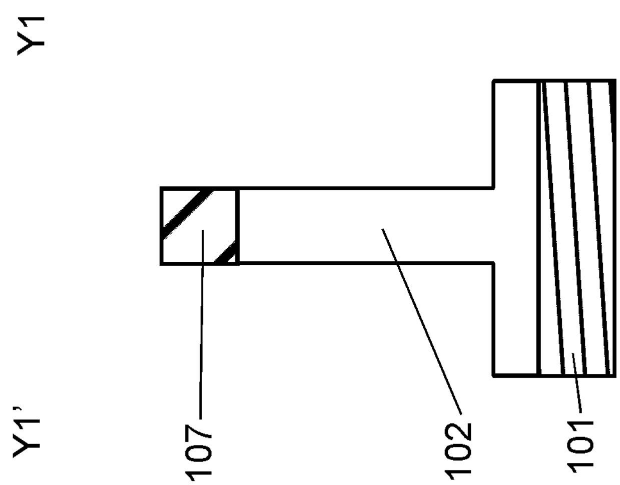
FIG. 12A is a cross-sectional diagram taken in the line Y1-Y1' of FIG. 11A.
Figure 12B:
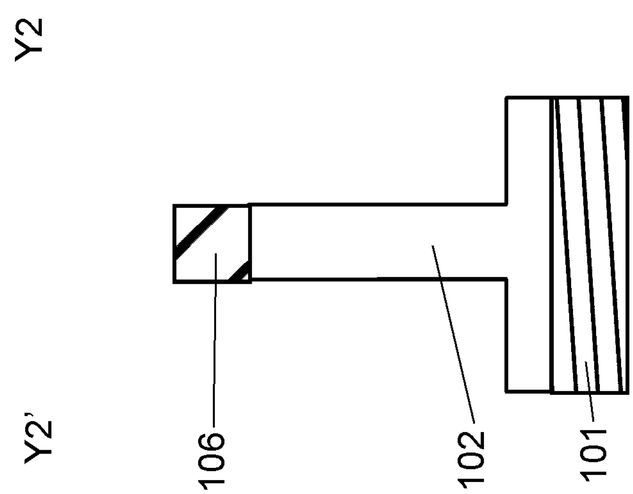
FIG. 12B is a cross-sectional diagram taken in the line Y2-Y2' of FIG. 11A.
Figure 13A:
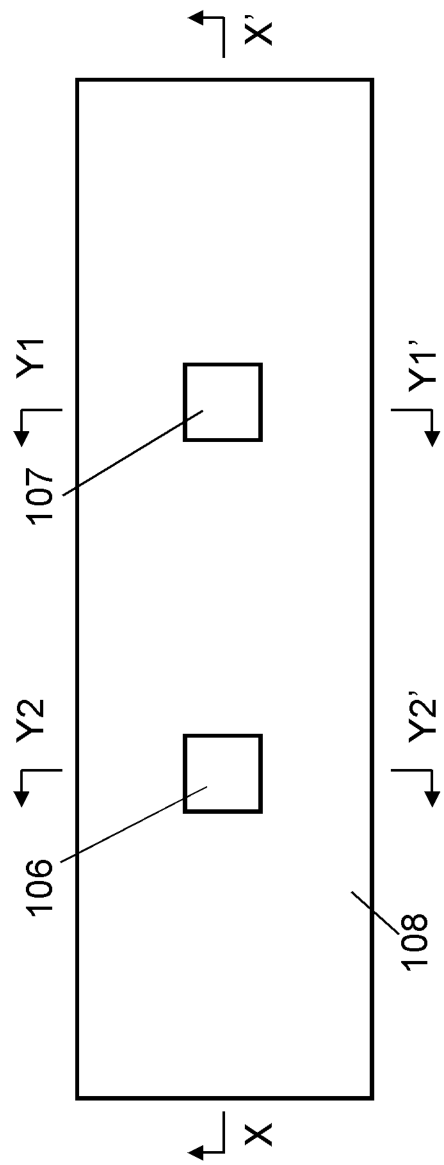
FIG. 13A is a top view for explaining the fabrication method of the semiconductor device according to the first embodiment.
Figure 13B:
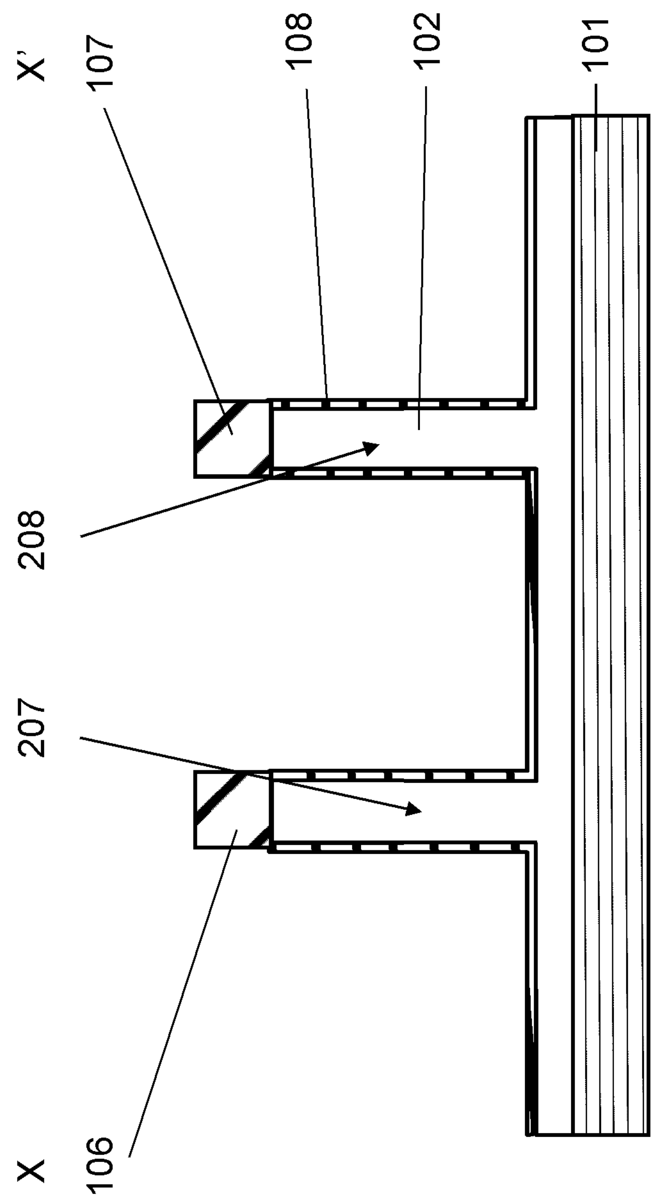
FIG. 13B is a cross-sectional diagram taken in the line X-X' of FIG. 13A.
Figure 14A:
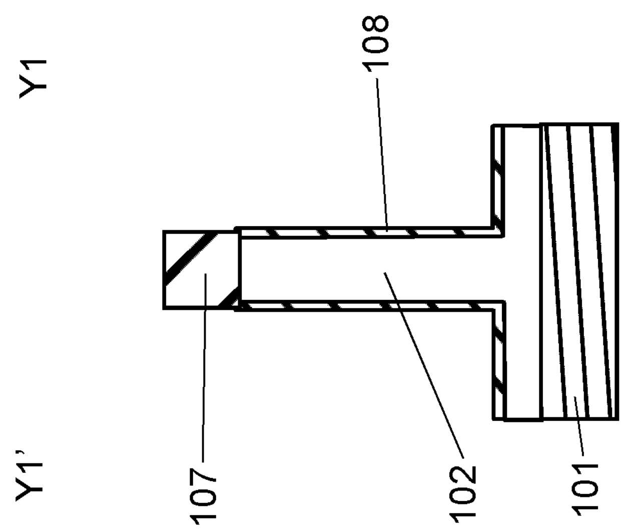
FIG. 14A is a cross-sectional diagram taken in the line Y1-Y1' of FIG. 13A.
Figure 14B:
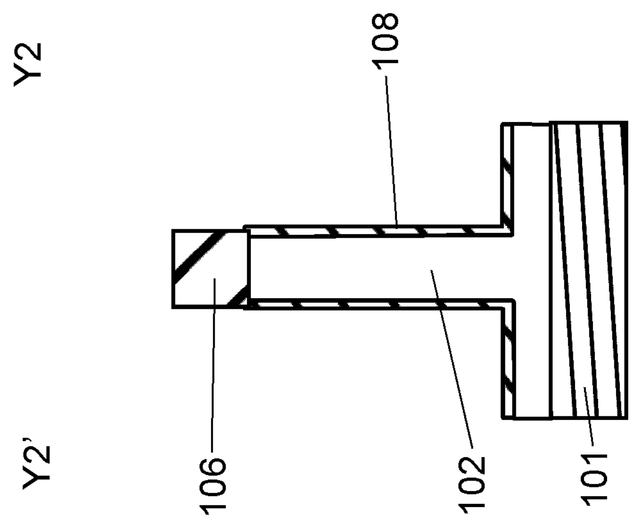
FIG. 14B is a cross-sectional diagram taken in the line Y2-Y2' of FIG. 13A.
Figure 15A:
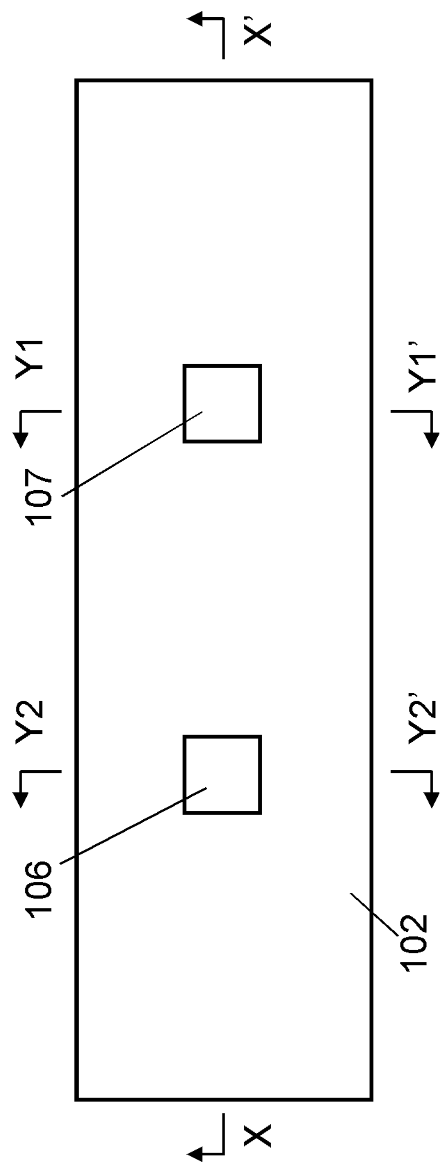
FIG. 15A is a top view for explaining the fabrication method of the semiconductor device according to the first embodiment.
Figure 15B:
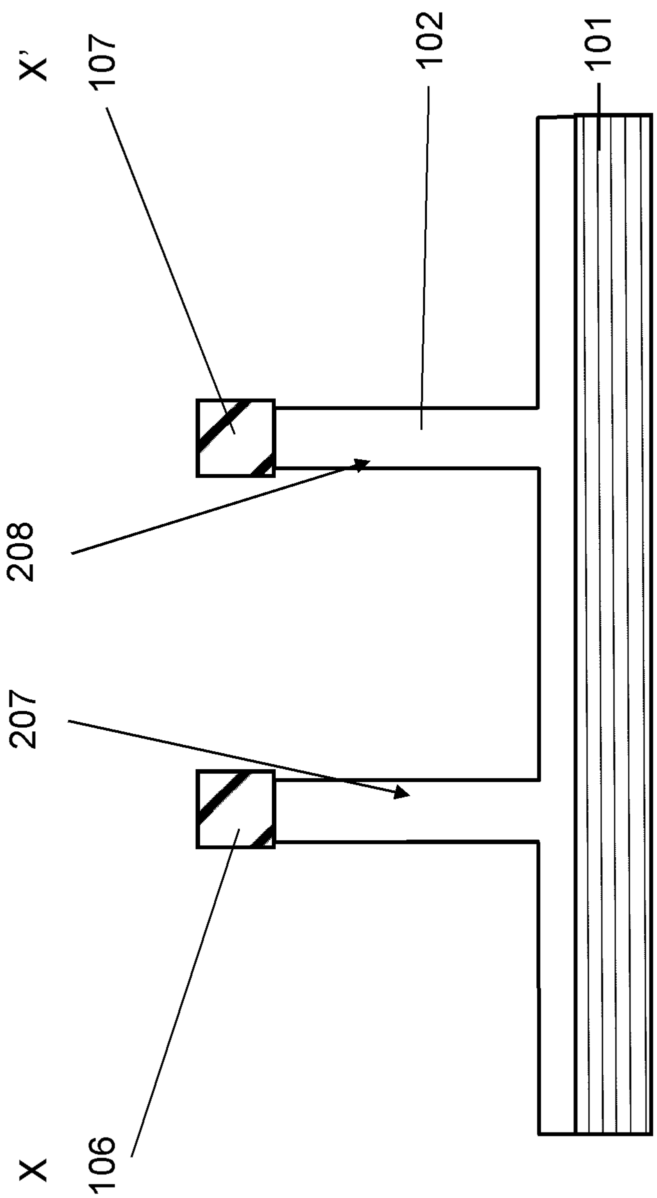
FIG. 15B is a cross-sectional diagram taken in the line X-X' of FIG. 15A.
Figure 16A:
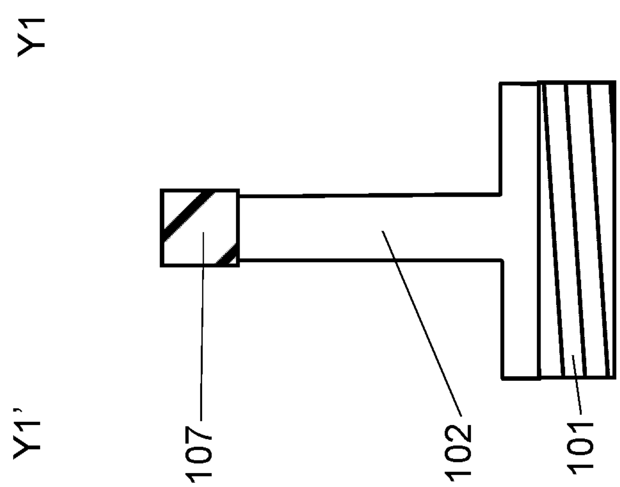
FIG. 16A is a cross-sectional diagram taken in the line Y1-Y1' of FIG. 15A.
Figure 16B:
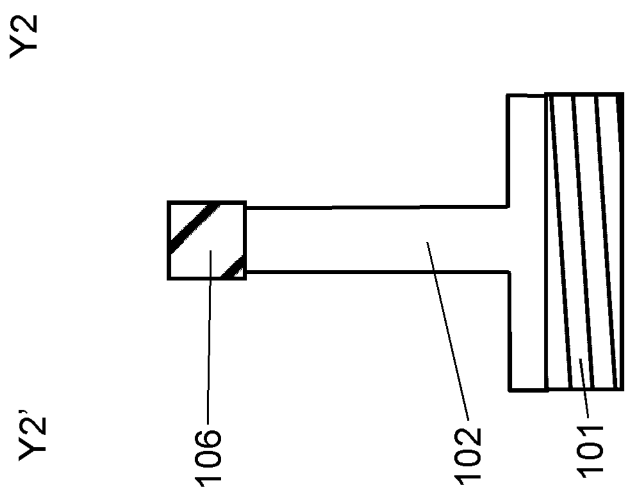
FIG. 16B is a cross-sectional diagram taken in the line Y2-Y2' of FIG. 15A.
Figure 17A:
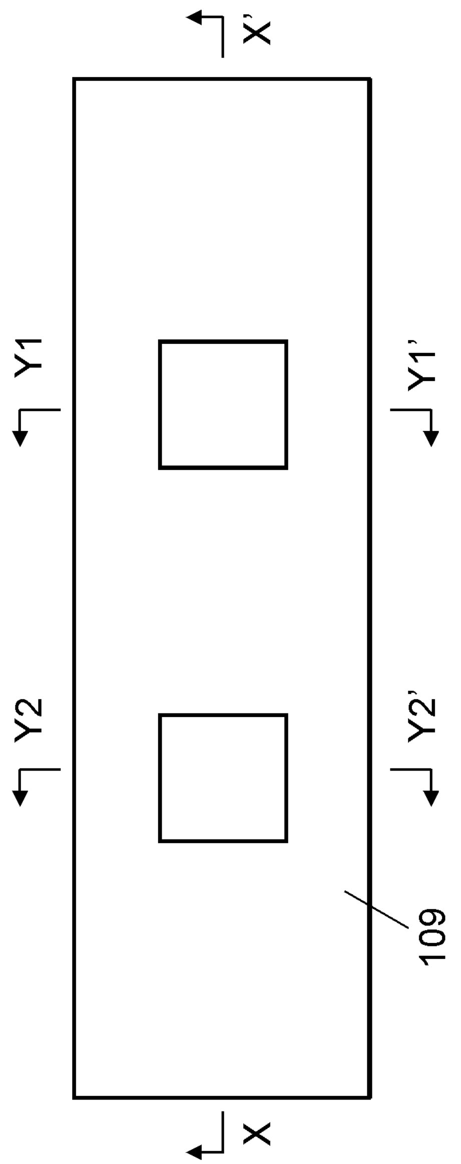
FIG. 17A is a top view for explaining the fabrication method of the semiconductor device according to the first embodiment.
Figure 17B:
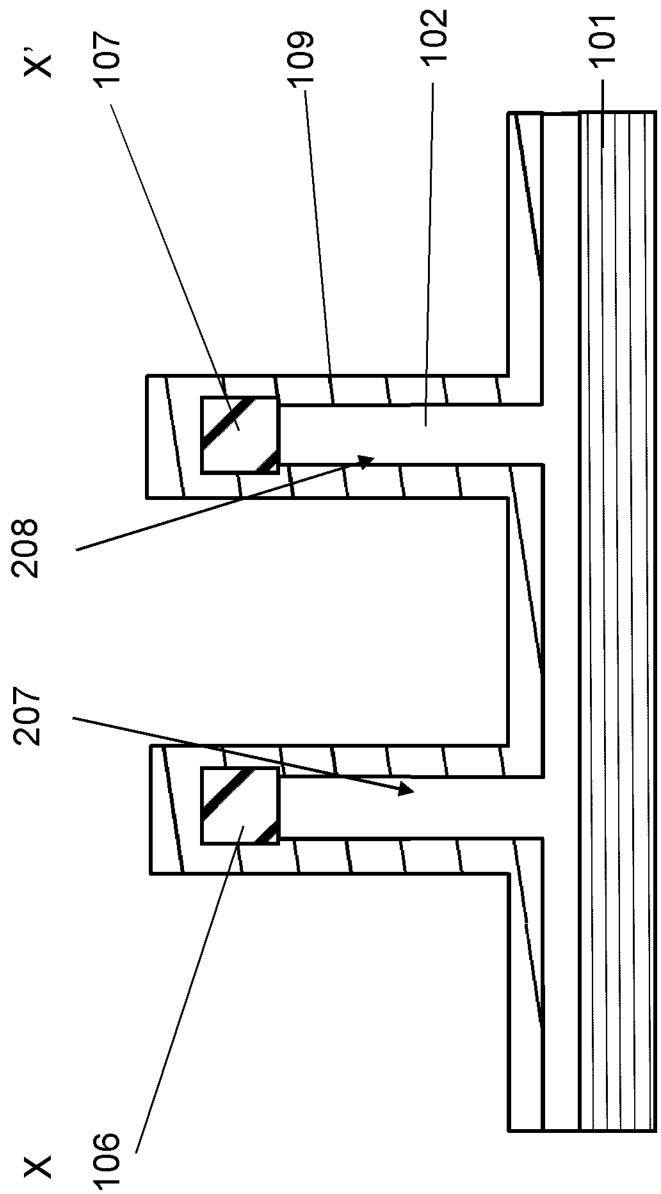
FIG. 17B is a cross-sectional diagram taken in the line X-X' of FIG. 17A.
Figure 18A:
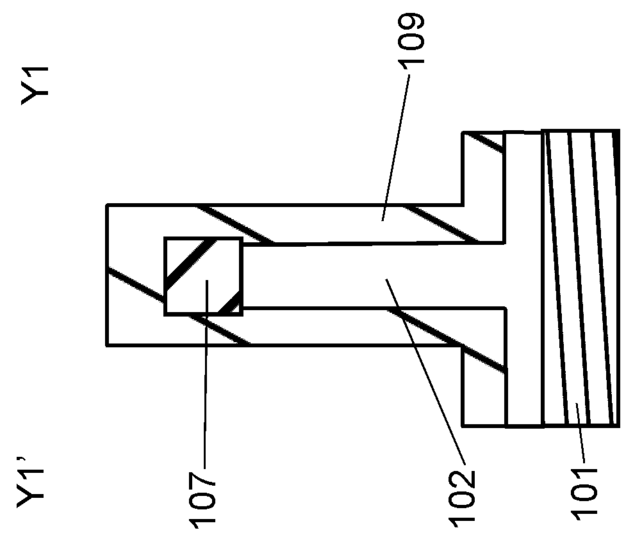
FIG. 18A is a cross-sectional diagram taken in the line Y1-Y1' of FIG. 17A.
Figure 18B:
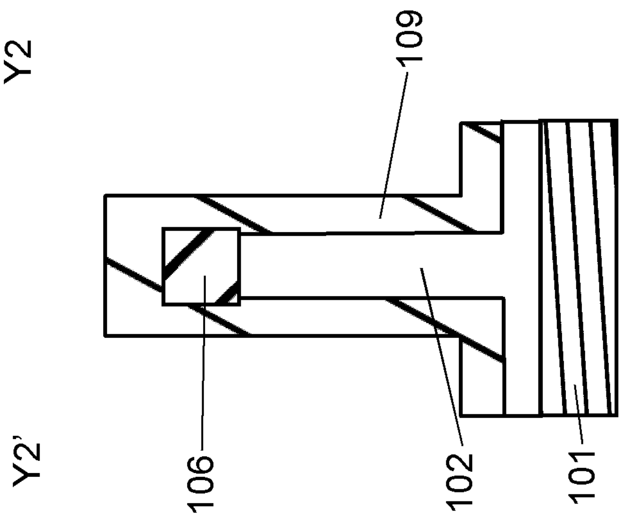
FIG. 18B is a cross-sectional diagram taken in the line Y2-Y2' of FIG. 17A.
Figure 19A:
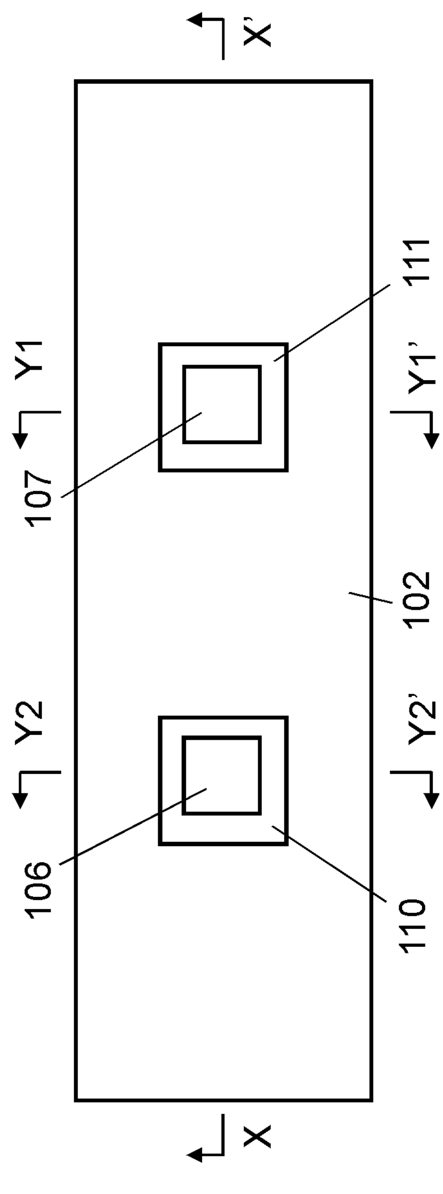
FIG. 19A is a top view for explaining the fabrication method of the semiconductor device according to the first embodiment.
Figure 19B:
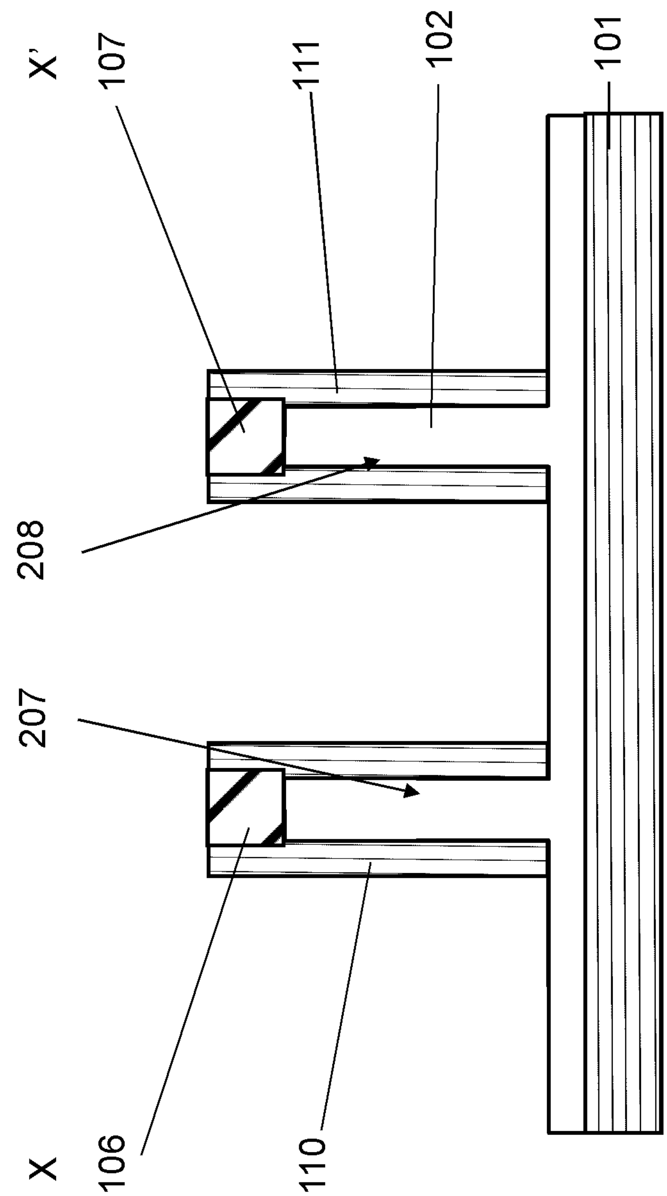
FIG. 19B is a cross-sectional diagram taken in the line X-X' of FIG. 19A.
Figure 20A:
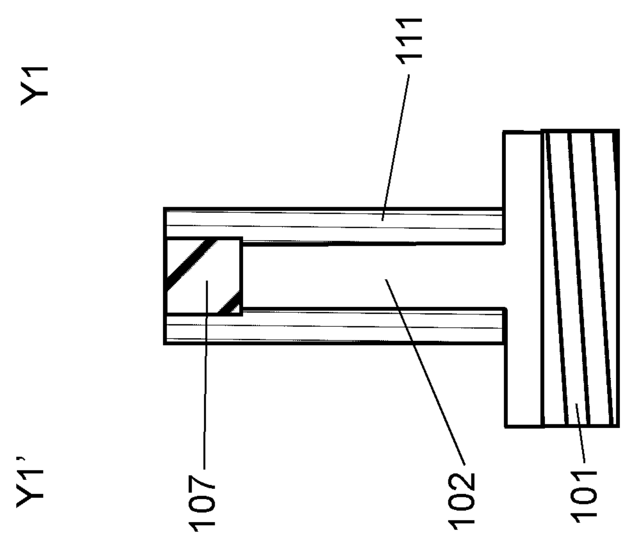
FIG. 20A is a cross-sectional diagram taken in the line Y1-Y1' of FIG. 19A.
Figure 20B:
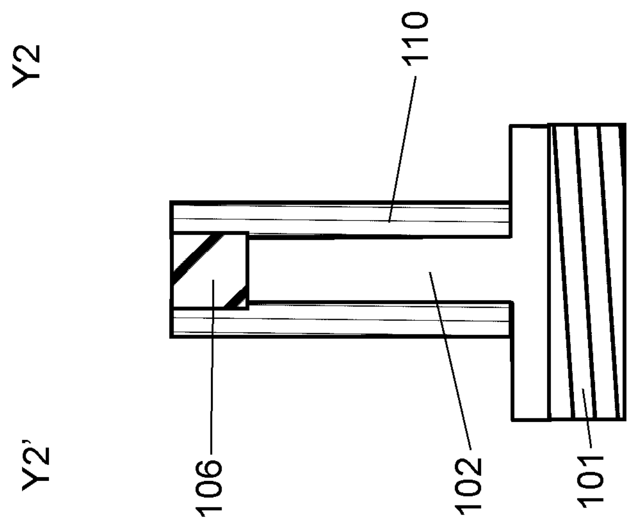
FIG. 20B is a cross-sectional diagram taken in the line Y2-Y2' of FIG. 19A.
Figure 21A:
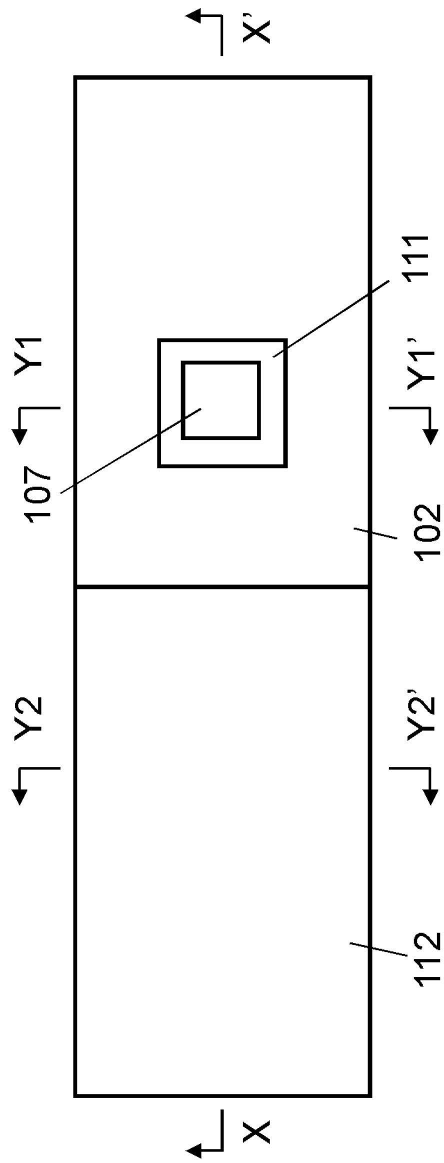
FIG. 21A is a top view for explaining the fabrication method of the semiconductor device according to the first embodiment.
Figure 21B:
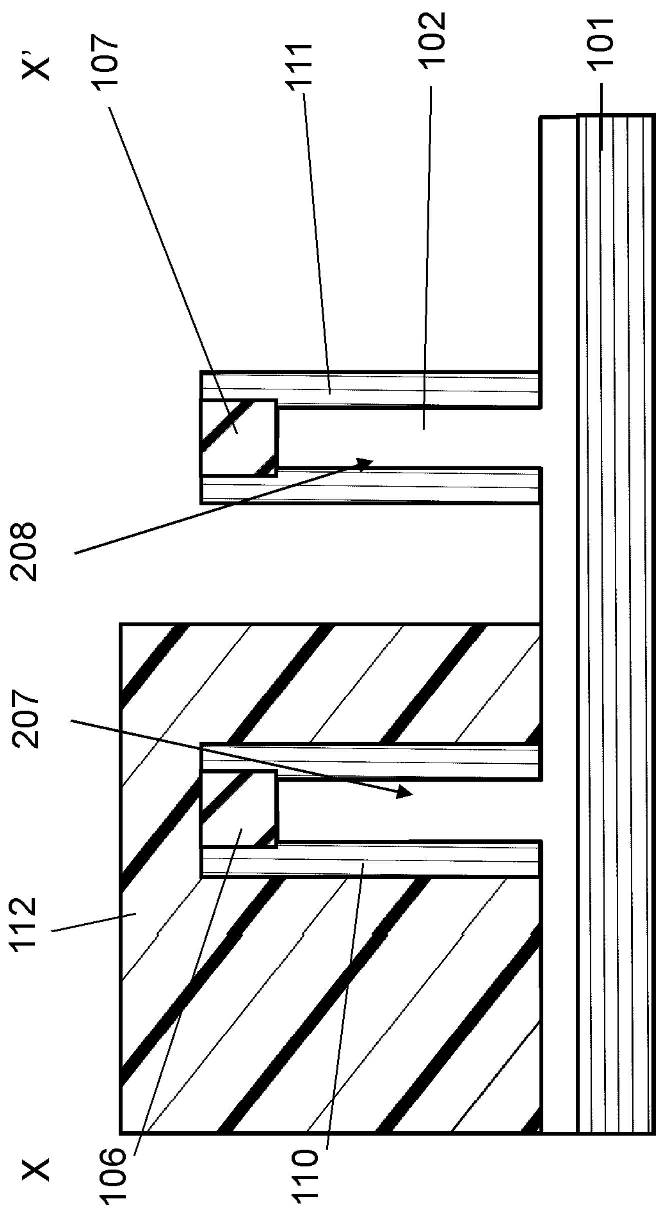
FIG. 21B is a cross-sectional diagram taken in the line X-X' of FIG. 21A.
Figure 22A:
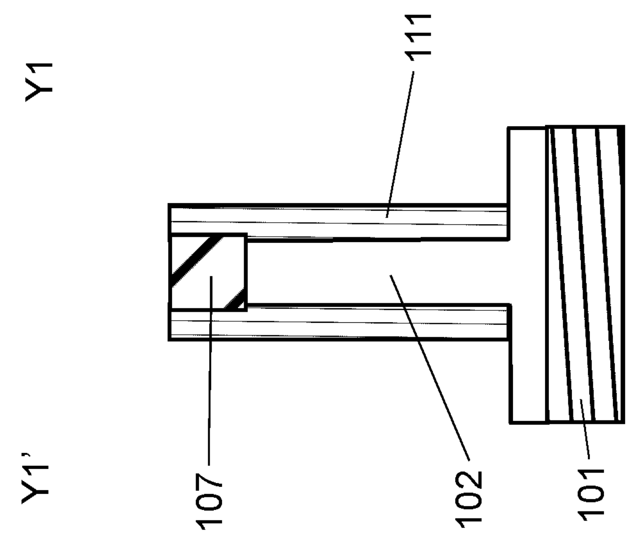
FIG. 22A is a cross-sectional diagram taken in the line Y1-Y1' of FIG. 21A.
Figure 22B:
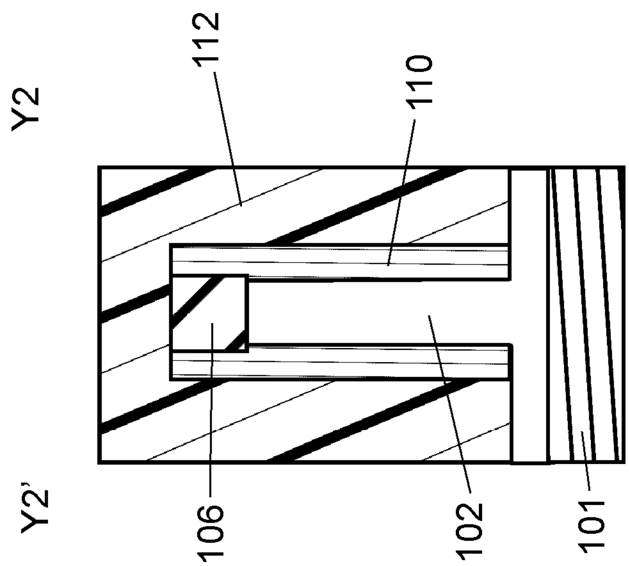
FIG. 22B is a cross-sectional diagram taken in the line Y2-Y2' of FIG. 21A.

In FIG. 3A to FIG. 4B, FIG. 3(*a*) shows a top view, FIG. 3B shows a cross-sectional diagram taken in the cutting line X-X' of FIG. 3A, FIG. 4A is a cross-sectional diagram taken in the cutting line Y1-Y1' of FIG. 3A, and FIG. 4B shows a cross-sectional diagram taken in the cutting line Y2-Y2' of FIG. 3A. Also in the following, it is similar for FIG. 5A to FIG. 148B.

As shown in FIG. 3A to FIG. 4B, a nitride film 103 is further formed on a substrate composed of a silicon dioxide film 101 and a silicon layer 102. A substrate consisting of silicon may be used. Alternatively, a substrate by which an oxide film is formed on silicon and a silicon layer is formed on the oxide film may be used. In this embodiment, an i type silicon layer is used as the silicon layer 102. An impurity is doped into the part acting as a channel of SGT when using a p type silicon layer and a n type silicon layer as the silicon layer 102. Alternatively, a thin n type silicon layer or a thin p type silicon layer may be used instead of the i type silicon layer.

As shown in FIG. 5A to FIG. 6B, resists 104 and 105 for forming a hard mask for formation of the columnar silicon layer is formed.

As shown in FIG. 7A to FIG. 8B, the nitride film 103 is etched to form hard masks 106 and 107.

As shown in FIG. 9A to FIG. 10B, the silicon layer 102 is etched by applying the hard mask 106 and 107 as a mask to form columnar silicon layers 207 and 208.

As shown in FIG. 11A to FIG. 12B, the resists 104 and 105 are removed.

As shown in FIG. 13A to FIG. 14B, a surface of the silicon layer 102 is oxidized to form a sacrificing oxide film 108. The sacrifice oxidation removes the silicon surface where carbon and the like are driven in the silicon etching.

As shown in FIG. 15A to FIG. 16B, etching removes the sacrificing oxide film 108.

As shown in FIG. 17A to FIG. 18B, an oxide film 109 is formed on the results of the above-mentioned processing step.

As shown in FIG. 19A to FIG. 20B, the oxide film 109 is etched to remain in a sidewall shape on sidewalls of the columnar silicon layers, and thereby sidewalls 110 and 111 are formed. When an n+ type silicon layer is formed into a lower part of the columnar silicon layers 207 and 208 by impurity implantation, the impurity is not doped into a channel by the sidewalls 101 and 111, and therefore a variation in threshold voltage of the SGT can be suppressed.

As shown in FIG. 21A to FIG. 22B, a resist 112 for implanting the impurity into the lower part of the columnar silicon layer 208 is formed.

Figure 23A:
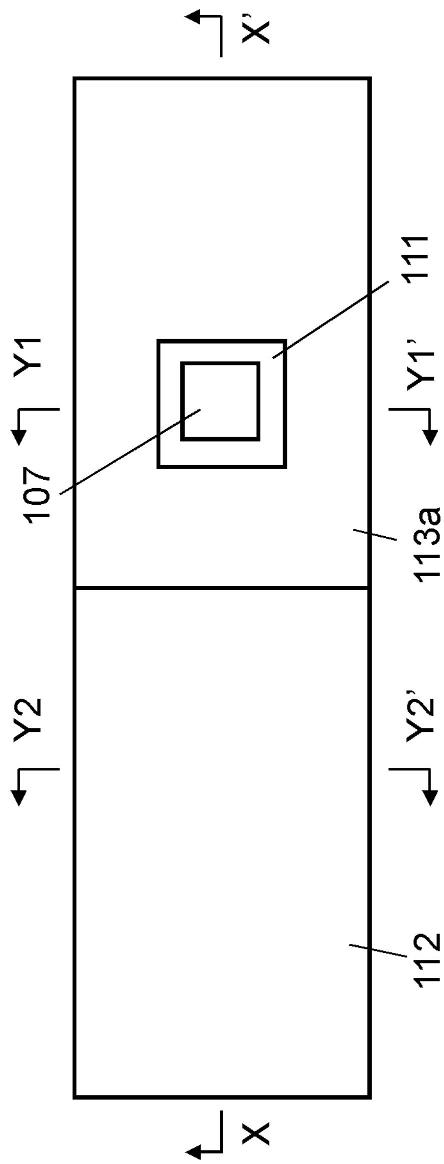
FIG. 23A is a top view for explaining the fabrication method of the semiconductor device according to the first embodiment.
Figure 23B:
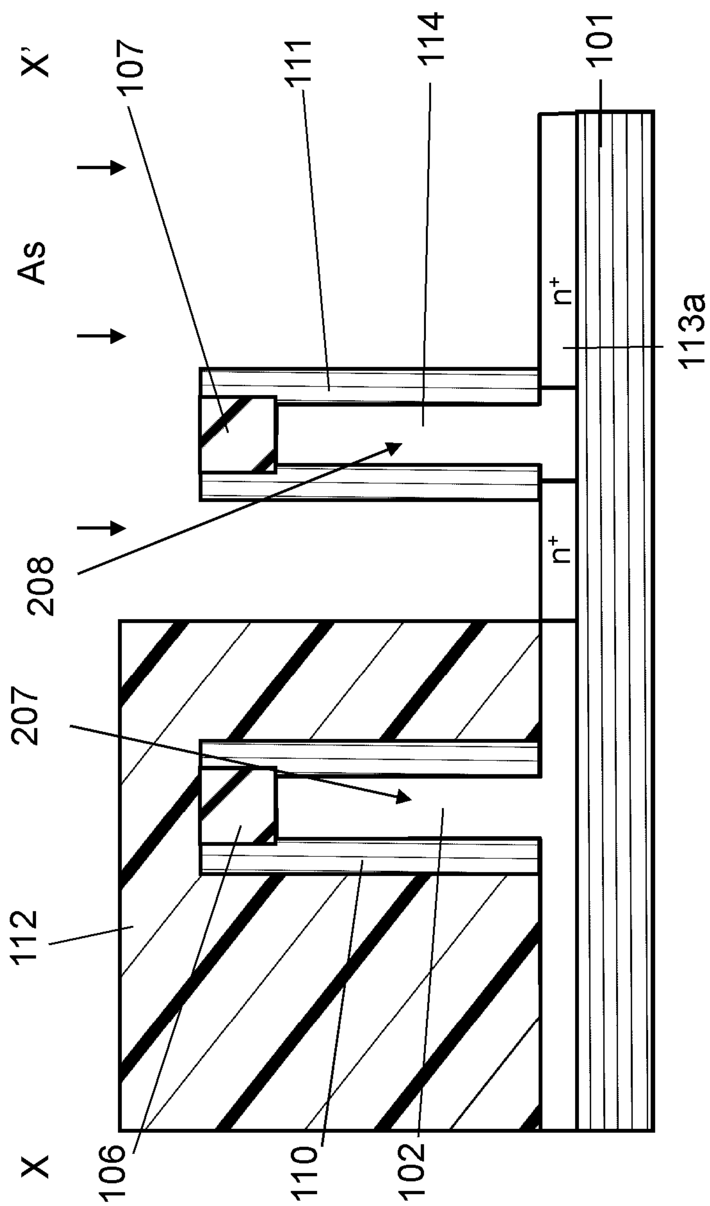
FIG. 23B is a cross-sectional diagram taken in the line X-X' of FIG. 23A.
Figure 24A:
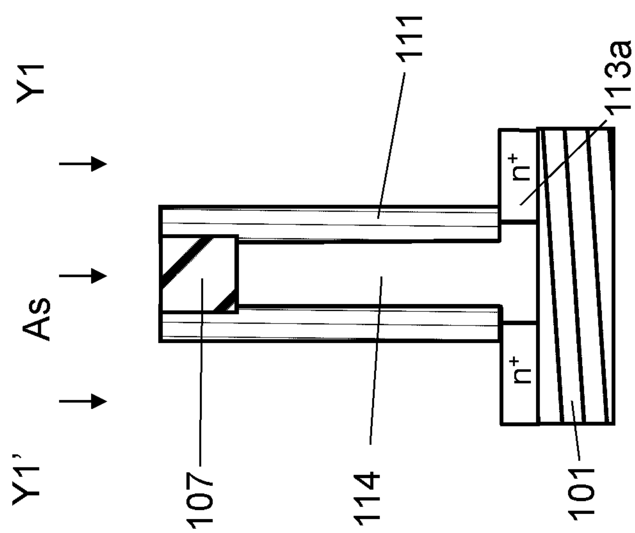
FIG. 24A is a cross-sectional diagram taken in the line Y1-Y1' of FIG. 23A.
Figure 24B:
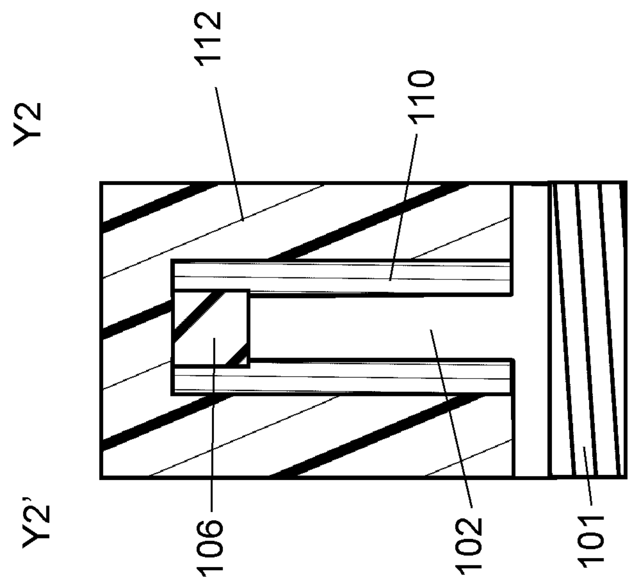
FIG. 24B is a cross-sectional diagram taken in the line Y2-Y2' of FIG. 23A.
Figure 25A:
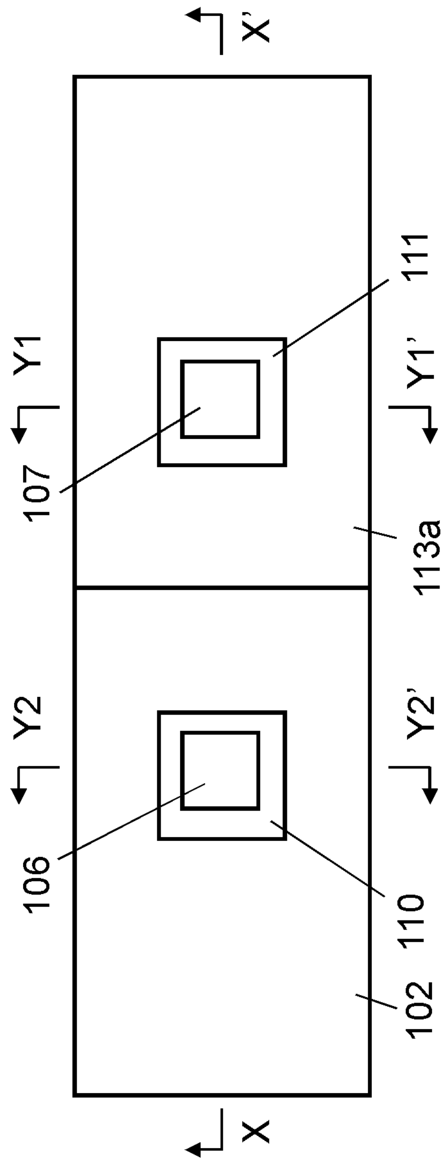
FIG. 25A is a top view for explaining the fabrication method of the semiconductor device according to the first embodiment.
Figure 25B:
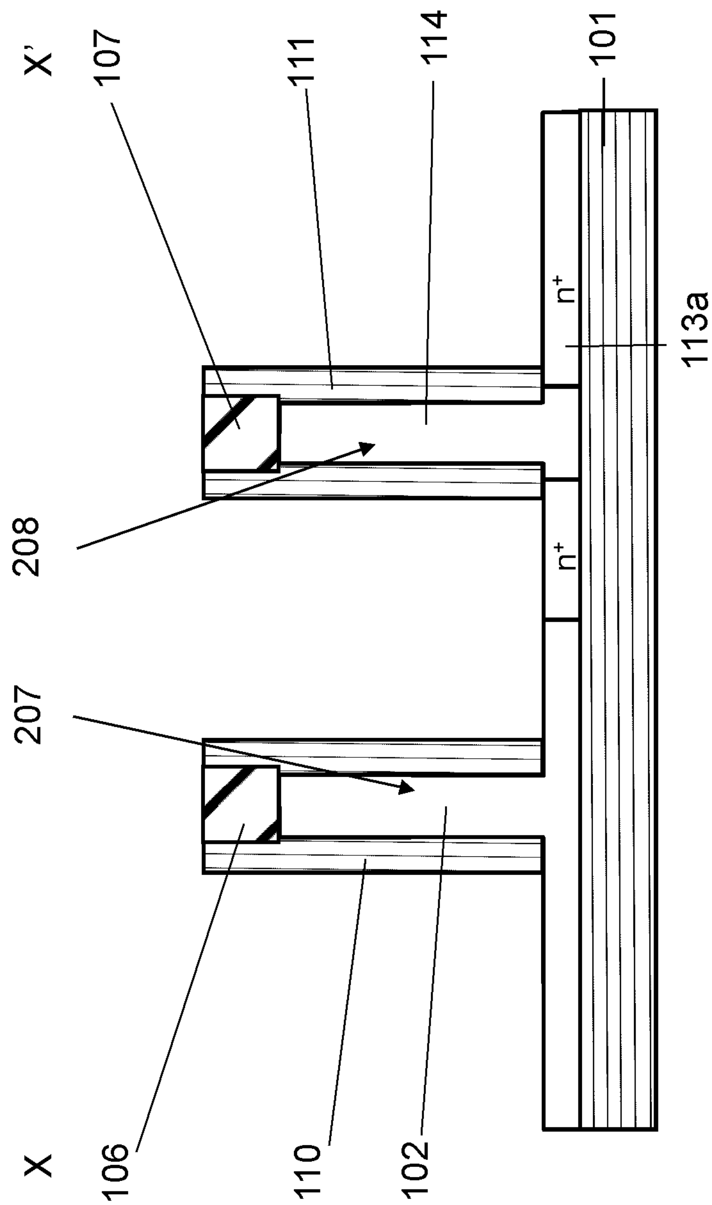
FIG. 25B is a cross-sectional diagram taken in the line X-X' of FIG. 25A.
Figure 26A:
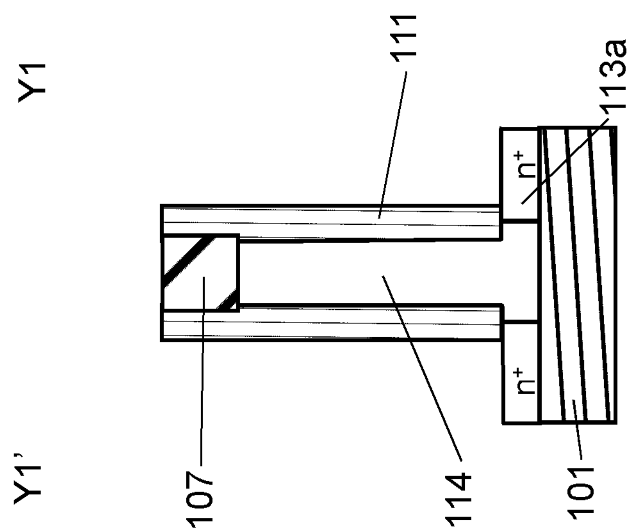
FIG. 26A is a cross-sectional diagram taken in the line Y1-Y1' of FIG. 25A.
Figure 26B:
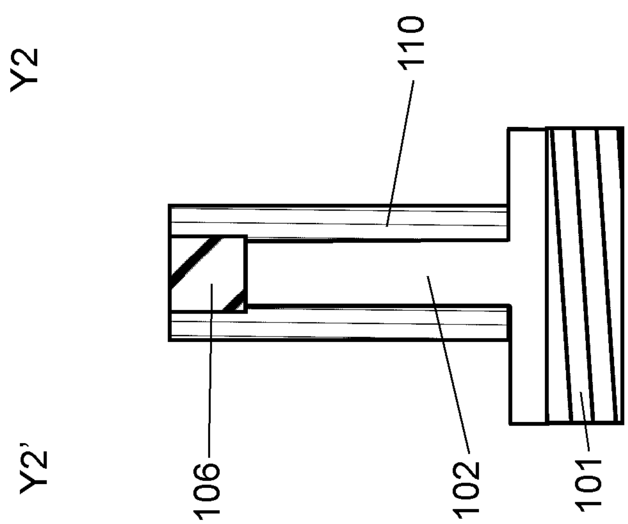
FIG. 26B is a cross-sectional diagram taken in the line Y2-Y2' of FIG. 25A.
Figure 27A:
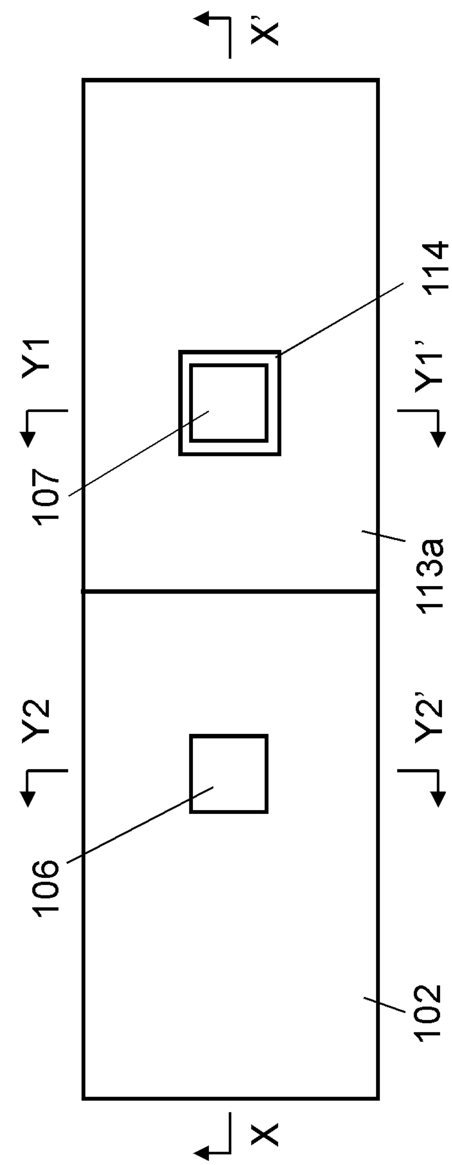
FIG. 27A is a top view for explaining the fabrication method of the semiconductor device according to the first embodiment.
Figure 27B:
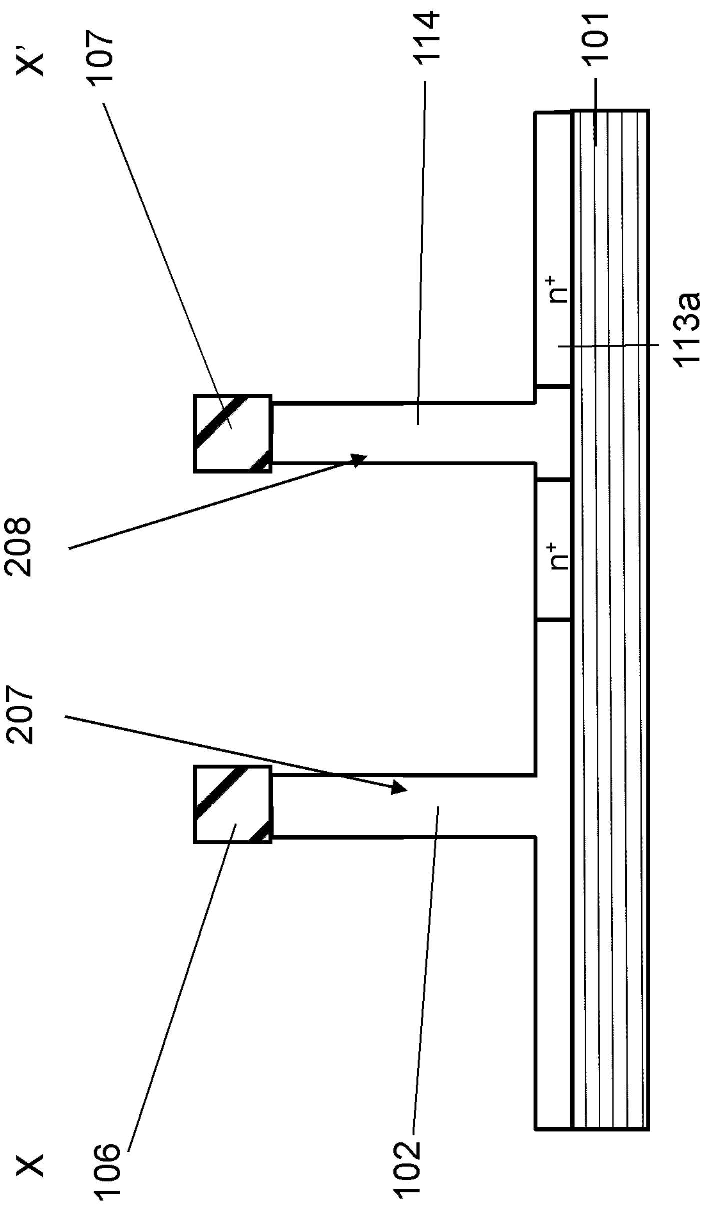
FIG. 27B is a cross-sectional diagram taken in the line X-X' of FIG. 27A.
Figure 28A:
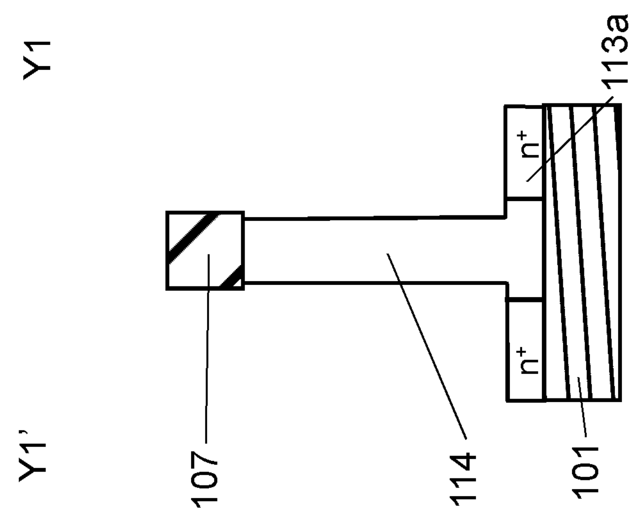
FIG. 28A is a cross-sectional diagram taken in the line Y1-Y1' of FIG. 27A.
Figure 28B:
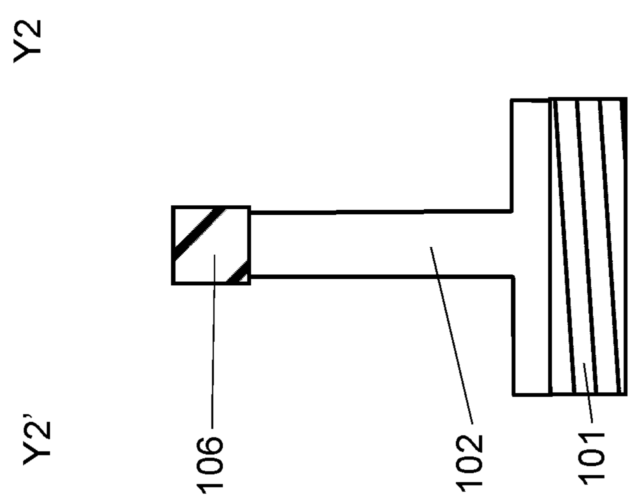
FIG. 28B is a cross-sectional diagram taken in the line Y2-Y2' of FIG. 27A.
Figure 29A:
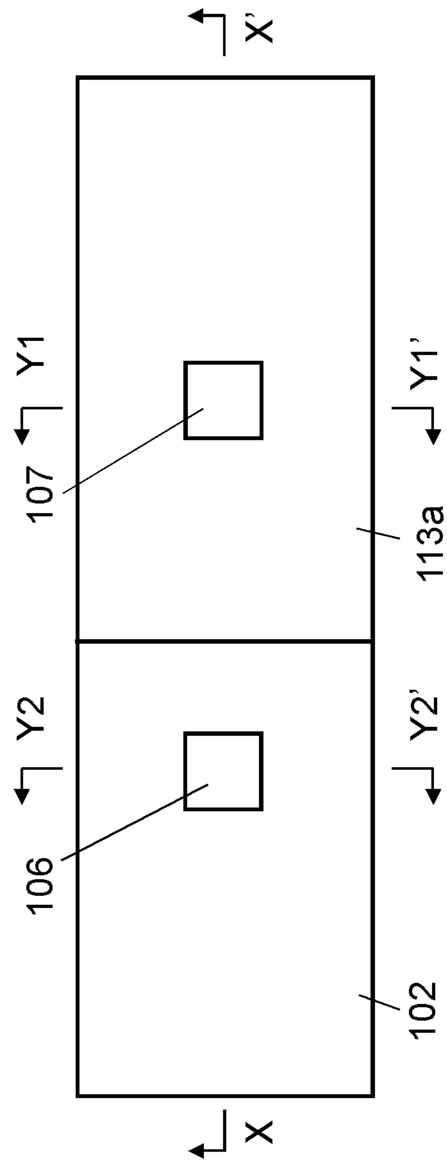
FIG. 29A is a top view for explaining the fabrication method of the semiconductor device according to the first embodiment.
Figure 29B:
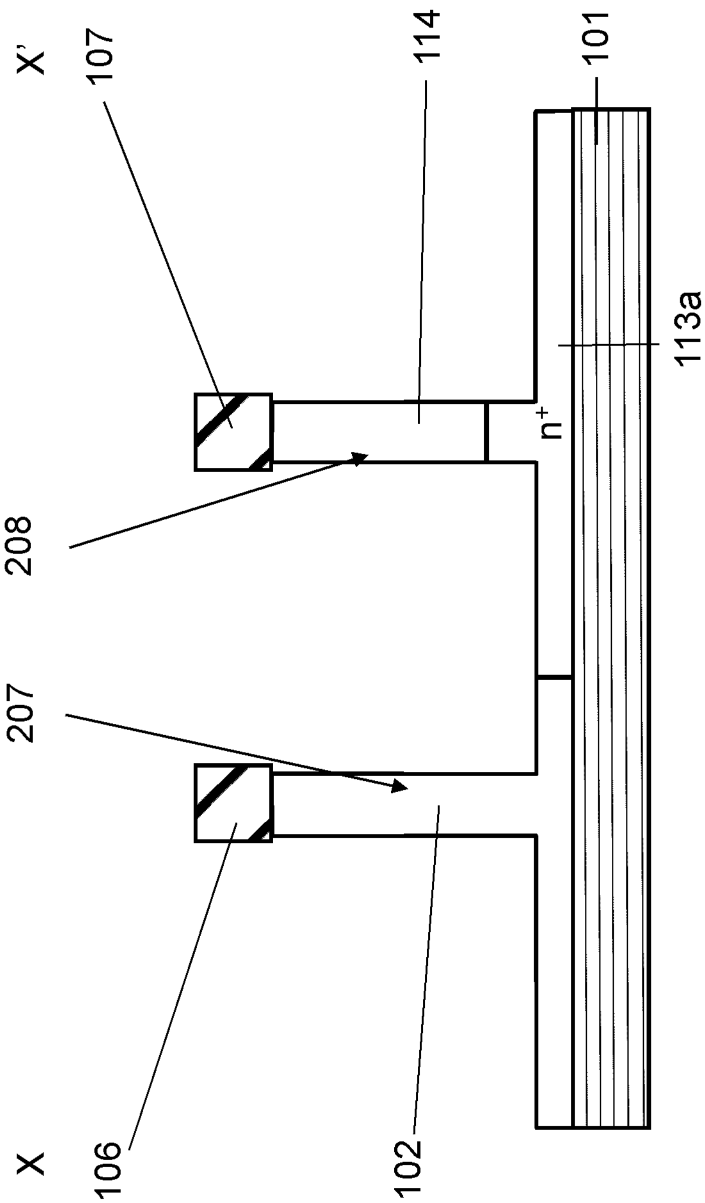
FIG. 29B is a cross-sectional diagram taken in the line X-X' of FIG. 29A.
Figure 30A:
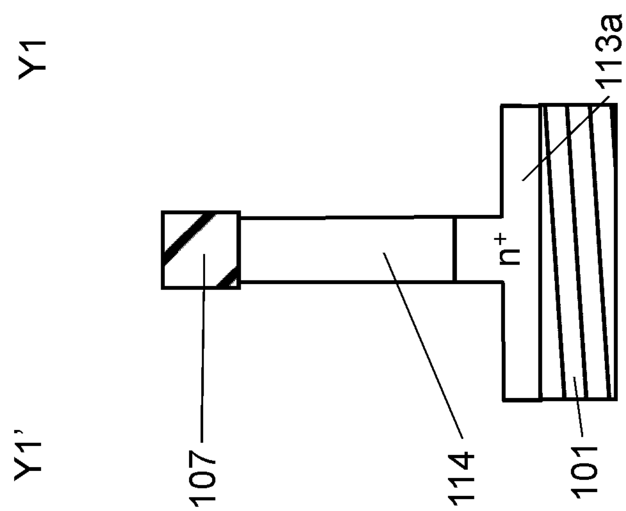
FIG. 30A is a cross-sectional diagram taken in the line Y1-Y1' of FIG. 29A.
Figure 30B:
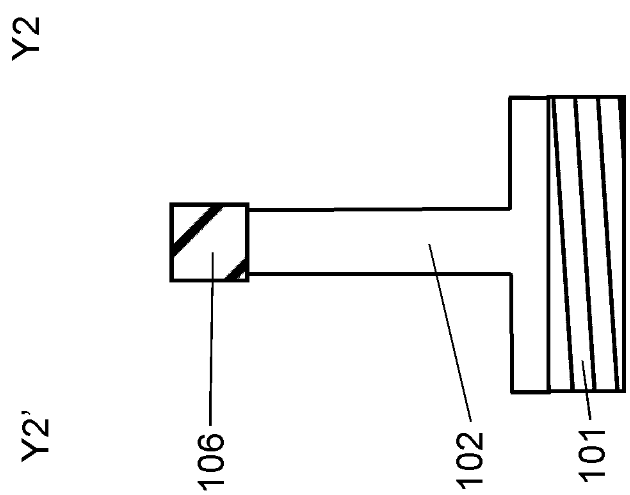
FIG. 30B is a cross-sectional diagram taken in the line Y2-Y2' of FIG. 29A.
Figure 31A:
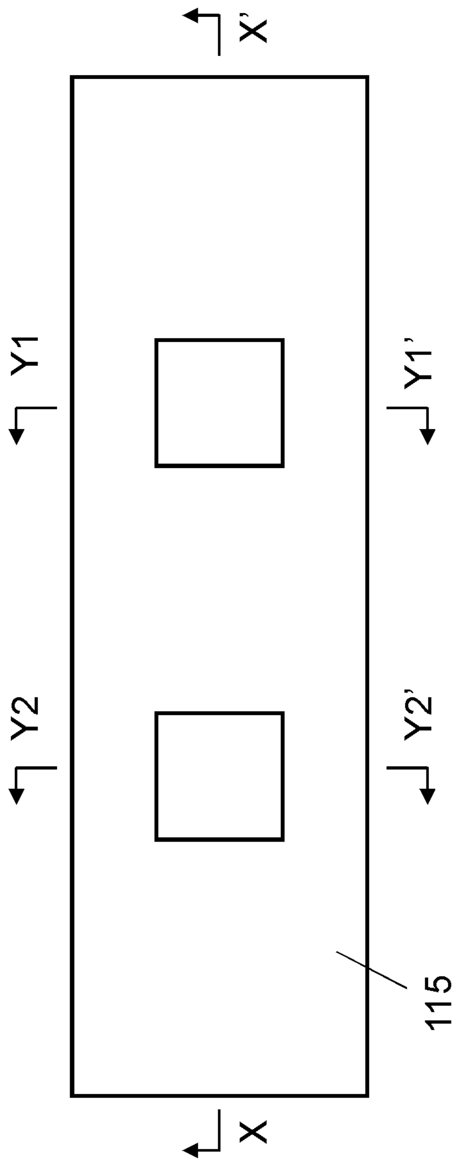
FIG. 31A is a top view for explaining the fabrication method of the semiconductor device according to the first embodiment.
Figure 31B:
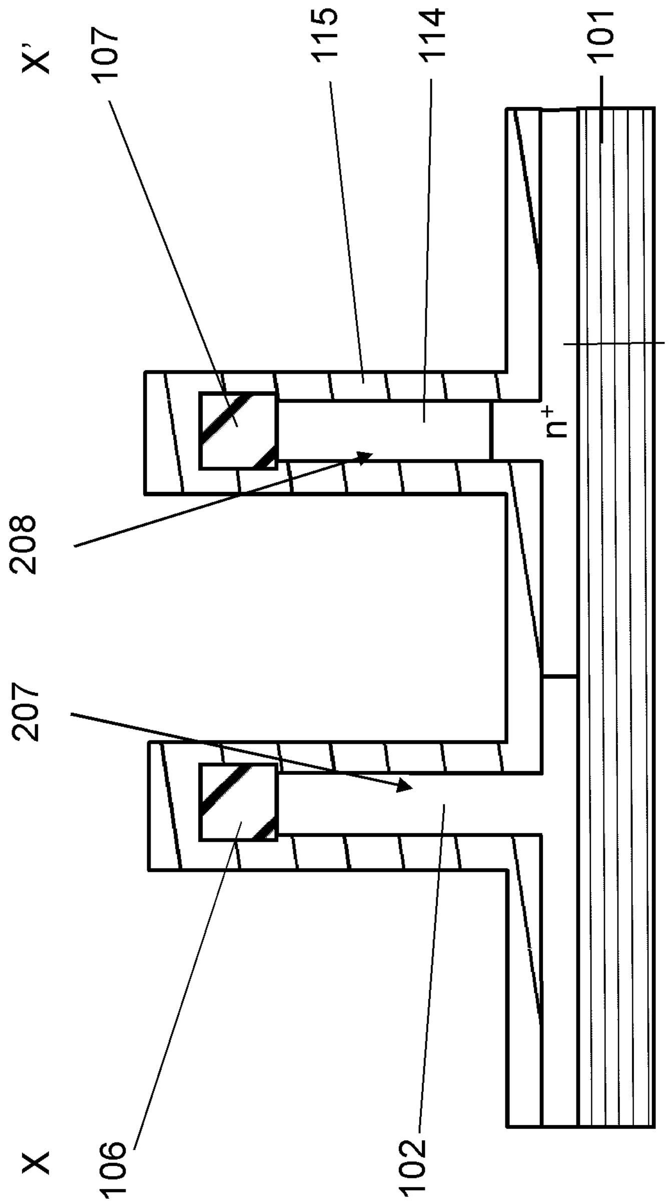
FIG. 31B is a cross-sectional diagram taken in the line X-X' of FIG. 31A.
Figure 32A:
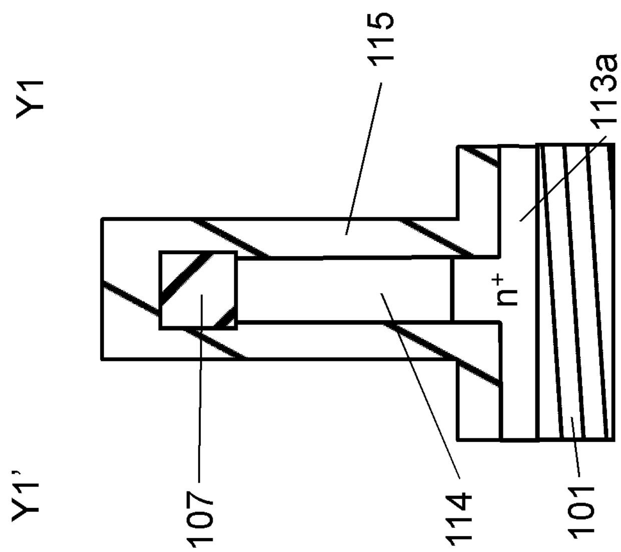
FIG. 32A is a cross-sectional diagram taken in the line Y1-Y1' of FIG. 31A.
Figure 32B:
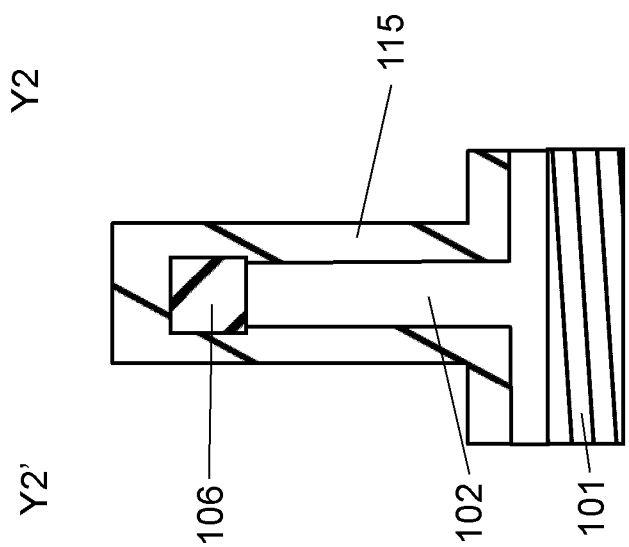
FIG. 32B is a cross-sectional diagram taken in the line Y2-Y2' of FIG. 31A.
Figure 33A:
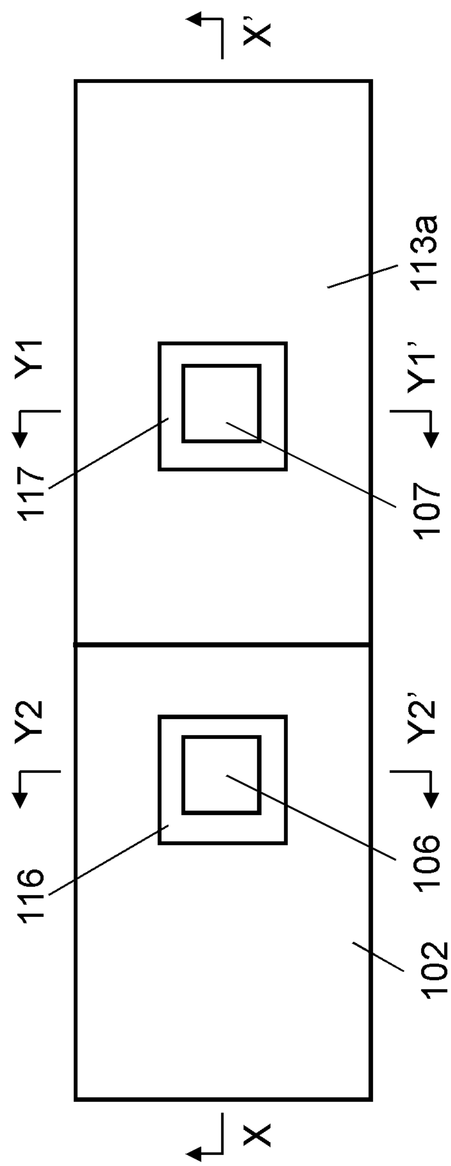
FIG. 33A is a top view for explaining the fabrication method of the semiconductor device according to the first embodiment.
Figure 33B:
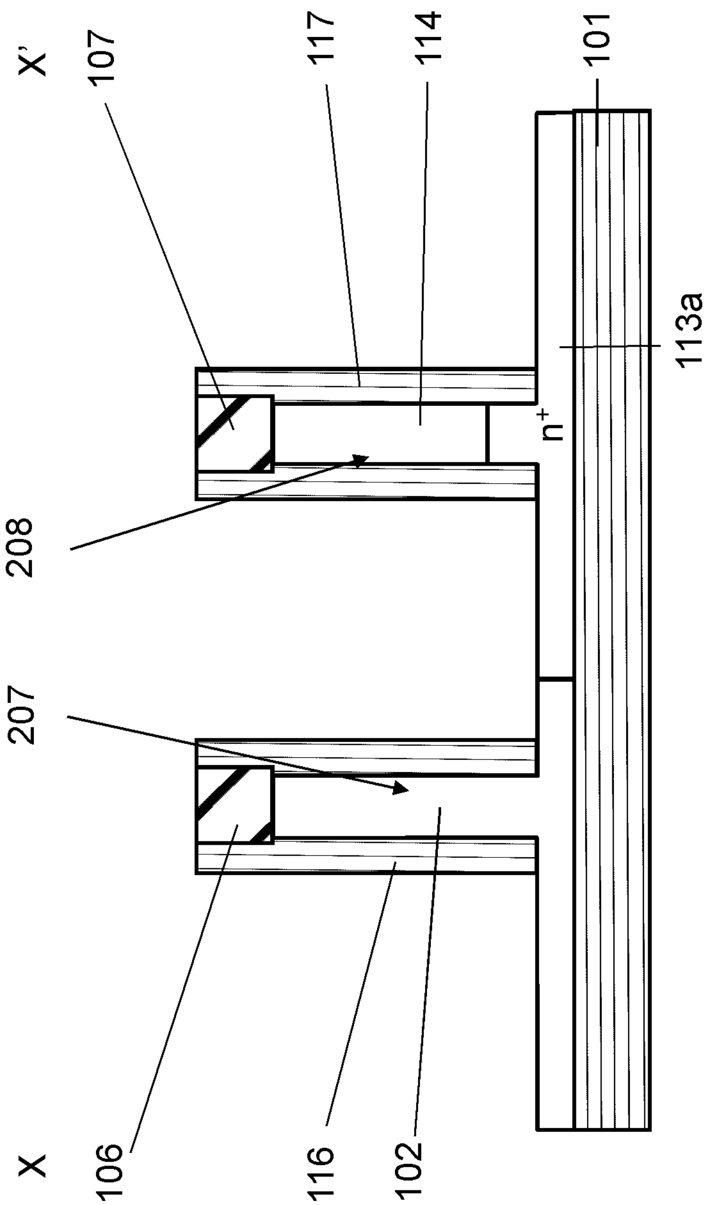
FIG. 33B is a cross-sectional diagram taken in the line X-X' of FIG. 33A.
Figure 34A:
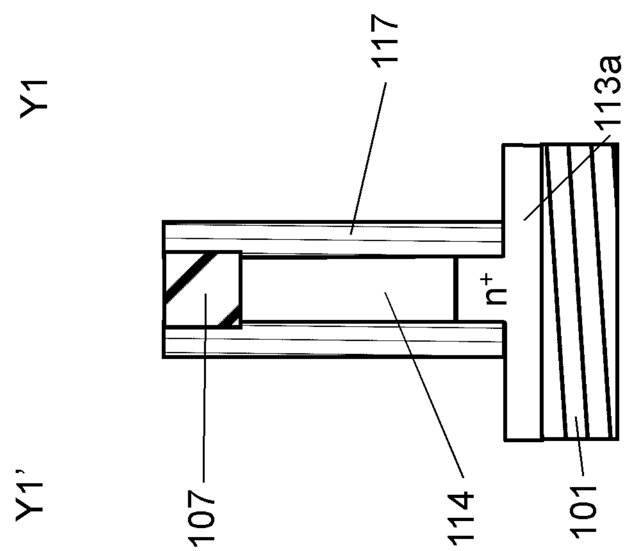
FIG. 34A is a cross-sectional diagram taken in the line Y1-Y1' of FIG. 33A.
Figure 34B:
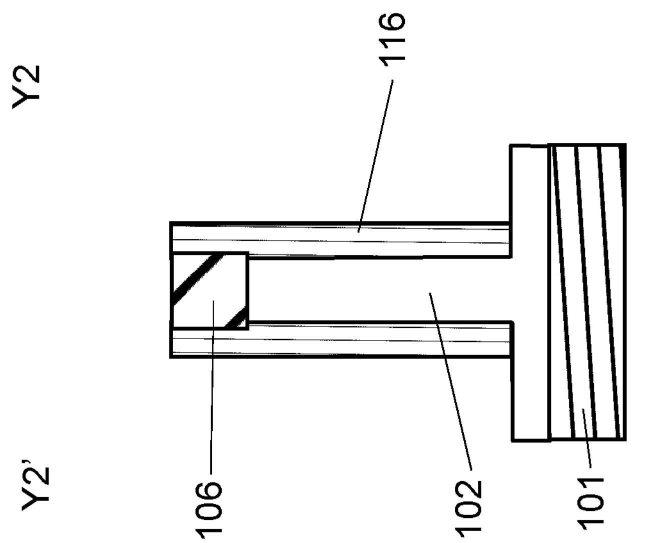
FIG. 34B is a cross-sectional diagram taken in the line Y2-Y2' of FIG. 33A.
Figure 35A:
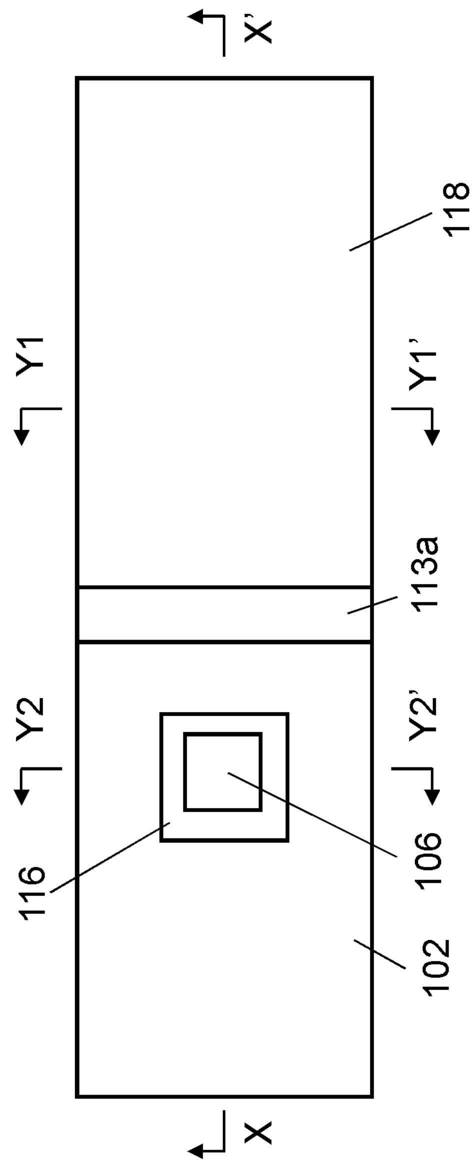
FIG. 35A is a top view for explaining the fabrication method of the semiconductor device according to the first embodiment.
Figure 35B:
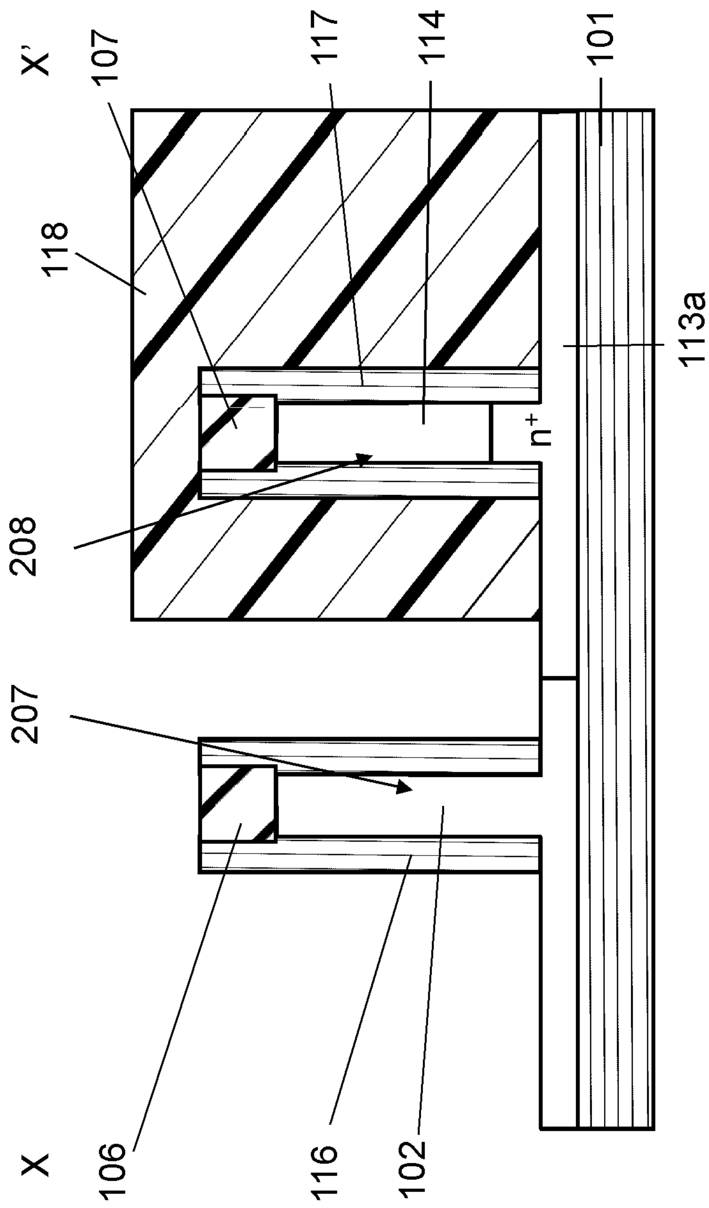
FIG. 35B is a cross-sectional diagram taken in the line X-X' of FIG. 35A.
Figure 36A:
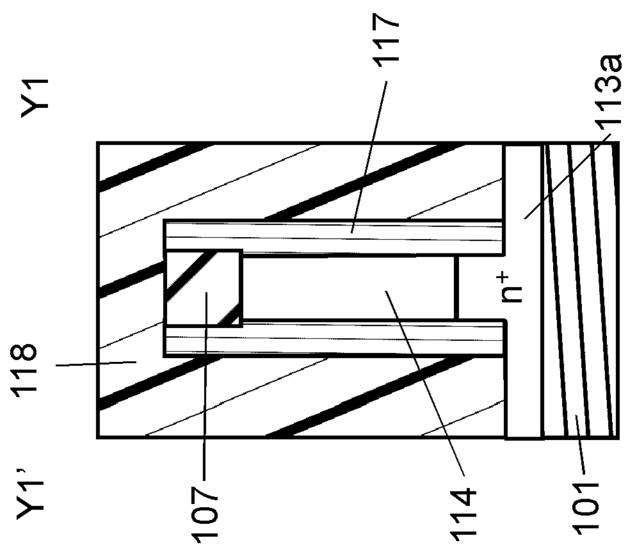
FIG. 36A is a cross-sectional diagram taken in the line Y1-Y1' of FIG. 35A.
Figure 36B:
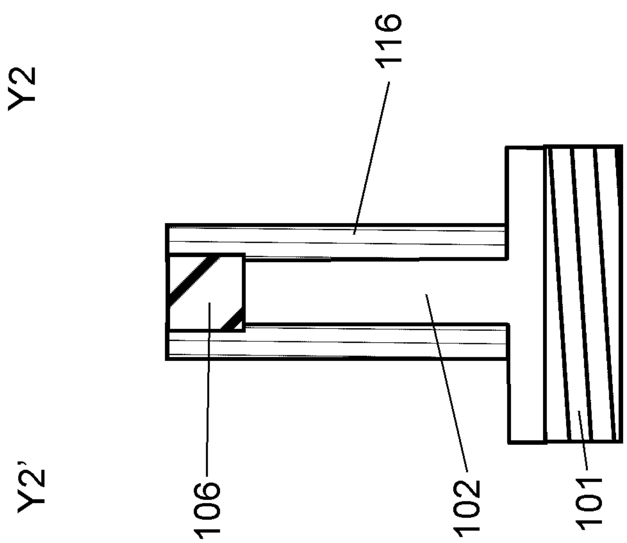
FIG. 36B is a cross-sectional diagram taken in the line Y2-Y2' of FIG. 35A.
Figure 37A:
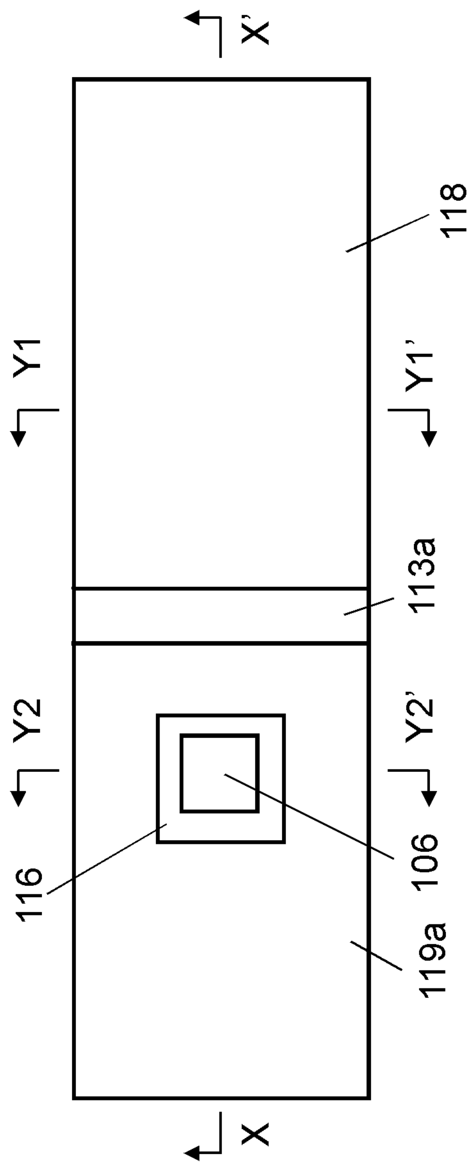
FIG. 37A is a top view for explaining the fabrication method of the semiconductor device according to the first embodiment.
Figure 37B:
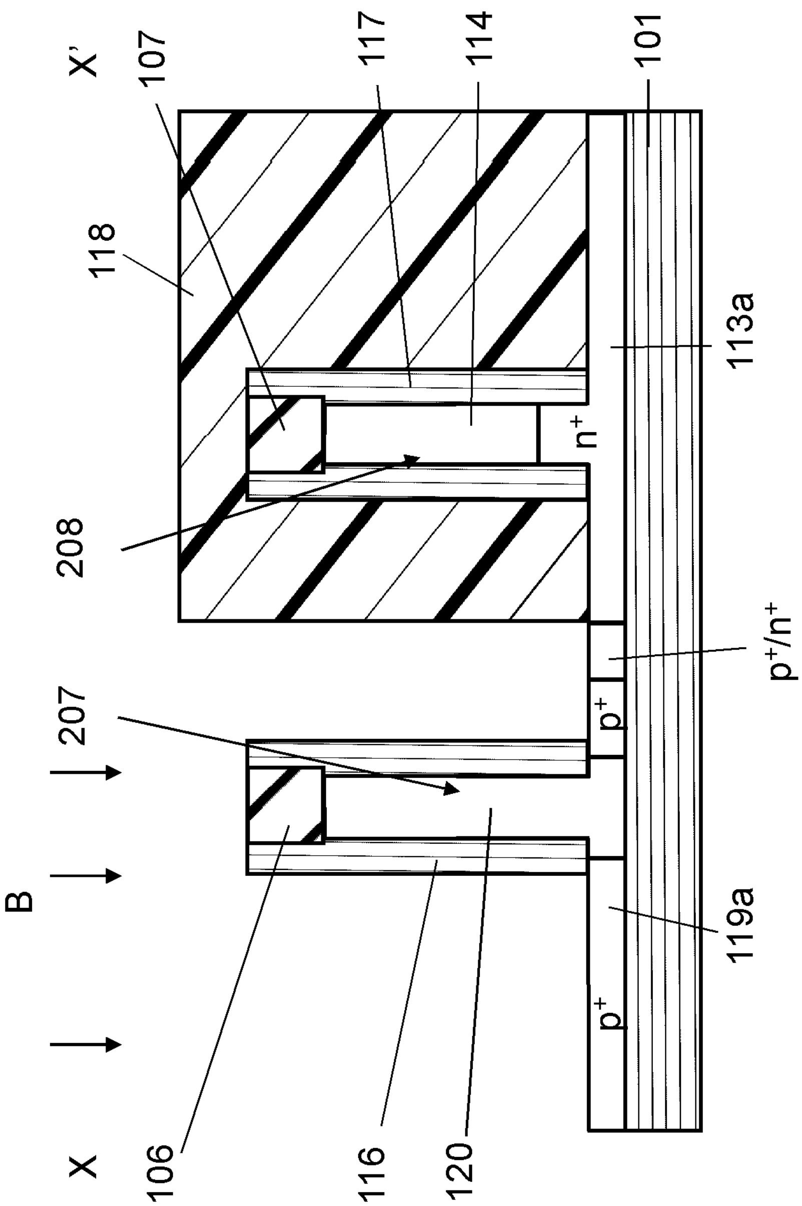
FIG. 37B is a cross-sectional diagram taken in the line X-X' of FIG. 37A.
Figure 38A:
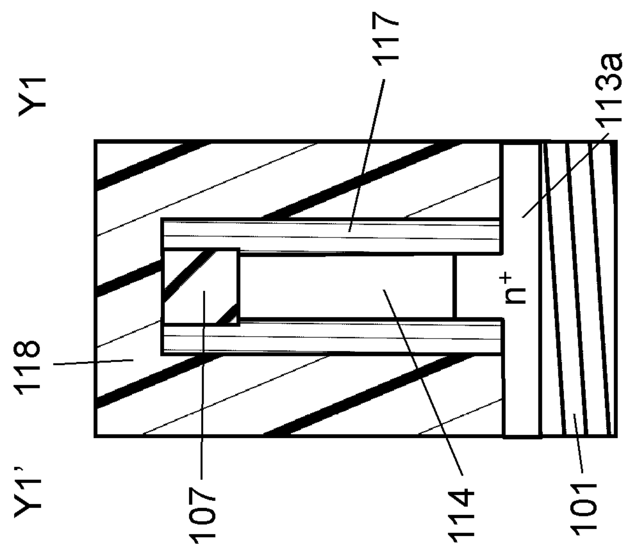
FIG. 38A is a cross-sectional diagram taken in the line Y1-Y1' of FIG. 37A.
Figure 38B:
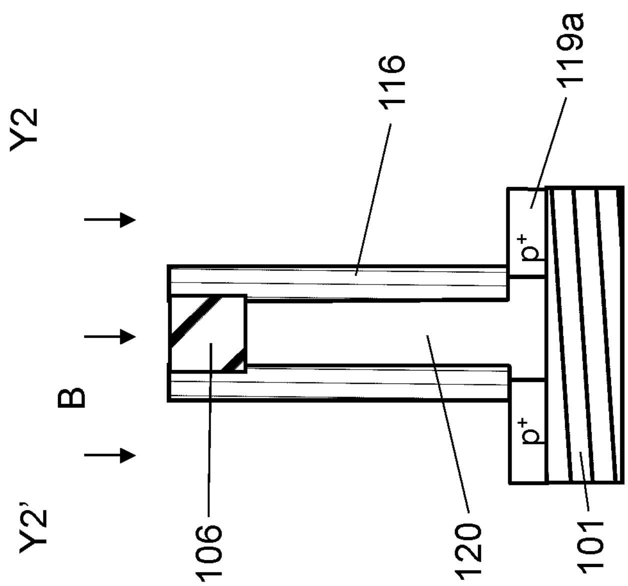
FIG. 38B is a cross-sectional diagram taken in the line Y2-Y2' of FIG. 37A.
Figure 39A:
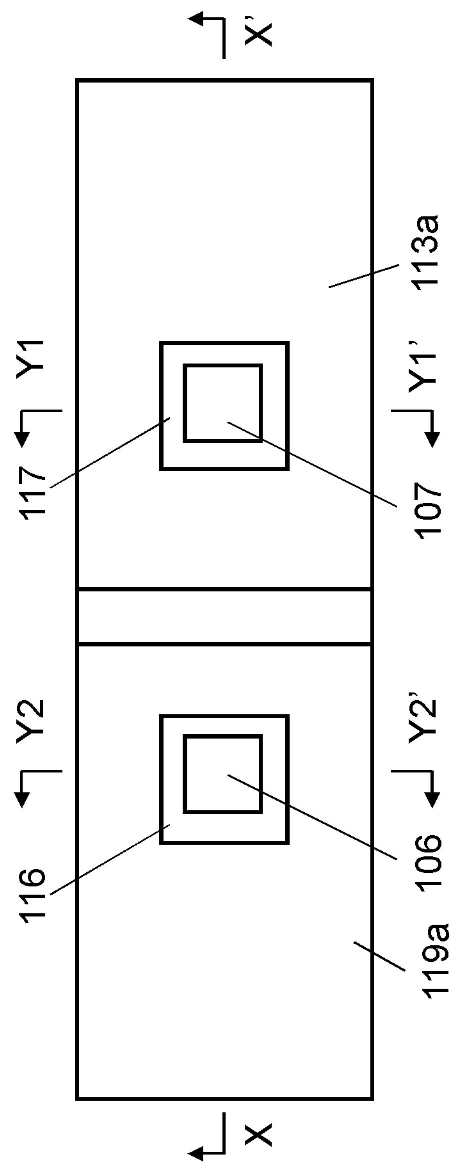
FIG. 39A is a top view for explaining the fabrication method of the semiconductor device according to the first embodiment.
Figure 39B:
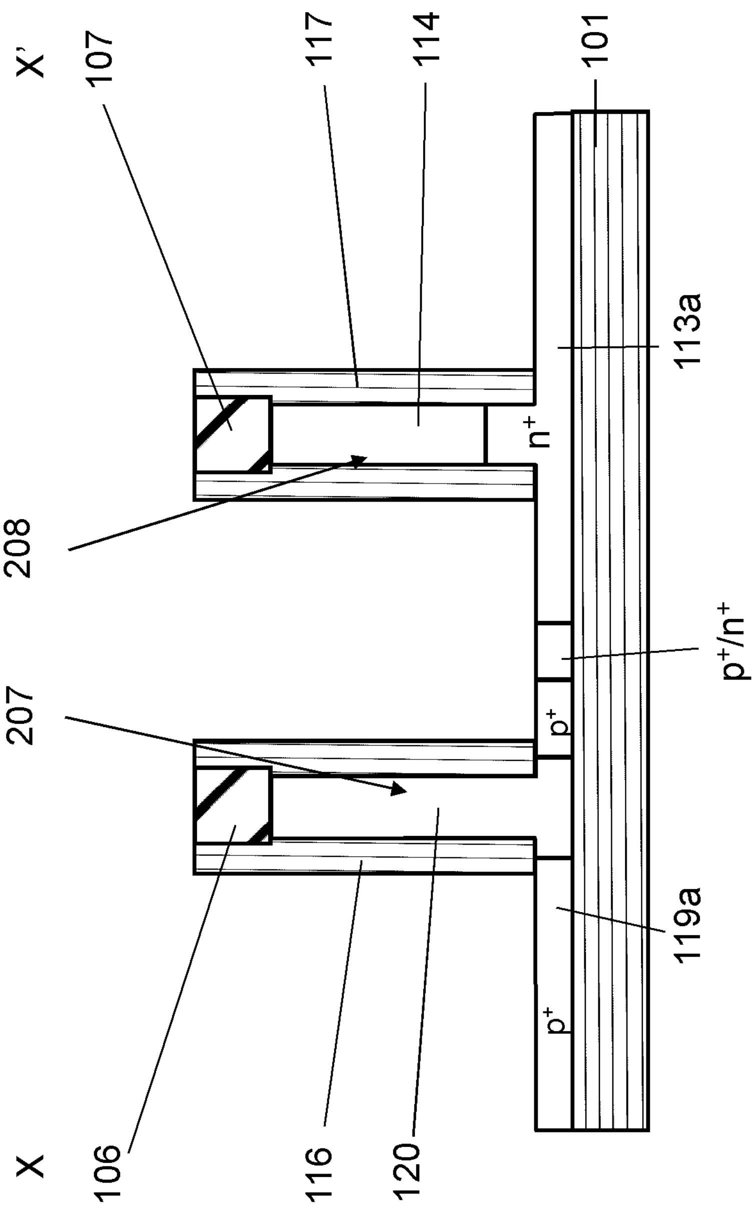
FIG. 39B is a cross-sectional diagram taken in the line X-X' of FIG. 39A.
Figure 40A:
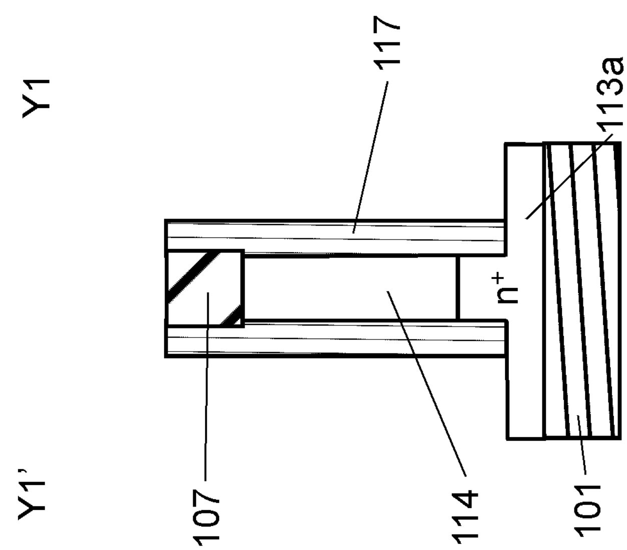
FIG. 40A is a cross-sectional diagram taken in the line Y1-Y1' of FIG. 39A.
Figure 40B:
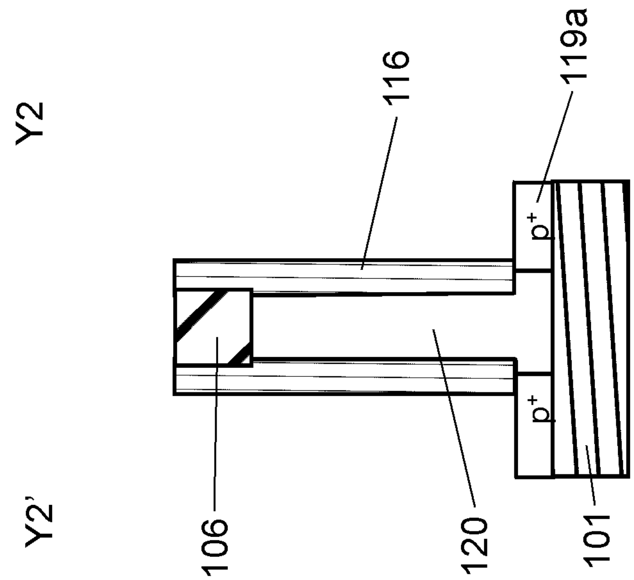
FIG. 40B is a cross-sectional diagram taken in the line Y2-Y2' of FIG. 39A.
Figure 41A:
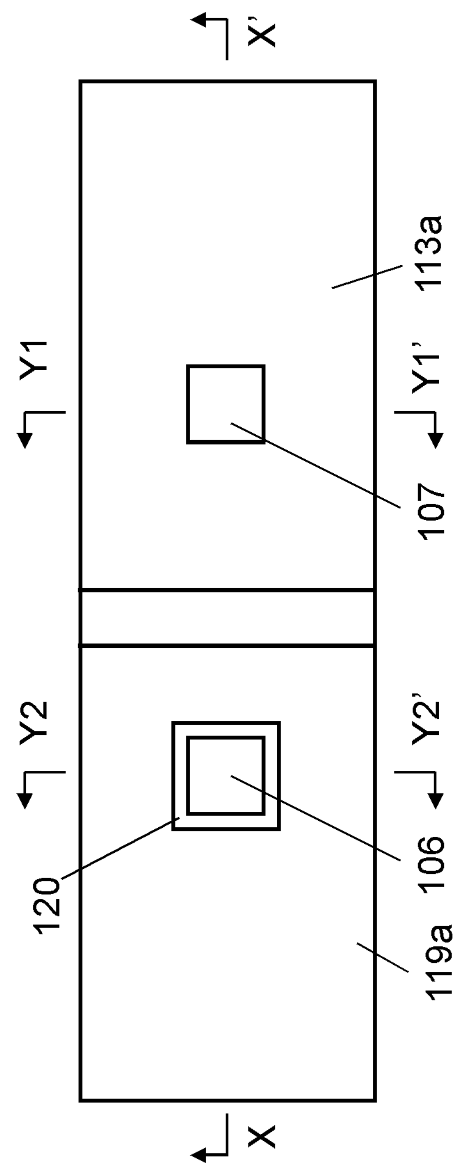
FIG. 41A is a top view for explaining the fabrication method of the semiconductor device according to the first embodiment.
Figure 41B:
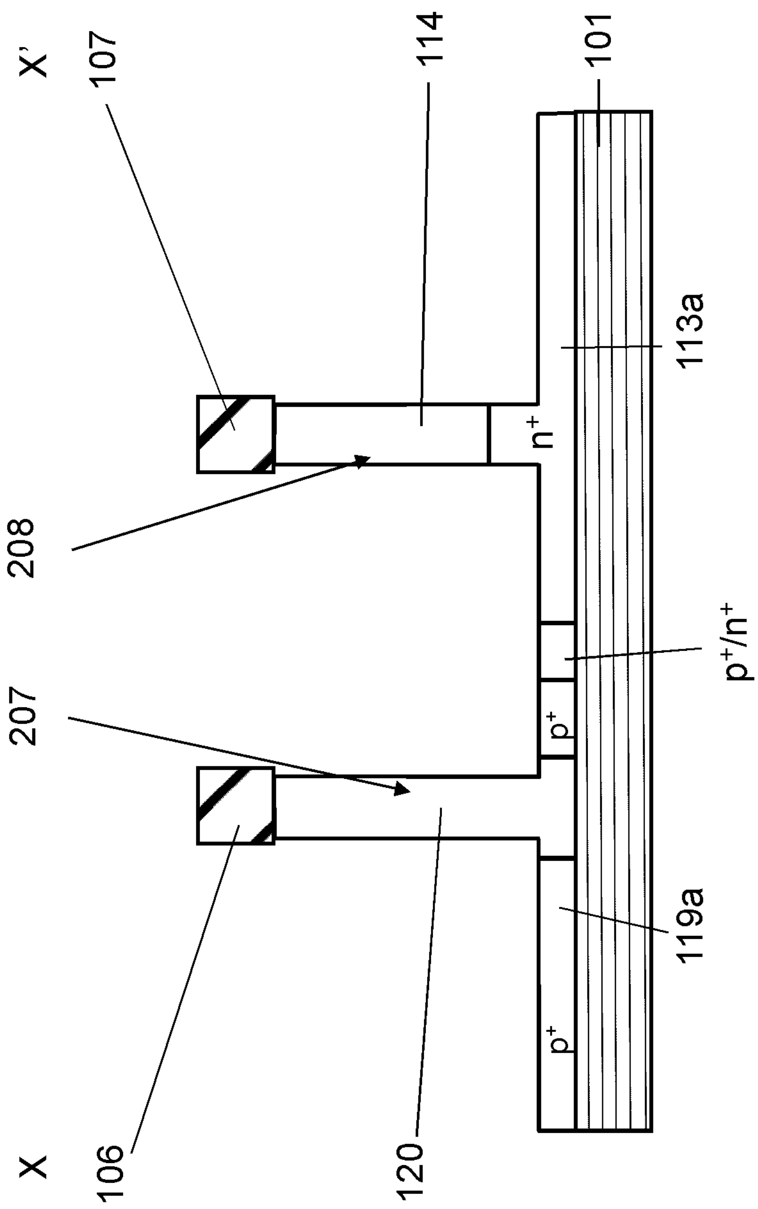
FIG. 41B is a cross-sectional diagram taken in the line X-X' of FIG. 41A.
Figure 42A:
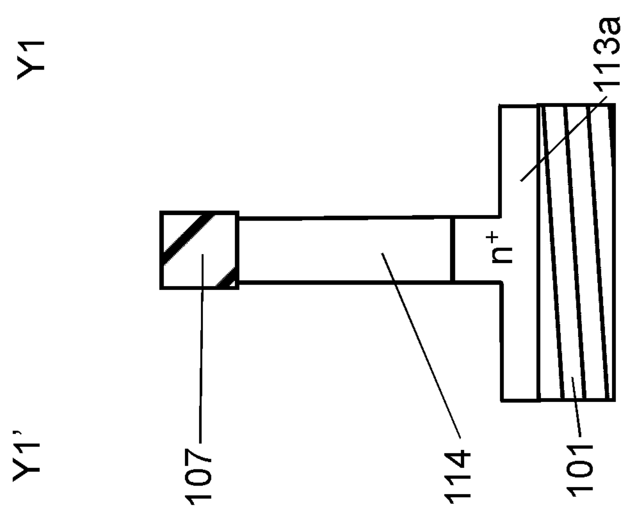
FIG. 42A is a cross-sectional diagram taken in the line Y1-Y1' of FIG. 41A.
Figure 42B:
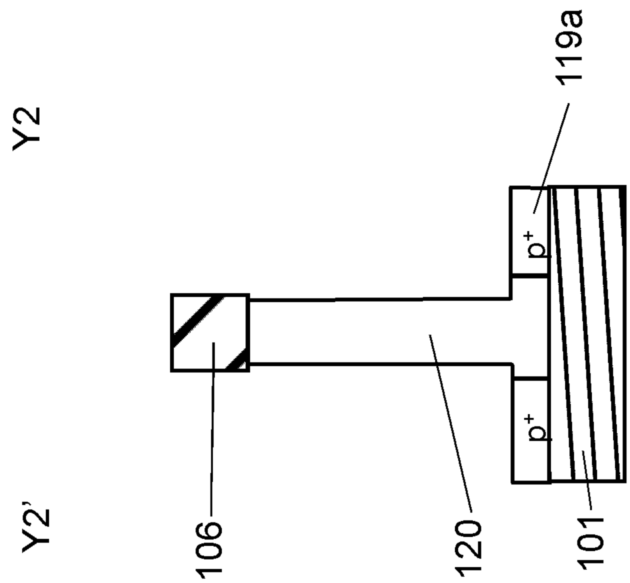
FIG. 42B is a cross-sectional diagram taken in the line Y2-Y2' of FIG. 41A.
Figure 43A:
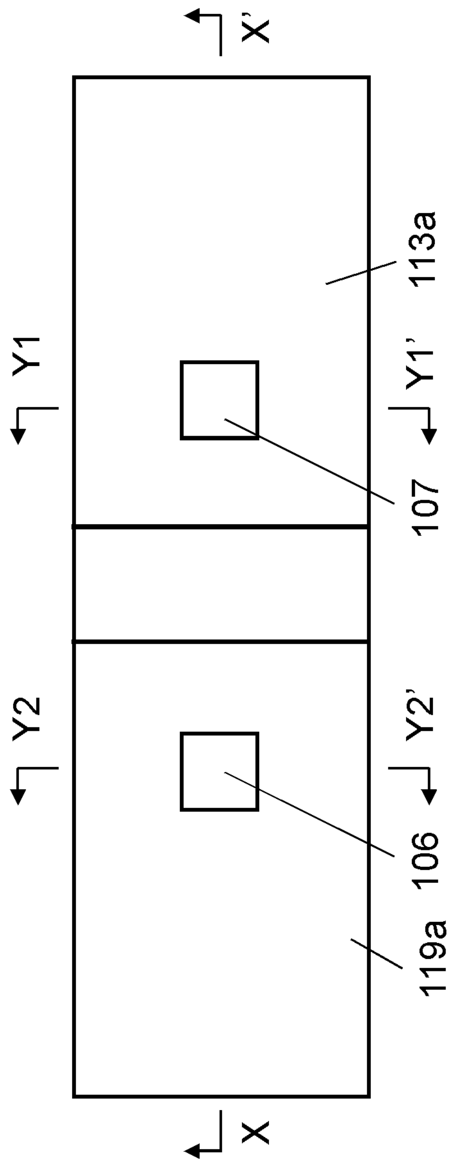
FIG. 43A is a top view for explaining the fabrication method of the semiconductor device according to the first embodiment.
Figure 43B:
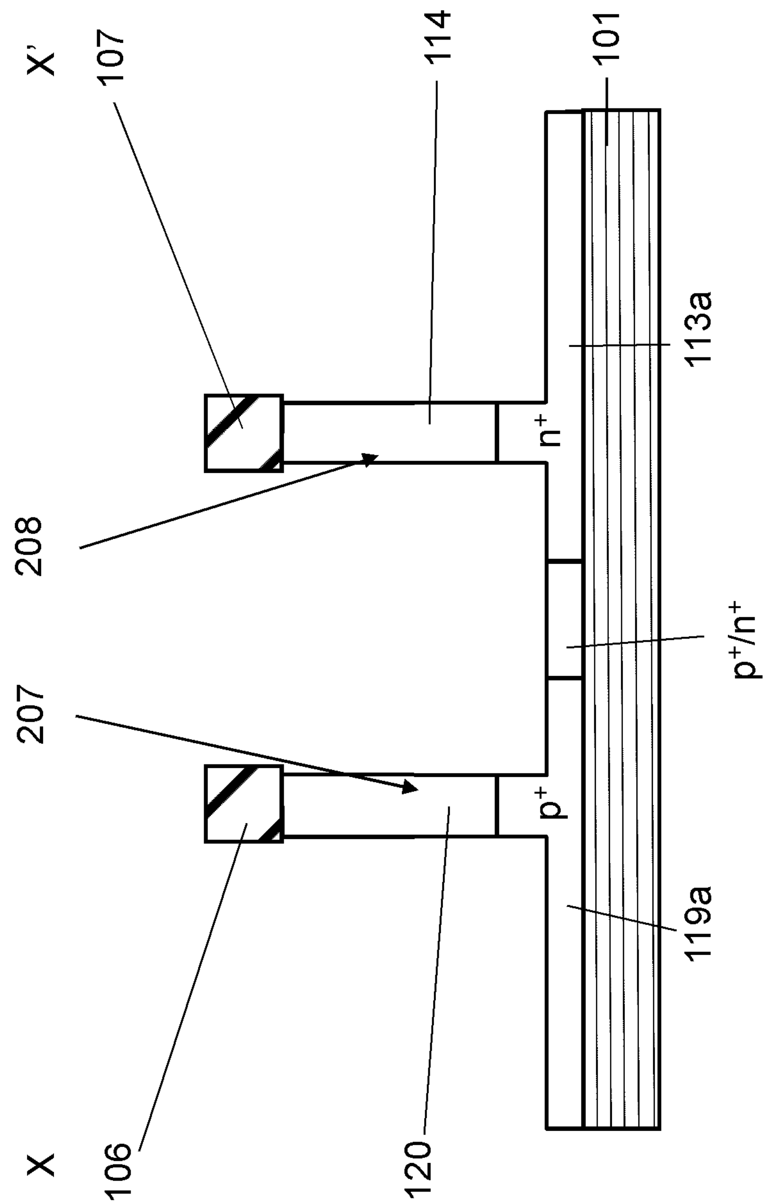
FIG. 43B is a cross-sectional diagram taken in the line X-X' of FIG. 43A.
Figure 44A:
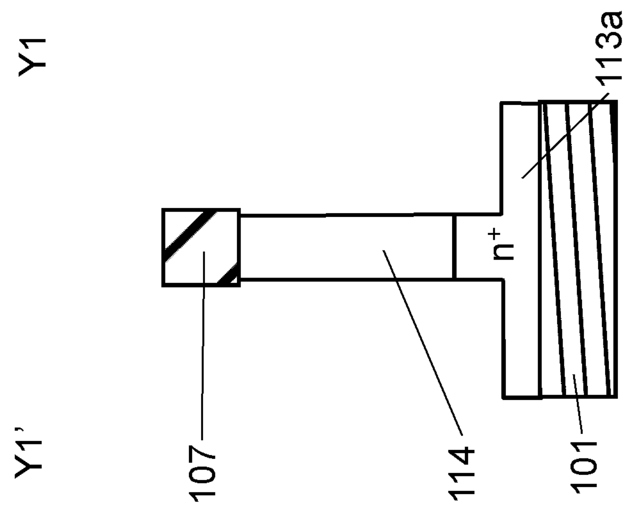
FIG. 44A is a cross-sectional diagram taken in the line Y1-Y1' of FIG. 43A.
Figure 44B:
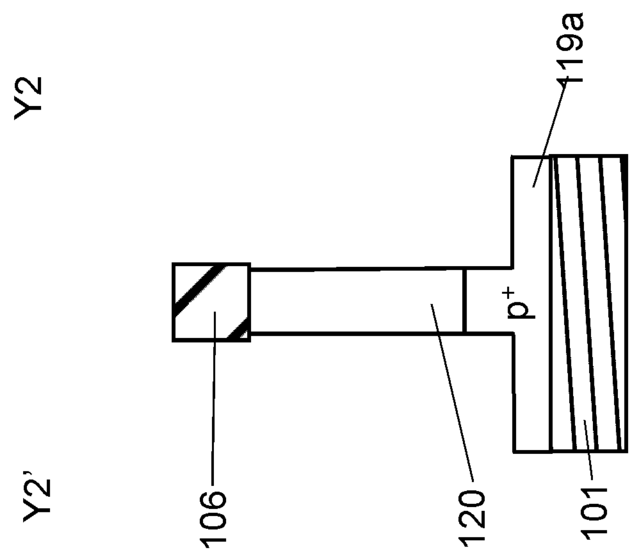
FIG. 44B is a cross-sectional diagram taken in the line Y2-Y2' of FIG. 43A.
Figure 45A:
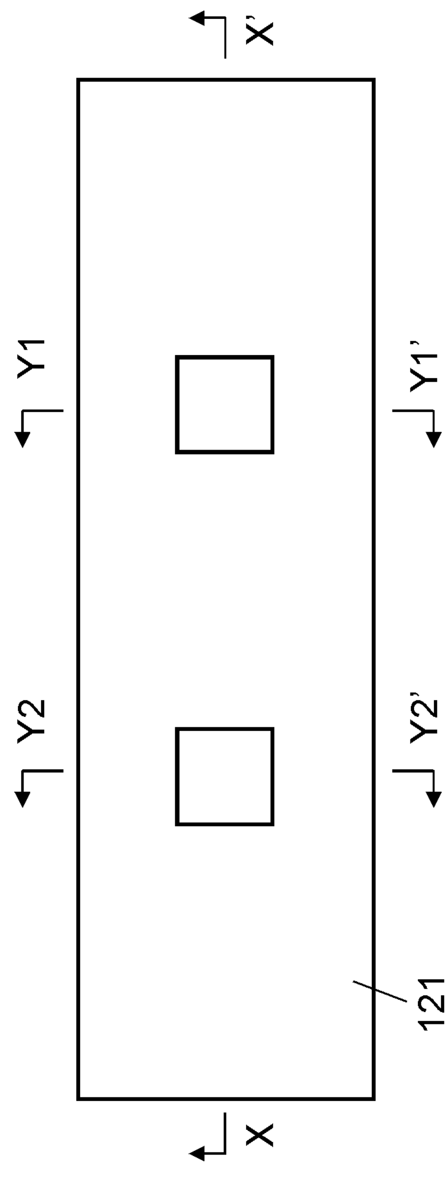
FIG. 45A is a top view for explaining the fabrication method of the semiconductor device according to the first embodiment.
Figure 45B:
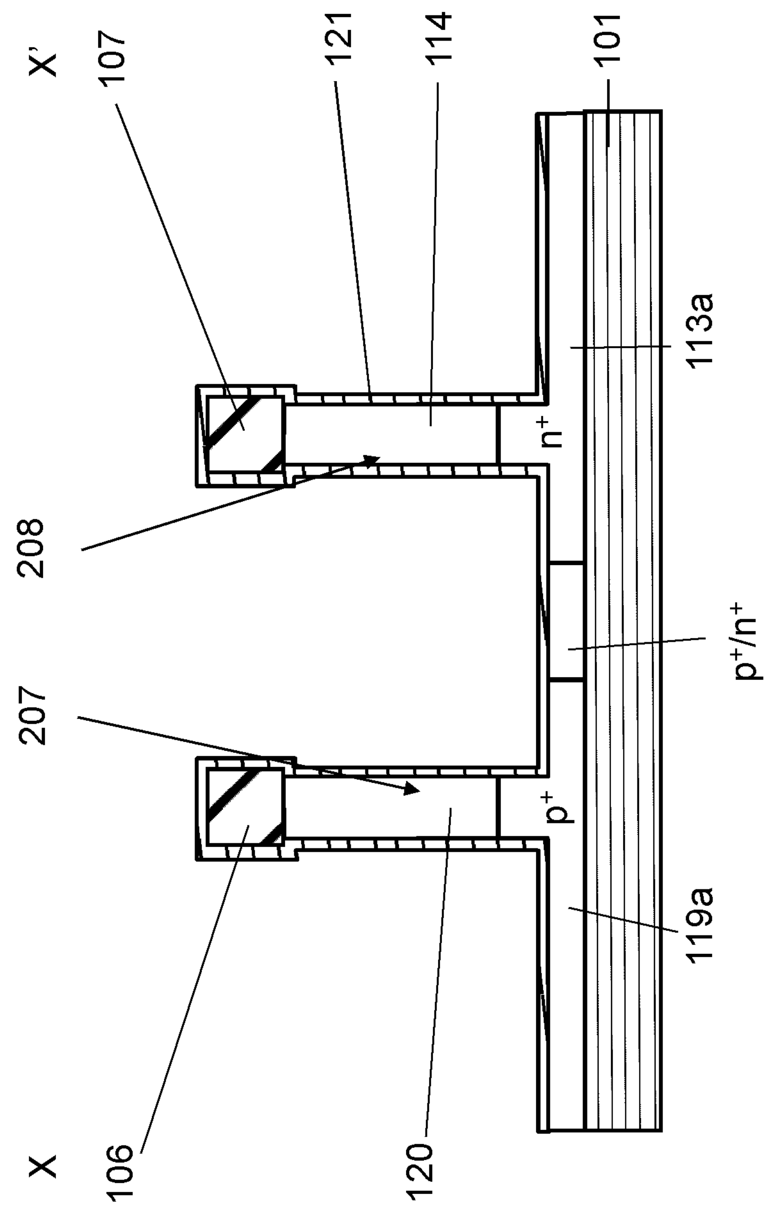
FIG. 45B is a cross-sectional diagram taken in the line X-X' of FIG. 45A.
Figure 46A:
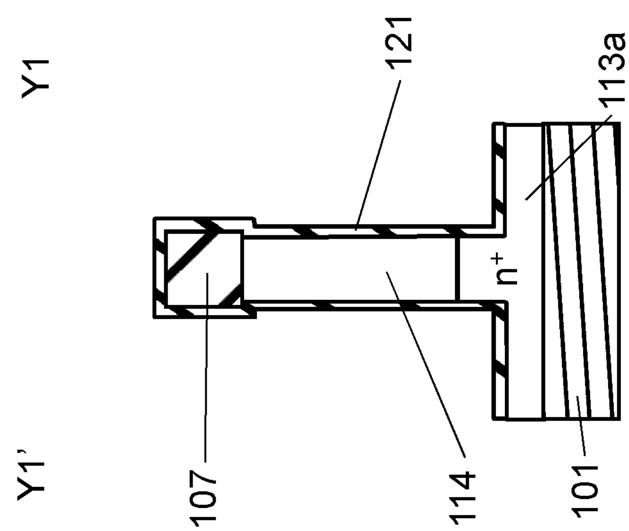
FIG. 46A is a cross-sectional diagram taken in the line Y1-Y1' of FIG. 45A.
Figure 46B:
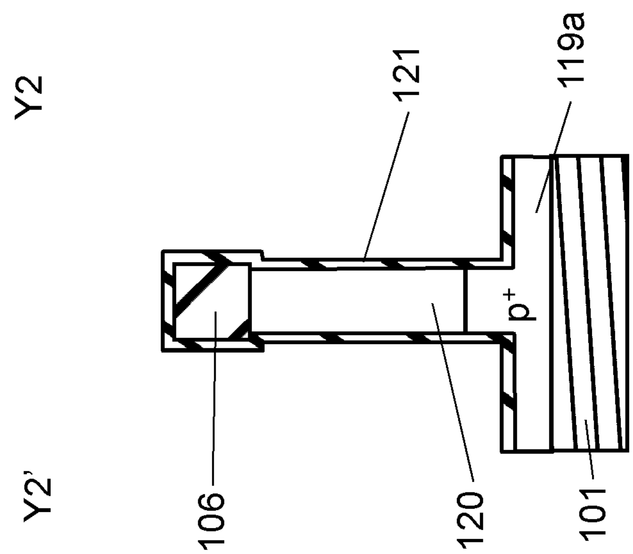
FIG. 46B is a cross-sectional diagram taken in the line Y2-Y2' of FIG. 45A.
Figure 47A:
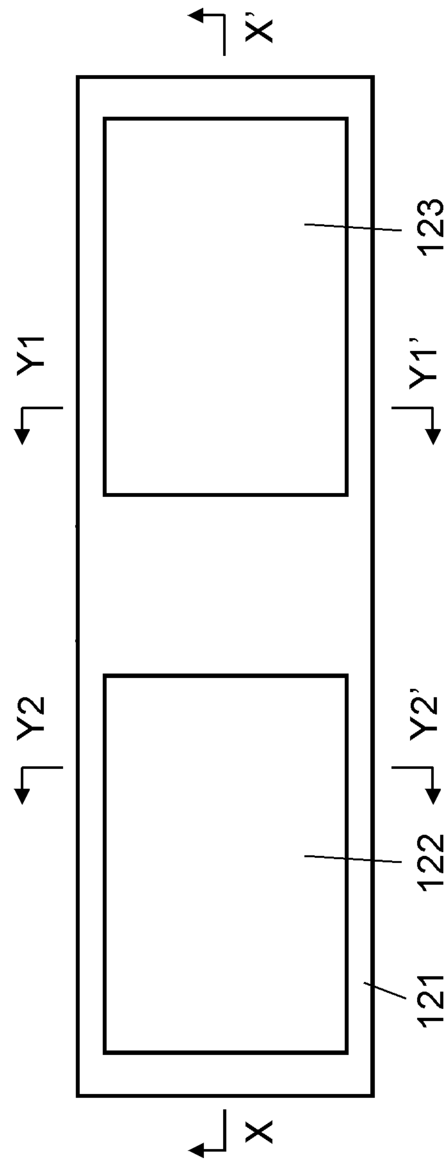
FIG. 47A is a top view for explaining the fabrication method of the semiconductor device according to the first embodiment.
Figure 47B:
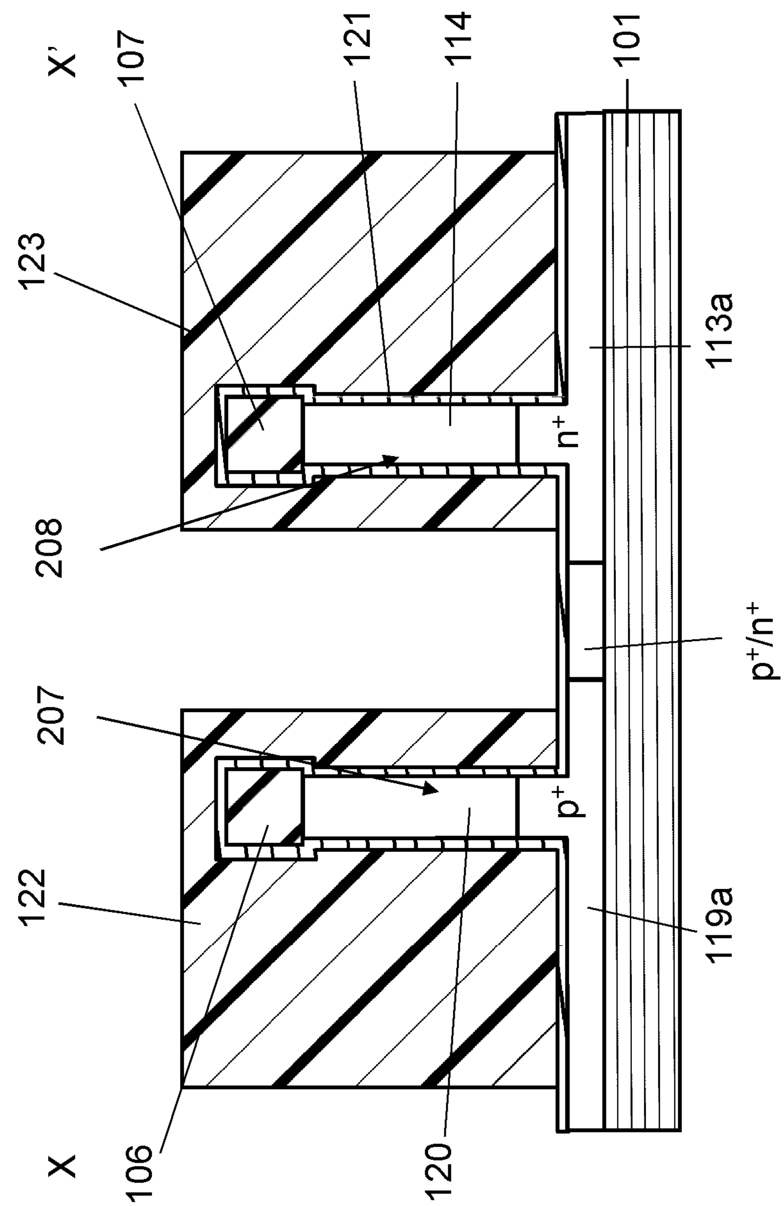
FIG. 47B is a cross-sectional diagram taken in the line X-X' of FIG. 47A.
Figure 48A:
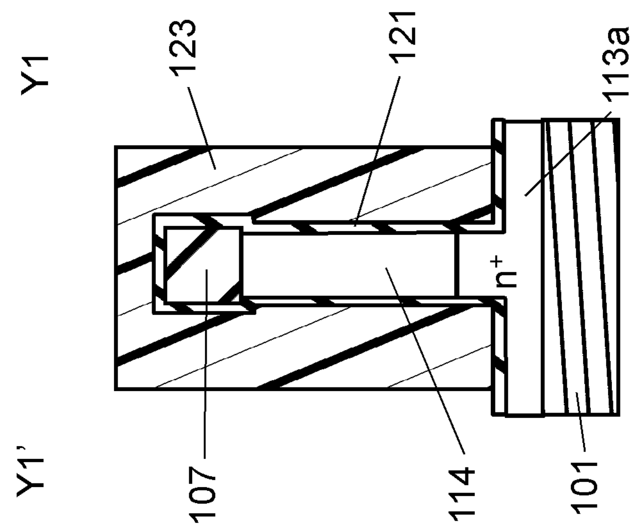
FIG. 48A is a cross-sectional diagram taken in the line Y1-Y1' of FIG. 47A.
Figure 48B:
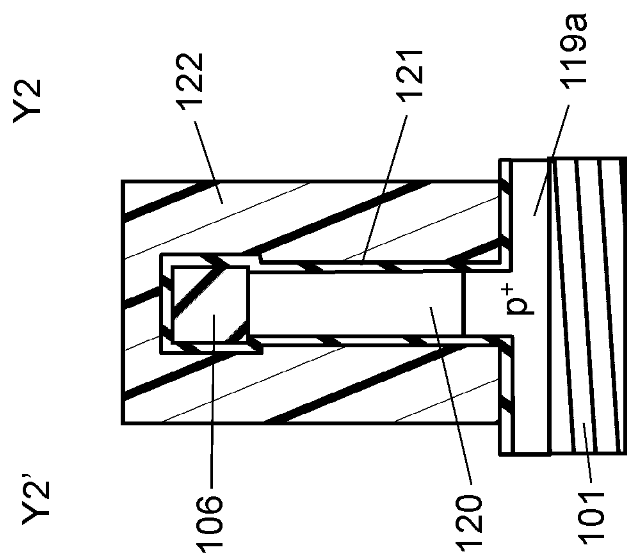
FIG. 48B is a cross-sectional diagram taken in the line Y2-Y2' of FIG. 47A.

As the arrow shows FIG. 23B and FIG. 24A, arsenic is implanted into the silicon layer 102 of a formation scheduled region of the NMOS-SGT to form an n+ type silicon layer 113*a* under the columnar silicon layer 208. Accordingly, as shown in FIG. 23A to FIG. 24B, the region of the first silicon layer 114 in the columnar silicon layer 208 and the planar region of the silicon layer 102 are separated.

As shown in FIG. 25A to FIG. 26B, the resist 112 is removed.

As shown in FIG. 27A to FIG. 28B, the sidewalls 110 and 111 are removed by etching.

Next, annealing is performed to activate the implanted impurity (arsenic). Accordingly, as shown in FIG. 29A to FIG. 30B, the implanted impurity is diffused in a part of the silicon layer 102 and columnar silicon layer 208.

As shown in FIG. 31A to FIG. 32B, an oxide film 115 is formed on the results of the above-mentioned processing step.

As shown in FIG. 33A to FIG. 34B, the oxide film 115 is etched, to remain in the sidewall of the columnar silicon layers 207 and 208 in a sidewall shape, and thereby sidewalls 116 and 117 are formed. When forming a p+ type silicon layer under the columnar silicon layers 207 and 208 by impurity implantation, the impurity is not doped into a channel region by the sidewalls 116 and 117, and therefore a variation of a threshold value voltage of the SGT can be suppressed.

As shown in FIG. 35A to FIG. 36B, a resist 118 for implanting an impurity into the silicon layer 102 under the columnar silicon layer 207 is formed.

As shown in FIG. 37A to FIG. 38B, for example, boron is implanted into the silicon layer 102 of a formation scheduled region of the PMOS-SGT to form a p+ type silicon layer 119*a* under the columnar silicon layer 207. Accordingly, as shown in FIG. 37A to FIG. 38B, the region of the second silicon layer 120 in the columnar silicon layer 207 is separated from the planar silicon layer region.

As shown in FIG. 39A to FIG. 40B, the resist 118 is removed.

As shown in FIG. 41A to FIG. 42B, the sidewalls 116 and 117 is etched to remove.

Next, annealing is performed to activate the implanted impurity (boron). Accordingly, as shown in FIG. 43A to FIG. 44B, the implanted impurity is diffused in a part of the silicon layer 102 and columnar silicon layer 207.

As shown in FIG. 45A to FIG. 46B, an oxide film 121 is formed on the results of the above-mentioned processing step. The oxide film 121 protects the first silicon layer 114 and second silicon layer 120 from the resist for the formation of the planar silicon layer to be performed in the following processing step.

As shown in FIG. 47A to FIG. 48B, resists 122 and 123 for the formation of the planar silicon layer is formed.

As shown in FIG. 49A to FIG. 50B, a part of the oxide films 121 between the columnar silicon layers 207 and 208 is etched and separated into oxide films 124 and 125.

As shown in FIG. 51A to FIG. 52B, a part of the p+ type silicon layer 119*a* and n+ type silicon layer 113*a* is etched. Accordingly, planar silicon layers 211 and 212 having the p+ type silicon layer 119 and the first n+ type silicon layer 113 which remained, respectively, are formed.

As shown in FIG. 53A to FIG. 54B, the resists 122 and 123 is removed.

As shown in FIG. 55A to FIG. 56B, an oxide film 126*a* is thickly formed so that these results is embedded on the results of the above-mentioned processing step.

As shown in FIG. 57A to FIG. 58B, chemical mechanical polishing (CMP) is performed by applying the hard masks 106 and 107 as a stopper to planarize the oxide film 126*a*.

Next, the oxide film 126*a* and oxide films 124 and 125 are etched, and as shown in FIG. 59A to FIG. 60B, an oxide film 126 which fills between the planar silicon layers 211 and 212 is formed.

As shown in FIG. 61A to FIG. 62B, an oxide film 128 is formed on the results of the above-mentioned processing step. The oxide film 128 is thickly formed on the first n+ type silicon layer 113, p+ type silicon layer 119, oxide film 126, and hard masks 106 and 107, and the oxide film 128 is thinly formed on the sidewall of the columnar silicon layers 207 and 208.

As shown in FIG. 63A to FIG. 64B, a part of oxide films 128 are etched to remove the oxide film 128 formed on the sidewall of the columnar silicon layers 207 and 208. The etching is preferably isotropically performed. The oxide film 128 is thickly formed on the first n+ type silicon layer 113, p+ type silicon layer 119, oxide film 126, and hard masks 106 and 107, and thinly formed on the sidewalls of the columnar silicon layers 207 and 208, and therefore even after the oxide film on the sidewalls of the columnar silicon layers has been etched, a part of the oxide film 128 remains on the first n+ type silicon layer 113, p+ type silicon layer 119, and oxide film 126 to form into an insulating film 129*c*. In this case, oxide films 130 and 131 also remain on the hard masks 106 and 107.

The insulating film 129*c* becomes first and second insulating films 129*a* and 129*b* in the following processing step, and the first and second insulating films 129*a* and 129*b* can reduce parasitic capacitances between the gate electrode and the planar silicon layer.

As shown in FIG. 65A to FIG. 66B, an insulating film 132 is formed on the results of the above-mentioned processing step. The insulating film 132 is a film including any one of an oxide film, nitride film, or high dielectric film. Also, hydrogen atmosphere annealing or epitaxial growth may be performed for the columnar silicon layers 207 and 208 before the film formation of the insulating film 132.

As shown in FIG. 67A to FIG. 68B, a metal film 133 is formed on the insulating film 132. The metal film 133 is preferably a film including titanium nitride or tantalum nitride. By using the metal film 133, depleting of the channel region can be suppressed, and low-resistivity of the gate electrode can be achieved. Moreover, depending on a material for the metal film 133, a threshold voltage of the transistors can also be set. It is necessary to apply all the processing steps after this process into a fabricating processing step so as to suppress the metallic contamination by the metal gate electrode.

As shown in FIG. 69A to FIG. 70B, a polysilicon film 134 is formed on the results of the above-mentioned processing step. In order to suppress the metallic contamination, it is preferable to form the polysilicon film 134 using atmospheric pressure CVD.

As shown in FIG. 71A to FIG. 72B, the polysilicon film 134 is etched to form polysilicon films 135 and 136 made to remain in a sidewall shape on the sidewall of the columnar silicon layers 207 and 208 and the sidewall of the hard masks 106 and 107.

As shown in FIG. 73A to FIG. 74B, the metal film 133 is etched. The metal film 133 of the sidewall of the columnar silicon layers 207 and 208 is protected by the polysilicon films 135 and 136 without being etched, and forms metal films 137*a* and 138*a* remaining in a sidewall shape on the sidewall of the columnar silicon layers 207 and 208 and the sidewall of the hard masks 106 and 107.

Next, the insulating film 132 is etched. As shown in FIG. 75A to FIG. 76B, the insulating film 132 of the sidewall of the columnar silicon layers 207 and 208 is protected by the polysilicon films 135 and 136 without being etched, and forms gate insulating films 139*a* and 140*a* remaining in a sidewall shape on the sidewall of the columnar silicon layers 207 and 208 and the sidewall of the hard masks 106 and 107.

As shown in FIG. 77A to FIG. 78B, a polysilicon film 141 is formed on the results of the above-mentioned processing step. In order to suppress the metallic contamination, it is preferable to form the polysilicon film 141 using atmospheric pressure CVD.

In the case of using a high dielectric film for the gate insulating films 139 and 140, this high dielectric film may act as a source of the metal contamination. By forming the polysilicon film 141, the gate insulating film 139*a* and metal film 137*a* are covered with the columnar silicon layer 207, polysilicon films 135 and 141, insulating film 129*c*, and hard mask 106. Also, the gate insulating film 140*a* and metal film 138*a* are covered with the columnar silicon layer 208, the polysilicon films 136 and 141, insulating film 129*c*, and hard mask 107. That is, the gate insulating films 139*a* and 140*a* and metal films 137*a* and 138*a* acting as the contamination sources are covered with the columnar silicon layers 207 and 208, the polysilicon films 135, 136, and 141, insulating film 129*c*, and hard masks 106 and 107, and therefore the metal contamination due to a metal included in the gate insulating films 139*a* and 140*a* and metal films 137*a* and 138*a* can be suppressed.

After the metal film has been thickly formed and etched to remain in the sidewall shape, and then the gate insulating film has been etched, the polysilicon films is formed, thereby forming the structure in which the gate insulating films and metal films are covered with the columnar silicon layers, polysilicon films, insulating film, and hard masks.

As shown in FIG. 79A to FIG. 80B, a polysilicon film layer 142 is formed on the results of the above-mentioned processing step so that these results is embedded. Since between the columnar silicon 207 and 208 is embedded, it is preferable to form the polysilicon film 142 using a low-pressure CVD. The gate insulating films 139*a* and 140*a* and metal films 137*a* and 138*a* acting as the contamination sources are covered with the columnar silicon layers 207 and 208, polysilicon films 135, 136, and 141, insulating film 129*c*, and hard masks 106 and 107, and therefore the low pressure CVD can be used.

As shown in FIG. 81A to FIG. 82B, a chemical mechanical polishing (CMP) is performed by applying the oxide films 130 and 131 into a polishing stopper to planarize the polysilicon film 142.

As shown in FIG. 83A to FIG. 84B, the oxide films 130 and 131 is etched. After etching the oxide film, a chemical mechanical polishing may be performed by applying the hard masks 106 and 107 into a polishing stopper.

As shown in FIG. 85A to FIG. 86B, the polysilicon films 135*a*, 136*a*, 141 and 142 are etched back, and the polysilicon films 135*a*, 136*a*, 141 and 142 are removed to a top edge of the gate insulating films 139 and 140 which are formed and a formation scheduled region of the gate electrode. The etch-back determines gate lengths of the SGTs. According to this processing step, the upper region of the metal films 137 and 138 is exposed.

As shown in FIG. 87A to FIG. 88B, the metal films 137 and 138 of the upper sidewall of the columnar silicon layers 207 and 208 are etched and then removed to form the metal films 137 and 138.

As shown in FIG. 89A to FIG. 90B, the gate insulating films 139*a* and 140*a* of the upper sidewall of the columnar silicon layers 207 and 208 are etched and then removed to form gate insulating films 139 and 140.

As shown in FIG. 91A to FIG. 92B, a resist 143 for forming the second n+ type silicon layer 144 in the upper part of the columnar silicon layer 208 is formed.

Figure 93A:
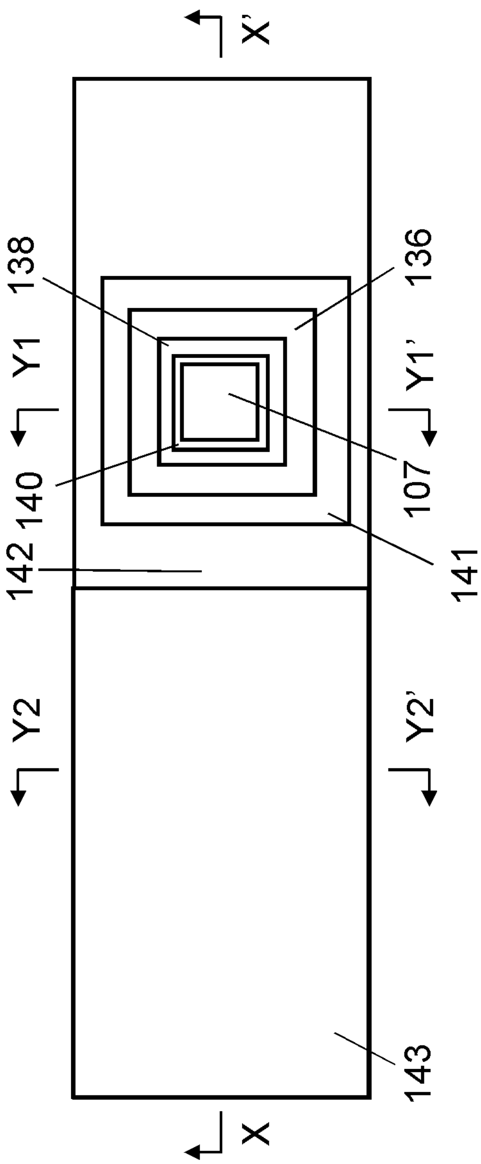
FIG. 93A is a top view for explaining the fabrication method of the semiconductor device according to the first embodiment.
Figure 93B:
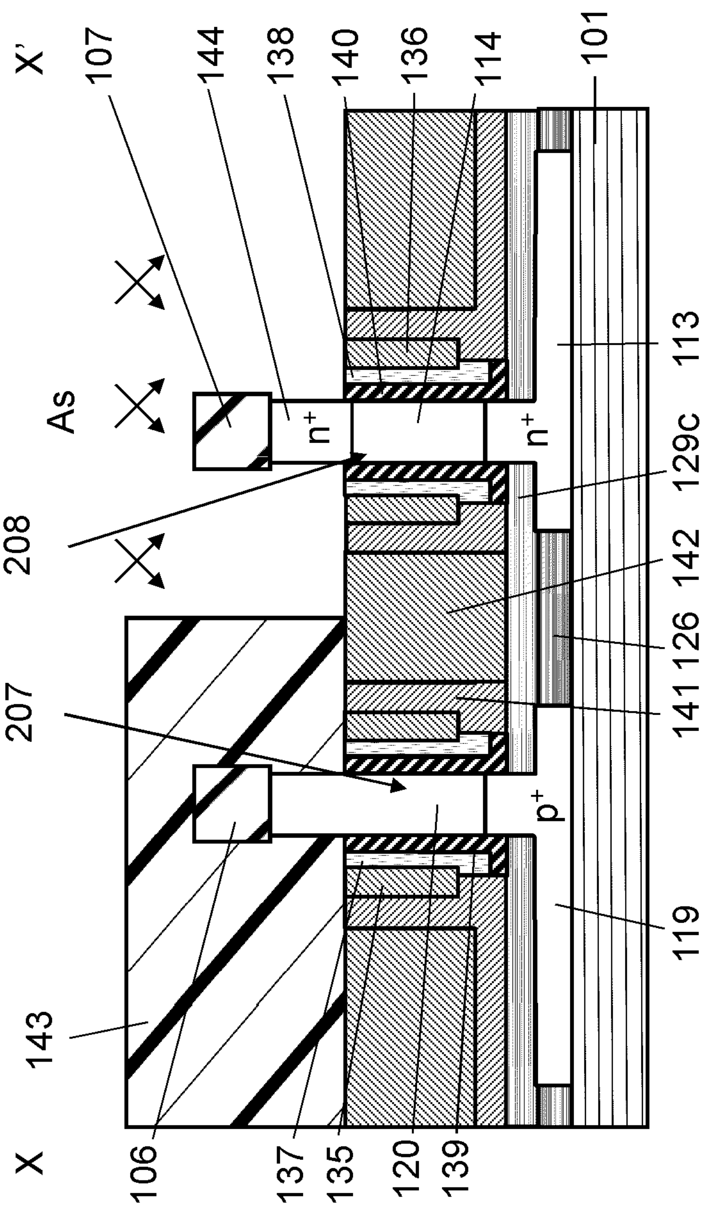
FIG. 93B is a cross-sectional diagram taken in the line X-X' of FIG. 93A.
Figure 94A:
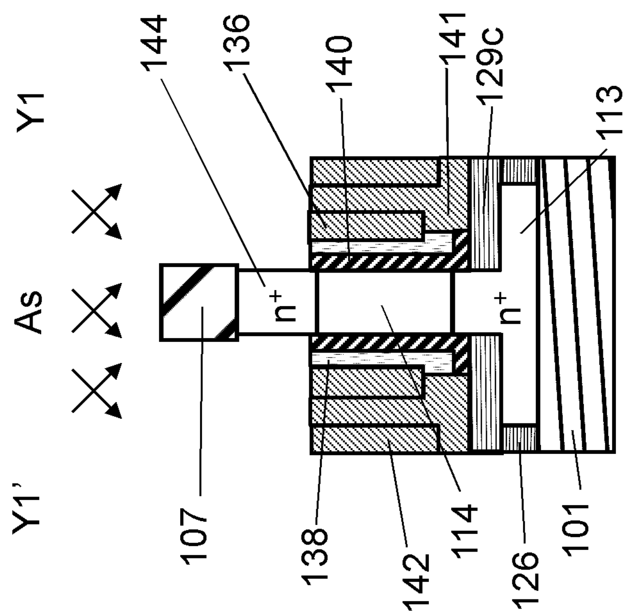
FIG. 94A is a cross-sectional diagram taken in the line Y1-Y1' of FIG. 93A.
Figure 94B:
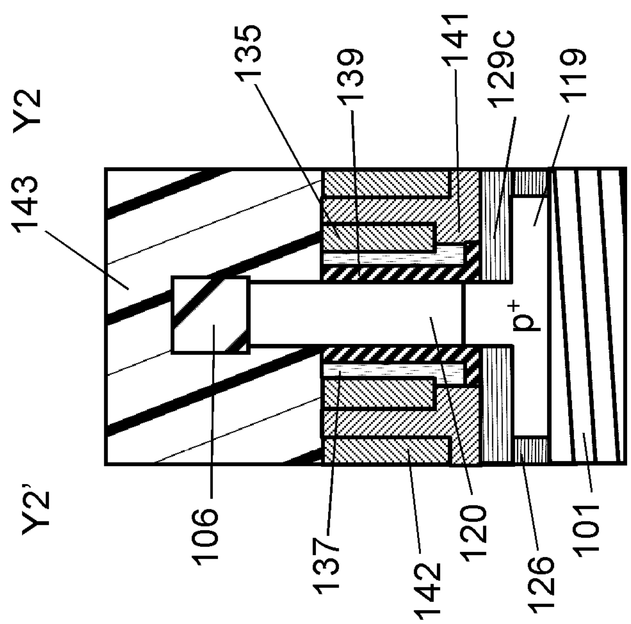
FIG. 94B is a cross-sectional diagram taken in the line Y2-Y2' of FIG. 93A.
Figure 95A:
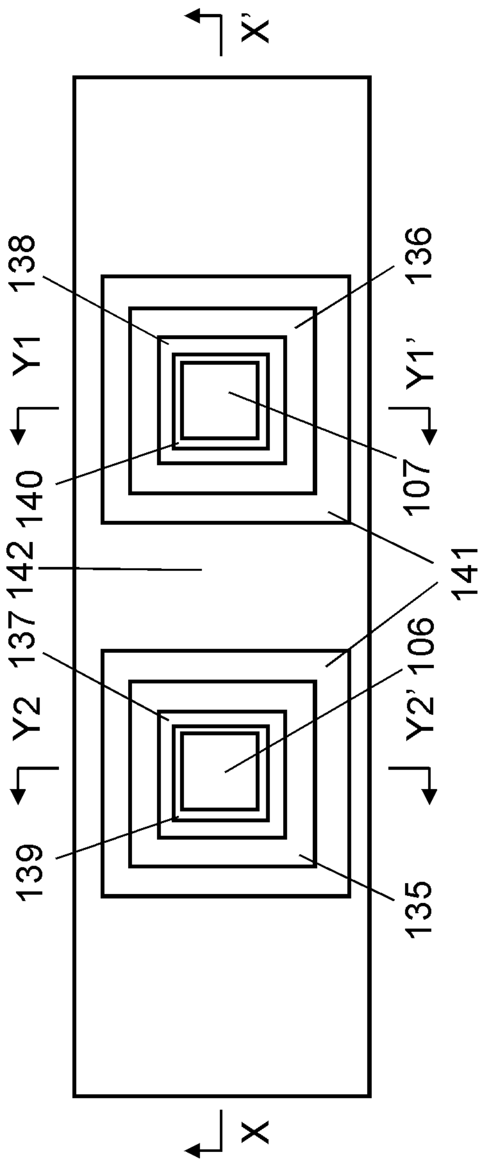
FIG. 95A is a top view for explaining the fabrication method of the semiconductor device according to the first embodiment.
Figure 95B:
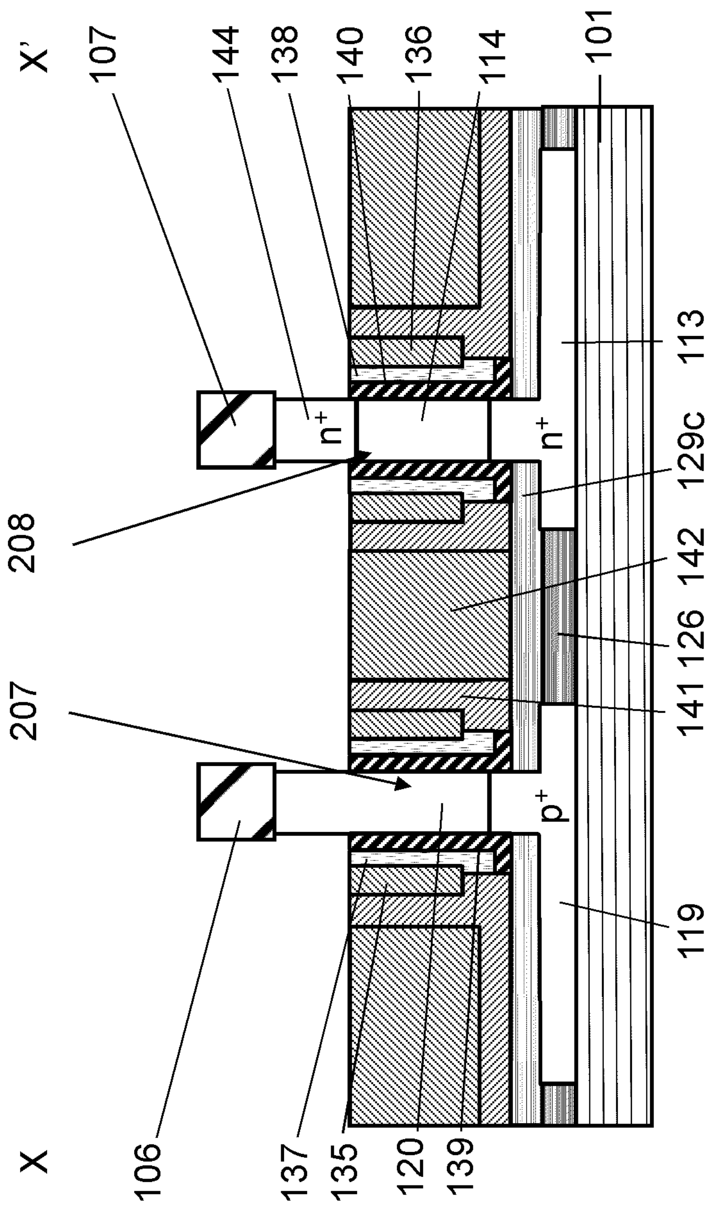
FIG. 95B is a cross-sectional diagram taken in the line X-X' of FIG. 95A.
Figure 96A:
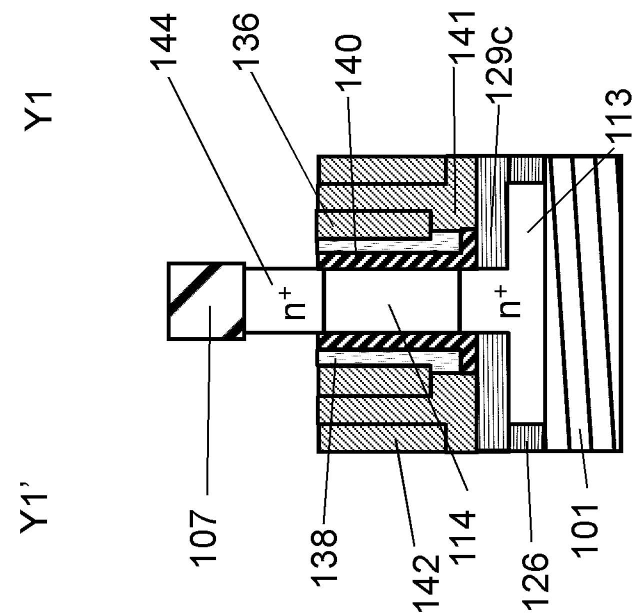
FIG. 96A is a cross-sectional diagram taken in the line Y1-Y1' of FIG. 95A.
Figure 96B:
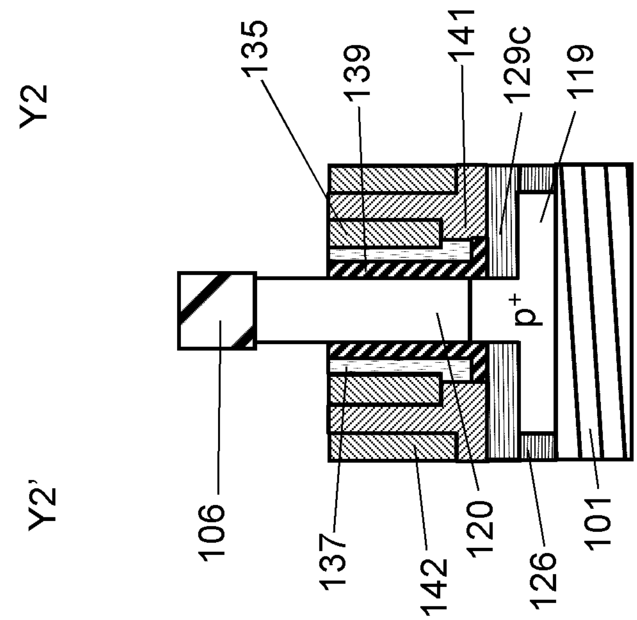
FIG. 96B is a cross-sectional diagram taken in the line Y2-Y2' of FIG. 95A.
Figure 97A:
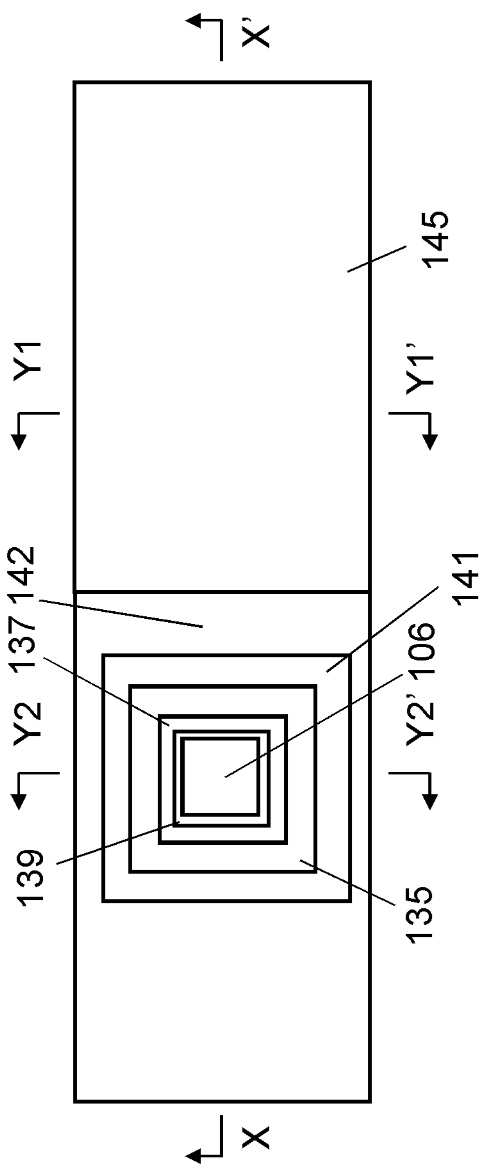
FIG. 97A is a top view for explaining the fabrication method of the semiconductor device according to the first embodiment.
Figure 97B:
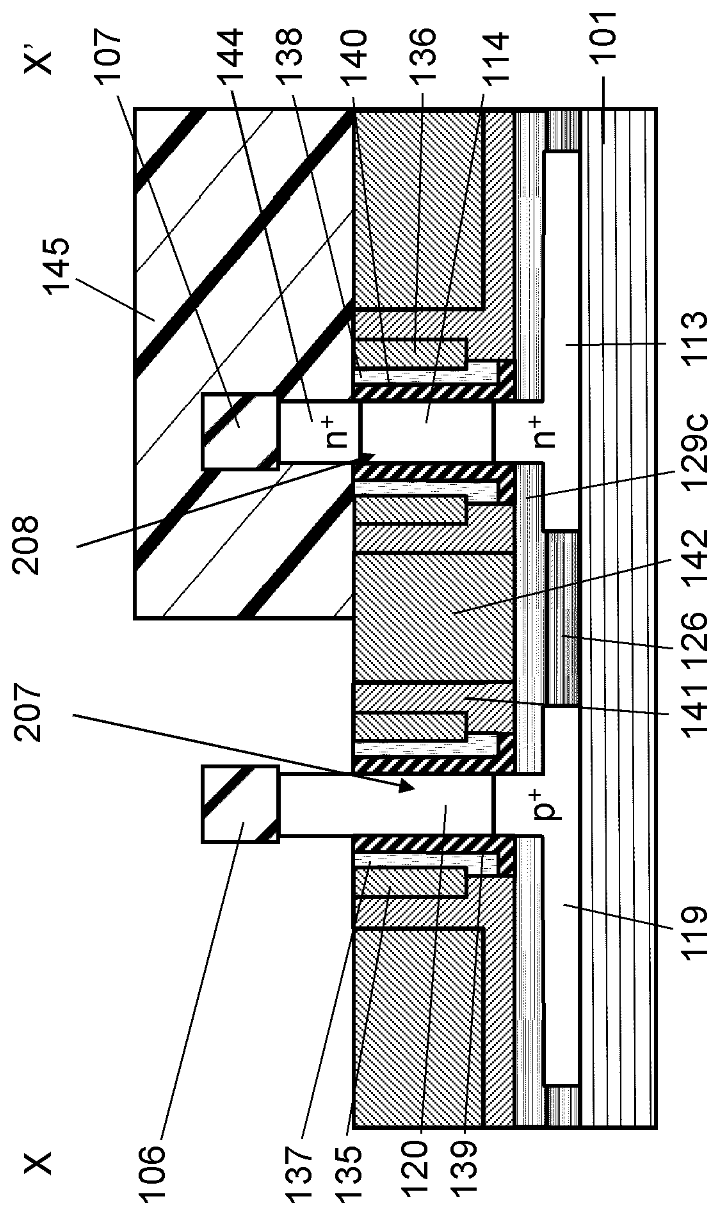
FIG. 97B is a cross-sectional diagram taken in the line X-X' of FIG. 97A.
Figure 98A:
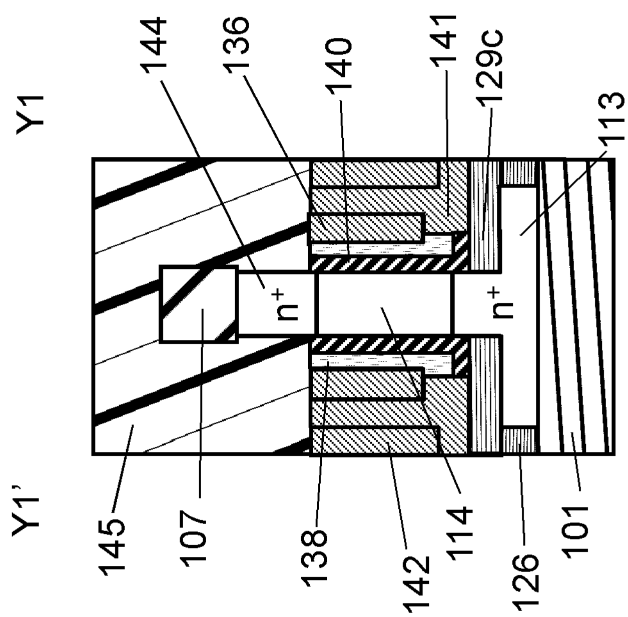
FIG. 98A is a cross-sectional diagram taken in the line Y1-Y1' of FIG. 97A.
Figure 98B:
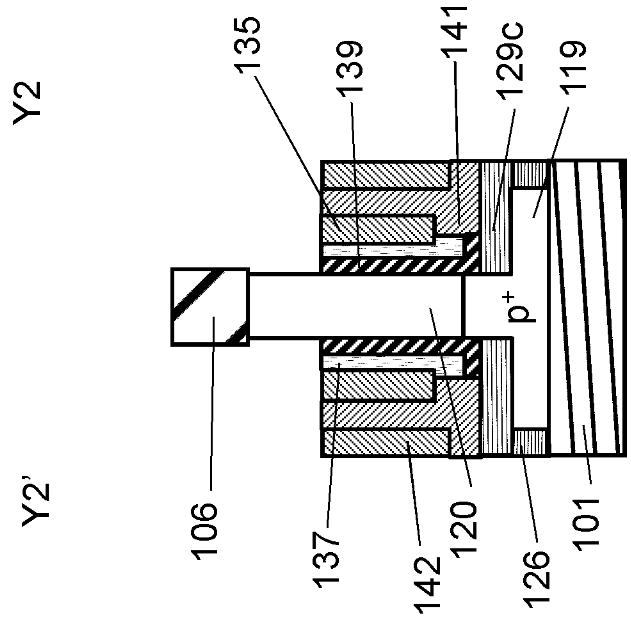
FIG. 98B is a cross-sectional diagram taken in the line Y2-Y2' of FIG. 97A.
Figure 99A:
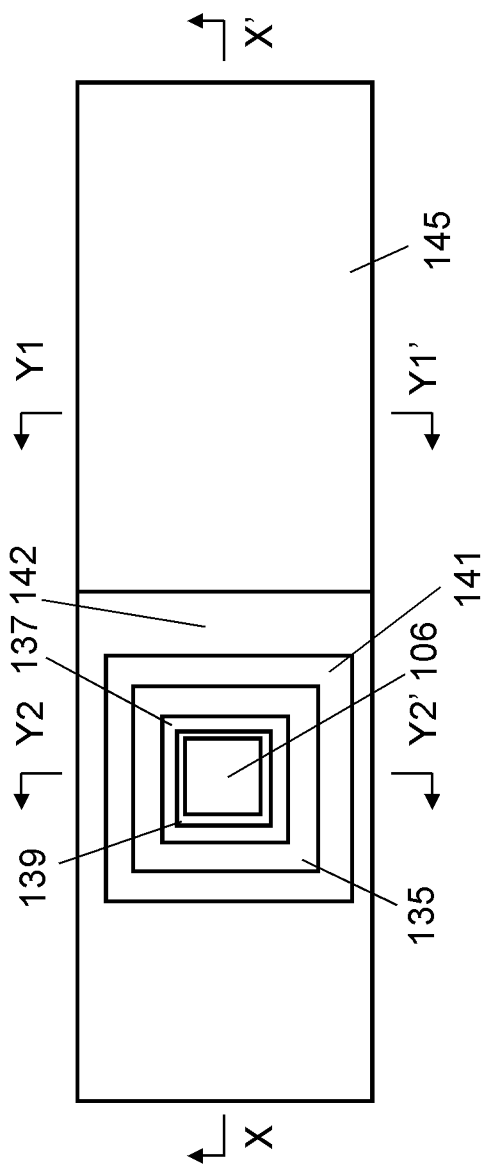
FIG. 99A is a top view for explaining the fabrication method of the semiconductor device according to the first embodiment.
Figure 99B:
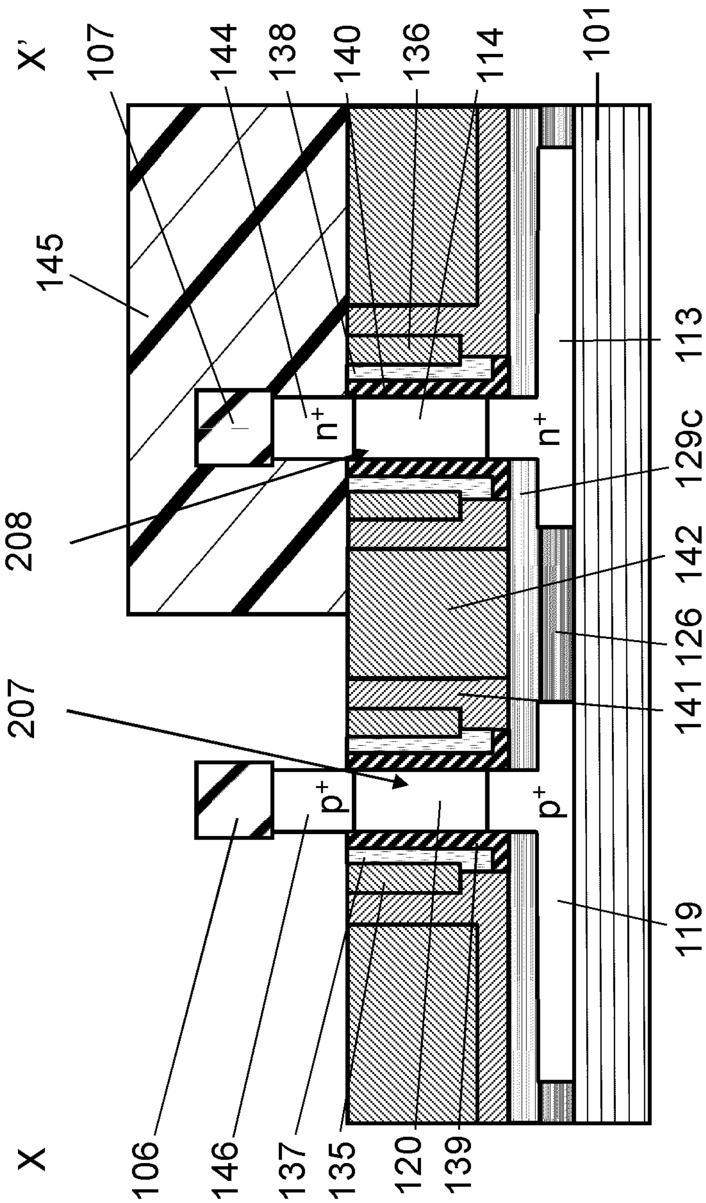
FIG. 99B is a cross-sectional diagram taken in the line X-X' of FIG. 99A.
Figure 100A:
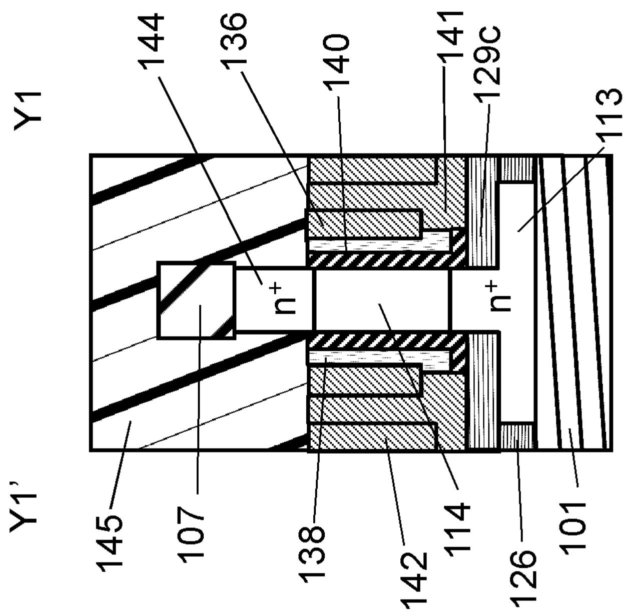
FIG. 100A is a cross-sectional diagram taken in the line Y1-Y1' of FIG. 99A.
Figure 100B:
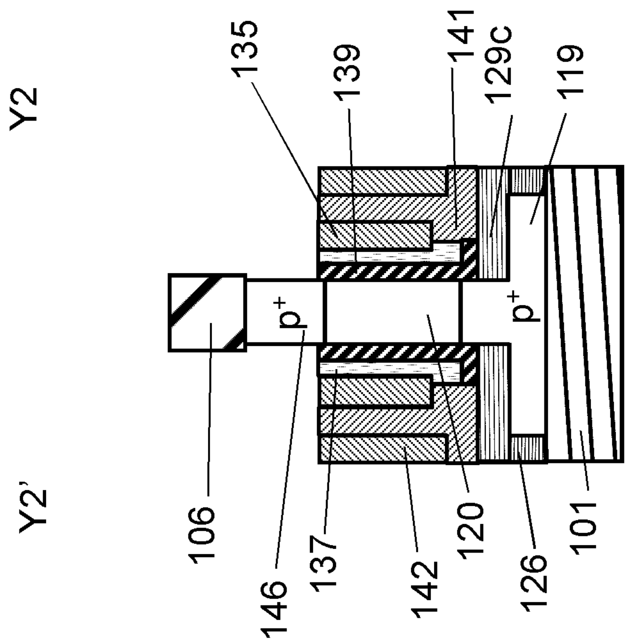
FIG. 100B is a cross-sectional diagram taken in the line Y2-Y2' of FIG. 99A.
Figure 101A:
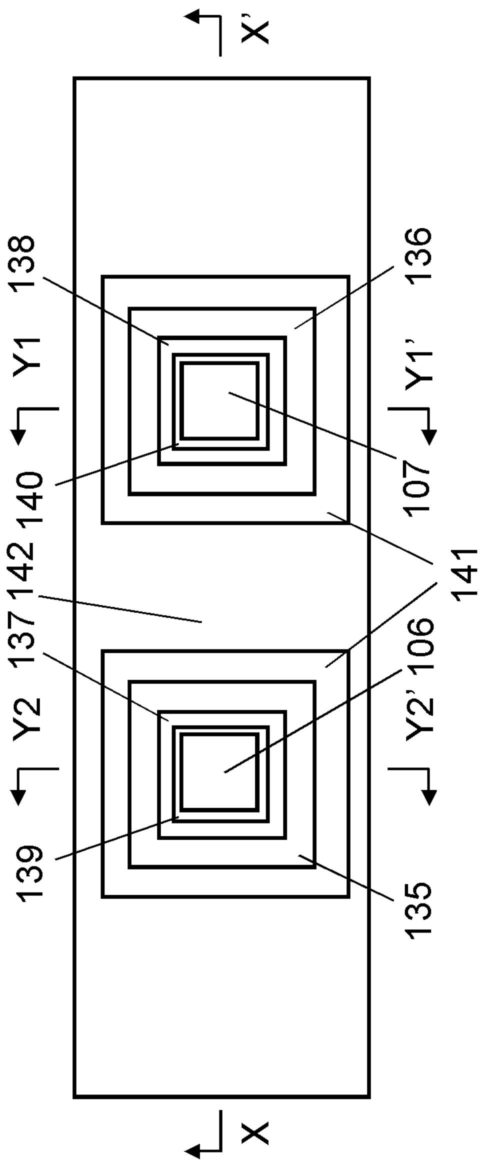
FIG. 101A is a top view for explaining the fabrication method of the semiconductor device according to the first embodiment.
Figure 101B:
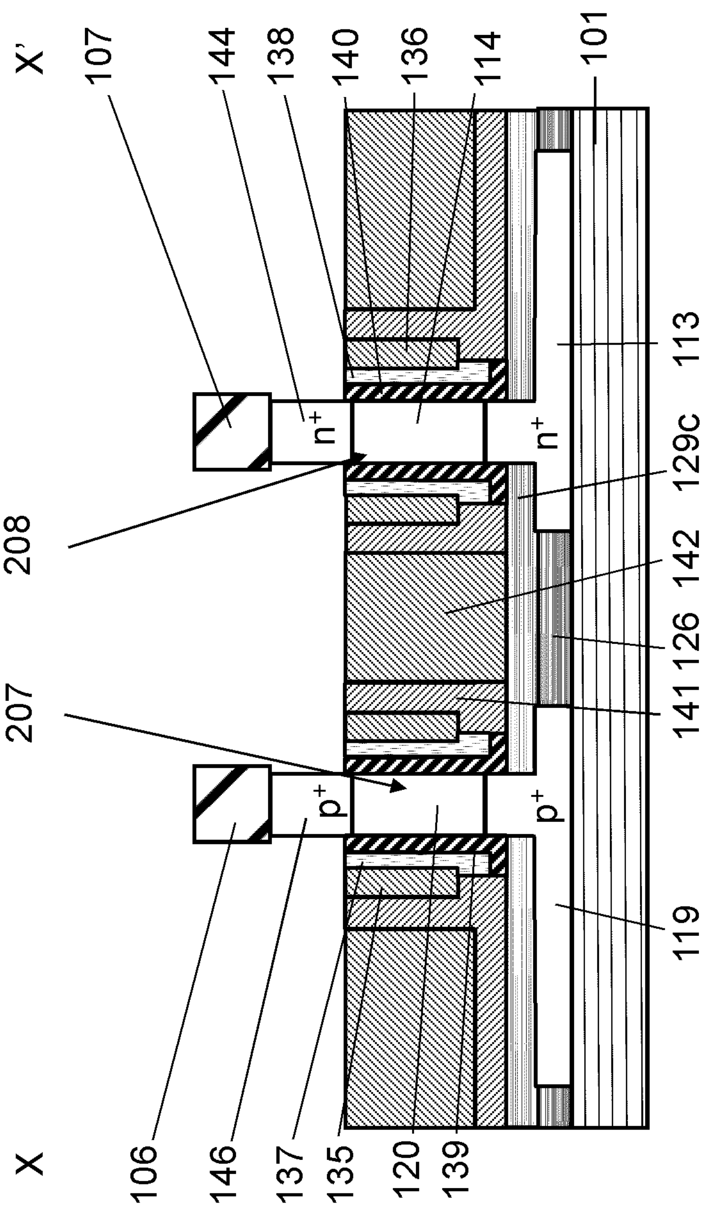
FIG. 101B is a cross-sectional diagram taken in the line X-X' of FIG. 101A.
Figure 102A:
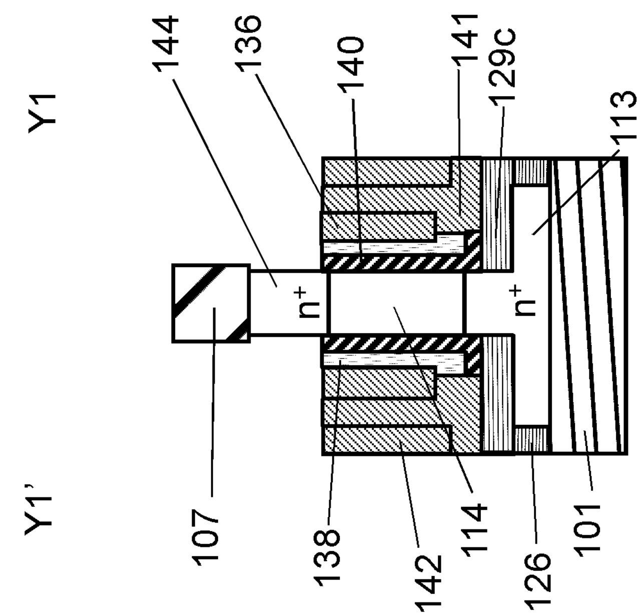
FIG. 102A is a cross-sectional diagram taken in the line Y1-Y1' of FIG. 101A.
Figure 102B:
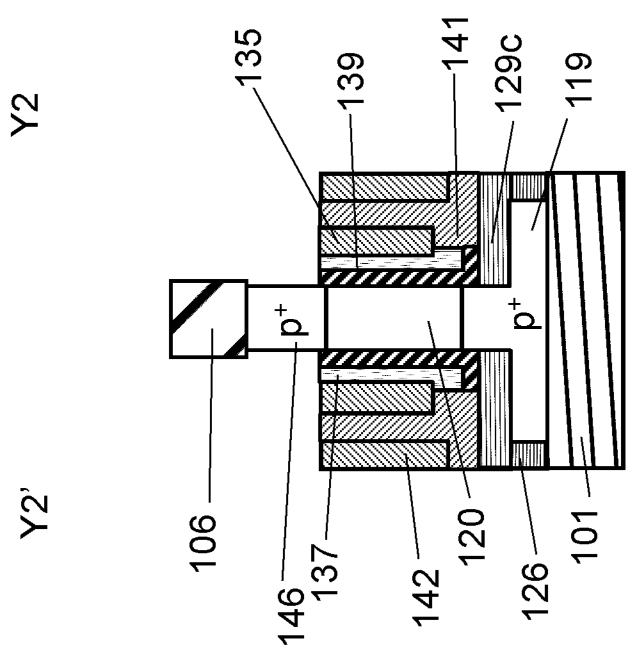
FIG. 102B is a cross-sectional diagram taken in the line Y2-Y2' of FIG. 101A.
Figure 103A:
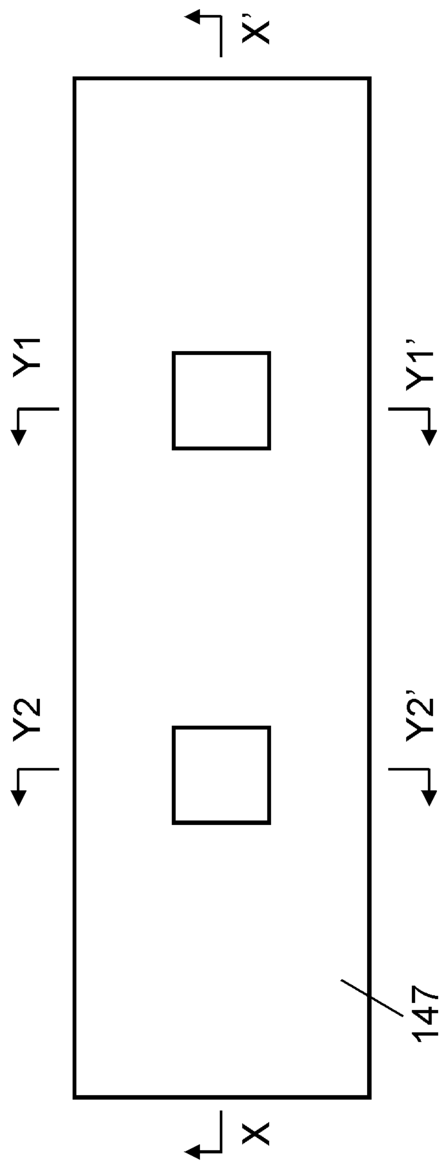
FIG. 103A is a top view for explaining the fabrication method of the semiconductor device according to the first embodiment.
Figure 103B:
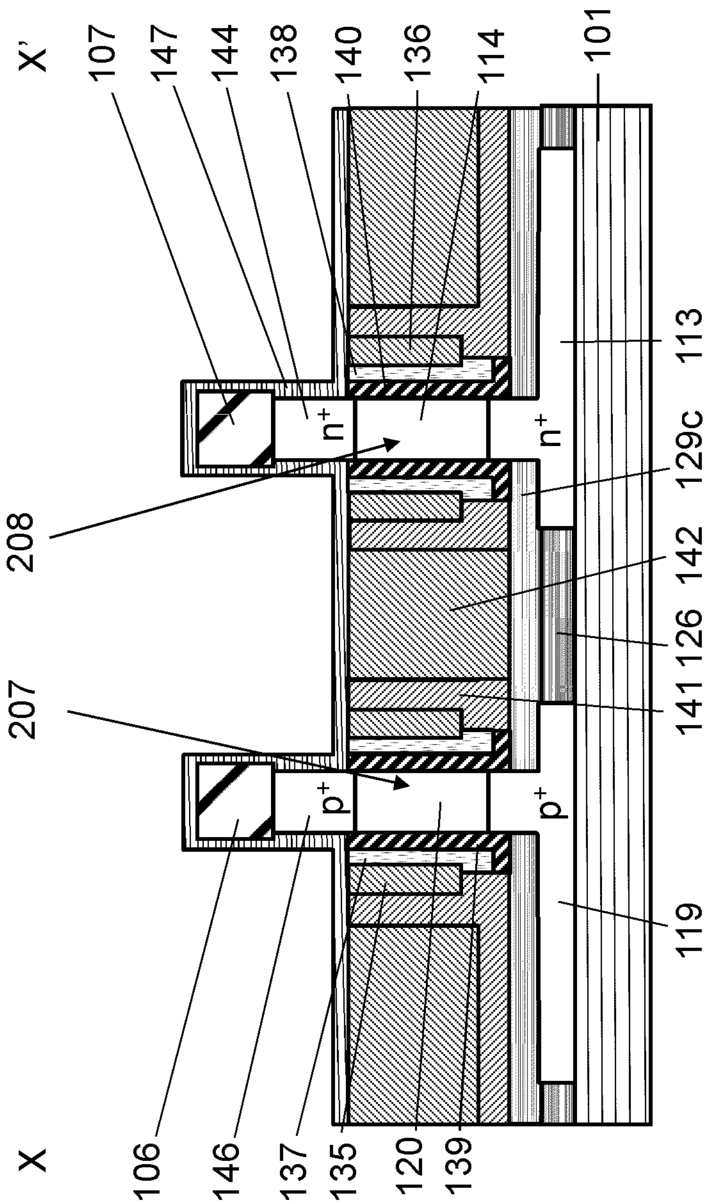
FIG. 103B is a cross-sectional diagram taken in the line X-X' of FIG. 103A.
Figure 104A:
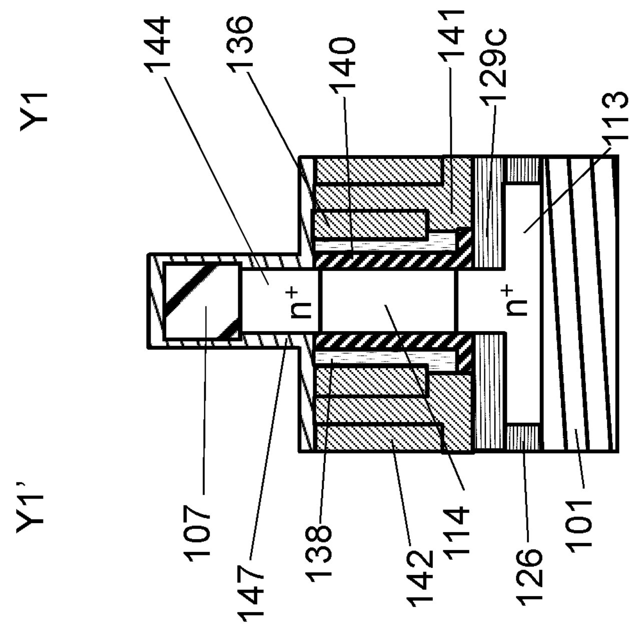
FIG. 104A is a cross-sectional diagram taken in the line Y1-Y1' of FIG. 103A.
Figure 104B:
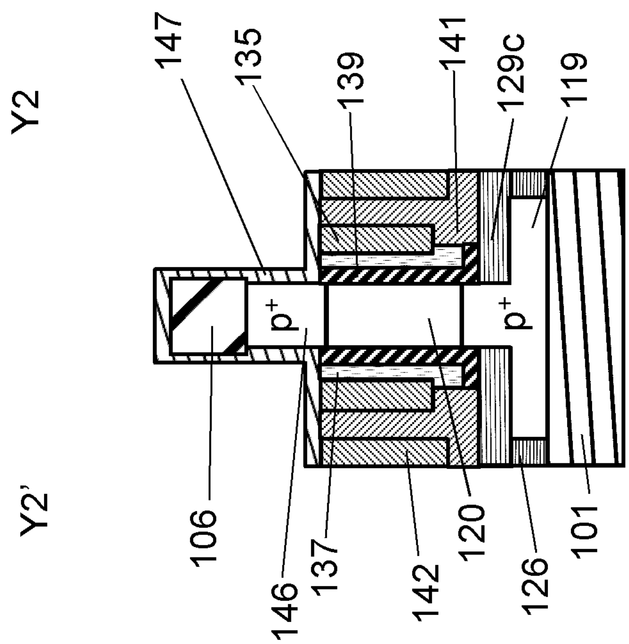
FIG. 104B is a cross-sectional diagram taken in the line Y2-Y2' of FIG. 103A.
Figure 105A:
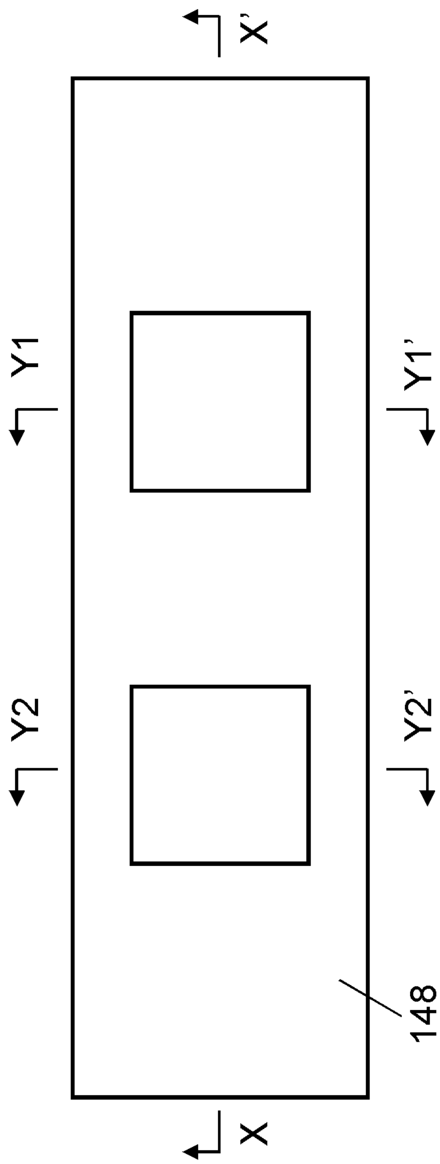
FIG. 105A is a top view for explaining the fabrication method of the semiconductor device according to the first embodiment.
Figure 105B:
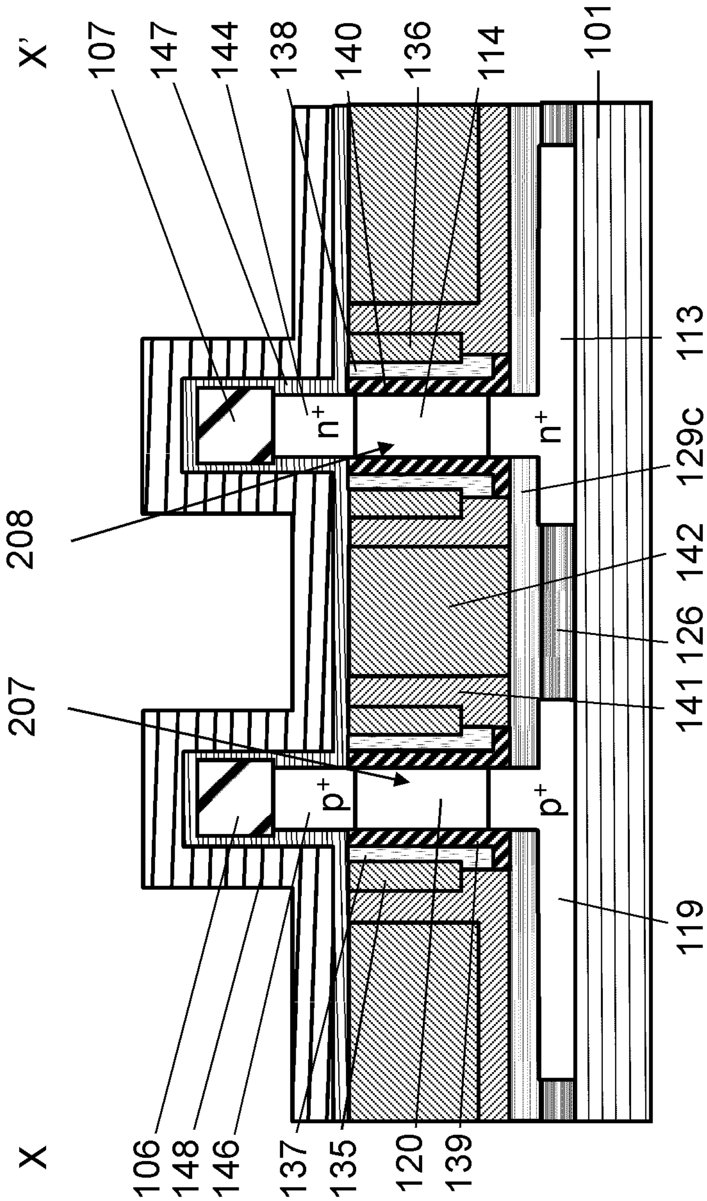
FIG. 105B is a cross-sectional diagram taken in the line X-X' of FIG. 105A.
Figure 106A:
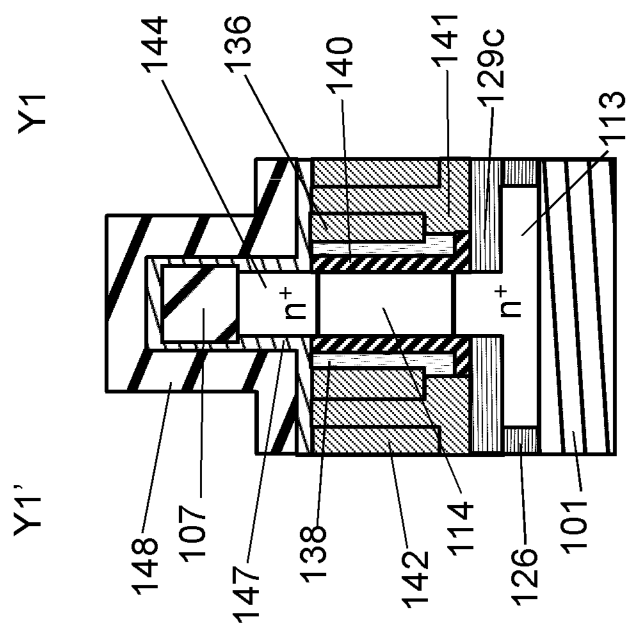
FIG. 106A is a cross-sectional diagram taken in the line Y1-Y1' of FIG. 105A.
Figure 106B:
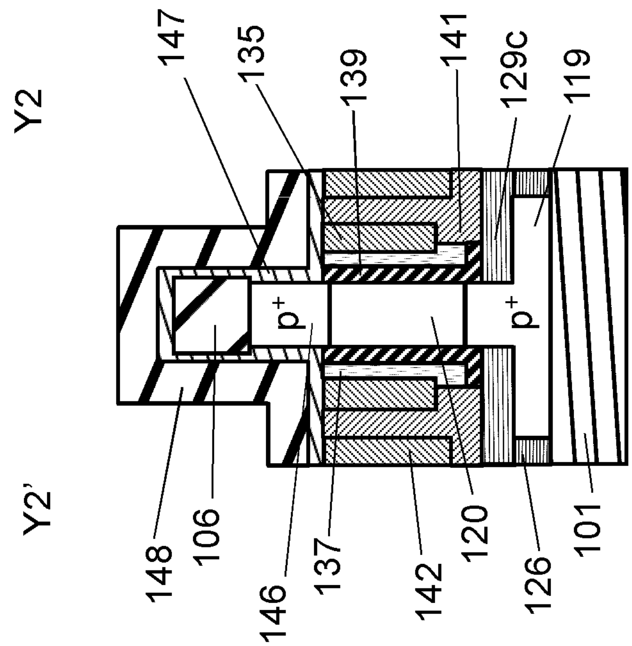
FIG. 106B is a cross-sectional diagram taken in the line Y2-Y2' of FIG. 106A.
Figure 107A:
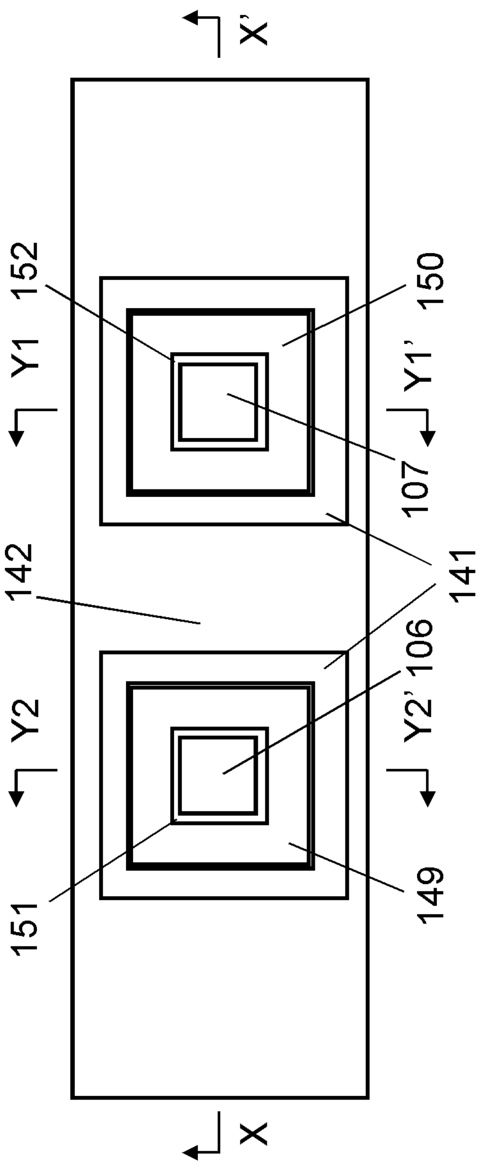
FIG. 107A is a top view for explaining the fabrication method of the semiconductor device according to the first embodiment.
Figure 107B:
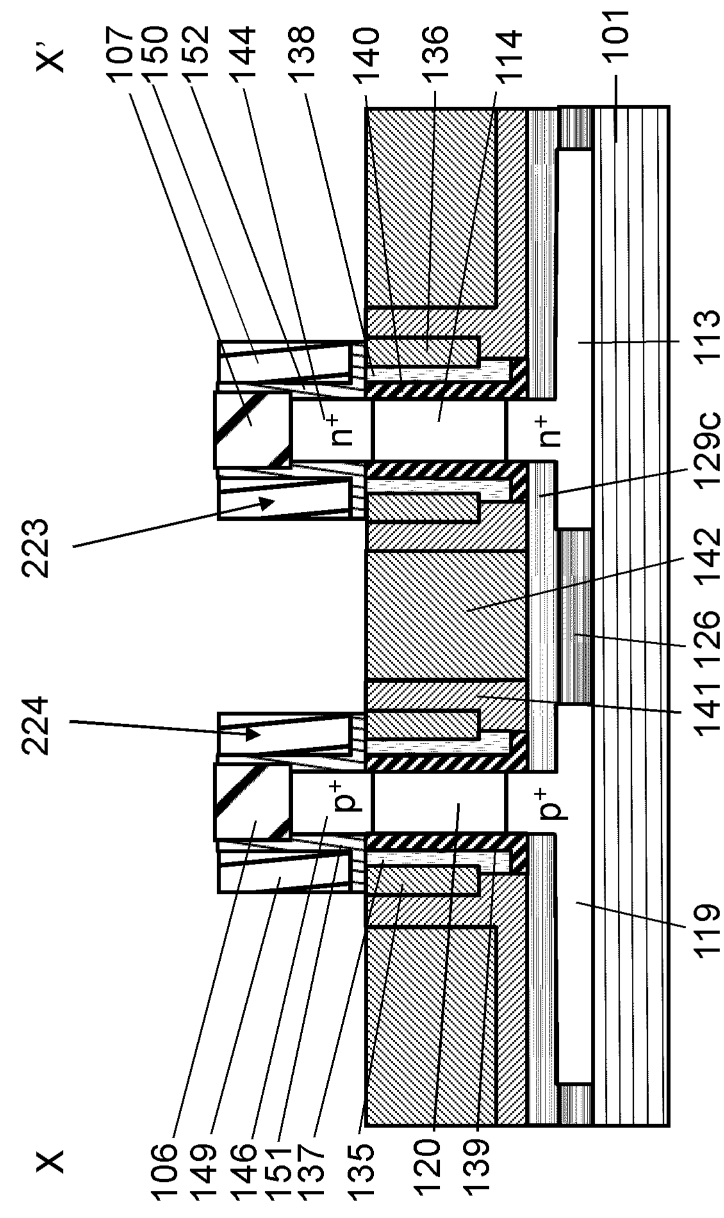
FIG. 107B is a cross-sectional diagram taken in the line X-X' of FIG. 107A.
Figure 108A:
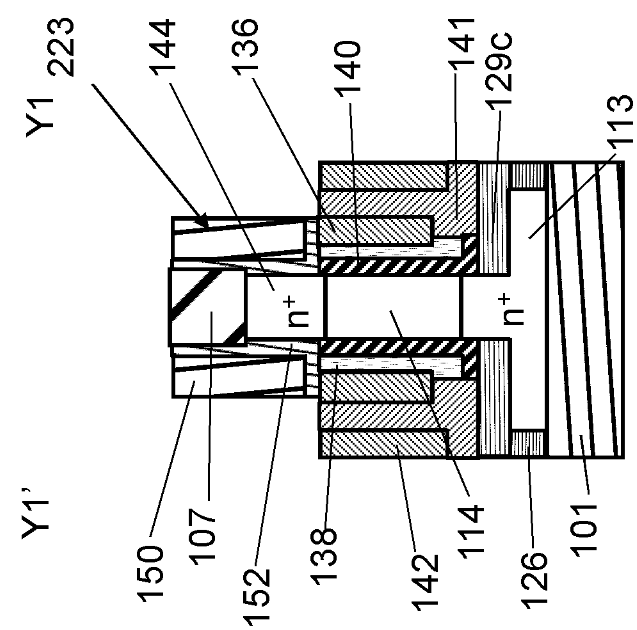
FIG. 108A is a cross-sectional diagram taken in the line Y1-Y1' of FIG. 107A.
Figure 108B:
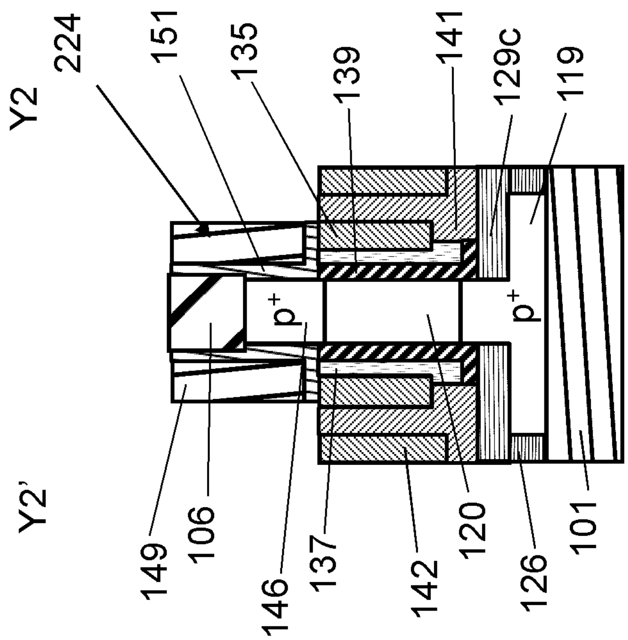
FIG. 108B is a cross-sectional diagram taken in the line Y2-Y2' of FIG. 107A.
Figure 109A:
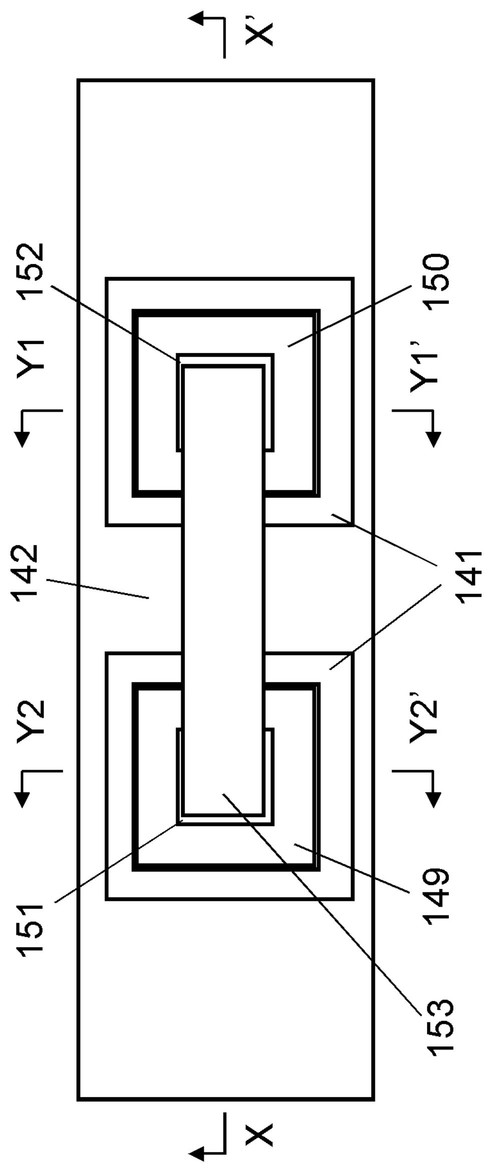
FIG. 109A is a top view for explaining the fabrication method of the semiconductor device according to the first embodiment.
Figure 109B:
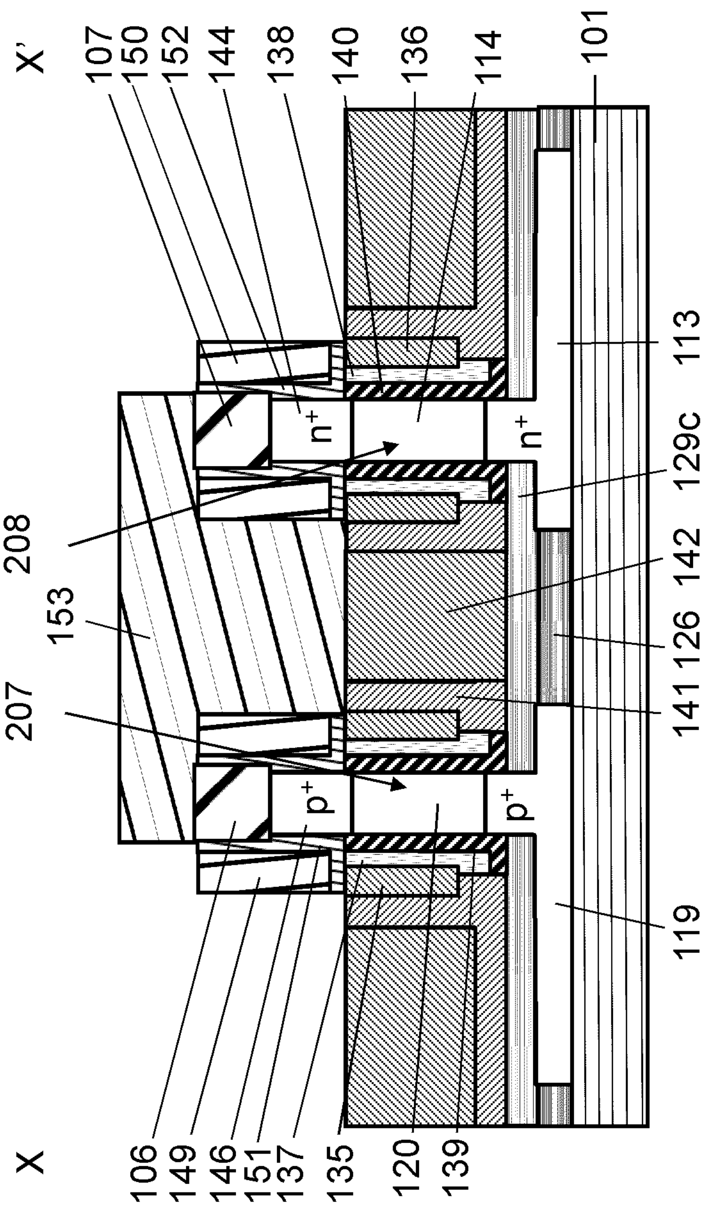
FIG. 109B is a cross-sectional diagram taken in the line X-X' of FIG. 109A.
Figure 110A:
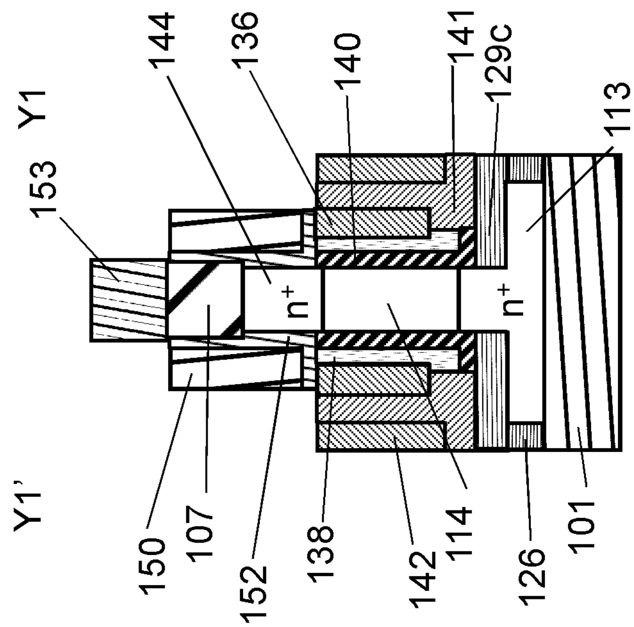
FIG. 110A is a cross-sectional diagram taken in the line Y1-Y1' of FIG. 109A.
Figure 110B:
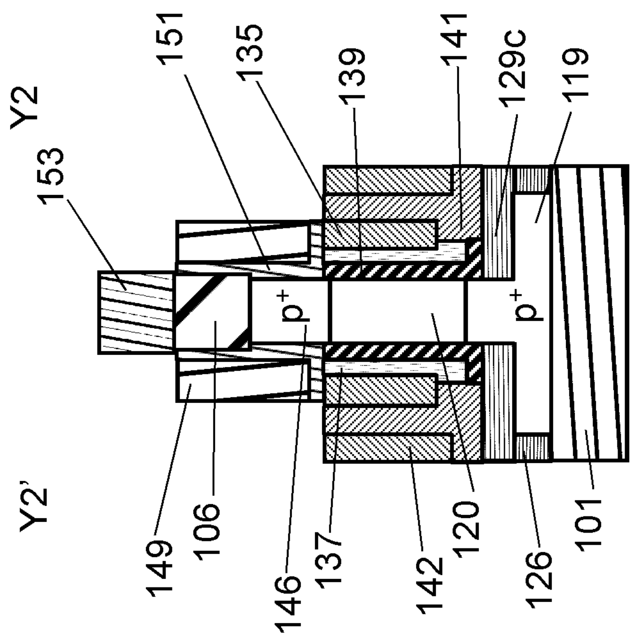
FIG. 110B is a cross-sectional diagram taken in the line Y2-Y2' of FIG. 109A.
Figure 111A:
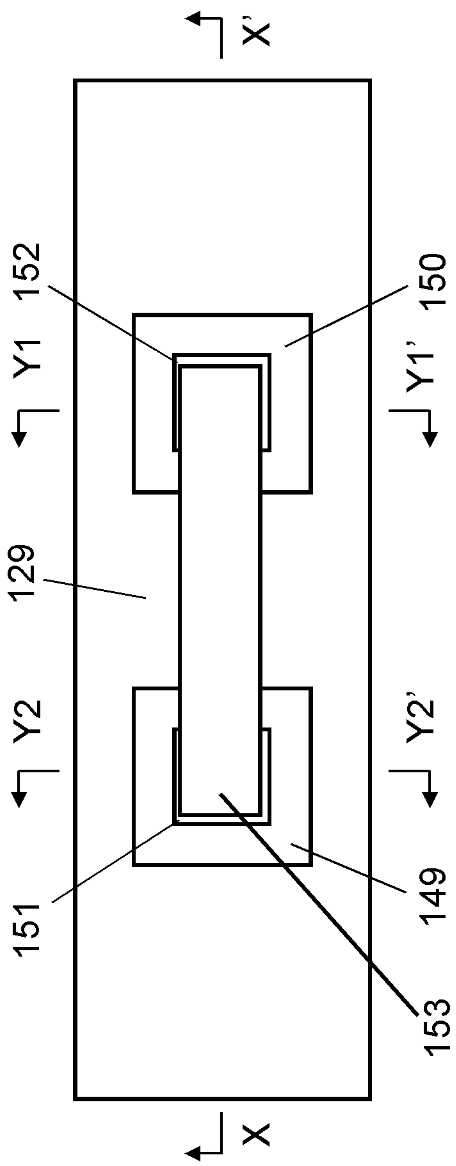
FIG. 111A is a top view for explaining the fabrication method of the semiconductor device according to the first embodiment.
Figure 111B:
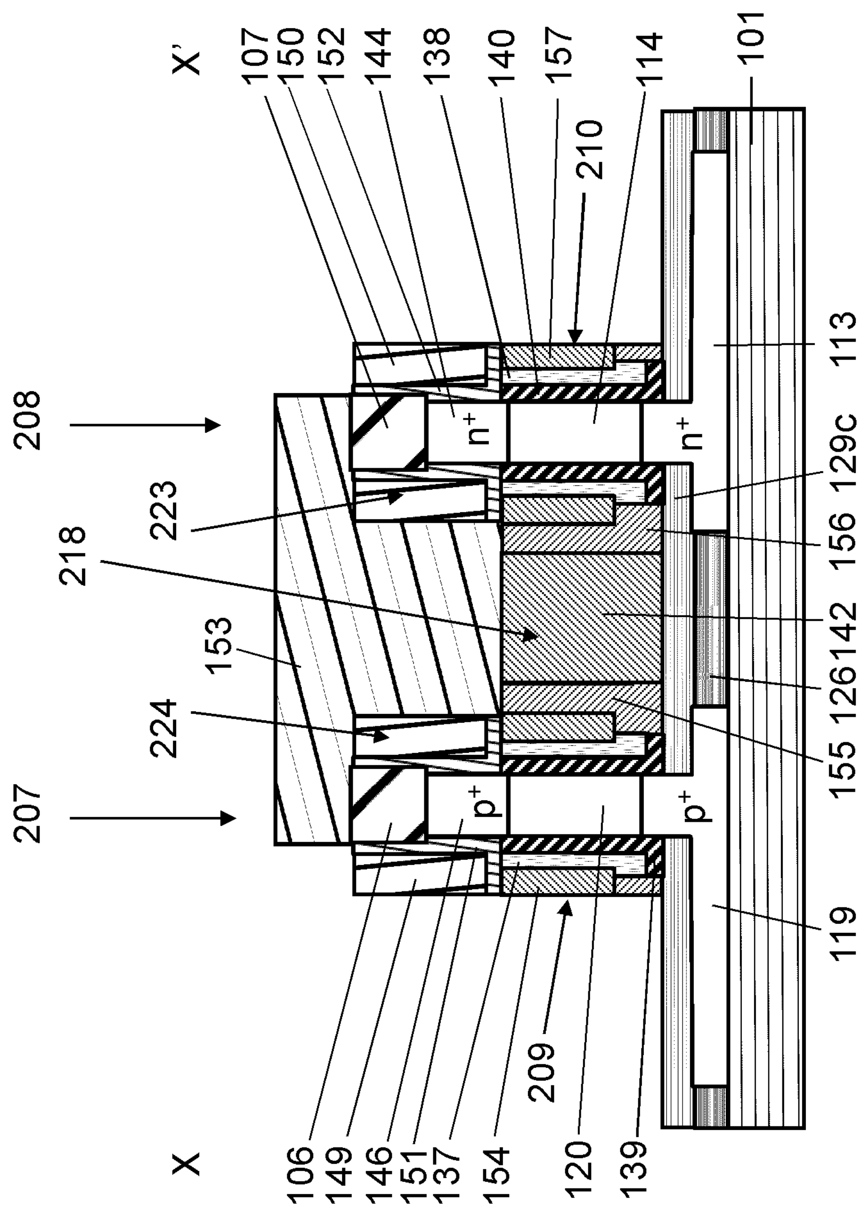
FIG. 111B is a cross-sectional diagram taken in the line X-X' of FIG. 11A.
Figure 112A:
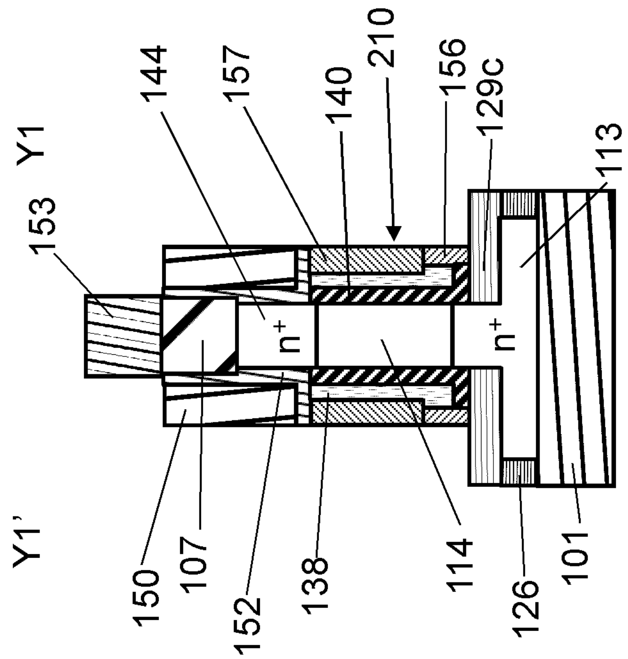
FIG. 112A is a cross-sectional diagram taken in the line Y1-Y1' of FIG. 111A.
Figure 112B:
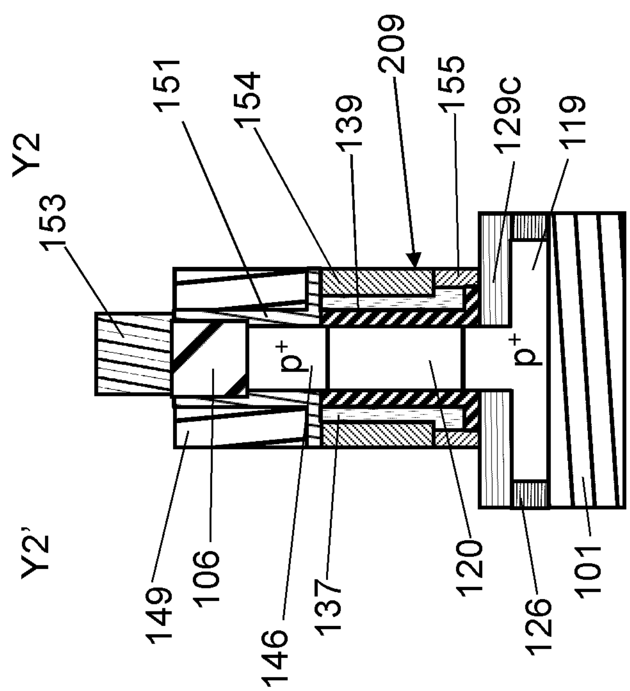
FIG. 112B is a cross-sectional diagram taken in the line Y2-Y2' of FIG. 111A.
Figure 113A:
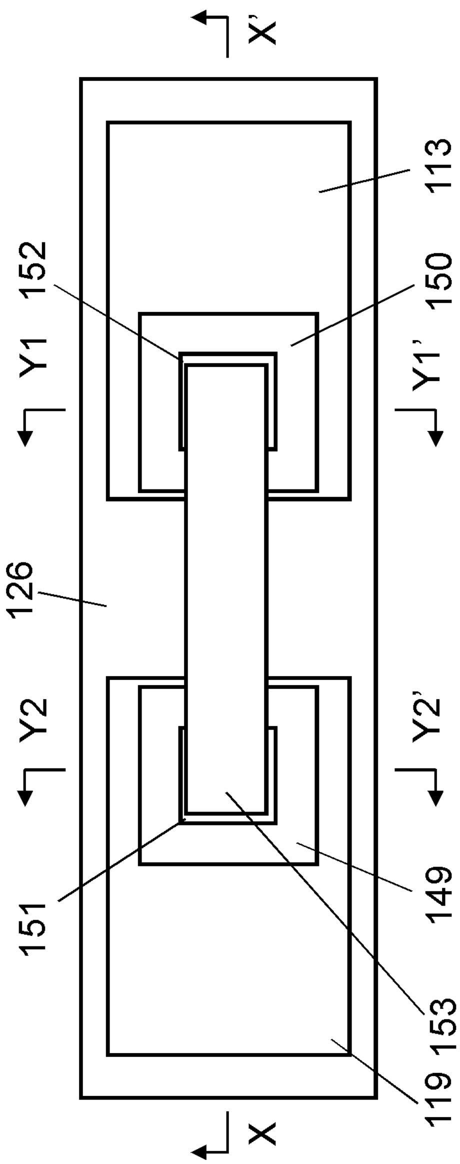
FIG. 113A is a top view for explaining the fabrication method of the semiconductor device according to the first embodiment.
Figure 113B:
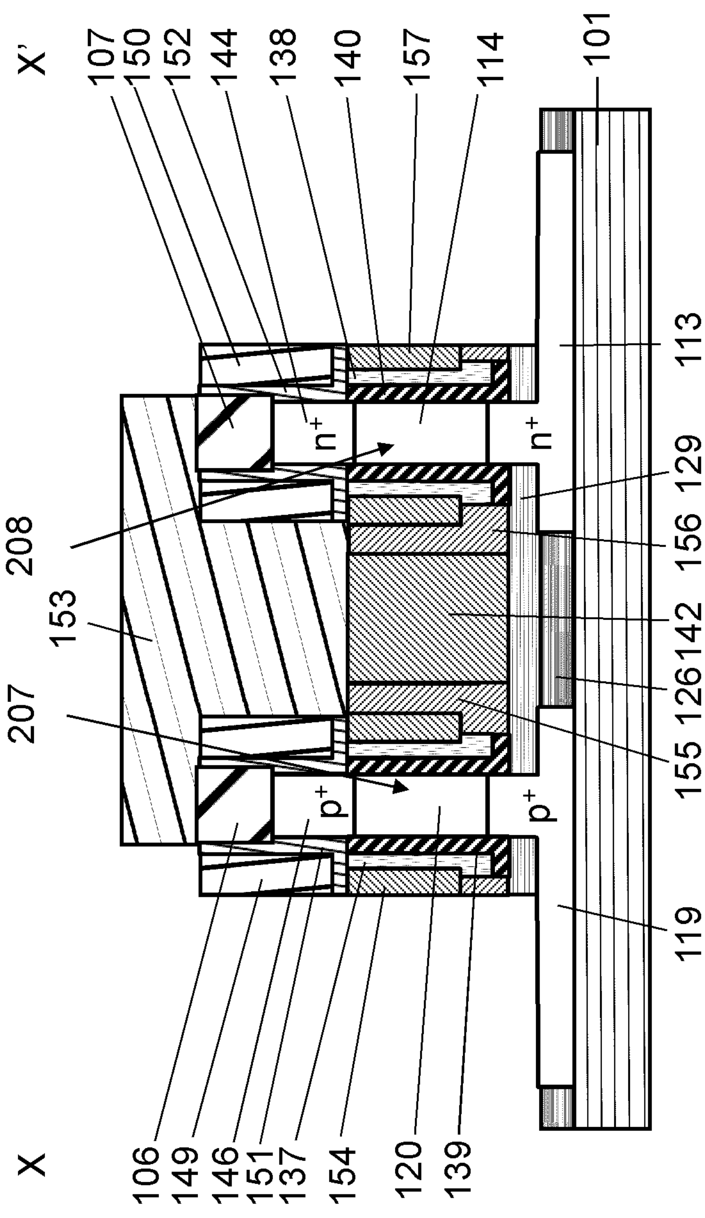
FIG. 113B is a cross-sectional diagram taken in the line X-X' of FIG. 113A.
Figure 114A:
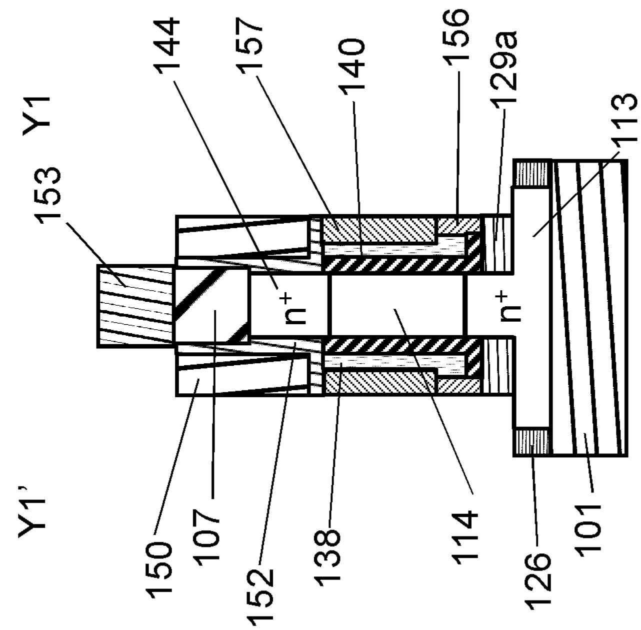
FIG. 114A is a cross-sectional diagram taken in the line Y1-Y1' of FIG. 113A.
Figure 114B:
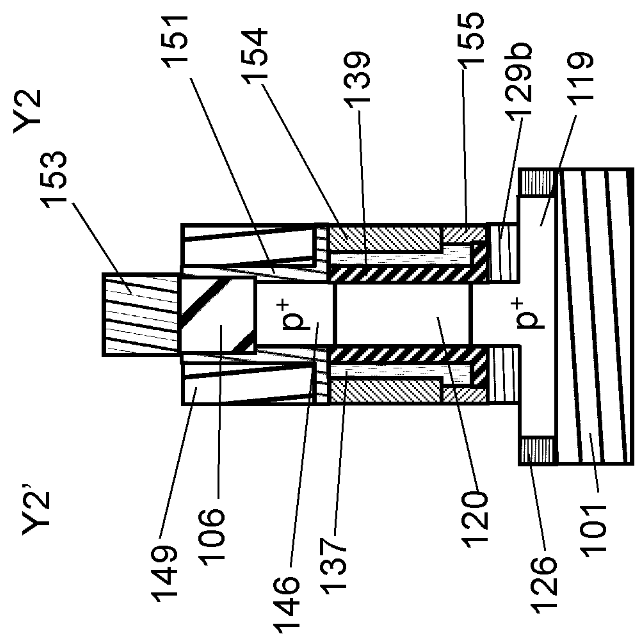
FIG. 114B is a cross-sectional diagram taken in the line Y2-Y2' of FIG. 113A.
Figure 115A:
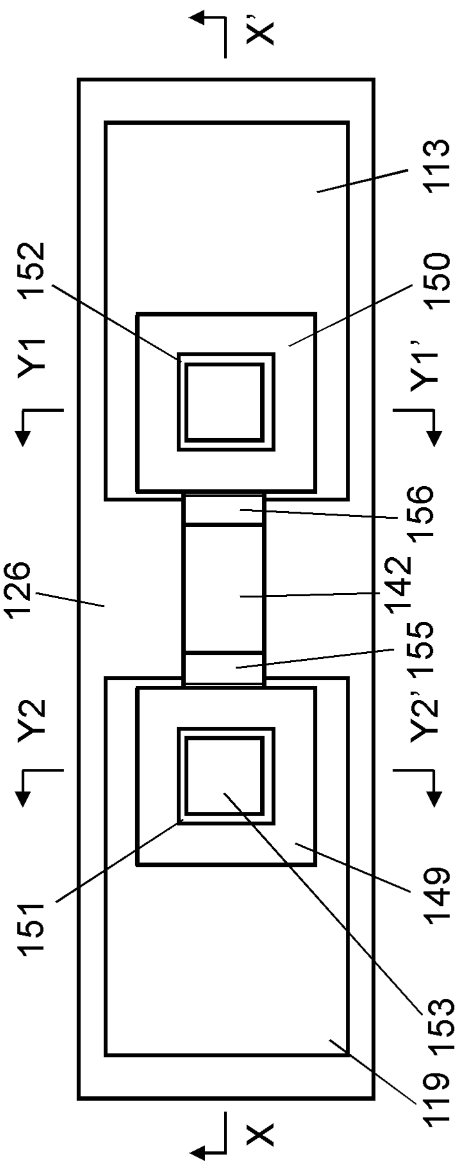
FIG. 115A is a top view for explaining the fabrication method of the semiconductor device according to the first embodiment.
Figure 115B:
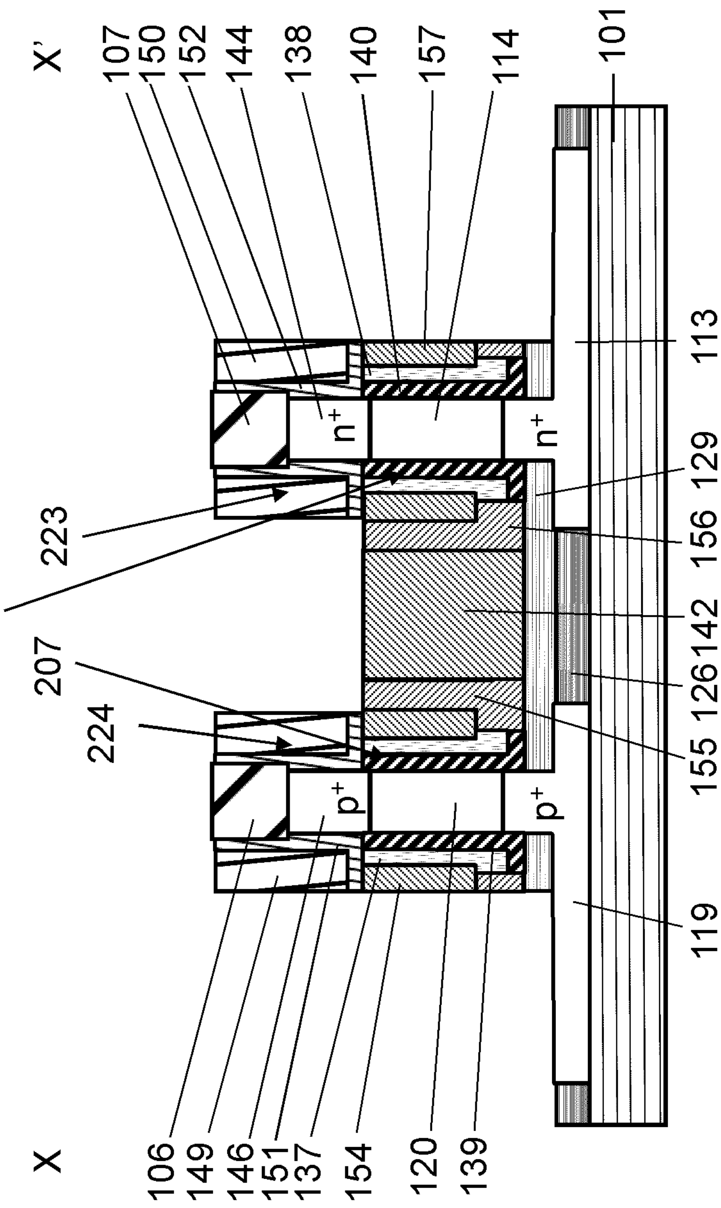
FIG. 115B is a cross-sectional diagram taken in the line X-X' of FIG. 115A.
Figure 116A:
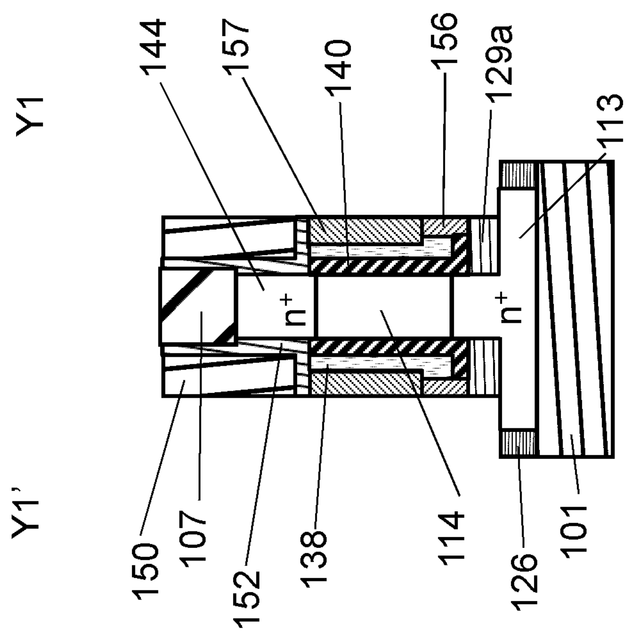
FIG. 116A is a cross-sectional diagram taken in the line Y1-Y1' of FIG. 115A.
Figure 116B:
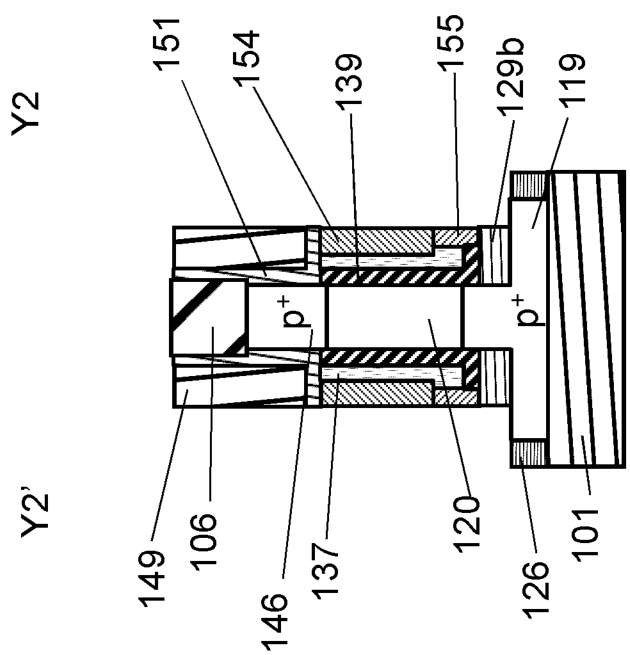
FIG. 116B is a cross-sectional diagram taken in the line Y2-Y2' of FIG. 115A.
Figure 117A:
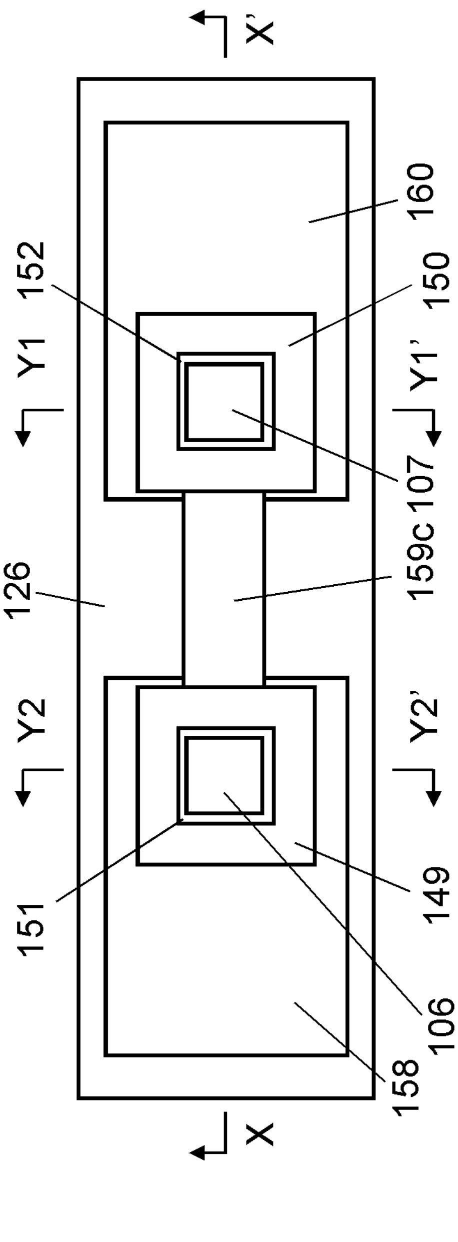
FIG. 117A is a top view for explaining the fabrication method of the semiconductor device according to the first embodiment.
Figure 117B:
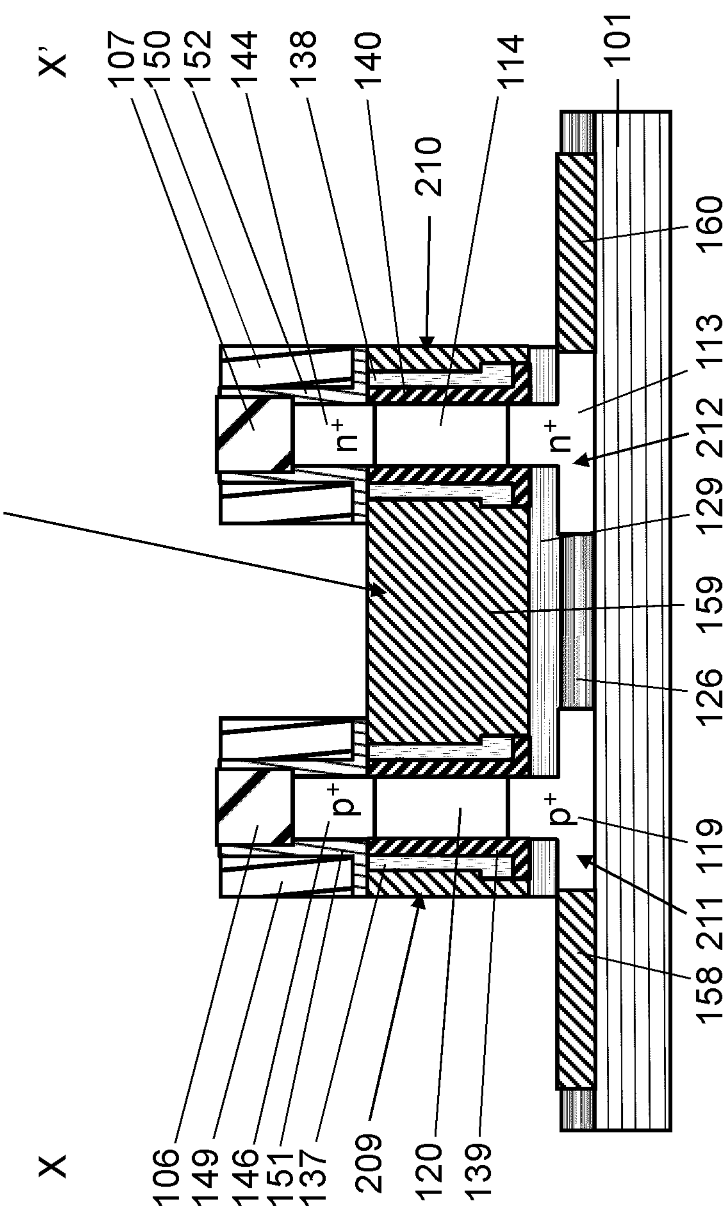
FIG. 117B is a cross-sectional diagram taken in the line X-X' of FIG. 117A.
Figure 118A:
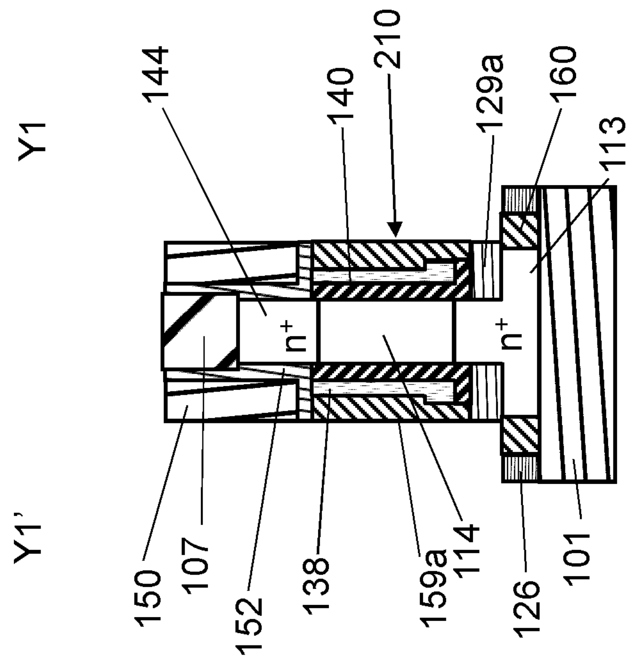
FIG. 118A is a cross-sectional diagram taken in the line Y1-Y1' of FIG. 117A.
Figure 118B:
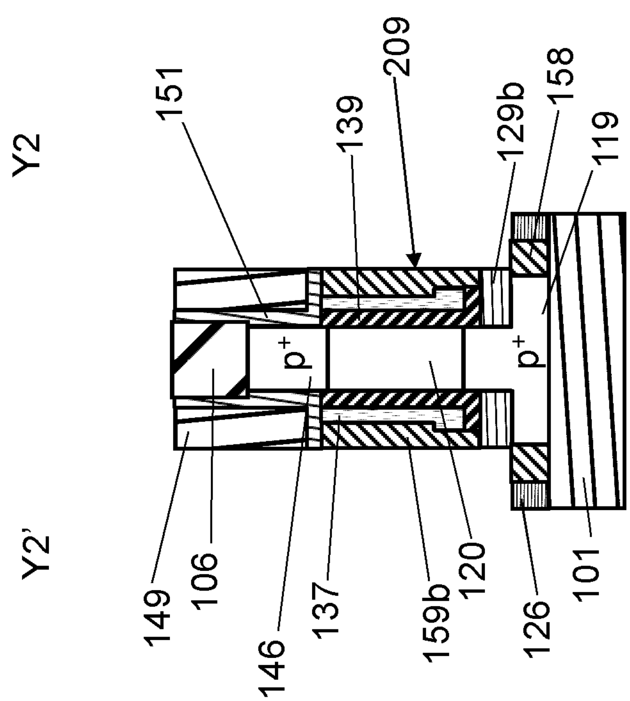
FIG. 118B is a cross-sectional diagram taken in the line Y2-Y2' of FIG. 117A.
Figure 119A:
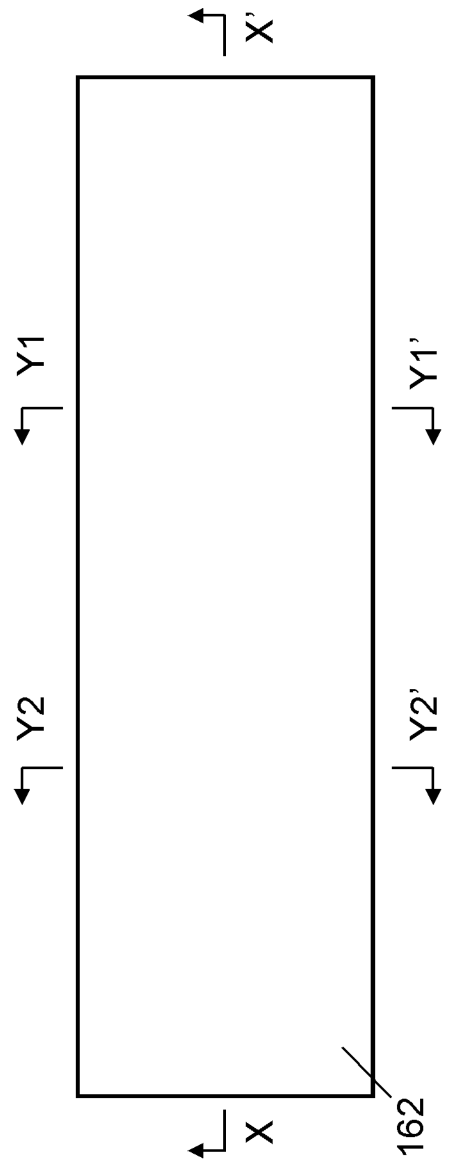
FIG. 119A is a top view for explaining the fabrication method of the semiconductor device according to the first embodiment.
Figure 119B:
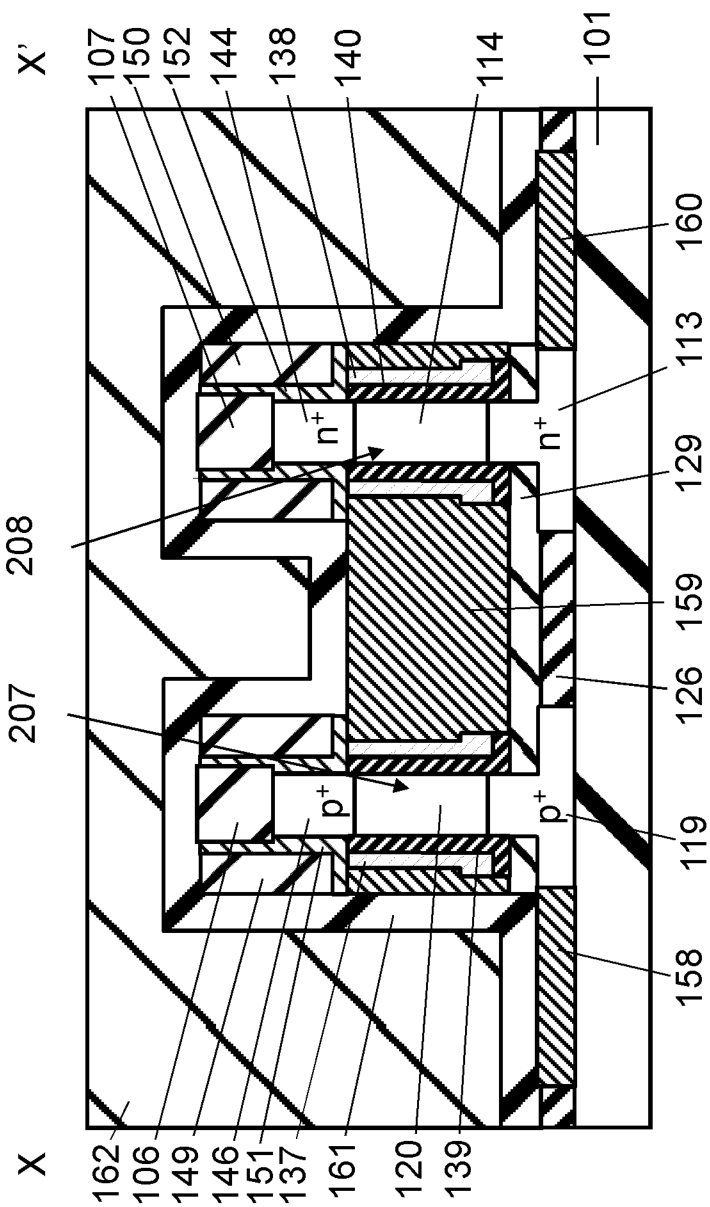
FIG. 119B is a cross-sectional diagram taken in the line X-X' of FIG. 119A.
Figure 120A:
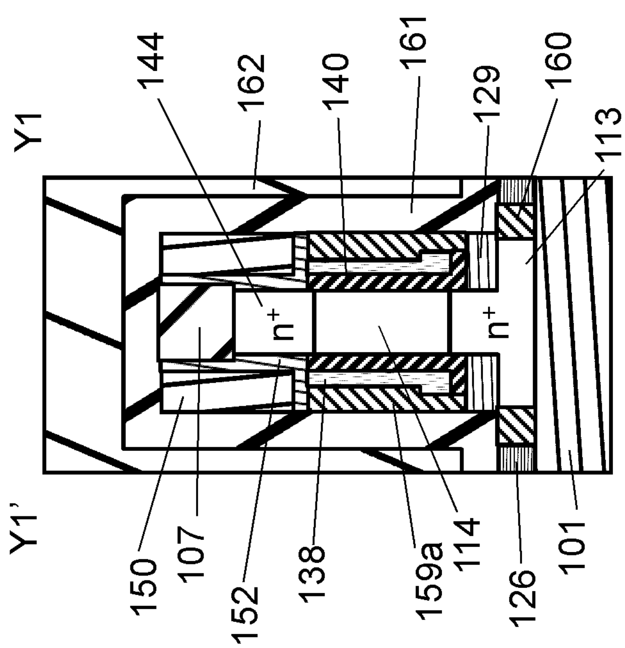
Figure 120B:
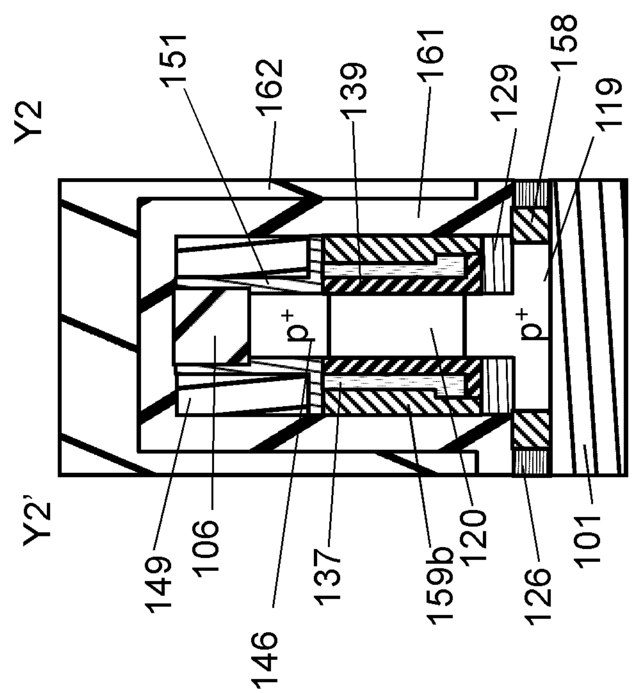
Figure 121A:
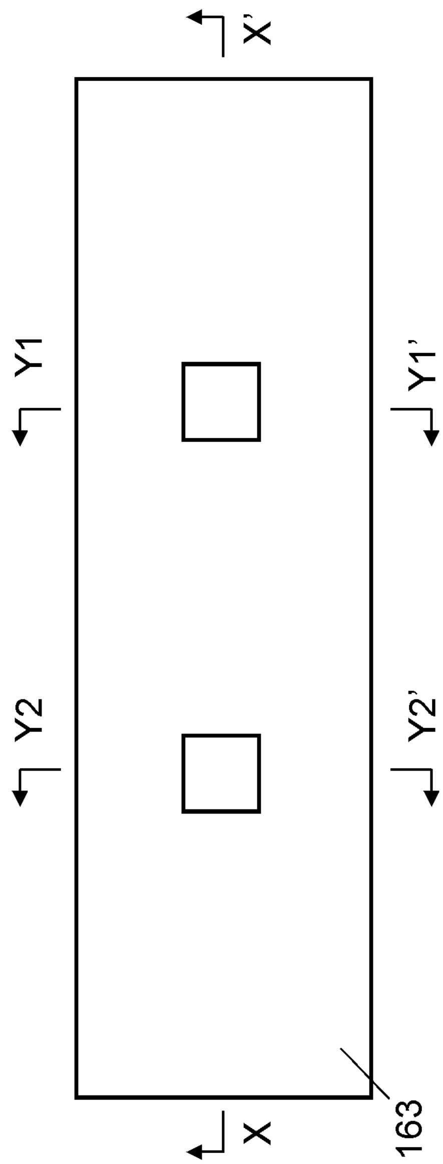
Figure 121B:
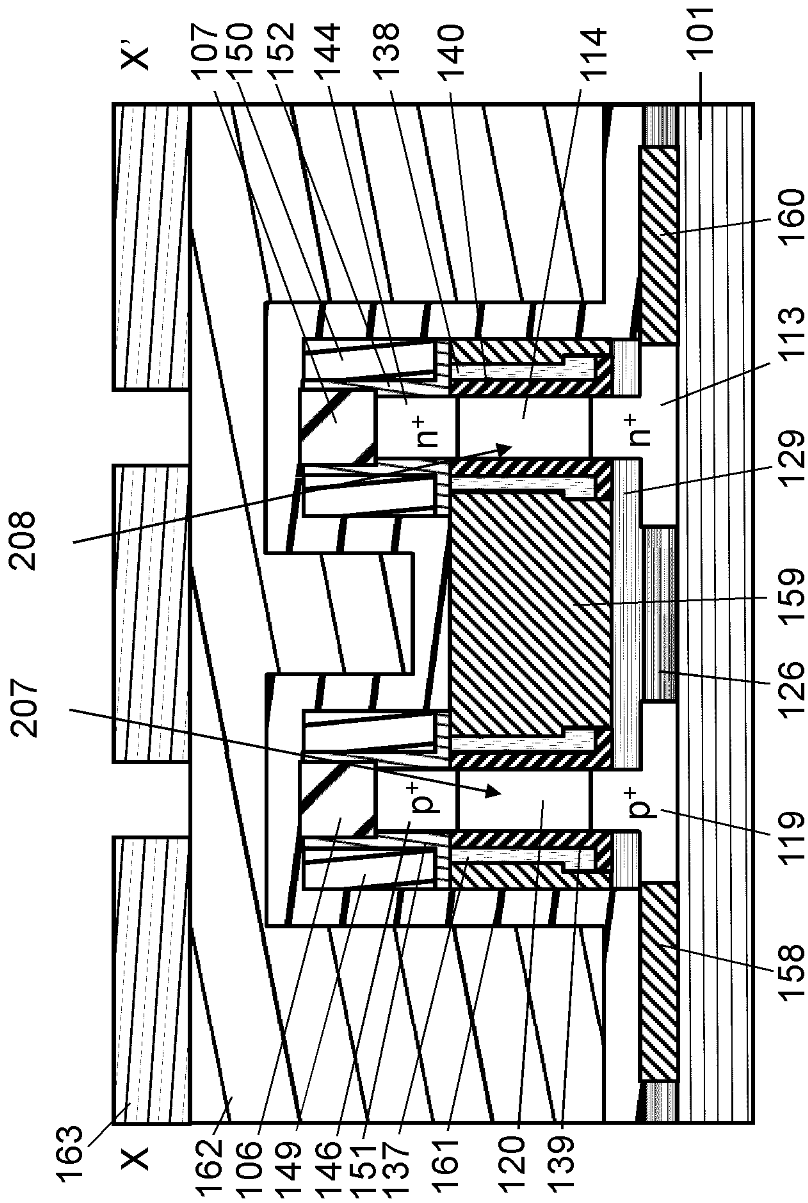
Figure 122A:
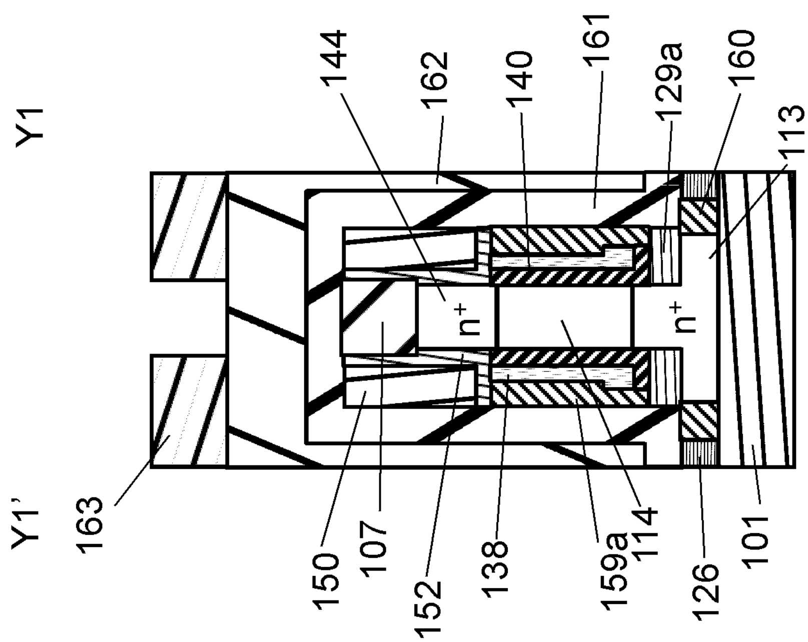
Figure 122B:
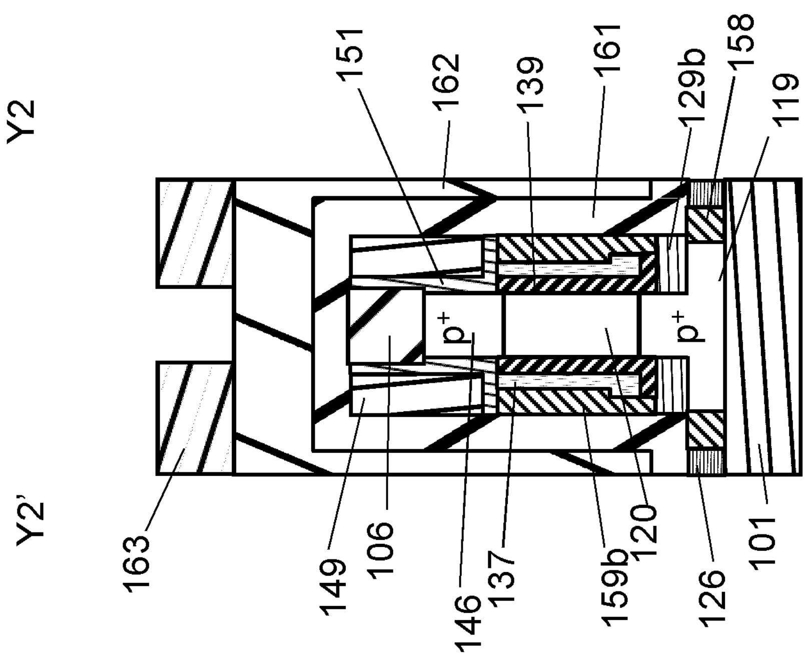
Figure 123A:
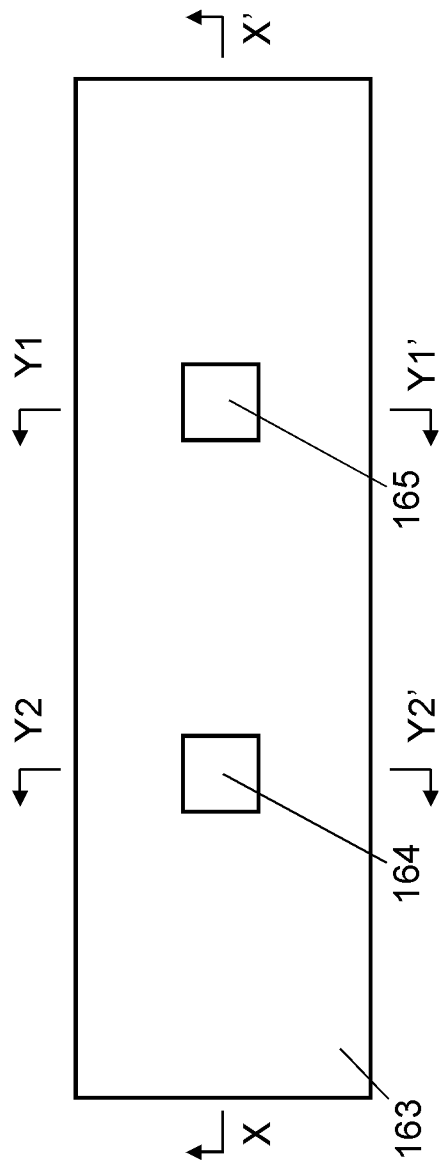
Figure 123B:
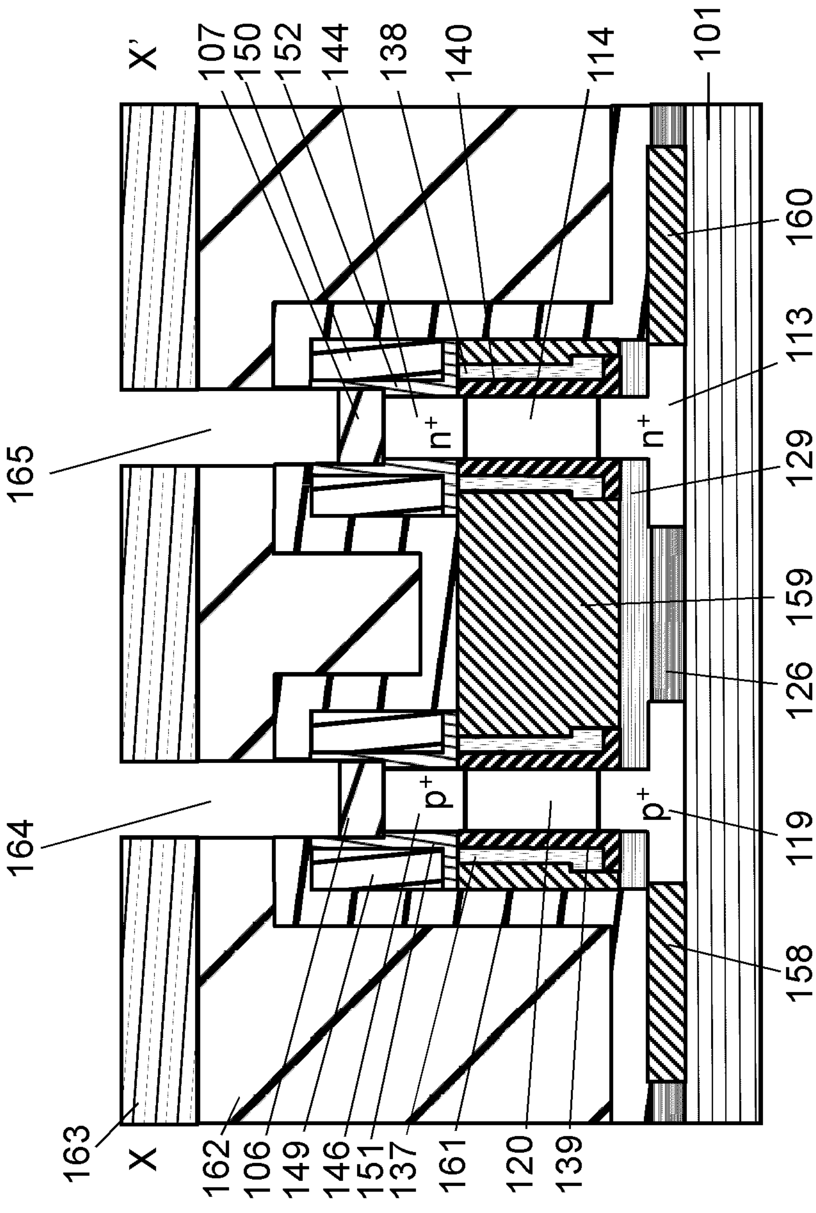
Figure 124A:
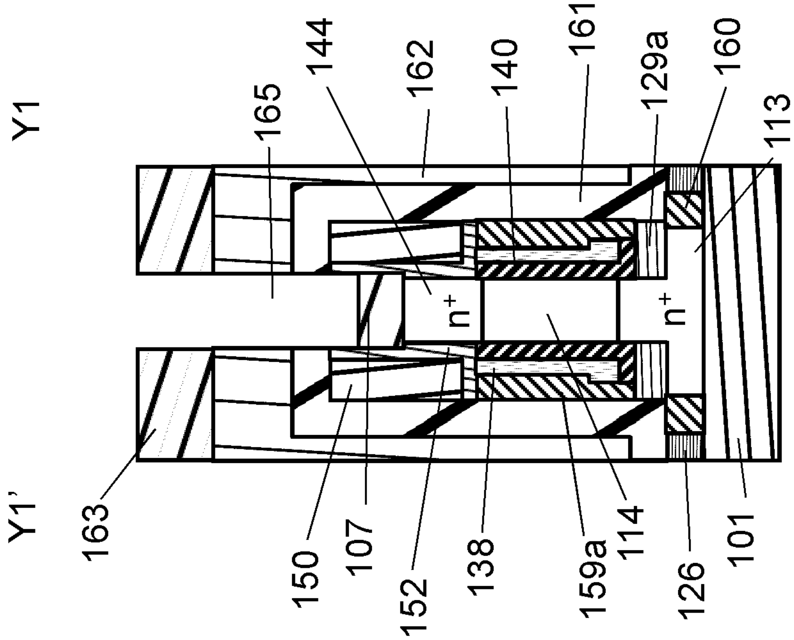
Figure 124B:
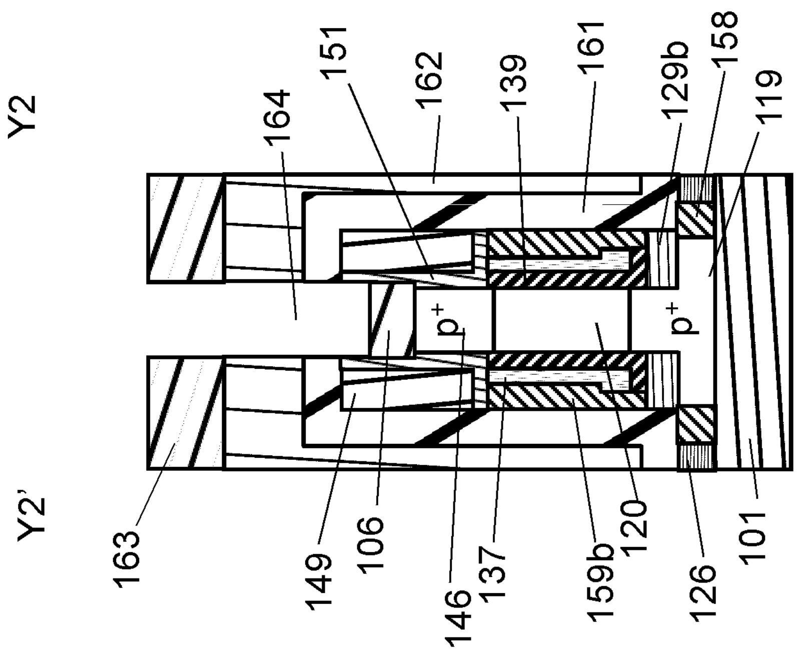
Figure 125A:
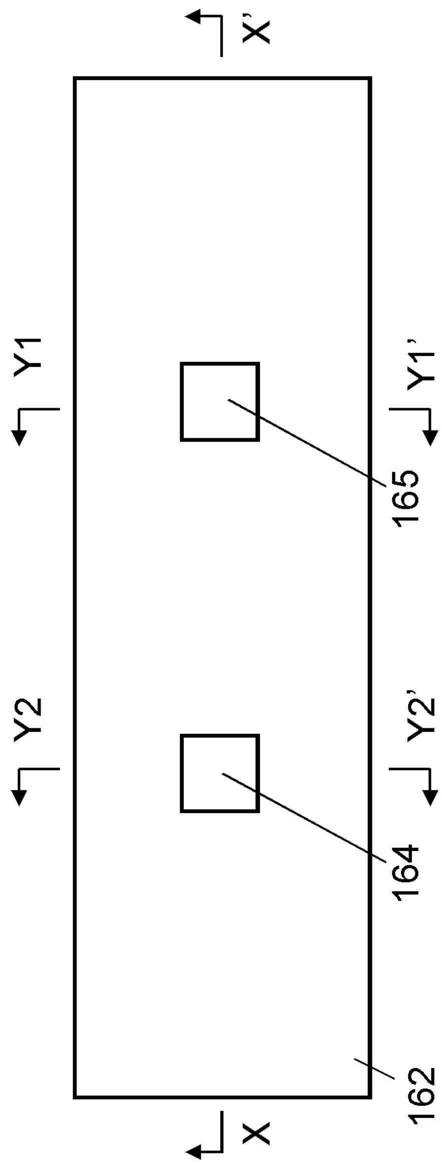
Figure 125B:
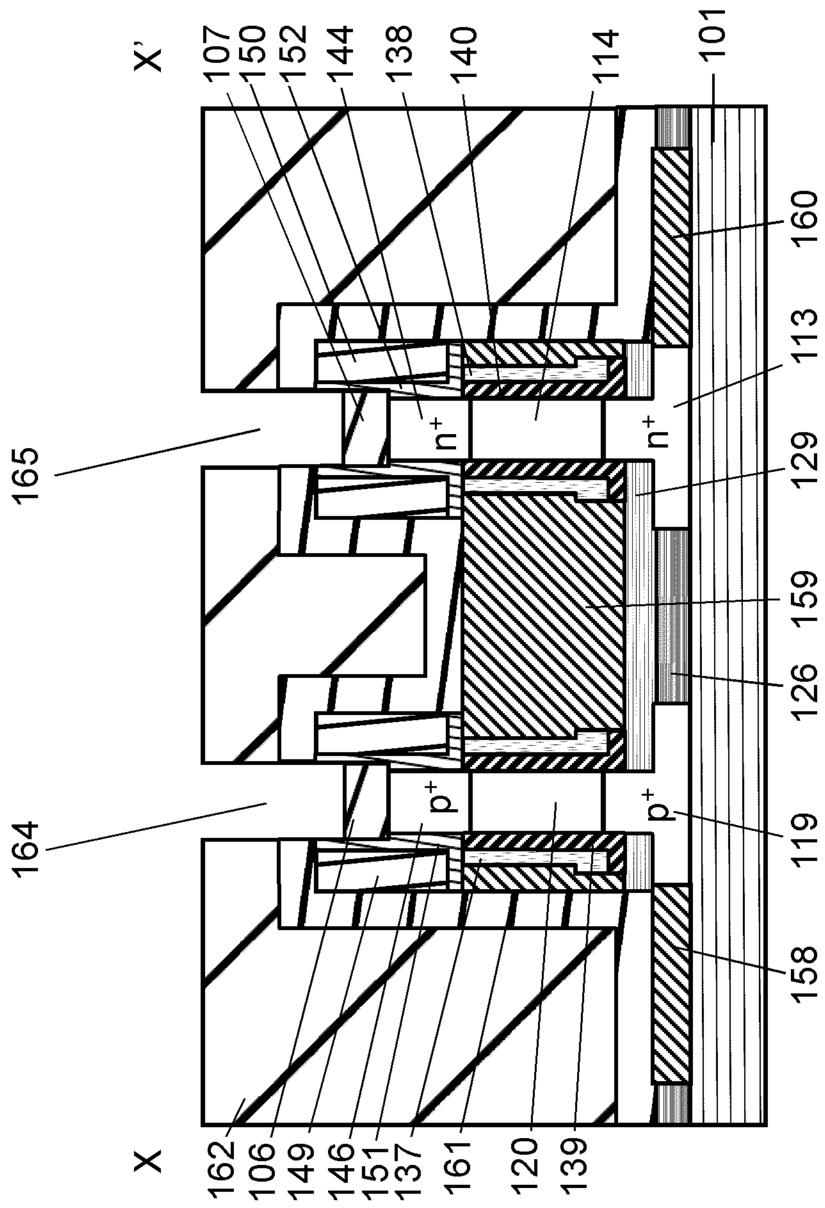
Figure 126A:
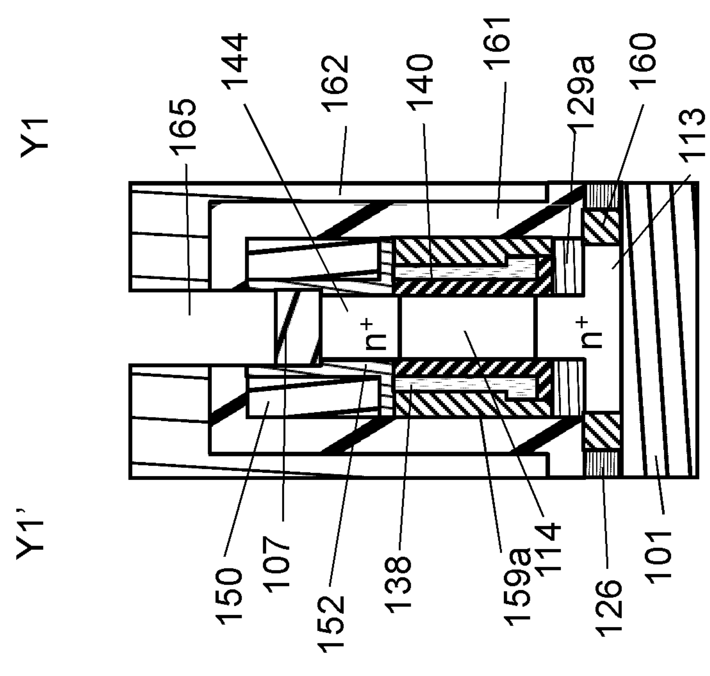
Figure 126B:
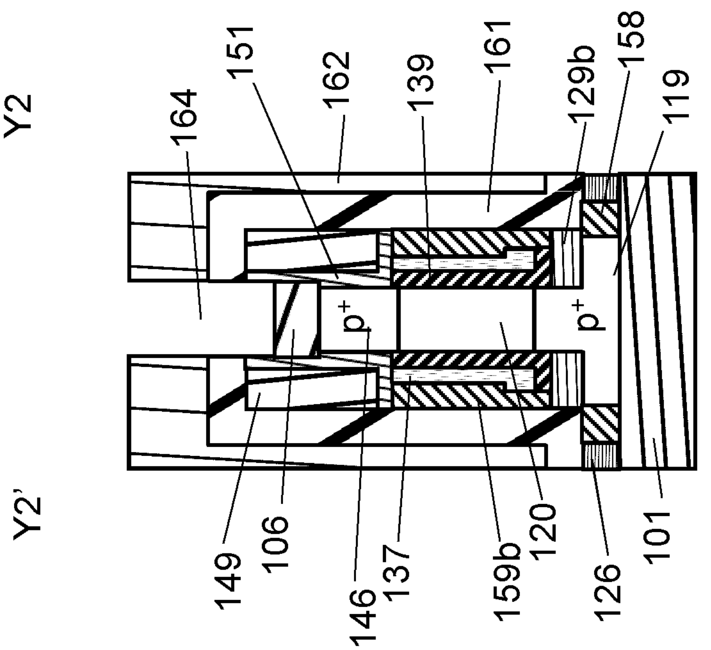
Figure 127A:
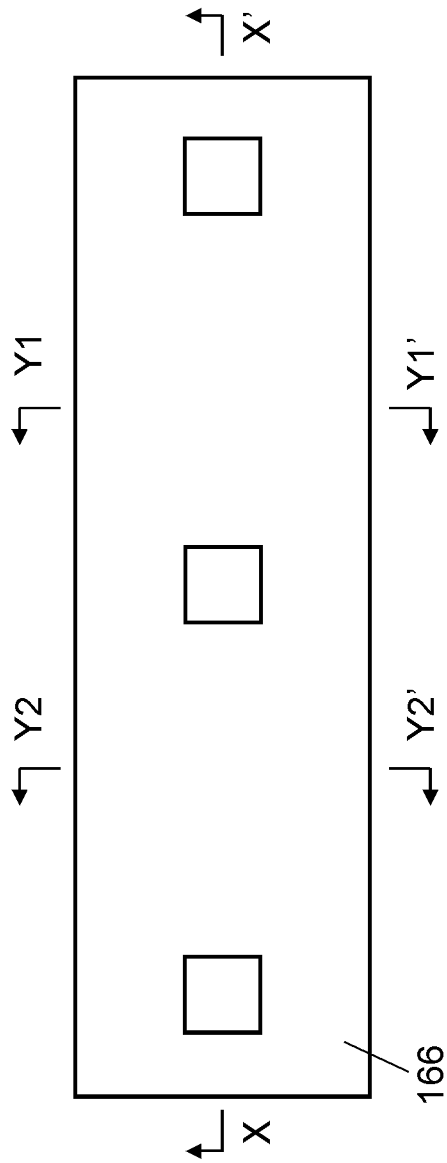
Figure 127B:
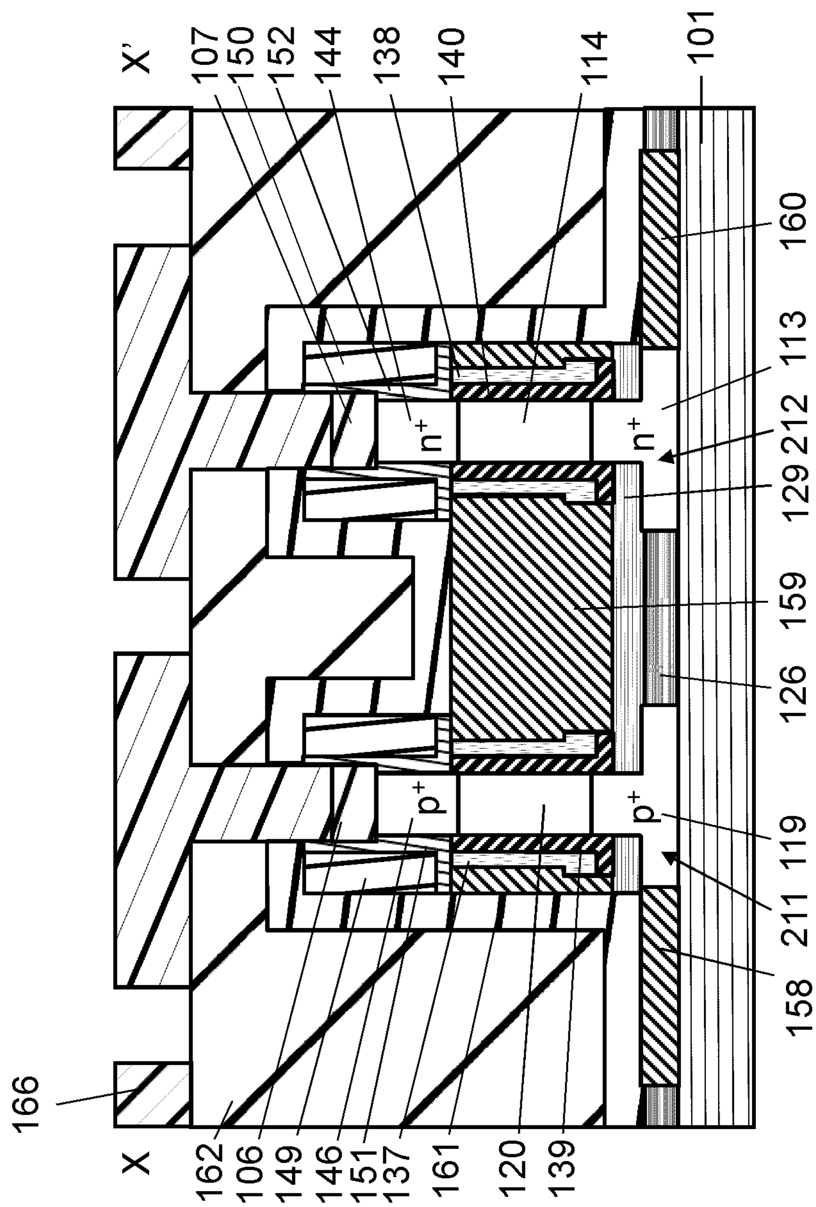
Figure 128A:
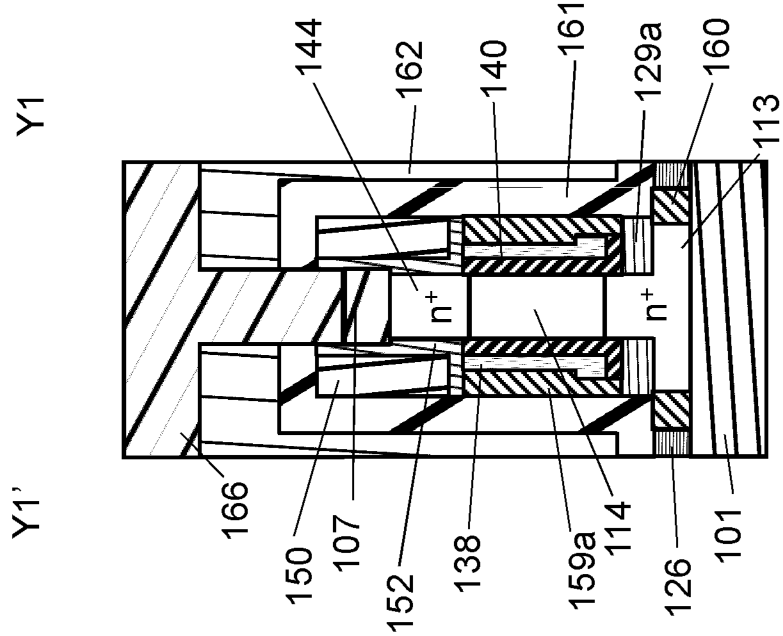
Figure 128B:
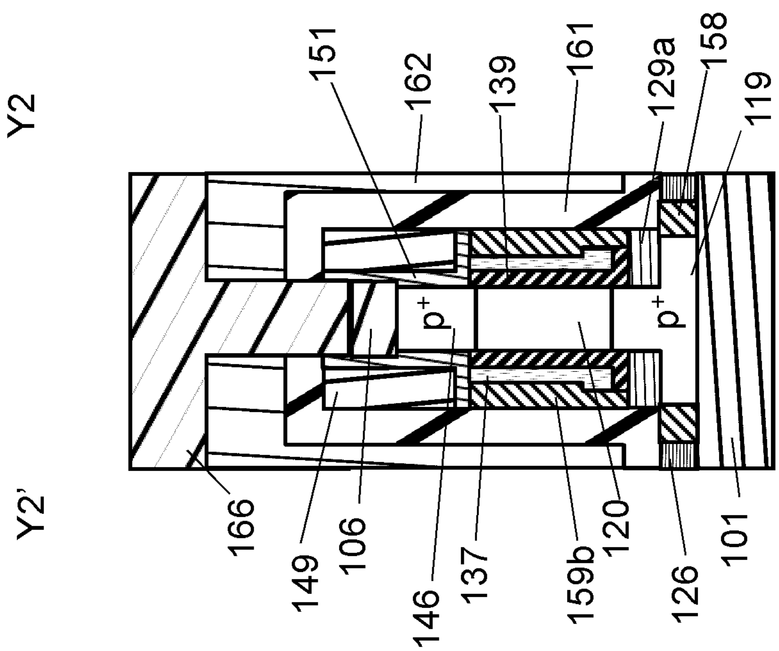
Figure 129A:
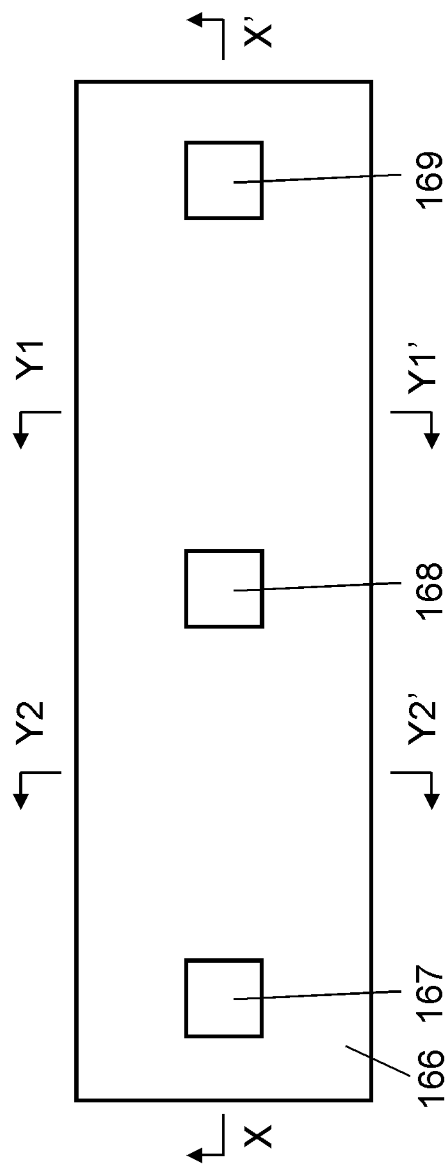
Figure 129B:
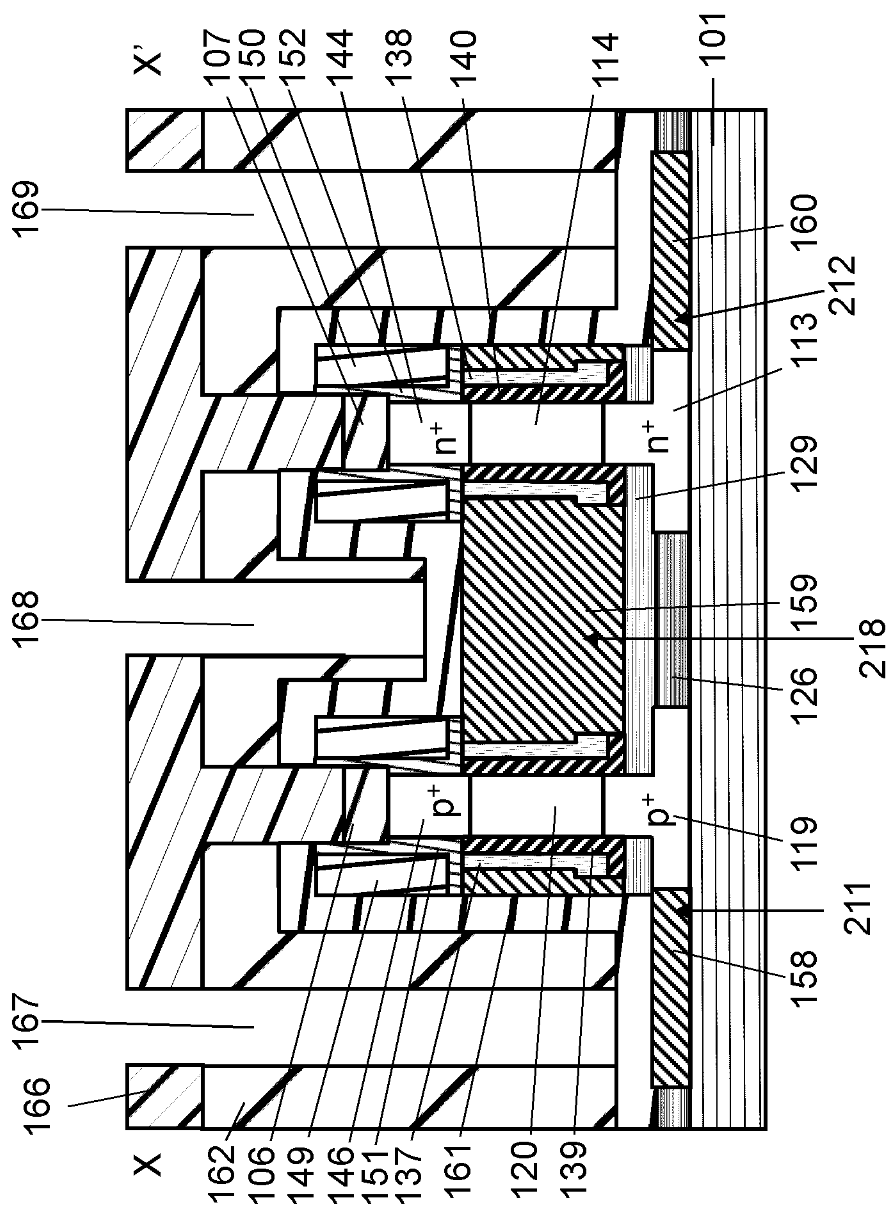
Figure 130A:
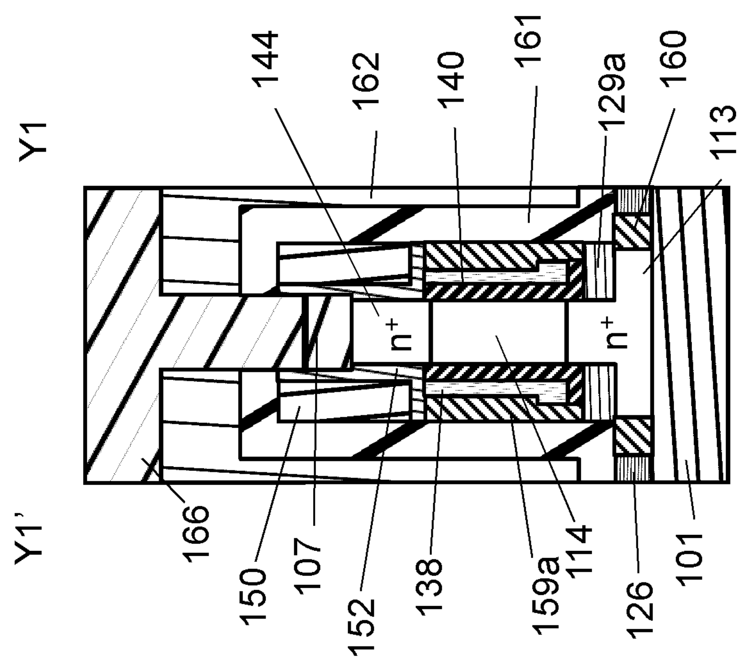
Figure 130B:
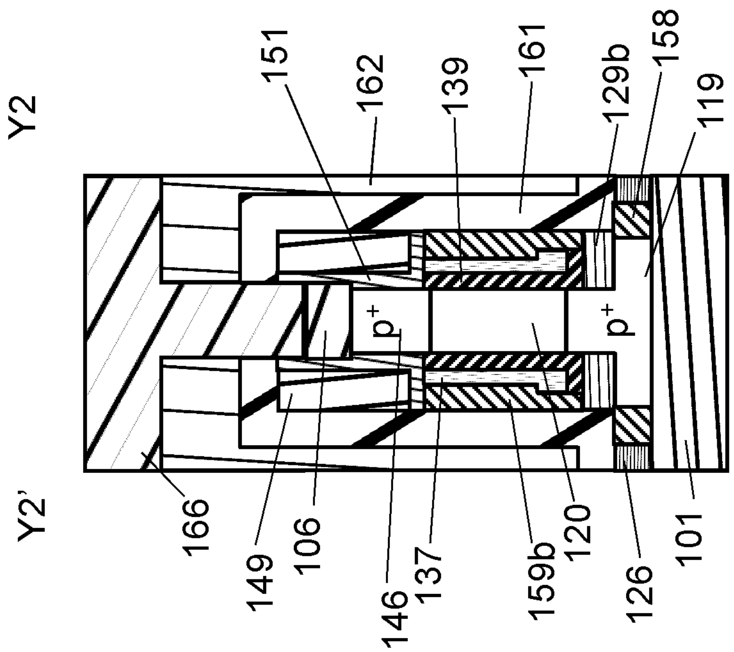

As shown in FIG. 93B and FIG. 94A as arrows, arsenic is implanted. Accordingly, as shown in FIG. 93A to FIG. 94B, a second n+ type silicon layer 144 is formed in the upper part of the columnar silicon layer 208. Assuming that a line vertical to the substrate be 0 degree, an angle at which the arsenic is implanted is in the range of 10 to 60 degrees, and in particular, a high angle of 60 degrees is preferable. This is because the hard mask 107 is disposed on the columnar silicon layer 208.

As shown in FIG. 95A-FIG. 96B, the resist 143 is removed. Then, annealing treatment is performed.

As shown in FIG. 97A to FIG. 98B, a resist 145 for forming the p+ type silicon layer 146 in the upper part of the columnar silicon layer 207 is formed.

As shown in FIG. 99A to FIG. 100B, for example, boron is implanted to form the p+ type silicon layer 146 in the upper part of the columnar silicon layer 207. Assuming that a line vertical to the substrate be 0 degree, an angle at which the boron is implanted is in the range of 10 to 60 degrees, and in particular, a high angle of 60 degrees is preferable. This is because the hard mask 106 is disposed on the columnar silicon layer 207.

As shown in FIG. 101A to FIG. 102B, the resist 145 is removed.

As shown in FIG. 103A to FIG. 104B, an oxide film 147 is formed on the results of the above-mentioned processing step. The oxide film 147 is preferably one formed by atmospheric pressure CVD. The oxide film 147 enables a subsequent nitride film 148 to be formed by low pressure CVD.

As shown in FIG. 105A to FIG. 106B, a nitride film 148 is formed. The nitride film 148 is preferably one formed by the low pressure CVD. This is because the low-pressure CVD is effective in homogeneity as compared with atmospheric pressure CVD.

As shown in FIG. 107A to FIG. 108B, the nitride film 148 and oxide film 147 are etched to form a first insulating film sidewall 223 and second insulating film sidewall 224. The first insulating film sidewall 223 is composed of the nitride film 150 and oxide film 152 which remained by the etching, and the second insulating film sidewall 224 is composed of the nitride film 149 and oxide film 151 which remained by the etching.

The sum of a film thicknesses of the nitride film 149 and oxide film 151, which are made to remain in the sidewall shape, will correspond to a film thickness of the gate electrodes afterward, and therefore by adjusting the deposition thicknesses and etching conditions of the oxide and nitride films 147 and 148, the gate electrodes having a desired thickness can be formed.

Also, the sum of a film thickness of the insulating film side walls 223 and 224 and a radius of the columnar silicon layers 207 and 208 is preferably larger than an outer circumferential radius of a cylinder formed by the gate insulating films 139 and 140 and metal films 137 and 138. Since the sum of the film thickness of the insulating film side walls 223 and 224 and radius of the columnar silicon layers 207 and 208 is larger than the outer circumferential radius of the cylinder formed by the gate insulating films 139 and 140 and metal films 137 and 138, metal films 137 and 138 are covered with the polysilicon film after gate etching, and therefore the metal contamination can be suppressed.

Further, on the basis of this processing step, the upper surfaces of the columnar silicon layers 207 and 208 have a structure covered with the hard masks 106 and 107 and insulating film sidewalls 223 and 224, respectively. The structure eliminates the formation of a metal-semiconductor compound on the surfaces of the columnar silicon layers 207 and 208. Still further, since the upper surfaces of the columnar silicon layers 207 and 208 have the structure covered with the hard masks 106 and 107 and insulating film sidewalls 223 and 224, the n+ type silicon layer and p+ type silicon layer are formed before the polysilicon is etched and the gate electrode is formed as explained using FIG. 91A to FIG. 102B.

As shown in FIG. 109A to FIG. 110B, a resist 153 for forming the gate wiring 218 is formed.

As shown in FIG. 111A to FIG. 112B, the polysilicon films 142, 141, 135 and 136 are etched to form gate electrodes 209 and 210 and a gate wiring 218.

The gate electrode 209 is composed of the metal film 137 and polysilicon films 154 and 155 which react to metal to form a metal silicon compound in the following process, and the gate electrode 210 is composed of the metal film 138 and polysilicon films 156 and 157 which react to metal to form a metal silicon compound in the following processing step. The gate wiring 218 which connects between the gate electrode 209 and gate electrodes 210 is composed of the polysilicon films 154, 155, 142, 156 and 157 which react to metal to form a metal silicon compound in the following processing step. In addition, the polysilicon film 154 and 157 is a part which remained after the etching of the polysilicon films 135 and 136, and the polysilicon films 155 and 156 are a part which remained after the etching of the polysilicon film 141. Since the sum of the film thickness of the insulating film side walls 223 and 224 and radius of the columnar silicon layers 207 and 208 is larger than the outer circumferential radius of the cylinder formed by the gate insulating films 139 and 140 and metal films 137 and 138, the metal films 137 and 138 are covered with the polysilicon films 154, 155, 142, 156 and 157 after the gate etching, and therefore the metal contamination can be suppressed.

As shown in FIG. 113A to FIG. 114B, the insulating film 129*c* is etched to form first insulating films 129*a* and second insulating film 129*b*, and to expose the surface of the p+ type silicon layer 119 and first n+ type silicon layer 113. In this embodiment, since the first and second insulating films 129*a* and 129*b* are formed in the same processing step by using the same material in one piece as above-mentioned, reference numeral 129 denotes the first and second insulating films in the cross-sectional diagram taken in the cutting line X-X' of FIG. 113 to FIG. 147.

As shown in FIG. 115A to FIG. 116B, the resist 150 is removed. There is obtained a structure in which the gate insulating film 140 and metal film 138 are covered with the columnar silicon layer 208, the polysilicon films 156 and 157, the first insulating film 129 (129*a*), and first insulating film sidewall 223, and the second gate insulating film 139 and second metal film 137 are covered with the second columnar silicon layer 207, polysilicon films 154 and 155, second insulating film 129 (129*b*), and second insulating film sidewall 224. Also, there is obtained a structure in which the upper parts of the columnar silicon layers 207 and 208 is covered with the hard masks 106 and 107 and insulating film sidewalls 224 and 223. Such a structure eliminates the formation of a metal-semiconductor compound in the upper part of the columnar silicon layer 207 and 208.

A metal such as Ni or Co is sputtered on the results of the above-mentioned processing step and then subjected to heat treatment to thereby react the gate electrode polysilicon films 154 and 155, the gate electrode polysilicon films 154, 155, 142, 156, and 157, and planar silicon layer with the sputtered metal. Then, an unreacted metal film is removed by a sulfuric acid/hydrogen peroxide mixed solution or ammonia/hydrogen peroxide mixed solution. Accordingly, as shown in FIG. 117A to FIG. 118B, a metal-silicon compound layer 159 (159*a* to 159C) is formed for the gate electrodes 209 and 210 and gate wiring 218; a metal-silicon compound layer 158 is formed in the planar silicon layer 211; and a metal-silicon compound layer 160 is formed in the planar silicon layer 212. Since the first, third, and seventh metal-silicon compound layers 159*a* to 159*c* are formed in the same processing step by using the same material in this embodiment, the cross-sectional diagram taken in the cutting line X-X' of FIG. 117 to FIG. 147 shows their bundling by the metal-silicon compound layer 159.

On the other hand, the upper surfaces of the columnar silicon layers 207 and 208 have the structure covered with the hard masks 106 and 107 and insulating film sidewalls 224 and 223, and therefore in this processing step, any metal-silicon compound layer is not formed on the upper surfaces of the columnar silicon layers 207 and 208.

Between the metal-silicon compound layer 159 and the metal films 137 and 138, a polysilicon film may be present. Also, under the fourth metal-silicon compound layer 158, the p+ type silicon layer 119 may be present, and under the second metal-silicon compound layer 160, the first n+ type silicon layer 113 may be present.

A nitride film 161 is formed on the results of the above-mentioned processing step, and an interlayer insulating film 162 is formed so that the results in which the nitride film 161 is formed may be embedded. Next, as shown in FIG. 119A to FIG. 120B, the interlayer insulating film 162 is planarized.

As shown in FIG. 121A to FIG. 122B, a resist 163 for forming contact holes on the columnar silicon layers 207 and 208 is formed.

As shown in FIG. 123A to FIG. 124B, the interlayer insulating film 162 is etched by applying the resist 163 as a mask to form contact holes 164 and 165 on the columnar silicon layers 207 and 208. At this time, it is preferable to etch parts of the nitride film 161 and hard masks 106 and 107 by over etching.

As shown in FIG. 125A to FIG. 126B, the resist 163 is removed.

As shown in FIG. 127A to FIG. 128B, a resist 166 for forming contact holes 167, 168 and 169 in each on the planar silicon layers 211 and 212 and gate wiring 218 is formed.

As shown in FIG. 129A to FIG. 130B, the interlayer insulating film 162 is etched by applying the resist 166 as a mask, to form the contact holes 167, 169 and 168 on the planar silicon layers 211 and 212 and gate wiring 218, respectively. The contact holes 164 and 165 on the columnar silicon layers 207 and 208, and the contact holes 167, 169 and 168 on the planar silicon layers 211 and 212 and gate wiring 218 are formed in the different processing steps, and therefore an etching condition for forming the contact holes 164 and 165 on the columnar silicon layers 207 and 208, and an etching condition for forming the contact holes 167, 169 and 168 on the planar silicon layers 211 and 212 and gate wiring 218 can be optimized, respectively.

As shown in FIG. 131A to FIG. 132B, the resist 166 is removed.

As shown in FIG. 133A to FIG. 134B, the nitride film 161 under the contact holes 167, 168 and 169 is etched to remove, and the hard masks 106 and 107 are further etched to remove.

As shown in FIG. 135A to FIG. 136B, a barrier metal layer 170 formed by a metal, such as tantalum, tantalum nitride, titanium, or titanium nitride, is formed, and then a metal layer 171 is formed. At this time, a metal which forms the barrier metal layer 170 such as titanium and silicon in the upper parts of the columnar silicon layers 207 and 208 may react to form a compound of metal and silicon, and a fifth metal-silicon compound layer and a sixth metal-silicon compound layer may be formed at interfaces between the barrier metal layer 170 and the columnar silicon layers 207 and 208. Depending on a material for the barrier metal layer, the fifth metal silicon compound layer and sixth metal silicon compound layer may not be formed.

As shown in FIG. 137A to FIG. 138B, a metal layer 172 is deposited on the results of the above-mentioned processing step.

As shown in FIG. 139A to FIG. 140B, the metal layers 172 and 171 and the barrier metal layer 170 are planarized and etched to form electric contacts 213, 214, 215, 216, and 217. The electric contact 213 includes the barrier metal layer 173 and the metal layers 174 and 175. The electric contact 214 includes the barrier metal layer 176 and the metal layers 177 and 178. The electric contact 215 includes the barrier metal layer 179 and the metal layers 180 and 181. The electric contact 216 includes the barrier metal layer 182 and the metal layers 183 and 184. The electric contact 217 includes the barrier metal layer 185 and the metal layers 186 and 187.

As shown in FIG. 141A to FIG. 142B, a barrier metal layer 188, metal layer 189, and barrier metal layer 190 are sequentially formed on the results of the above-mentioned processing step.

As shown in FIG. 143A to FIG. 144B, resists 191, 192, 193 and 194 for forming power source wirings, input wiring, and output wiring are formed.

As shown in FIG. 145A to FIG. 146B, the barrier metal layer 190, metal layer 189, and barrier metal layer 188 are etched to form the power source wirings 219 and 222, input wiring 221, and output wire 220. The power source wiring 219 includes barrier metal layer 195, metal layer 196, and barrier metal layer 197. The power source wiring 222 includes barrier metal layer 204, metal layer 205, and barrier metal layer 206. The input wiring 221 includes barrier metal layer 201, metal layer 202, and barrier metal layer 203. The output wire 220 includes barrier metal layer 198, metal layer 199, and barrier metal layer 200.

As shown in FIG. 147A to FIG. 148B, the resists 191, 192, 193 and 194 is removed.

According to the above processes, the semiconductor device according to this embodiment is formed.

According to the fabrication method of this embodiment, the electric contacts 214 and 216 can be directly formed on the columnar silicon layers 207 and 208. Therefore, a thick metal semiconducting compound which may cause occurrence of leakage current is not formed on the columnar silicon layers 207 and 208. Also, since it is not necessary to thickly form the second n+ type silicon layer 144 and the p+ type silicon layer 146 comprising the highly doped silicon layers in order to suppress the occurrence of this leakage current, increase of the electrical resistance by the second n+ type silicon layer 144 and the p+ type silicon layer 146 of the highly doped silicon layers 144 and 146 is also avoidable.

Still Also, since the thick metal-silicon compound layers 158 to 160 can be formed in the gate electrodes 209 and 210 and the planar silicon layers 211 and 212 of the lower part of the columnar silicon layers 207 and 208, the low-resistivity of the gate electrodes 209 and 210 and planar silicon layers 211 and 212 can be achieved. Accordingly, the high-speed operation of SGT becomes enabling.

Also, since the first insulating film 129*a* and second insulating film 129*b* are formed between the gate electrodes 209 and 210 and the planar silicon layers 211 and 212, the parasitic capacitance between the gate electrode and the planar semiconductor layer can be reduced.

According to the configuration mentioned above, the low-resistivity and the miniaturization of the semiconductor device are achievable.

Although the fabrication method of the above-mentioned embodiment was explained using the inverter provided with the NMOS-SGT and PMOS-SGT, it can fabricate NMOS-SGT, PMOS-SGT, or a plurality of SGT(s) by the similar process.

In the above-mentioned embodiment, the case where the electric contact is contacted to the second highly doped silicon layer on the columnar semiconductor layer was explained. However, the fifth and sixth metal-silicon compound layers formed in the interface between the electric contact and the second highly doped silicon layer from a compound of a metal of the barrier metal layer and a semiconductor may be formed by making the metal of the barrier metal layer react to the silicon of the upper part of the columnar silicon layer when forming electric contact on a columnar silicon layer directly. In this case, since the fifth and sixth metal-silicon compound layers are thinly formed compared with the first to fourth and seventh metal-silicon compound layers, a problem of leakage current mentioned above is not occurred. Also, a metal included in the fifth and sixth metal-silicon compound layers is a metal which forms the barrier metal layer, and differs from the metal included in the first to fourth and seventh metal-silicon compound layers. In addition, the fifth and sixth metal-silicon compound layers may be formed or may not be formed depending on the material of the barrier metal layer.

In the above-mentioned embodiment, although the case where the gate electrode includes the metal film was explained, it is not necessary to include the metal film if it can function as a gate electrode.

In the above-mentioned embodiment, although the transistor of the enhancement type by which the channel is formed in the region of the first silicon layer 114 and second silicon layer 120 by applying voltage to the first gate electrode 210 and second gate electrode 209 was explained, the transistor may be a depression type.

In the above-mentioned embodiment, although the example which uses silicon is shown as the semiconductor, it also enables to use germanium, a compound semiconductor, etc. if the formation of the SGT enables.

As for material(s) for forming the metal layer, the insulating film, etc. in the above-mentioned embodiment, well-known material(s) can be also used suitably.

The substance name(s) mentioned above is exemplifying and therefore the present invention is not limited to this example.

Moreover, the present invention, to the extent that it does not deviate from the broad spirit and parameters of the present invention, may have various embodiments and modifications. In addition, the above described embodiment is provided to explain one embodiment of the present invention, but does not restrict the scope of the invention.

What is claimed is:

1. A semiconductor device comprising:

a first planar semiconductor layer;

a first columnar semiconductor layer on the first planar semiconductor layer;

a first highly doped semiconductor layer in a lower region of the first columnar semiconductor layer and in an adjacent region of the first planar semiconductor layer;

a second highly doped semiconductor layer in an upper region of the first columnar semiconductor layer and having a conductivity type that is the same as a conductivity type of the first highly doped semiconductor layer;

a first gate insulating film surrounding the first columnar semiconductor layer on a sidewall of the first columnar semiconductor layer between the first highly doped semiconductor layer and the second highly doped semiconductor layer;

a first gate electrode surrounding the first gate insulating film on the first gate insulating film;

a first insulating film between the first gate electrode and the first planar semiconductor layer;

a first insulating film sidewall contacting a top surface of the first gate electrode and an upper sidewall of the first columnar semiconductor layer, and surrounding the upper region of the first columnar semiconductor layer;

a second metal-semiconductor compound layer in the same layer as the first planar semiconductor layer and contacting the first highly doped semiconductor layer; and a first electric contact on the second highly doped semiconductor layer, wherein the first electric contact is adjacent to the second highly doped semiconductor layer and the first gate electrode includes a first metal-semiconductor compound layer.

2. The semiconductor device according to claim 1, wherein the first electric contact further comprises a fifth metal-semiconductor compound layer at an interface between the first electric contact and the second highly doped semiconductor layer, and wherein:

the metal of the fifth metal-semiconductor compound comprises one or more metals that are different from the metal of the first metal-semiconductor compound layer and the metal of the second metal-semiconductor compound layer.

3. The semiconductor device according to claim 2, wherein the first gate electrode further comprises a first metal film between the first gate insulating film and the first metal-semiconductor compound layer.

4. The semiconductor device according to claim 1, wherein the first gate electrode further comprises a first metal film between the first gate insulating film and the first metal-semiconductor compound layer.

5. A semiconductor device comprising a first transistor and a second transistor, the first transistor comprising:

a first planar semiconductor layer;

a first columnar semiconductor layer formed on the first planar semiconductor layer;

a first highly doped semiconductor layer of a second-conductivity type in the lower region of the first columnar semiconductor layer and in an adjacent region of the first planar semiconductor layer;

a second highly doped semiconductor layer of the second-conductivity type in the upper region of the first columnar semiconductor layer;

a first gate insulating film surrounding the first columnar semiconductor layer on a sidewall of the first columnar semiconductor layer between the first highly doped semiconductor layer and the second highly doped semiconductor layer;

a first gate electrode surrounding the first gate insulating film on the first gate insulating film;

a first insulating film between the first gate electrode and the first planar semiconductor layer;

a first insulating film sidewall contacting a top surface of the first gate electrode and an upper sidewall of the first columnar semiconductor layer and surrounding the upper region of the first columnar semiconductor layer;

a second metal-semiconductor compound layer in the same layer as the first planar semiconductor layer and contacting the first highly doped semiconductor layer; and a first electric contact on the second highly doped semiconductor layer, and the second transistor comprising:

a second planar semiconductor layer;

a second columnar semiconductor layer on the second planar semiconductor layer;

a third highly doped semiconductor layer of a first conductivity type in a lower region of the second columnar semiconductor layer and in an adjacent region of the second planar semiconductor layer;

a fourth highly doped semiconductor layer of the first conductivity type formed in an upper region of the second columnar semiconductor layer;

a second gate insulating film surrounding the second columnar semiconductor layer on a sidewall of the second columnar semiconductor layer between the third highly doped semiconductor layer and the fourth highly doped semiconductor layer;

a second gate electrode surrounding the second gate insulating film on the second gate insulating film;

a second insulating film between the second gate electrode and the second planar semiconductor layer;

a second insulating film sidewall contacting a top surface of the second gate electrode and an upper sidewall of the second columnar semiconductor layer, and surrounding the upper region of the second columnar semiconductor layer;

a fourth metal-semiconductor compound layer in the same layer as the second planar semiconductor layer and contacting the third highly doped semiconductor layer; and a second electric contact on the fourth highly doped semiconductor layer, wherein the first electric contact is adjacent to the second highly doped semiconductor layer, the second electric contact is adjacent to the fourth highly doped semiconductor layer, the first gate electrode includes a first metal-semiconductor compound layer, and the second gate electrode includes a third metal-semiconductor compound layer.

6. The semiconductor device according to claim 5 further comprising:

a fifth metal-semiconductor compound layer at an interface between the first electric contact and the second highly doped semiconductor layer;

a sixth metal-semiconductor compound layer at an interface between the second electric contact and the fourth highly doped semiconductor layer, wherein the metal of the fifth metal-semiconductor compound comprises one or more metals that are different from the metal of the first metal-semiconductor compound and the metal of the second metal-semiconductor compound, and the metal of the sixth metal-semiconductor compound comprises one or more metals that are different from the metal of the third metal-semiconductor compound and the metal of the fourth metal-semiconductor compound.

7. The semiconductor device according to claim 6 further comprising:

a first metal film between the first gate insulating film and the first metal-semiconductor compound layer; and a second metal film between the second gate insulating film and the third metal-semiconductor compound layer.

8. The semiconductor device according to claim 7, wherein:

the first gate insulating film and the first metal film comprise materials that render the first transistor enhancement type, and the second gate insulating film and the second metal film comprise materials that render the second transistor an enhancement type.

9. The semiconductor device according to claim 5 further comprising:

a first metal film between the first gate insulating film and the first metal-semiconductor compound layer; and a second metal film between the second gate insulating film and the third metal-semiconductor compound layer.

10. The semiconductor device according to claim 9, wherein:

the first gate insulating film and the first metal film comprise materials rendering the first transistor enhancement type transistor, and the second gate insulating film and the second metal film comprise materials rendering the second transistor enhancement type transistor.

* * * * *